(12) United States Patent
Nagata et al.

(10) Patent No.: US 10,615,172 B2
(45) Date of Patent: Apr. 7, 2020

(54) THREE-DIMENSIONAL MEMORY DEVICE HAVING DOUBLE-WIDTH STAIRCASE REGIONS AND METHODS OF MANUFACTURING THE SAME

(71) Applicant: SANDISK TECHNOLOGIES LLC, Addison, TX (US)

(72) Inventors: Koichiro Nagata, Yokkaichi (JP); Junpei Kanazawa, Yokkaichi (JP); Yoshitaka Otsu, Yokkaichi (JP); Takaaki Iwai, Yokkaichi (JP); Shuji Minagawa, Yokkaichi (JP); Hisakazu Otoi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/363,621

(22) Filed: Mar. 25, 2019

(65) Prior Publication Data
US 2019/0348435 A1    Nov. 14, 2019

Related U.S. Application Data

(63) Continuation-in-part of application No. 15/977,212, filed on May 11, 2018, now Pat. No. 10,347,654.

(51) Int. Cl.
*H01L 27/11582* (2017.01)
*H01L 21/768* (2006.01)
(Continued)

(52) U.S. Cl.
CPC .. *H01L 27/11582* (2013.01); *H01L 21/76895* (2013.01); *H01L 23/528* (2013.01); *H01L 27/11556* (2013.01)

(58) Field of Classification Search
CPC ......... H01L 27/11582; H01L 27/11556; H01L 23/528; H01L 21/76895
See application file for complete search history.

(56) References Cited

U.S. PATENT DOCUMENTS

| 5,915,167 A | 6/1999 | Leedy |
| 8,878,278 B2 | 11/2014 | Alsmeier et al. |

(Continued)

OTHER PUBLICATIONS

U.S. Appl. No. 15/977,212, filed May 11, 2018, Sandisk Technologies LLC.

*Primary Examiner* — Anthony Ho
(74) *Attorney, Agent, or Firm* — The Marbury Law Group PLLC

(57) ABSTRACT

Memory openings and backside openings are formed through an alternating stack of insulating layers and sacrificial material layers with patterned stepped surfaces and an overlying retro-stepped dielectric material portion. The backside openings may be formed in rows with shape modifications in staircase regions to provide more lateral elongation in areas with lesser layers of the alternating stack. Non-circular horizontal cross-sectional shapes for the backside openings in the staircase regions allow formation of the backside opening with less shape distortion. Memory opening fill structures are formed in the memory openings, and the sacrificial material layers are replaced with electrically conductive layers using the backside openings as conduits for an etchant and for a deposition precursor material. The electrically conductive layers are isotropically recessed around each backside opening to form width-modulated cavities, which is filled with width-modulated insulating wall structures.

15 Claims, 100 Drawing Sheets

(51) Int. Cl.
*H01L 23/528* (2006.01)
*H01L 27/11556* (2017.01)

(56) References Cited

U.S. PATENT DOCUMENTS

| | | |
|---|---|---|
| 9,455,267 B2 | 9/2016 | Zhang et al. |
| 9,679,906 B2 | 6/2017 | Lu et al. |
| 9,859,363 B2 | 1/2018 | Lu et al. |
| 9,917,093 B2 | 3/2018 | Chu et al. |
| 9,972,640 B1 | 5/2018 | Kai et al. |
| 2013/0126957 A1 | 5/2013 | Higashitani et al. |
| 2016/0086969 A1 | 3/2016 | Zhang et al. |
| 2016/0163732 A1 | 6/2016 | Lim et al. |
| 2017/0047334 A1 | 2/2017 | Lu et al. |
| 2017/0236896 A1 | 8/2017 | Lu et al. |
| 2017/0373078 A1 | 12/2017 | Chu et al. |
| 2017/0373087 A1 | 12/2017 | Ito et al. |
| 2019/0006381 A1 | 1/2019 | Nakatsuji et al. |

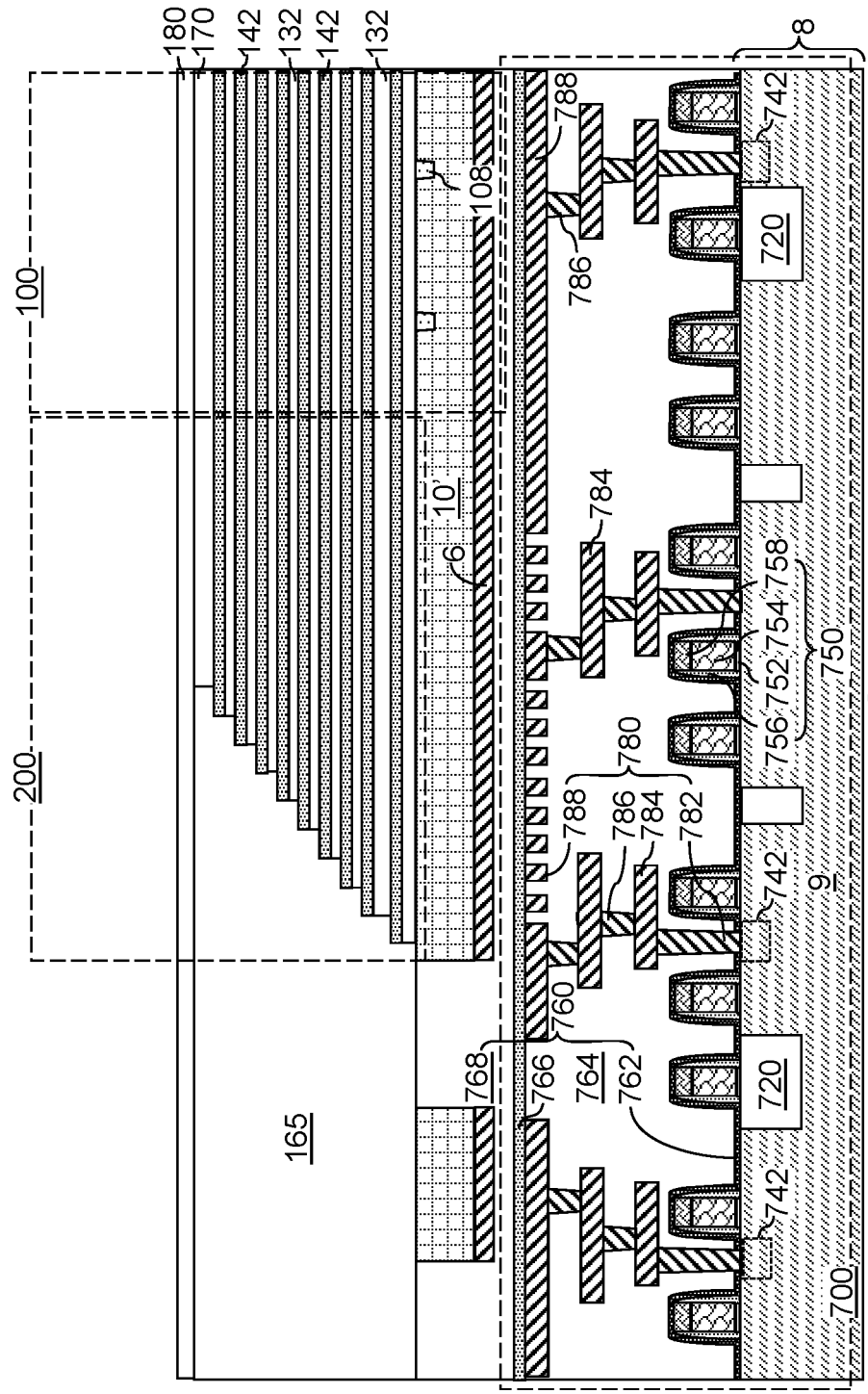

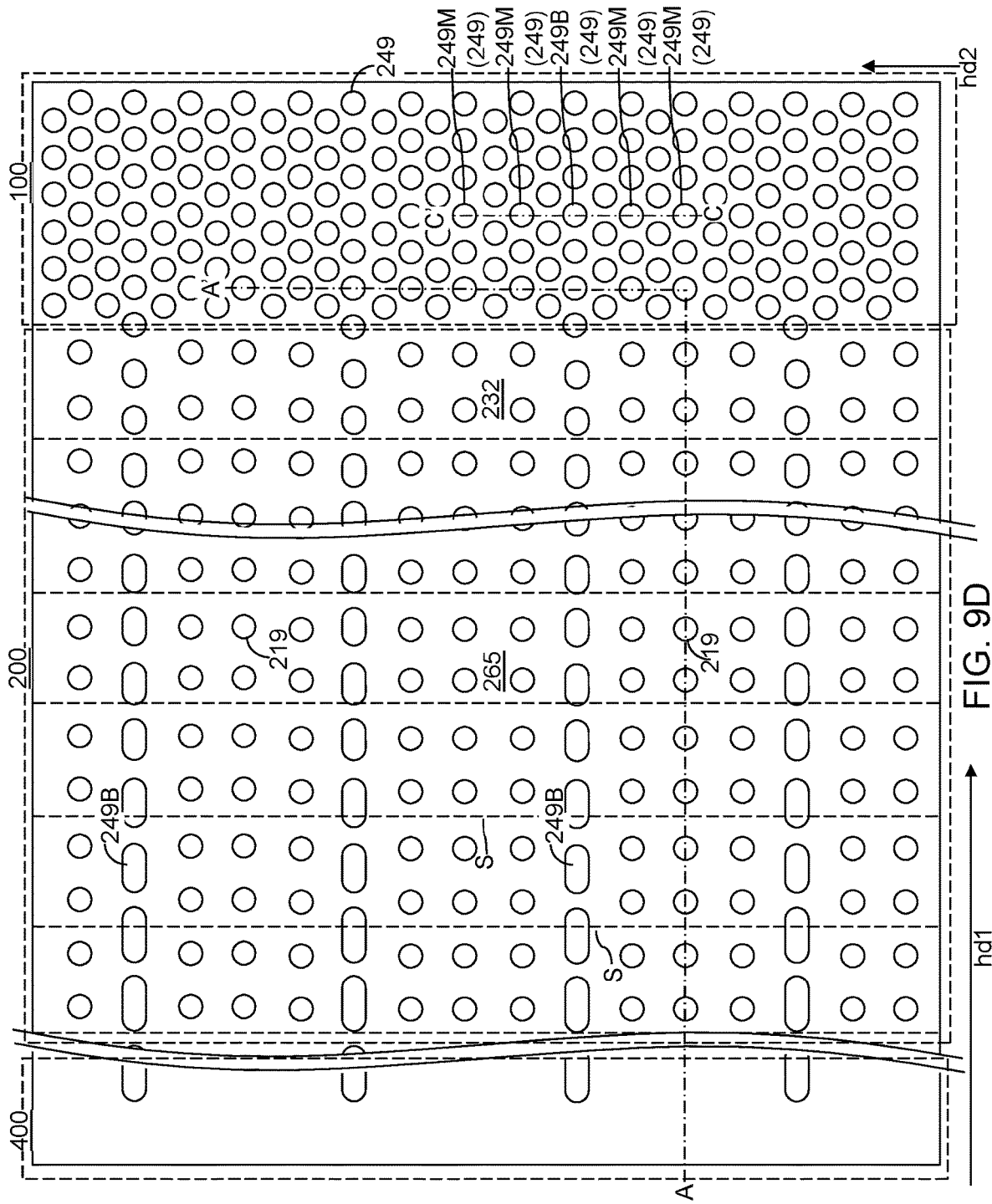

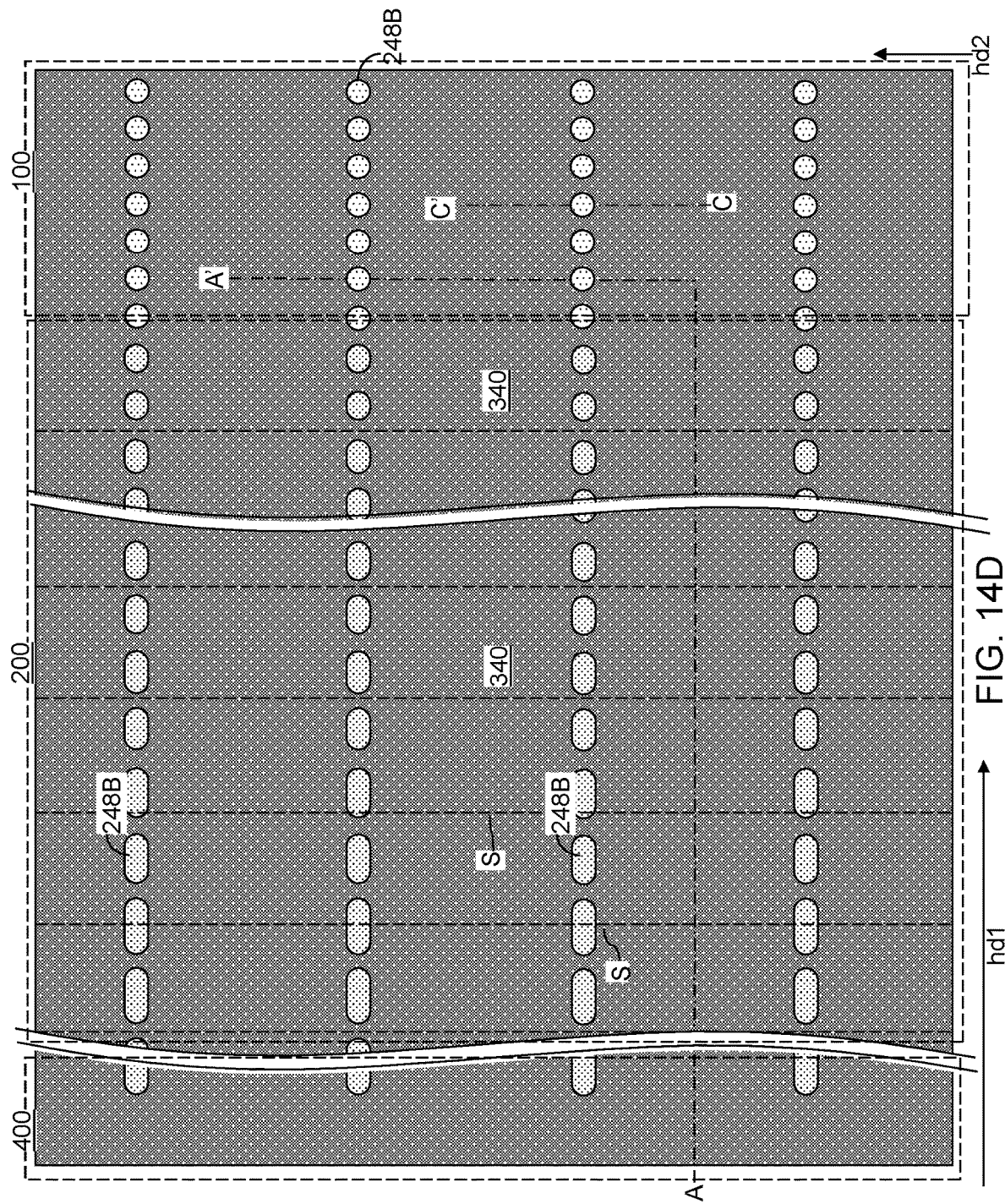

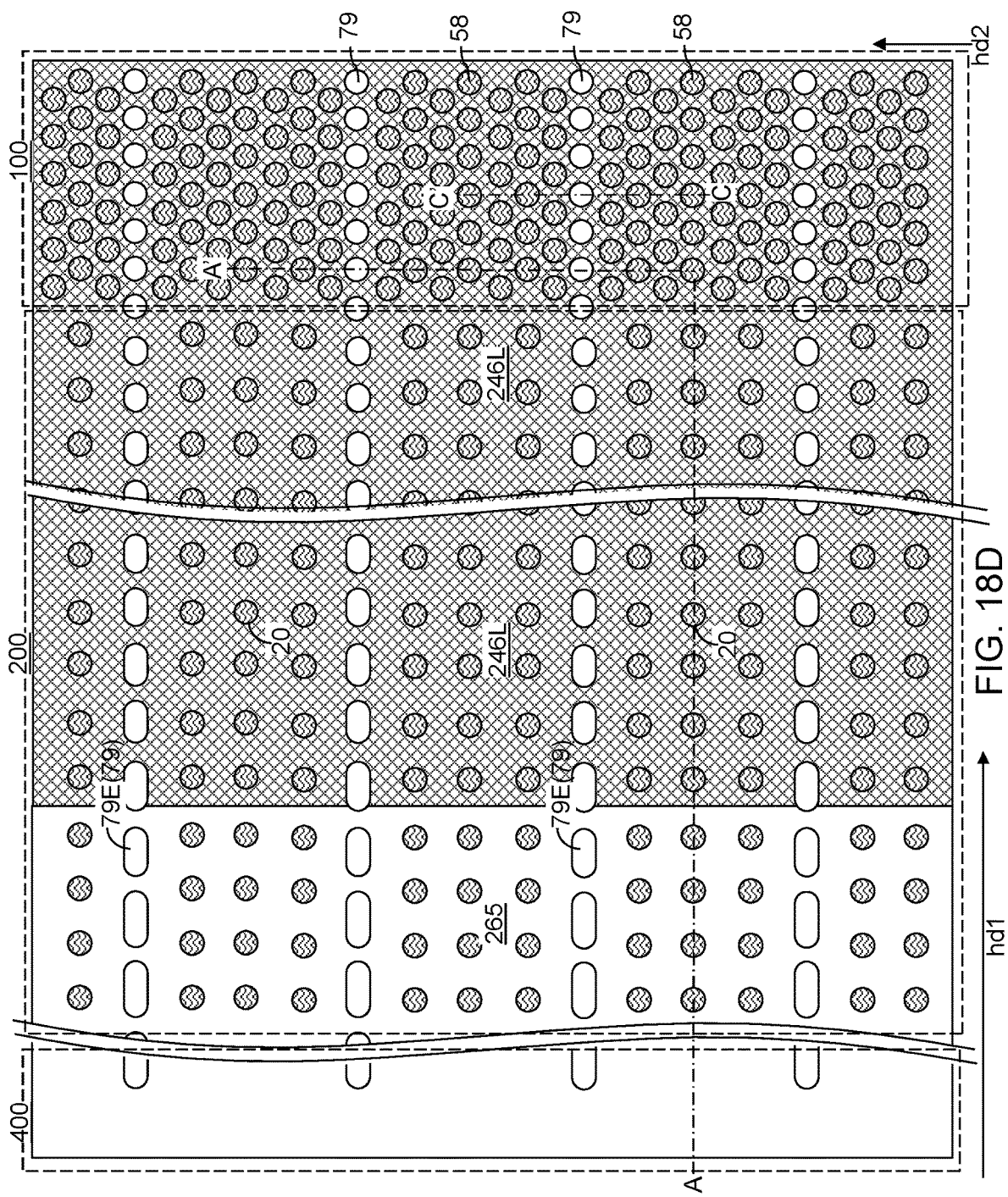

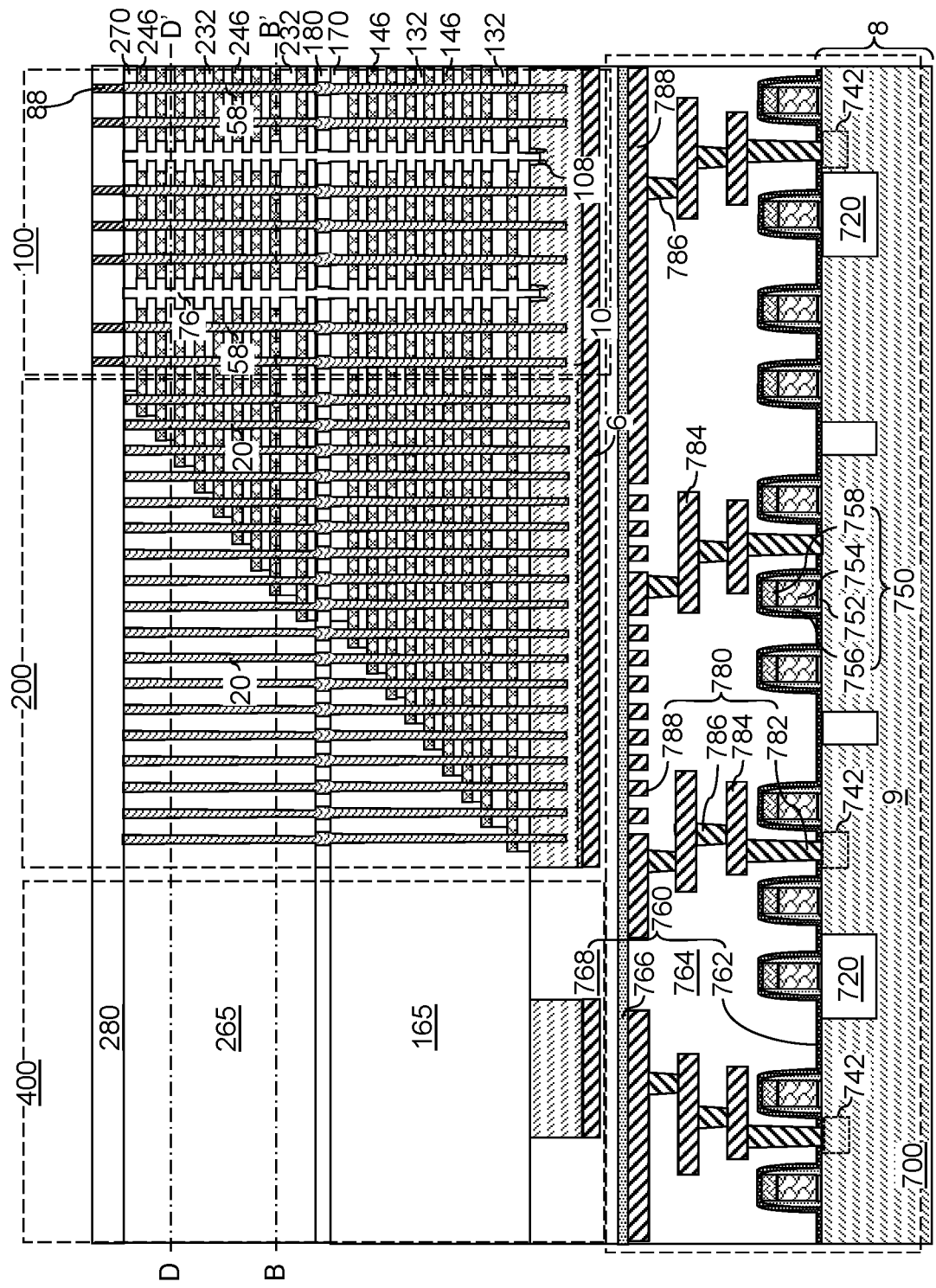

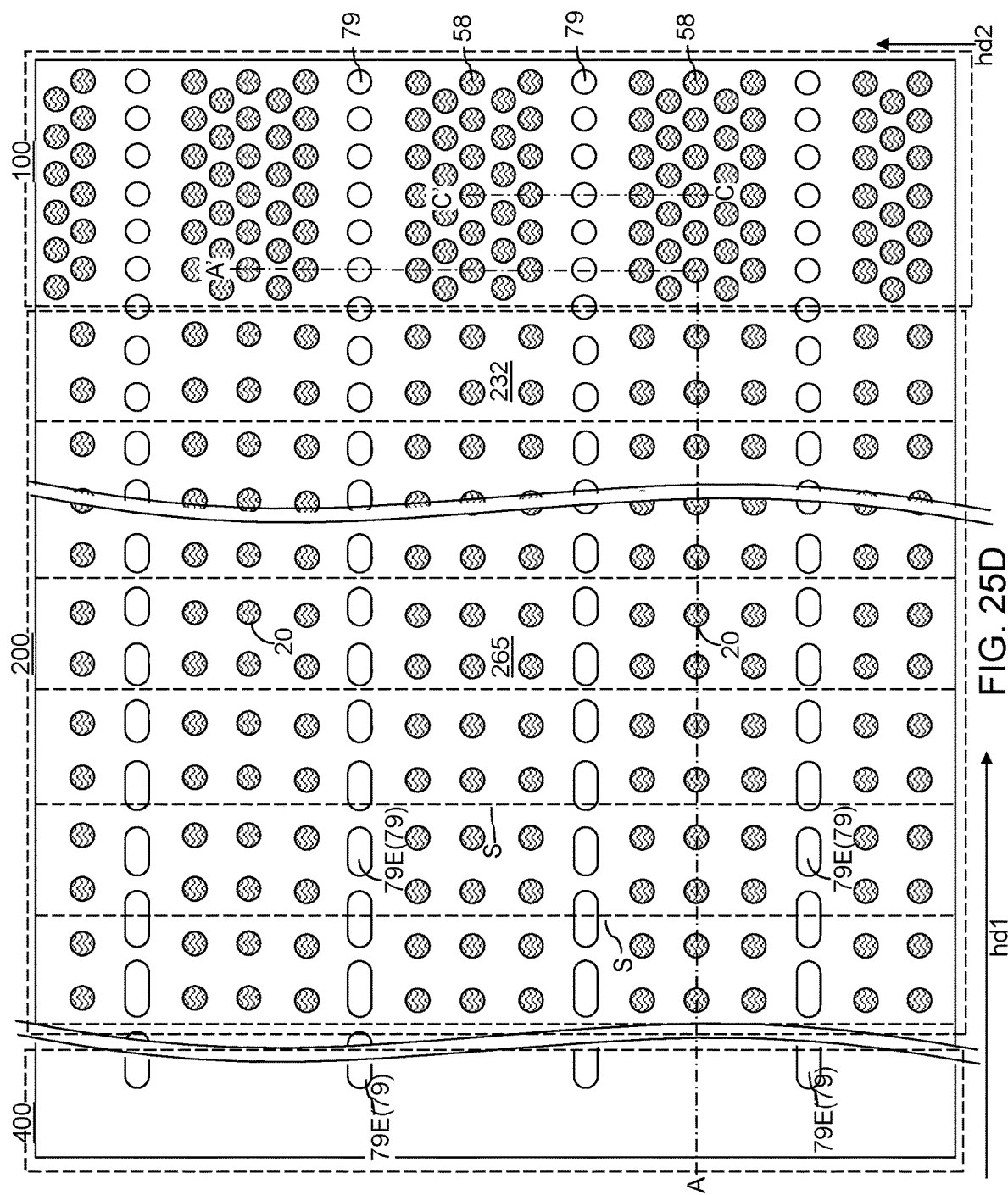

THREE-DIMENSIONAL MEMORY DEVICE HAVING DOUBLE-WIDTH STAIRCASE REGIONS AND METHODS OF MANUFACTURING THE SAME

RELATED APPLICATIONS

The present application is a continuation-in-part application of U.S. application Ser. No. 15/977,212 filed on May 11, 2018, the entire contents of which are incorporated herein by reference.

FIELD

The present disclosure relates generally to the field of semiconductor devices and specifically to a three-dimensional memory device using discrete backside replacement openings and methods of making the same.

BACKGROUND

Recently, ultra-high-density storage devices using three-dimensional (3D) memory stack structures have been proposed. For example, a 3D NAND stacked memory device may be formed from an array of an alternating stack of insulating materials and spacer material layers that are formed as electrically conductive layers or replaced with electrically conductive layers over a substrate containing peripheral devices (e.g., driver/logic circuits). Memory openings may be formed through the alternating stack, and are filled with memory stack structures, each of which includes a vertical stack of memory elements and a vertical semiconductor channel.

SUMMARY

According to an embodiment of the present disclosure, a three-dimensional memory device is provided, which may comprise: an alternating stack of insulating layers and electrically conductive layers located over a substrate; a width-modulated insulating wall structure that may laterally extend along a first horizontal direction and vertically extend through each layer in the alternating stack; and groups of memory stack structures that mat extend through the alternating stack, wherein each insulating layer is a continuous perforated insulating layer that laterally extends around pillar structures of the width-modulated insulating wall structure along a second horizontal direction that is perpendicular to the first horizontal direction, and the width-modulated insulating wall structure includes a laterally alternating sequence of bulging regions and neck regions. In various embodiments, a neck-to-neck distance between neighboring pairs of neck regions monotonically changes along a lengthwise direction of the width-modulated insulating wall structure within a nonuniform spacing segment of the laterally alternating sequence.

According to another embodiment of the present disclosure, a method of forming a three-dimensional semiconductor device is provided, which comprises: forming an alternating stack of insulating layers and sacrificial material layers over a substrate; forming groups of memory stack structures through the alternating stack, wherein each memory stack structure comprises a memory film and a vertical semiconductor channel; forming backside opening through the alternating stack, wherein the backside openings are arranged in rows that laterally extend along a first horizontal direction, and the backside openings have a variable lateral extent that changes along the first horizontal direction; and replacing remaining portions of the sacrificial material layers with electrically conductive layers by introducing an isotropic etchant that etches the remaining portions of the sacrificial material layers through the backside openings and subsequently introducing a precursor material for deposition of the electrically conductive layers thorough the backside openings.

According to an embodiment of the present disclosure, a three-dimensional semiconductor device comprises an alternating stack of insulating layers and electrically conductive strips located over a substrate, a width-modulated insulating wall structure that laterally extends along a first horizontal direction and vertically extends through each layer in the alternating stack, and groups of memory stack structures extending through the alternating stack, wherein each memory stack structure includes a memory film and a vertical semiconductor channel. Each insulating layer is a continuous perforated insulating layer that laterally extends through the width-modulated insulating wall structure, and the electrically conductive strips in each vertical level are discrete strips which are laterally separated from each other by the width-modulated insulating wall structure.

According to another embodiment of the present disclosure, a method of forming a three-dimensional semiconductor device is provided, which comprises the steps of: forming an alternating stack of insulating layers and sacrificial material layers over a substrate; forming memory openings and backside openings through the alternating stack; forming memory opening fill structures in the memory openings and sacrificial backside opening fill structures in the backside openings, wherein each memory opening fill structure comprises a respective memory film and a respective vertical semiconductor channel; forming cavities in volumes of the backside openings by removing the sacrificial backside opening fill structures; replacing remaining portions of the sacrificial material layers with material portions including electrically conductive layers, wherein each electrically conductive layer is formed as a continuous material layer including holes around the backside openings; singulating each electrically conductive layer into a plurality of electrically conductive strips by isotropically recessing the electrically conductive layers around each backside opening, wherein width-modulated cavities including expanded volumes of the backside openings are formed; and forming width-modulated insulating wall structures in the width-modulated cavities.

BRIEF DESCRIPTION OF THE DRAWINGS

FIG. 4 is a vertical cross-sectional view of the exemplary structure after patterning a first-tier staircase region, a first retro-stepped dielectric material portion, and an inter-tier dielectric layer according to an embodiment of the present disclosure.

FIG. 9D is a horizontal cross-sectional view of the first alternative embodiment of the exemplary structure along the horizontal plane B-B' of FIG. 9A. The hinged vertical plane A-A' corresponds to the plane of the vertical cross-sectional view of FIG. 9A. The vertical plane C-C' corresponds the plane of the vertical cross-sectional view of FIG. 9C.

FIG. 14D is a top-down view of the first alternative embodiment of the exemplary structure of FIG. 14A. The hinged vertical plane A-A' corresponds to the plane of the vertical cross-sectional view of FIG. 14A. The vertical plane C-C' corresponds the plane of the vertical cross-sectional view of FIG. 14C.

FIG. 18D is a horizontal cross-sectional view of the first alternative embodiment of the exemplary structure along the horizontal plane B-B' of FIG. 18A. The hinged vertical plane A-A' corresponds to the plane of the vertical cross-sectional view of FIG. 18A. The vertical plane C-C' corresponds the plane of the vertical cross-sectional view of FIG. 18C.

FIG. 21A is a vertical cross-sectional view of the exemplary structure after formation of various contact via structures according to an embodiment of the present disclosure.

FIG. 25D is a horizontal cross-sectional view of the third alternative embodiment of the exemplary structure at the processing steps of FIGS. 16A, 16B, and 16C. The hinged vertical plane A-A' corresponds to the plane of the vertical cross-sectional view of FIG. 25A. The vertical plane C-C' corresponds the plane of the vertical cross-sectional view of FIG. 25C.

DETAILED DESCRIPTION

Figure 1A:
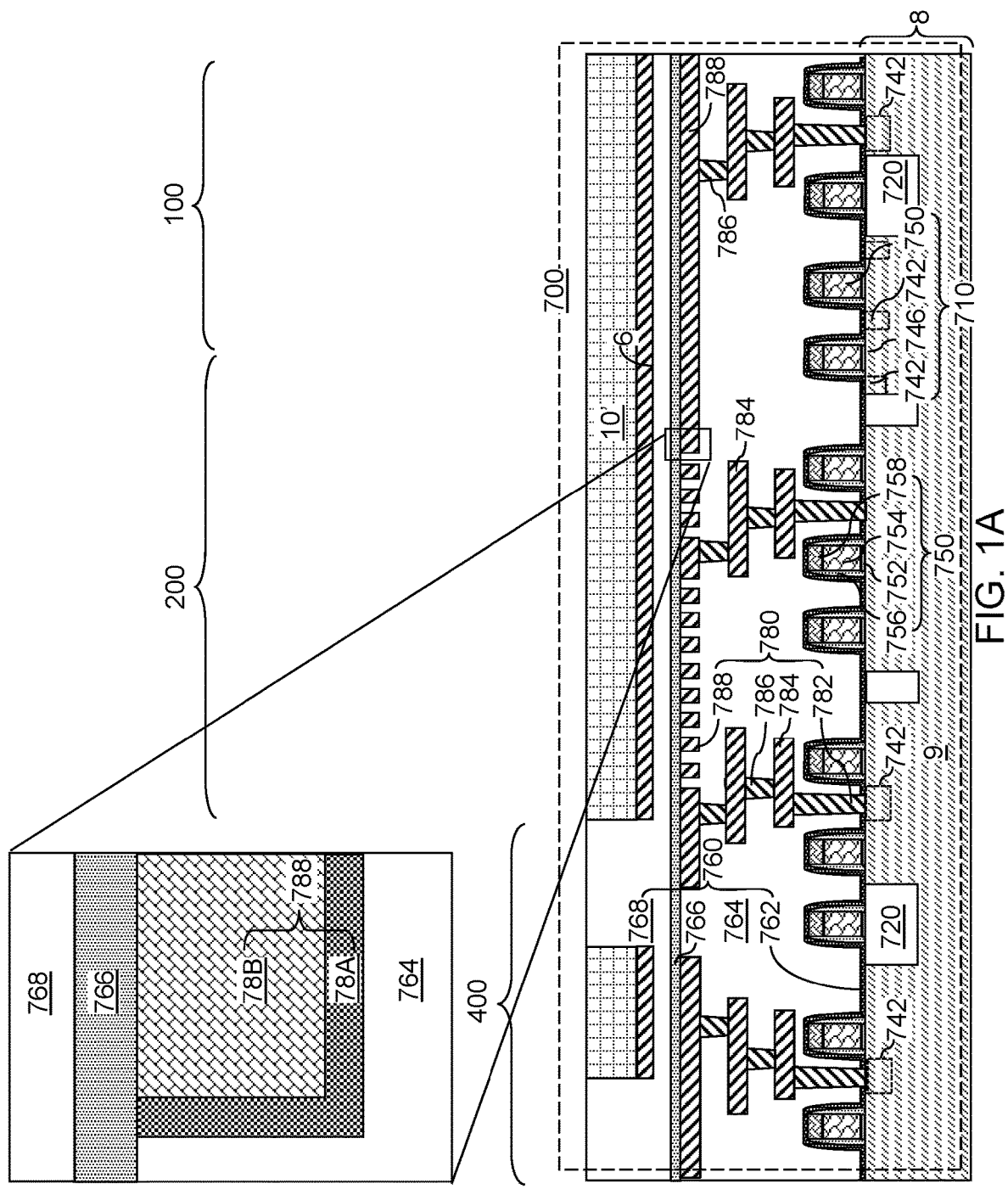
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

An alternating stack of insulating layers and electrically conductive layers (e.g., word lines) of a three-dimensional memory device may be formed by providing an in-process alternating stack of the insulating layers and sacrificial material layers, and by forming elongated backside trenches that laterally extend along a same horizontal direction. The sacrificial material layers may be removed by providing an isotropic etchant into the backside trenches, and the electrically conductive layers may be formed by providing a reactant through the backside trenches. Typically, the metallic material of the electrically conductive layers generates a high level of stress, such as a tensile stress, that tends to bend the substrate. Because the backside trenches laterally extend along a same lengthwise horizontal direction and function as stress-relieving buffers along a widthwise horizontal direction of the backside trenches, distortion of the substrate occurs primarily along the lengthwise horizontal direction of the backside trenches. A unidirectional stress may cause significant bowing of the substrate, and may significantly decrease the process window for subsequent lithography steps.

In addition, during the etching of backside trenches, device openings and support openings, the deposition of by-products along the sidewalls of the device and support openings may cause a bending of the ions used to etch the openings. Moreover, the degree of ion bending may vary in forming the various openings as each opening in a peripheral, staircase and memory region may have varying layers of materials through which the etch process must remove to form the various openings. By employing a different shape for each opening in each respective region, the bending may be mitigated. For example, a circular shape may be optimal in a memory region that penetrates the layers of an alternating stack of insulating and sacrificial materials. In such regions increased deposition of by products may occur on the opening sidewalls. Thus, a substantially circular shape may be preferred to avoid bending. However, an elongated or elliptical shape may be preferred in the peripheral or staircase region where fewer layers of the alternating stack are etched through and to merge the elliptical openings into a backside trench which separates the metal (e.g., tungsten) word lines between different memory blocks. In one embodiment, the elliptical openings remain in the insulating layers and the elliptical openings do not coalesce into a backside trench such that the elliptical openings do not fully separate the insulating layers located in adjacent memory blocks in the staircase region. In contrast, a substantially circular shape may be distorted by what little deposition of by-products does occur. The various embodiments disclosed herein employ steps to form openings wherein the shape of the opening may vary depending on the region in which the opening is formed. In this manner, a backside trench with less bending may be formed to isolate memory blocks of a memory device.

According to embodiments of the present disclosure a method of more evenly distributing the mechanical stress on the substrate during replacement of sacrificial material layers with electrically conductive layers is provided. In the embodiments of the present disclosure, discrete backside openings may be used instead of the elongated backside trenches for replacement of the sacrificial material layers with electrically conductive layers (e.g., word lines). Stress generated by the electrically conductive layers may be distributed omni-directionally into the substrate and the amount of unidirectional stress (e.g., the large difference in stress provided between the x and y directions) on the substrate is reduced or eliminated.

The embodiments of the present disclosure may be used to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are used merely to identify similar elements, and different ordinals may be used across the specification and the claims of the instant disclosure. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string may be located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
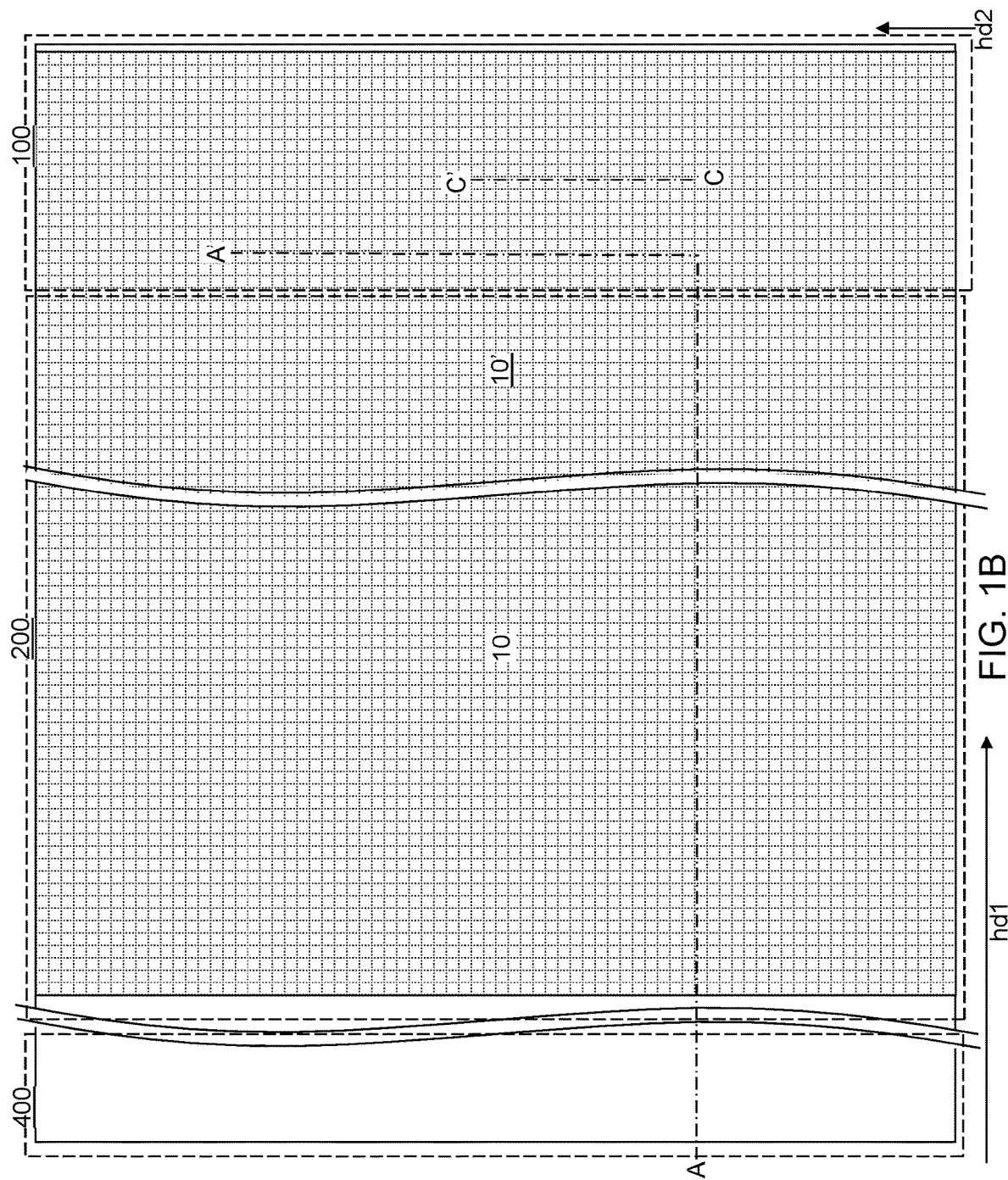
FIG. 1B is a top-down view of the exemplary structure of FIG. 1A. The hinged vertical plane A-A' is the plane of the vertical cross-sectional view of FIG. 1A.
Figure 1C:
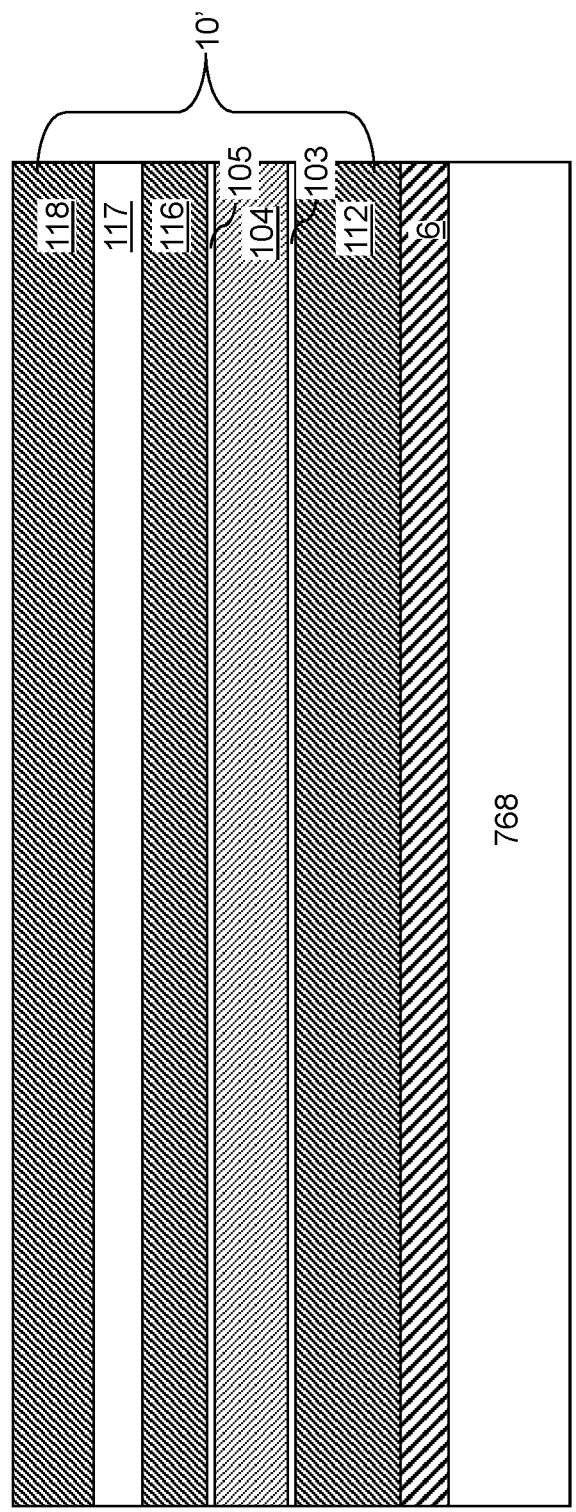
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 10' illustrated in FIGS. 1A and 1B. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 may be formed in an upper portion of the substrate semiconductor layer 9 to provide electrical isolation from and/or between the semiconductor devices 710. The semiconductor devices 710 may include, for example, field effect transistors including respective transistor active regions 742 (i.e., source regions and drain regions), channel regions 746 and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices may include any semiconductor circuitry to support operation of a memory structure to be subsequently formed, which is typically referred to as a driver circuitry, which is also known as peripheral circuitry. As used herein, a peripheral circuitry may refer to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices 710 may include word line switching devices for electrically biasing word lines of three-dimensional memory structures to be subsequently formed.

Dielectric material layers may be formed over the semiconductor devices 710, which is herein referred to as lower-level dielectric layers 760. The lower-level dielectric layers 760 may constitute a dielectric layer stack in which each lower-level dielectric layer 760 overlies or underlies other lower-level dielectric layers 760. The lower-level dielectric layers 760 may include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower-level dielectric layers 760 functions as a matrix for lower-level metal interconnect structures 780 that provide electrical wiring to connect the various nodes of the semiconductor devices 710 and landing pads for through-stack contact via structures to be subsequently formed. The lower-level metal interconnect structures 780 may be formed within the dielectric layer stack of the lower-level dielectric layers 760, and comprise a lower-level metal line structure located under and optionally contacting a bottom surface of the silicon nitride layer 766.

For example, the lower-level metal interconnect structures 780 may be formed within the at least one first dielectric material layer 764. The at least one first dielectric material layer 764 may be a plurality of dielectric material layers in which various elements of the lower-level metal interconnect structures 780 are sequentially formed. Each dielectric material layer selected from the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 may comprise, or consist essentially of, dielectric material layers having dielectric constants that do not exceed the dielectric constant of undoped silicate glass (silicon oxide) of 3.9.

The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and topmost lower-level metal line structures 788 that are configured to function as landing pads for through-stack contact via structures to be subsequently formed. In an embodiment, the at least one first dielectric material layer 764 may be a plurality of dielectric material layers that are formed level by level while incorporating components of the lower-level metal interconnect structures 780 within each respective level. For example, single damascene processes may be used to form the lower-level metal interconnect structures 780, and each level of the lower-level metal via structures 786 may be formed within a respective via level dielectric material layer and each level of the lower-level metal line structures (784, 788) may be formed within a respective line level dielectric material layer. Alternatively, a dual damascene process may be used to form integrated line and via structures, each of which includes a lower-level metal line structure and at least one lower-level metal via structure.

The topmost lower-level metal line structures 788 may be formed within a topmost dielectric material layer of the at least one first dielectric material layer 764 (which may be a plurality of dielectric material layers). Each of the lower-level metal interconnect structures 780 may include a metallic nitride liner 78A and a metal fill portion 78B. Each metallic nitride liner 78A may include a conductive metallic nitride material such as TiN, TaN, and/or WN. Each metal fill portion 78B may include an elemental metal (such as Cu, W, Al, Co, Ru) or an intermetallic alloy of at least two metals. Top surfaces of the topmost lower-level metal line structures 788 and the topmost surface of the at least one first dielectric material layer 764 may be planarized by a planarization process, such as chemical mechanical planarization. In this case, the top surfaces of the topmost lower-level metal line structures 788 and the topmost surface of the at least one first dielectric material layer 764 may be within a horizontal plane that is parallel to the top surface of the substrate 8.

The silicon nitride layer 766 may be formed directly on the top surfaces of the topmost lower-level metal line structures 788 and the topmost surface of the at least one first dielectric material layer 764. Alternatively, a portion of the first dielectric material layer 764 may be located on the top surfaces of the topmost lower-level metal line structures 788 below the silicon nitride layer 766. In one embodiment, the silicon nitride layer 766 is a substantially stoichiometric silicon nitride layer which has a composition of Si3N4. A silicon nitride material formed by thermal decomposition of a silicon nitride precursor is preferred for the purpose of blocking hydrogen diffusion. In one embodiment, the silicon nitride layer 766 may be deposited by a low pressure chemical vapor deposition (LPCVD) using dichlorosilane (SiH2Cl2) and ammonia (NH3) as precursor gases. The temperature of the LPCVD process may be in a range from 750 degrees Celsius to 825 degrees Celsius, although lesser and greater deposition temperatures may also be used. The sum of the partial pressures of dichlorosilane and ammonia may be in a range from 50 mTorr to 500 mTorr, although lesser and greater pressures may also be used. The thickness of the silicon nitride layer 766 is selected such that the silicon nitride layer 766 functions as a sufficiently robust hydrogen diffusion barrier for subsequent thermal processes. For example, the thickness of the silicon nitride layer 766 may be in a range from 6 nm to 100 nm, although lesser and greater thicknesses may also be used.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and may be lithographically patterned to provide an optional planar conductive material layer 6 and an in-process source-level material layers 10'. The optional planar conductive material layer 6, if present, provides a high conductivity conduction path for electrical current that flows into, or out of, the in-process source-level material layers 10'. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses may also be used. A metal nitride layer (not shown) may be provided as a diffusion barrier layer on top of the planar conductive material layer 6. The planar conductive material layer 6 may function as a special source line in the completed device. In addition, the planar conductive material layer 6 may comprise an etch stop layer and may comprise any suitable conductive, semiconductor or insulating layer. The optional planar conductive material layer 6 may include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' may include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source select level conductive layer 118.

The lower source-level material layer 112 and the upper source-level material layer 116 may include a doped semiconductor material such as doped polysilicon or doped amorphous silicon. The conductivity type of the lower source-level material layer 112 and the upper source-level material layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 may include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 may include a dielectric material such as silicon oxide. The thickness of the source-level insulating layer 117 may be in a range from 20 nm to 400 nm, such as from 40 nm to 200 nm, although lesser and greater thicknesses may also be used. The optional source select level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional planar conductive material layer 6 and the in-process source-level material layers 10' may be patterned to provide openings in areas in which through-stack contact via structures and through-dielectric contact via structures are to be subsequently formed. Patterned portions of the stack of the planar conductive material layer 6 and the in-process source-level material layers 10' are present in each memory array region 100 in which three-dimensional memory stack structures are to be subsequently formed. The at least one second dielectric material layer 768 may include a blanket layer portion 768A underlying the planar conductive material layer 6 and the in-process source-level material layers 10' and a patterned portion 768B that fills gaps among the patterned portions of the planar conductive material layer 6 and the in-process source-level material layers 10'.

Openings in the optional planar conductive material layer 6 and the in-process source-level material layers 10' may be formed within the area of a staircase region 200 in which contact via structures contacting word line electrically conductive layers are to be subsequently formed. In one embodiment, the staircase region 200 may be laterally spaced from the memory array region 100 along a first horizontal direction hd1 (e.g., word line direction). A horizontal direction that is perpendicular to the first horizontal direction hd1 is herein referred to as a second horizontal direction hd2 (e.g., bit line direction). In one embodiment, additional openings in the optional planar conductive material layer 6 and the in-process source-level material layers 10' may be formed within the area of a memory array region 100, in which a three-dimensional memory array including memory stack structures is to be subsequently formed. A peripheral region 400 that may be subsequently filled with a field dielectric material portion may be provided adjacent to the staircase region 200.

The region of the semiconductor devices 710 and the combination of the lower-level dielectric layers 760 and the lower-level metal interconnect structures 780 is herein referred to an underlying peripheral region 700, which is located underneath a memory-level assembly to be subsequently formed and includes peripheral devices for the memory-level assembly. The lower-level metal interconnect structures 780 may be formed in the lower-level dielectric layers 760.

The lower-level metal interconnect structures 780 may be electrically coupled (connected) to active nodes (e.g., transistor active regions 742 or gate electrodes 754) of the semiconductor devices 710 (e.g., CMOS devices), and may be located at the level of the lower-level dielectric layers 760. Through-stack contact via structures may be subsequently formed directly on the lower-level metal interconnect structures 780 to provide electrical connection to memory devices to be subsequently formed. In one embodiment, the pattern of the lower-level metal interconnect structures 780 may be selected such that the topmost lower-level metal line structures 788 (which are a subset of the lower-level metal interconnect structures 780 located at the topmost portion of the lower-level metal interconnect structures 780) may provide landing pad structures for the through-stack contact via structures to be subsequently formed.

Referring to FIGS. 2A-2D, dielectric etch stop material portions 108 may be formed through a subset of material layers within the in-process source-level material layers 10'. For example, a photoresist layer (not shown) may be applied over the top surface of the in-process source-level material layers 10', and may be lithographically patterned to form one-dimensional arrays of openings that extend along the first horizontal direction hd1. The one-dimensional arrays of openings may be laterally spaced from one another along the second horizontal direction hd2. The one-dimensional arrays of openings may extend through the memory array region 100 and the staircase region 200 along the first horizontal direction hd1. In one embodiment, each one-dimensional array of openings through the photoresist layer may be a periodic one-dimensional array having a common pitch, which may be in a range from 100 nm to 1,000 nm. The maximum dimension of each opening (such as a diameter) may be in a range from 50 nm to 600 nm, such as from 80 nm to 500 nm, although lesser and greater maximum dimensions may also be used. The ratio of the pitch of the periodic one-dimensional array to the maximum dimension of each opening may be in a range from 1.4 to 4, although lesser and greater ratios may also be used.

Figure 2A:
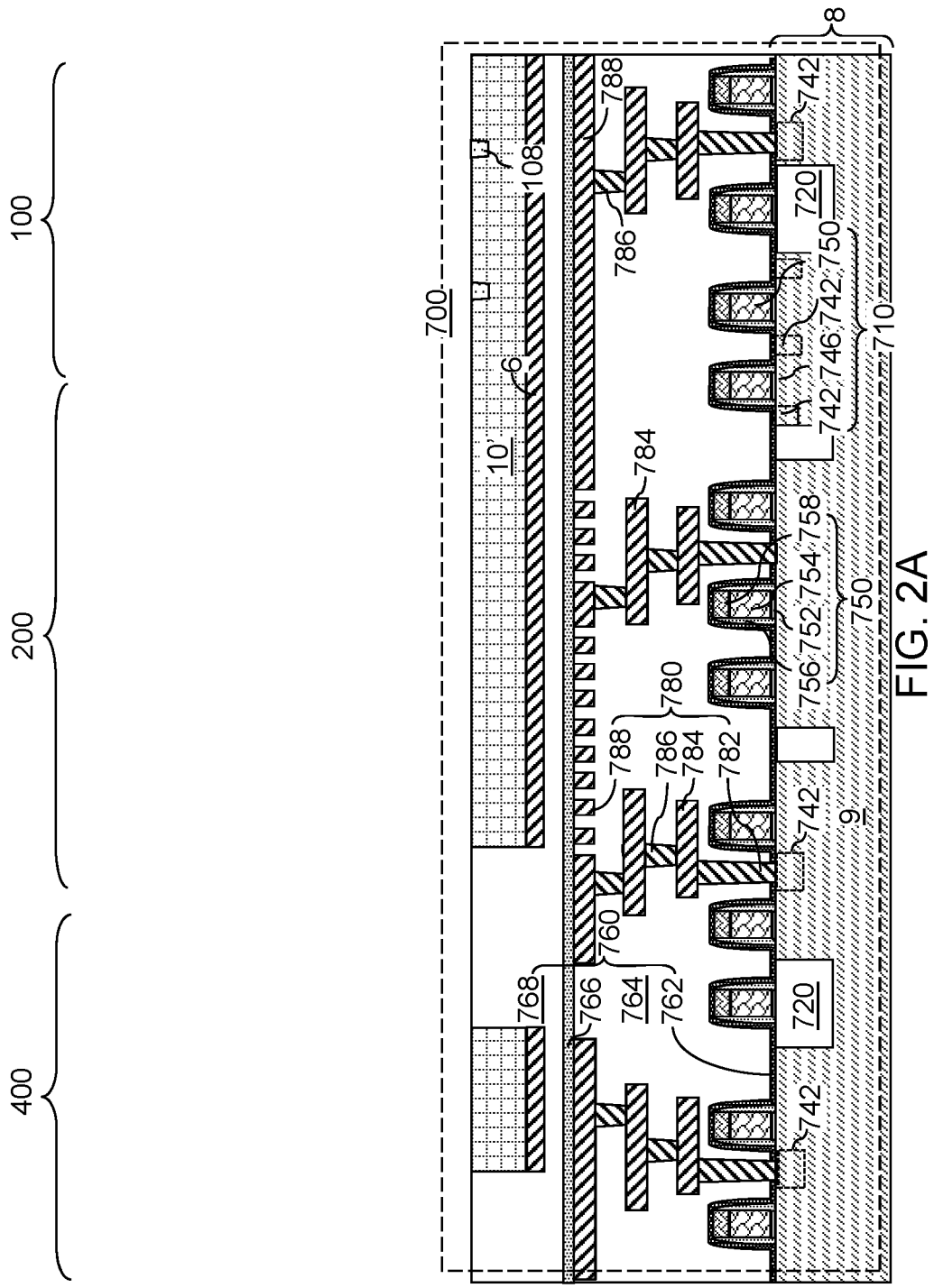
FIG. 2A is a vertical cross-sectional view of an exemplary structure after formation of dielectric etch stop material portions in an upper source-level material layer according to a first embodiment of the present disclosure.
Figure 2B:
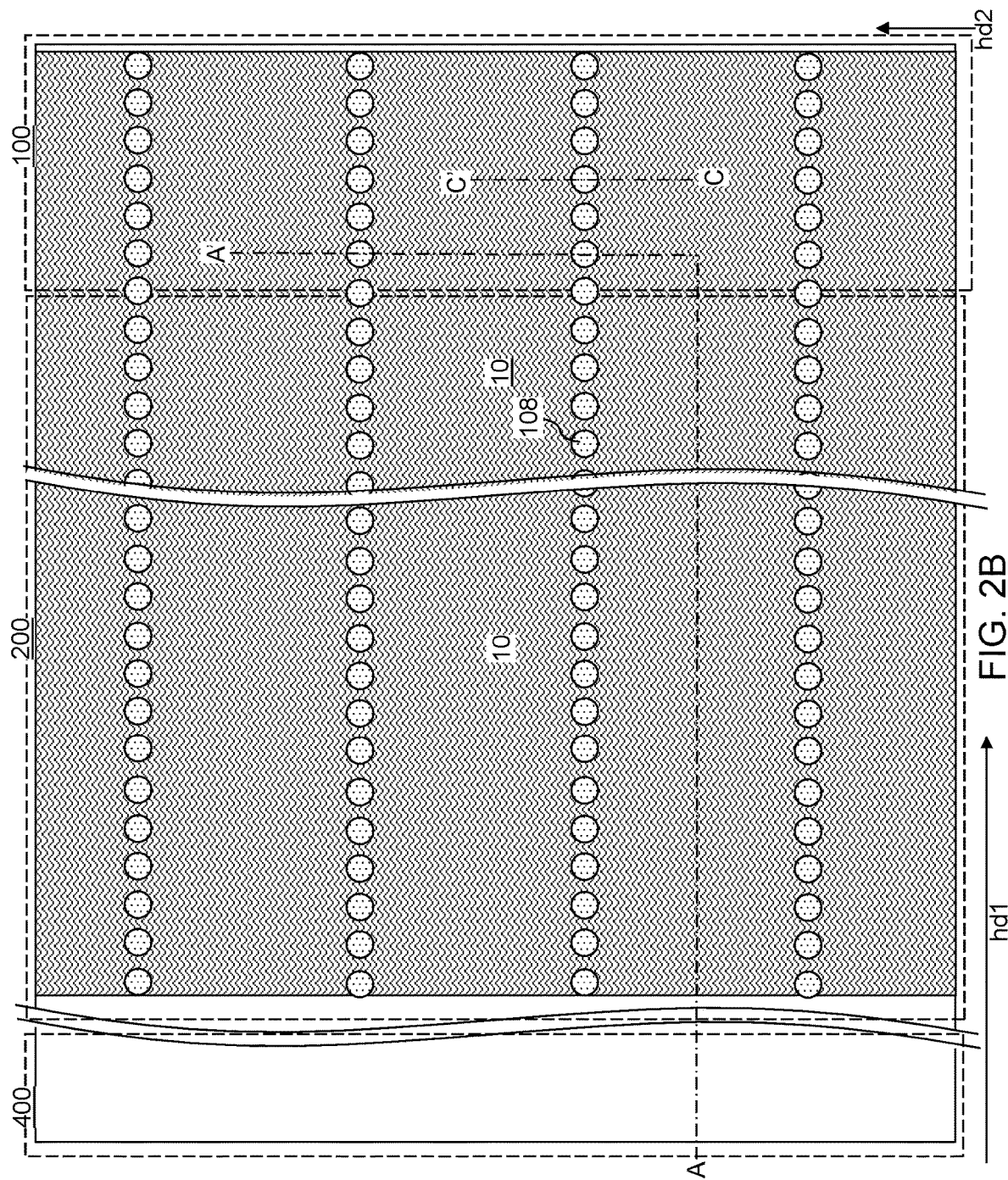
FIG. 2B is a top-down view of the exemplary structure of FIG. 2A. The hinged vertical plane A-A' is the plane of the vertical cross-sectional view of FIG. 2A.
Figure 2C:
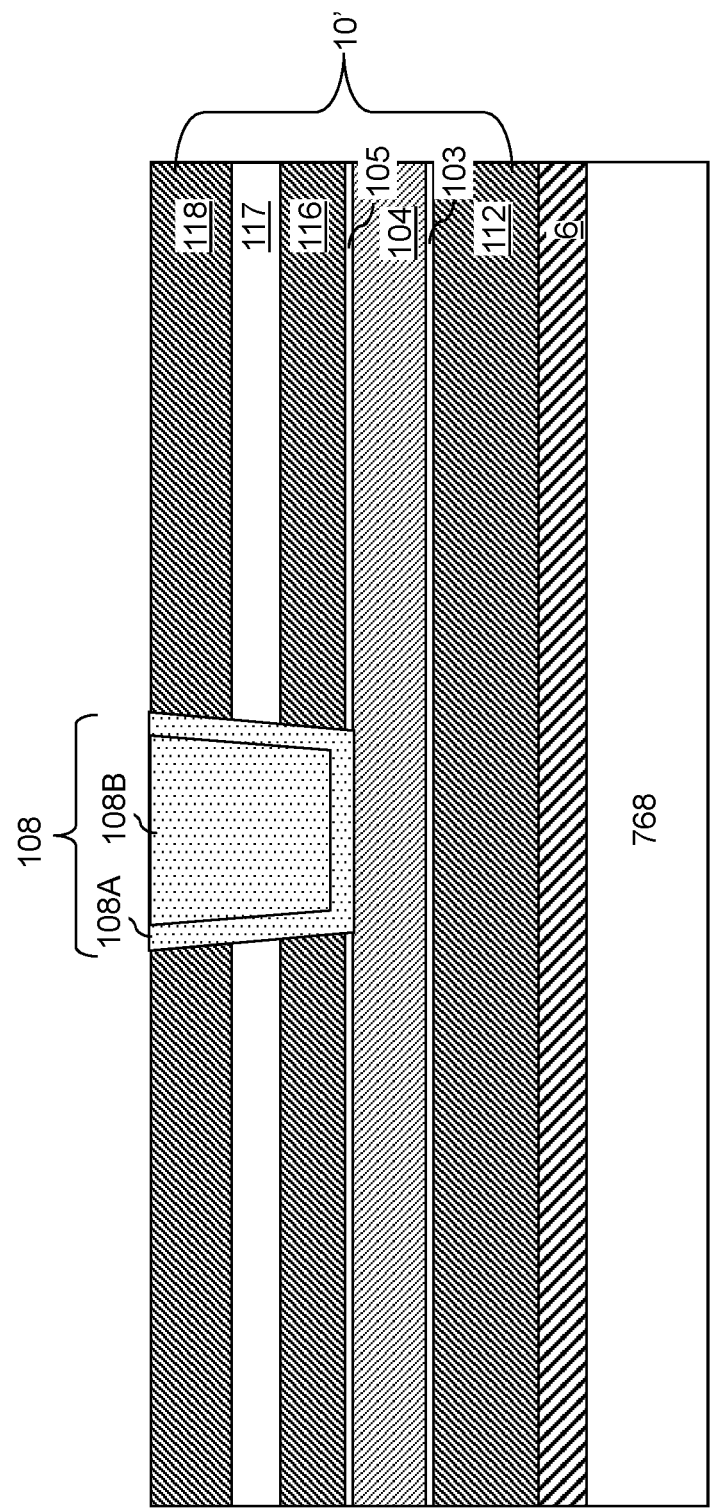
FIG. 2C is a magnified view of the in-process source level material layers along the vertical plane C-C' of FIG. 2B.

With reference to FIG. 2C, an anisotropic etch process may be performed to transfer the pattern of the openings through the optional source select level conductive layer 118, the source-level insulating layer 117, and the upper source-level material layer 116, and optionally through the upper sacrificial liner 105. Discrete recess regions are formed through the optional source select level conductive layer 118, the source-level insulating layer 117, and the upper source-level material layer 116, and optionally through the upper sacrificial liner 105. The photoresist layer may be subsequently removed, for example, by ashing. A dielectric etch stop material such silicon nitride and/or a dielectric metal oxide material may be deposited in the discrete recess regions. For example, an aluminum oxide liner 108A and a silicon nitride fill 108B may be deposited as the dielectric etch stop material. Other suitable etch stop materials may be used instead. Excess portions of the dielectric etch stop material may be removed from above the horizontal plane including the top surface of the in-process source-level material layers 10' (such as the top surface of the source select level conductive layer 118) by a planarization process. The planarization process may use chemical mechanical planarization (CMP) and/or a recess etch. The remaining portions of the dielectric etch stop material constitute the dielectric etch stop material portions 108, which may be a combination of a dielectric metal oxide (such as aluminum oxide) liner 108A and silicon nitride fill 108B.

Figure 2D:
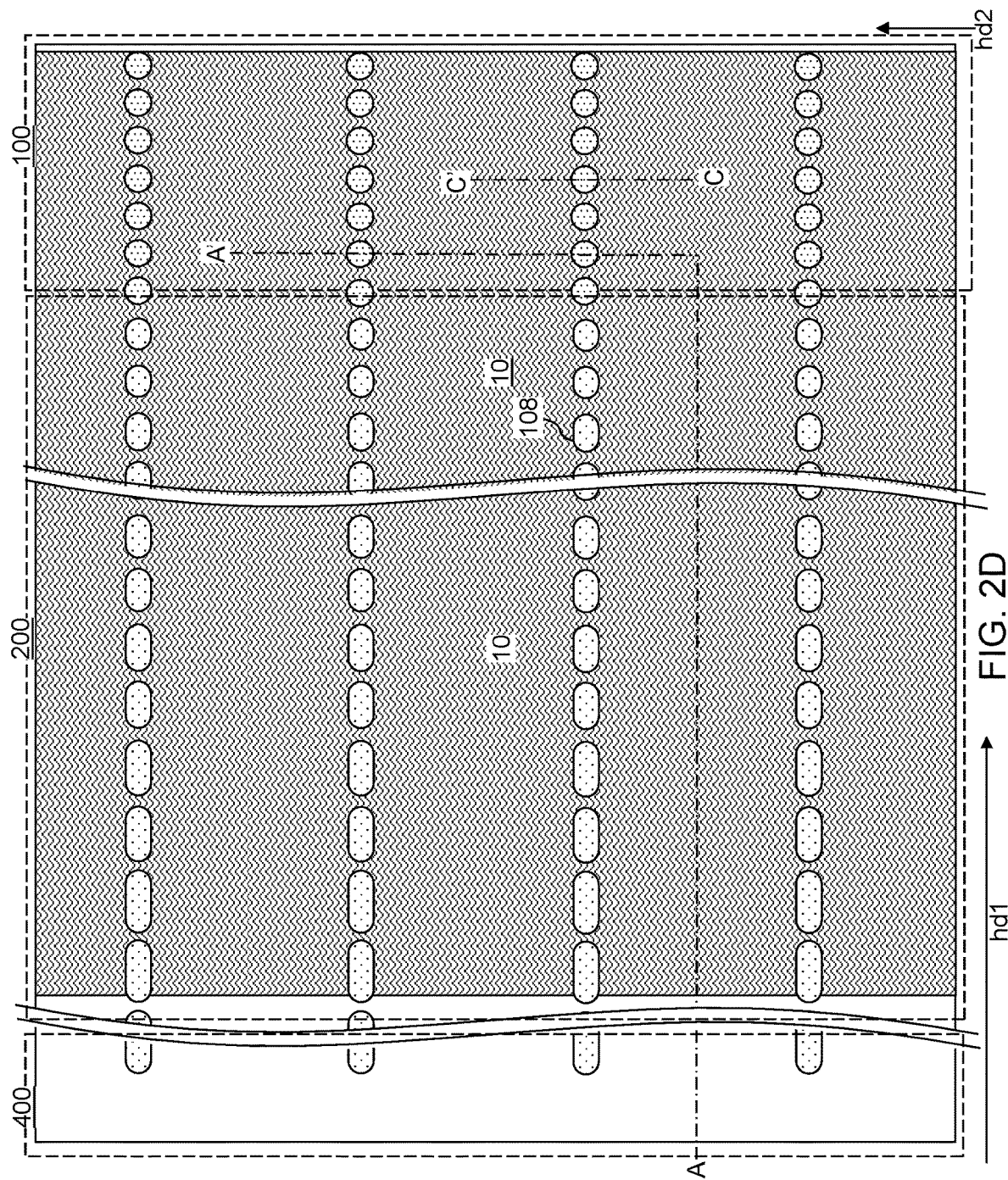
FIG. 2D is a top-down view of a first alternative embodiment of the exemplary structure of FIG. 2A. The hinged vertical plane A-A' is the plane of the vertical cross-sectional view of FIG. 2A. The vertical plane C-C' corresponds the plane of the vertical cross-sectional view of FIG. 5C.

Referring to FIG. 2D, a first alternative embodiment of the exemplary structure is illustrated, in which the pattern of the dielectric etch stop material portions 108 may be modified. Specifically, the dielectric etch stop material portions 108 may be modified in the staircase region 200 such that the lateral dimensions of the dielectric etch stop material portions 108 along the first horizontal direction hd1 gradually increases with a lateral distance away from the memory array region 100. The dielectric etch stop material portions 108 may be elongated more along the first horizontal direction hd1 with an increase in the lateral distance from the memory array region 100. In one embodiment, the dielectric etch stop material portions 108 in the memory array region 100 may have circular horizontal cross-sectional shapes, and the dielectric etch stop material portions 108 in the staircase regions have elongated horizontal cross-sectional shapes having a greater maximum lateral dimension along the first horizontal direction hd1 than a maximum lateral dimension along the second horizontal direction hd2. The ratio of the maximum lateral dimension along the first horizontal direction hd1 to the maximum lateral dimension along the second horizontal direction hd2 may monotonically increase with the lateral distance of the dielectric etch stop material portion 108 from the memory array region 100.

As used herein, a function that "monotonically increases" with a parameter refers to a function in which each value of the function for a first value of the parameter is not less than the value of the function for any second value of the parameter that is less than the first value. As used herein, a function that "monotonically decreases" with a parameter refers to a function in which each value of the function for a first value of the parameter is not more than the value of the function for any second value of the parameter that is less than the first value. As used herein, a function that "strictly increases" with a parameter refers to a function in which each value of the function for a first value of the parameter is more the value of the function for any second value of the parameter that is less than the first value. As used herein, a function that "strictly decreases" with a parameter refers to a function in which each value of the function for a first value of the parameter is less than the value of the function for any second value of the parameter that is less than the first value.

In one embodiment, the dielectric etch stop material portions 108 may be arranged in rows that extend along the first horizontal direction hd1 and may be laterally spaced apart along the second horizontal direction hd2. Dielectric etch stop material portions 108 located within a same row may be laterally spaced apart by a same spacing. The length-to-width ratio, i.e., the ratio of the maximum dimension along the first horizontal direction hd1 to the maximum dimension along the second horizontal dimension hd2, for the dielectric etch stop material portions 108 may be 1.0 in the memory array region 100, and may monotonically, and/or strictly, increase with a lateral distance from the memory array region 100 along the first horizontal direction hd1 within the area of the staircase region 200. The maximum value for the length-to-width ratio of the dielectric etch stop material portions 108 may be in a range from 2.0 to 20, such as from 4.0 to 10, although lesser and greater maximum values may also be used. In one embodiment, each of the dielectric etch stop material portions 108 may have the same maximum lateral dimension along the second horizontal direction hd2. In this case, the length-to-width ratios of the dielectric etch stop material portions 108 may be greater than 1.0 in the staircase region 200 by having a respective maximum lateral dimension along the first horizontal direction hd1 that is greater than the maximum lateral dimension along the second horizontal direction hd2. Generally, the dielectric etch stop material portions 108 may be formed within areas in which backside openings are to be subsequently formed.

Figure 3:
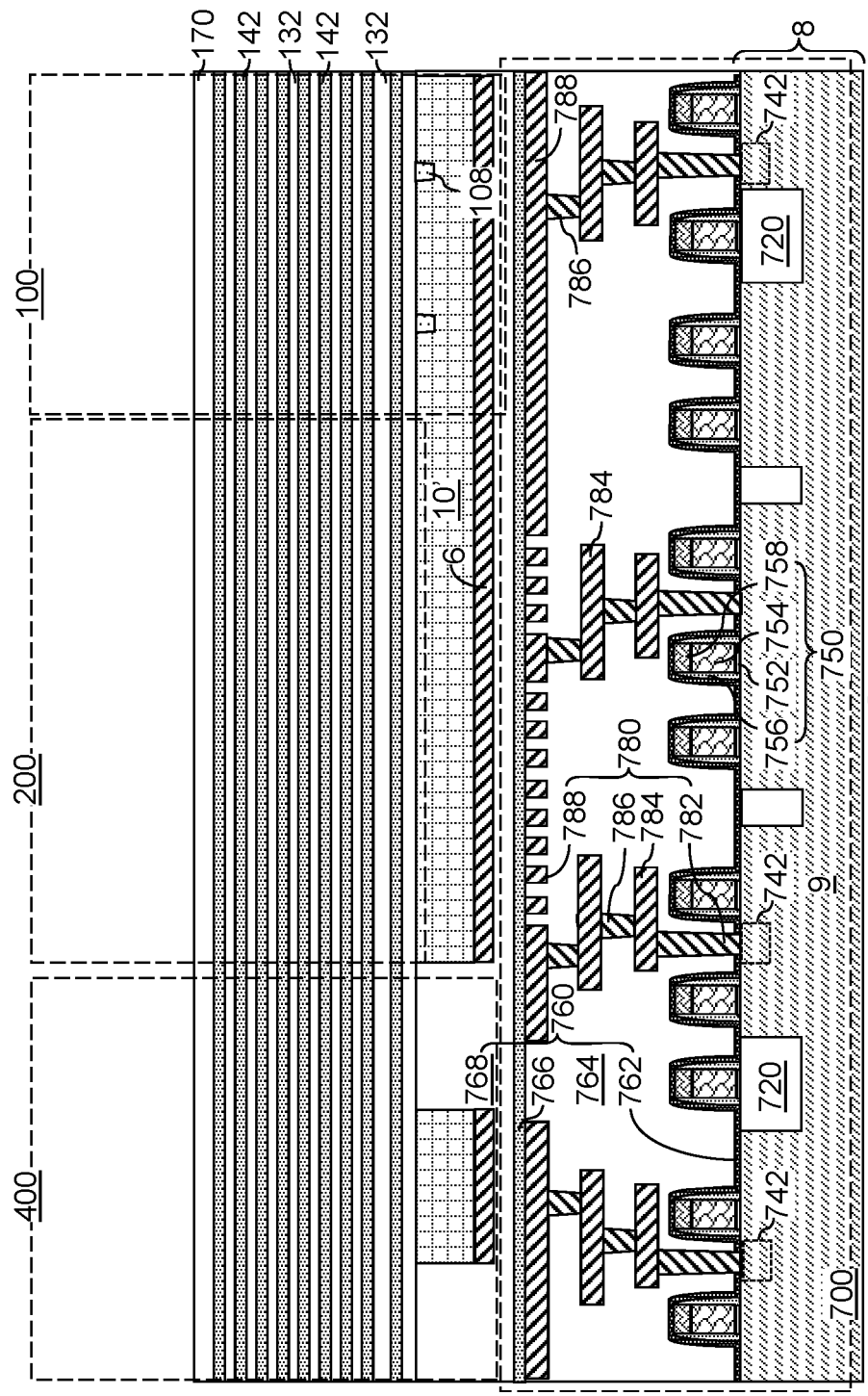
FIG. 3 is a vertical cross-sectional view of the exemplary structure after formation of a first-tier alternating stack of first insulting layers and first spacer material layers according to an embodiment of the present disclosure.

Referring to FIG. 3, an alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the stack (132, 142). The first insulating cap layer 170 may include a dielectric material, which may be any dielectric material that may be used for the first insulating layers 132. In one embodiment, the first insulating cap layer 170 may include the same dielectric material as the first insulating layers 132. The thickness of the insulating cap layer 170 may be in a range from 20 nm to 300 nm, although lesser and greater thicknesses may also be used.

Referring to FIG. 4, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165, 175). The inter-tier dielectric layer 180 may include a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Referring to FIGS. 5A-5D, various discrete (i.e., unconnected) openings (149, 129) may be formed through the inter-tier dielectric layer 180 and the first-tier structure (132, 142, 165). The various openings (149, 129) include first-tier device openings 149 that are subsequently used to form memory stack structures and first-tier support openings 129 that are subsequently used to form dummy structures (i.e., electrically inactive structures). The first-tier device openings 149 and the first-tier support openings 129 extend through the first-tier alternating stack (132, 142) and into the in-process source-level material layers 10'. The first-tier device openings 149 include first-tier memory openings 149M and first-tier backside openings 149B.

The first-tier backside openings 149B may be formed within areas that overlap with the areas of the dielectric etch stop material portions 108 in the memory array region 100 and in the staircase region 200. In one embodiment, a bottom periphery of each first-tier backside openings 149B may be formed within a periphery of a top surface of a respective one of the dielectric etch stop material portion 108. The first-tier memory openings 149M may be formed between rows of the first-tier backside openings 149B in the memory array region 100. In one embodiment, the first-tier memory openings 149M and the first-tier backside openings 149B may collectively form a periodic two-dimensional array of openings 149. Alternatively, each cluster of first-tier memory openings 149M between neighboring rows of first-tier backside openings 149B may be arranged as a respective two-dimensional array of openings, and the rows of the first-tier backside openings 149B may be off-pitch with respect to a neighboring two-dimensional periodic array of first-tier memory openings 149M. In one embodiment, the pitch of the first-tier backside openings 149B along the first horizontal direction hd1 may be the same as the pitch of memory openings 149M along the first horizontal direction hd1 within each row of memory openings 149M in the two-dimensional arrays of memory openings 149M. The first-tier support openings 129 may be formed in the staircase region 200 between each neighboring pairs of rows of first-tier backside openings 149B.

The first-tier memory openings 149M may be formed in the memory array region 100 at locations at which memory stack structures including vertical stacks of memory elements are to be subsequently formed. The first-tier backside openings 149B may be formed in the memory array region 100 and in the staircase region 200 at locations at which an etchant for removing the sacrificial material layers is to be subsequently introduced and materials for forming electrically conductive layers are to be subsequently introduced. The first-tier support openings 129 may be formed in the staircase-region contact via region 200 at which support structures will be provided during subsequent replacement of sacrificial material layers with electrically conductive layers.

For example, a lithographic material stack (not shown) including at least a photoresist layer may be formed over the inter-tier dielectric layer 180, and may be lithographically patterned to form openings within the lithographic material stack. The pattern in the lithographic material stack may be transferred through the inter-tier dielectric layer 180, and through the entirety of the first-tier alternating stack (132, 142) by at least one anisotropic etch that uses the patterned lithographic material stack as an etch mask. Portions of the optional inter-tier dielectric layer 180, the first insulating cap layer 170, and the first-tier alternating stack (132, 142) underlying the openings in the patterned lithographic material stack are etched to form the first-tier device openings 149 and the first-tier support openings 129. In other words, the transfer of the pattern in the patterned lithographic material stack through the optional inter-tier dielectric layer 180, the first insulating cap layer 170, and the first-tier alternating stack (132, 142) forms the first-tier device openings 149 and the first-tier support openings 129.

In one embodiment, the chemistry of the anisotropic etch process used to etch through the materials of the first-tier alternating stack (132, 142) may alternate to optimize etching of the first and second materials in the first-tier alternating stack (132, 142). The anisotropic etch may be, for example, a series of reactive ion etches or a single etch (e.g., $CF_4/O_2/Ar$ etch). The sidewalls of the first-tier device openings 149 and the first-tier support openings 129 may be substantially vertical, or may be tapered. Subsequently, the patterned lithographic material stack may be subsequently removed, for example, by ashing.

After etching through the alternating stack (132, 142), the chemistry of a terminal portion of the anisotropic etch process may be selected to etch through the optional source select level conductive layer 118, the source-level insulating layer 117, the upper source-level material layer 116, the upper sacrificial liner 105, the source-level sacrificial layer 104, and the lower sacrificial liner 103, and at least partly into the lower source-level material layer 112 with a lower etch rate for the material of the dielectric etch stop material portions 108. The terminal portion of the anisotropic etch process may include at least one etch chemistry for etching the various semiconductor materials of the in-process source-level material layers 10'. The upper sacrificial liner 105 and the lower sacrificial liner 103 may be used as intermediate etch stop layers. In one embodiment, the depth of each first-tier backside opening 149B into a respective dielectric etch stop material portion 108 may be in a range from 10% to 90%, such as from 20% to 80%, of the thickness of the respective dielectric etch stop material portion 108. In case the chemistry of the terminal portion of the anisotropic etch process is selective for etching the in-process source-level material layers 10' compared to the material of the dielectric etch stop material portions 108, another etch step may be added to partially etch the dielectric etch stop material portions 108.

Figure 5A:
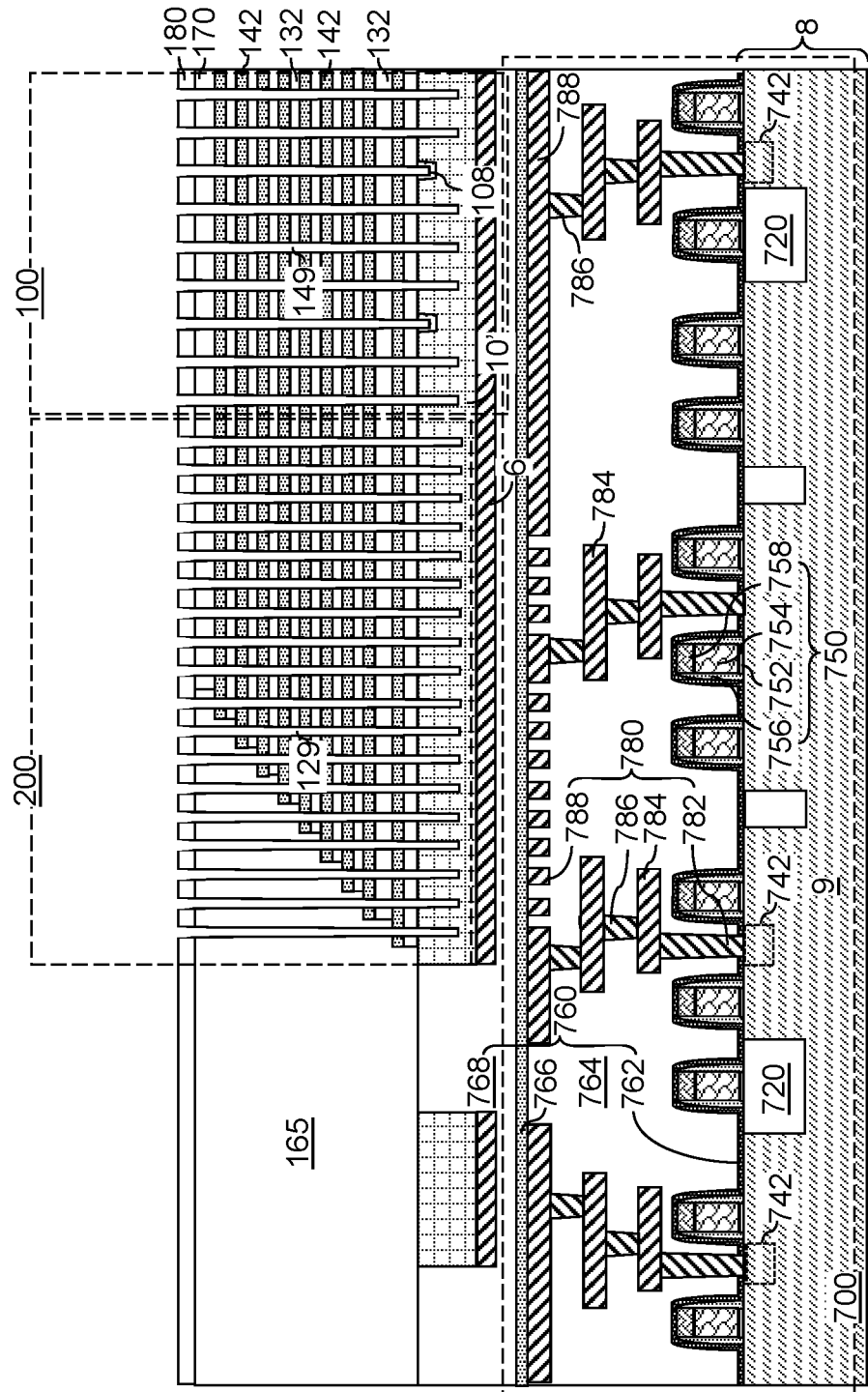
FIG. 5A is a vertical cross-sectional view of the exemplary structure after formation of first-tier memory openings, first-tier backside openings, and first-tier support openings according to an embodiment of the present disclosure.
Figure 5B:
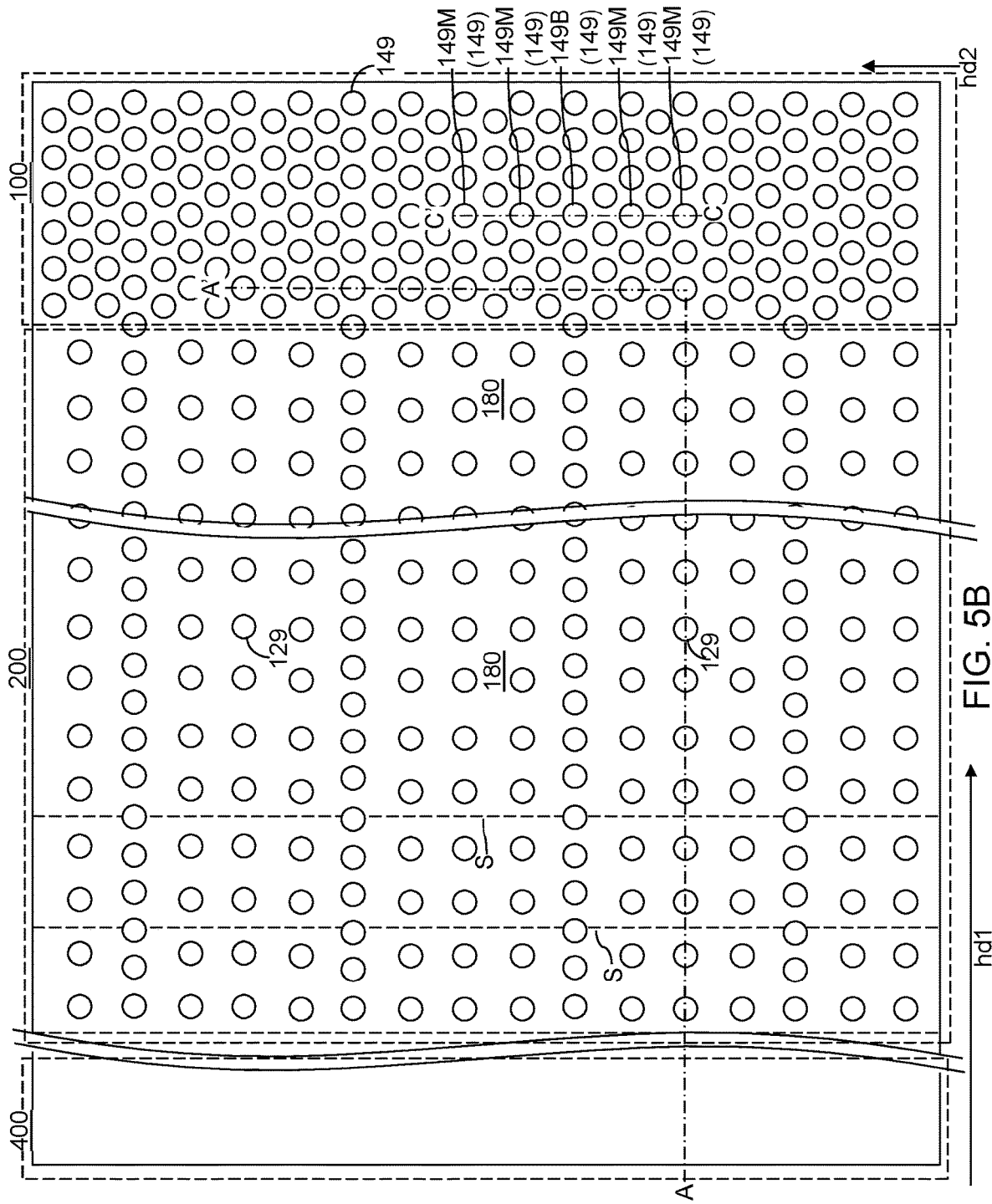
FIG. 5B is a top-down view of the exemplary structure of FIG. 5A. The hinged vertical plane A-A' corresponds to the plane of the vertical cross-sectional view of FIG. 5A.
Figure 5C:
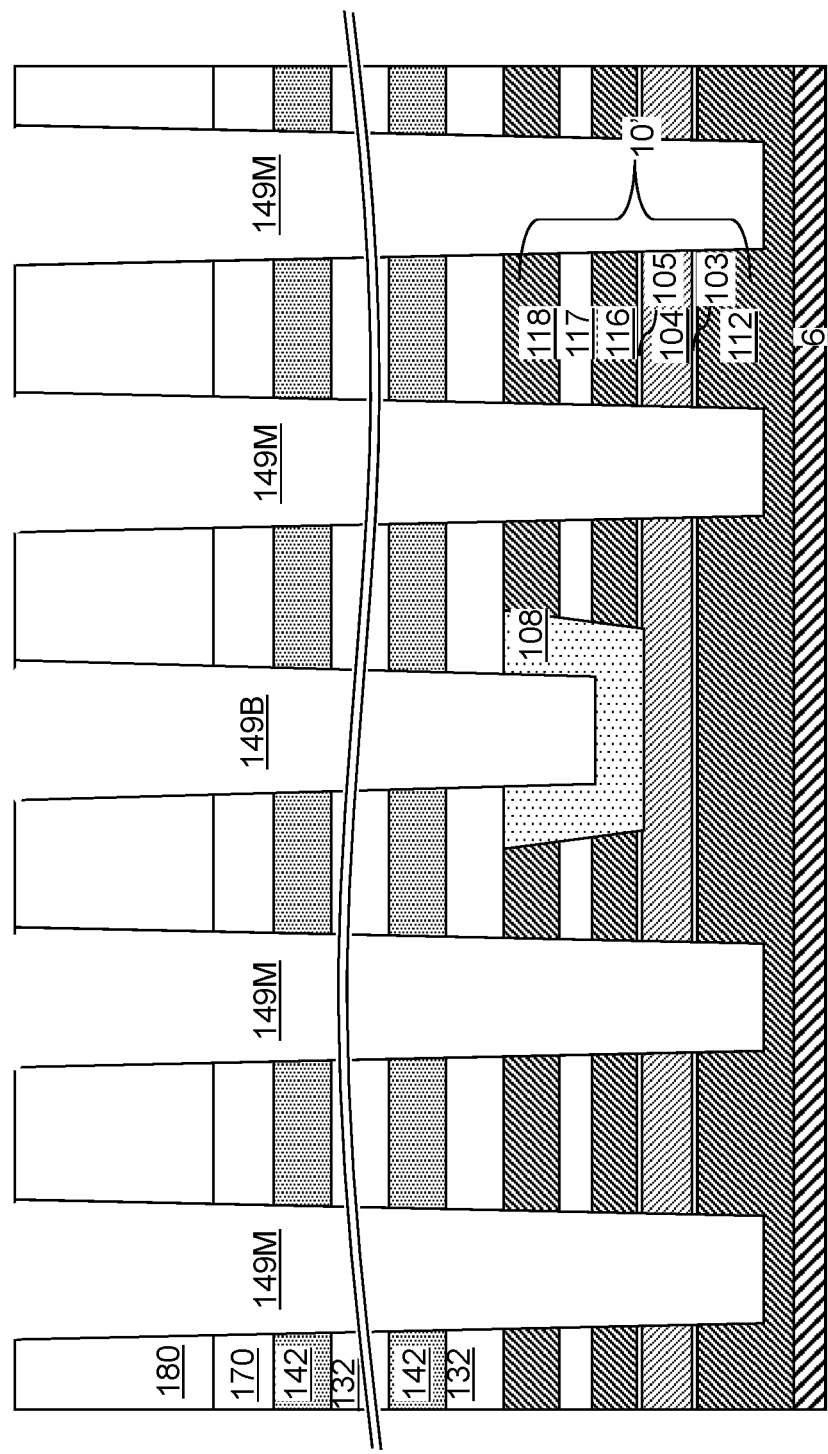
FIG. 5C is a magnified view of the in-process source level material layers along the vertical plane C-C' of FIG. 5B.
Figure 5D:
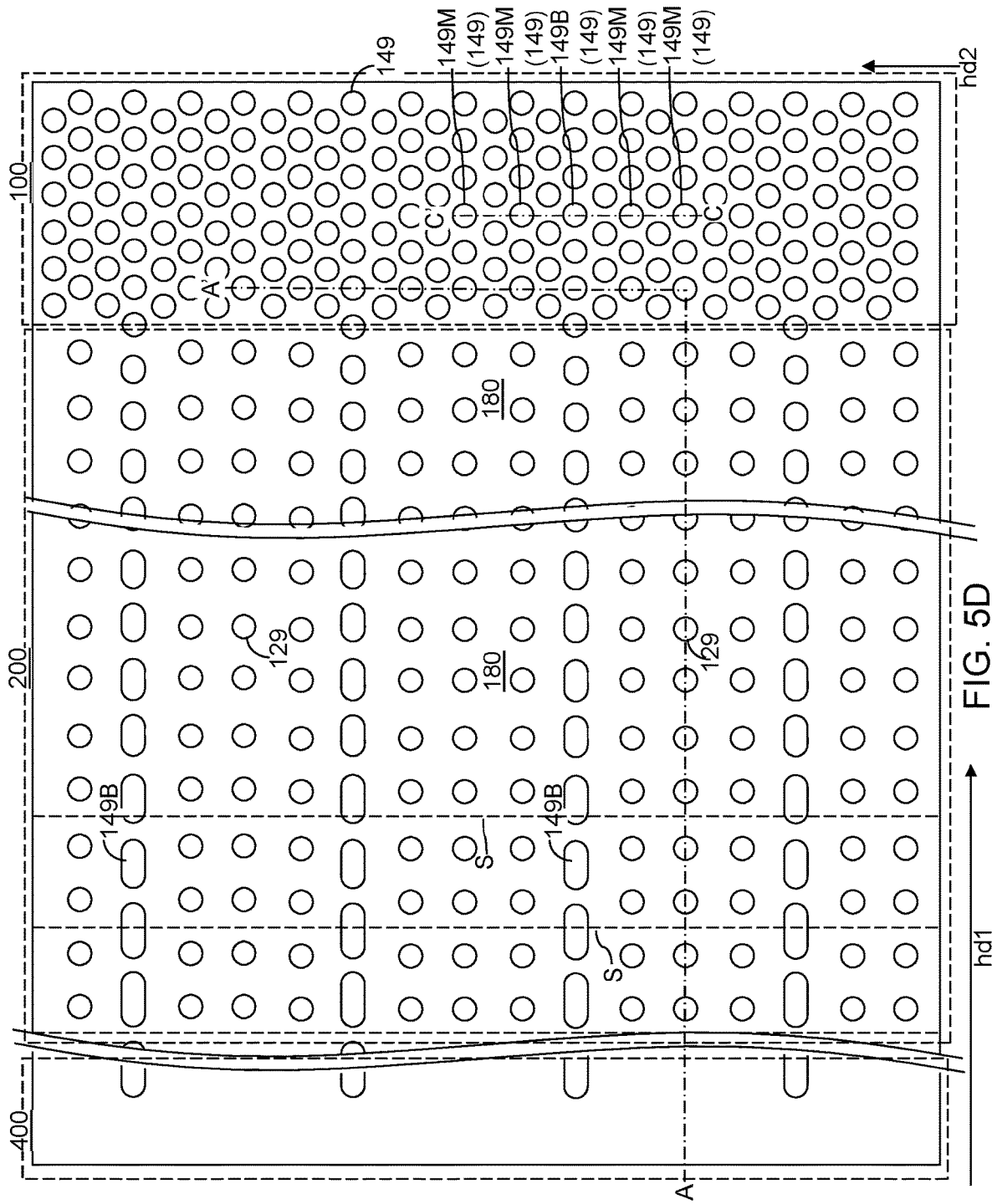
FIG. 5D is a top-down view of the first alternative embodiment of the exemplary structure of FIG. 5A. The hinged vertical plane A-A' corresponds to the plane of the vertical cross-sectional view of FIG. 5A. The vertical plane C-C' corresponds the plane of the vertical cross-sectional view of FIG. 5C.

FIG. 5D illustrates another embodiment of the present disclosure. Horizontal cross-sectional shapes of the first-tier backside openings 149B may be modified to match the shapes of the underlying dielectric etch stop material portions 108 such that the bottom periphery of each first-tier backside opening 149B is laterally offset inward from the periphery of the top surface of an underlying dielectric etch stop material portion 108 by an offset distance. Thus, the first-tier backside openings 149B may be arranged in rows that laterally extend along the first horizontal direction hd1, and the first-tier backside openings 149B may have a variable lateral extent that changes along the first horizontal direction hd1. Specifically, the variable lateral extent may be the maximum lateral dimension of respective first-tier backside openings 149B along the first horizontal direction hd1.

In one embodiment, the first-tier backside openings 149B may be modified in the staircase region 200 such that the lateral dimensions of the first-tier backside openings along the first horizontal direction hd1 gradually increases with a lateral distance from the memory array region 100. The first-tier backside openings 149B may be elongated more along the first horizontal direction hd1 with an increase in the lateral distance from the memory array region 100. In one embodiment, the first-tier backside openings 149B in the memory array region 100 may have substantially circular horizontal cross-sectional shapes, and the first-tier backside openings 149B in the staircase regions may have elongated horizontal cross-sectional shapes having a greater maximum lateral dimension along the first horizontal direction hd1 than a maximum lateral dimension along the second horizontal direction hd2. The ratio of the maximum lateral dimension along the first horizontal direction hd1 to the maximum lateral dimension along the second horizontal direction hd2 may monotonically increase with the lateral distance of the first-tier backside opening 149B from the memory array region 100.

In one embodiment, the first-tier backside openings 149B may be arranged in rows that extend along the first horizontal direction hd1 and may be laterally spaced apart along the second horizontal direction hd2. First-tier backside openings 149B located within a same row may be laterally spaced apart by a same spacing. The length-to-width ratio, i.e., the ratio of the maximum dimension along the first horizontal direction hd1 to the maximum dimension along the second horizontal dimension hd2, for the first-tier backside openings 149B may be 1.0 in the memory array region 100, and may monotonically, and/or strictly, increase with a lateral distance from the memory array region 100 along the first horizontal direction hd1 within the area of the staircase region 200. The maximum value for the length-to-width ratio of the first-tier backside openings 149B may be in a range from 2.0 to 20, such as from 4.0 to 10, although lesser and greater maximum values may also be used. In one embodiment, each of the first-tier backside openings 149B may have the same maximum lateral dimension along the second horizontal direction hd2. In this case, the length-to-width ratios of the first-tier backside openings 149B may be greater than 1.0 in the staircase region 200 by having a respective maximum lateral dimension along the first horizontal direction hd1 that is greater than the maximum lateral dimension along the second horizontal direction hd2. Generally, the backside openings 149B may be formed directly on a respective one of the dielectric etch stop material portions 108.

Figure 6A:
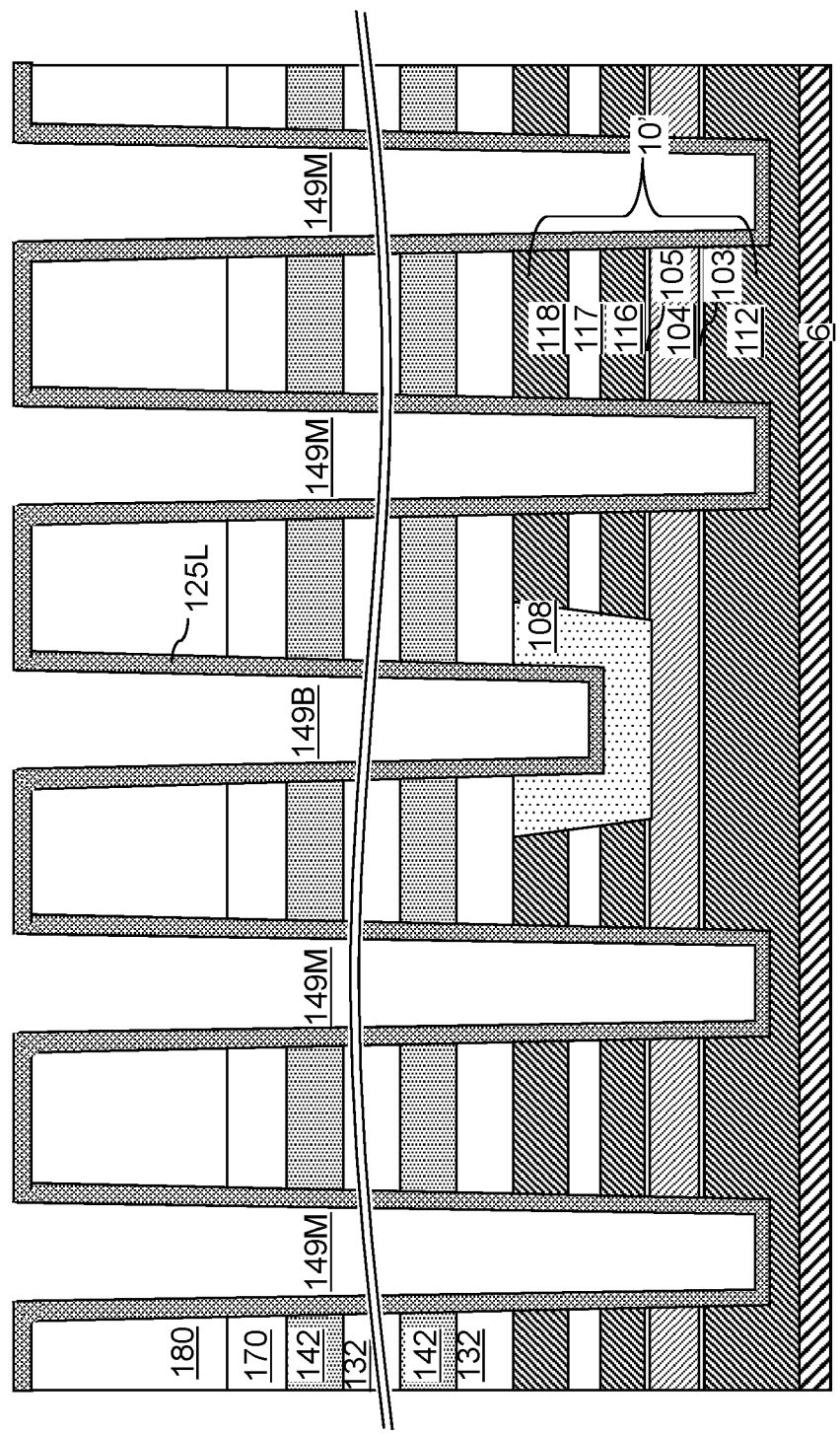
FIGS. 6A-6F illustrate sequential vertical cross-sectional views of first-tier memory openings and a first-tier backside opening during formation of sacrificial fill structures according to an embodiment of the present disclosure.
Figure 6B:
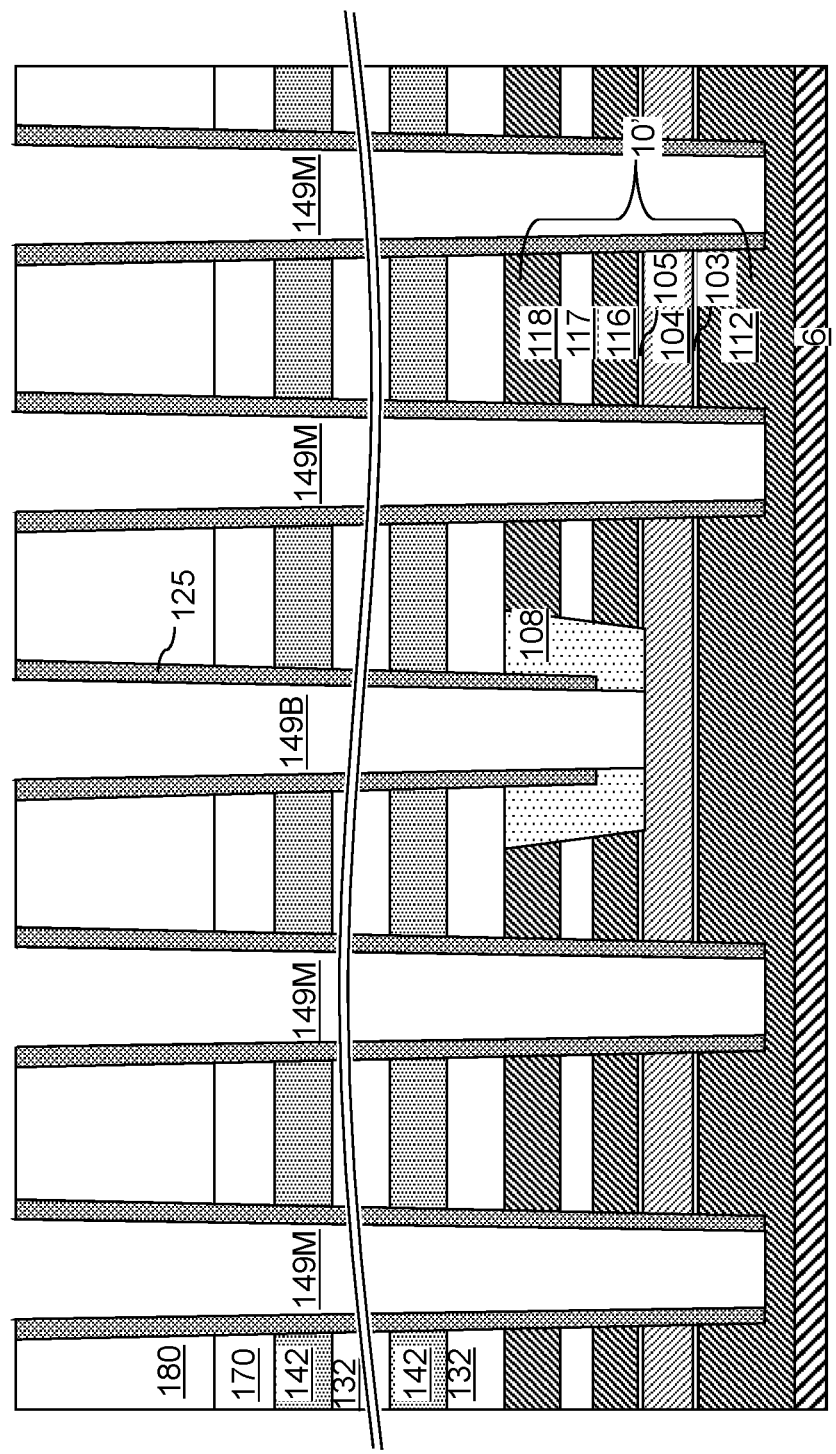
Figure 6C:
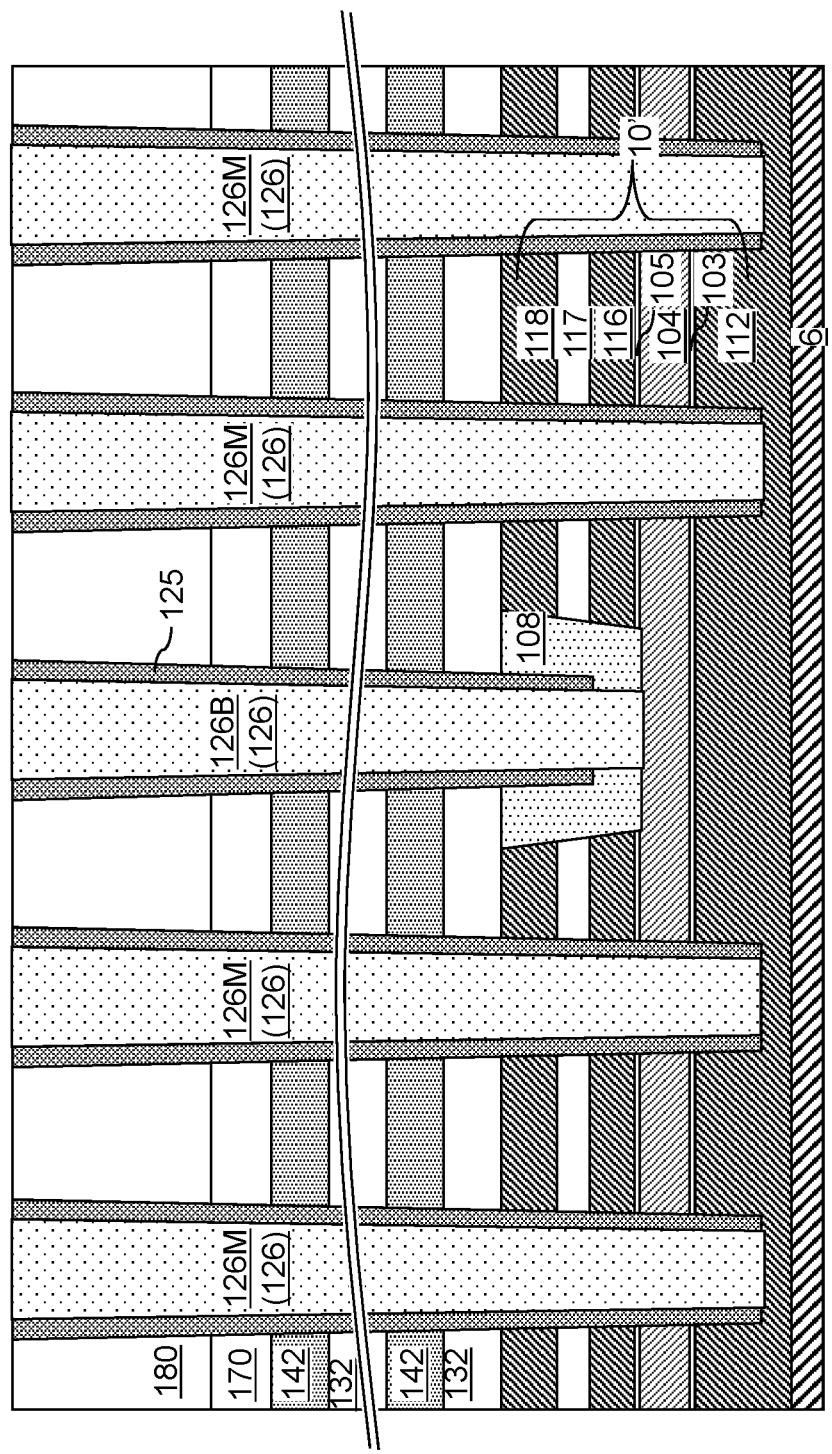
Figure 6D:
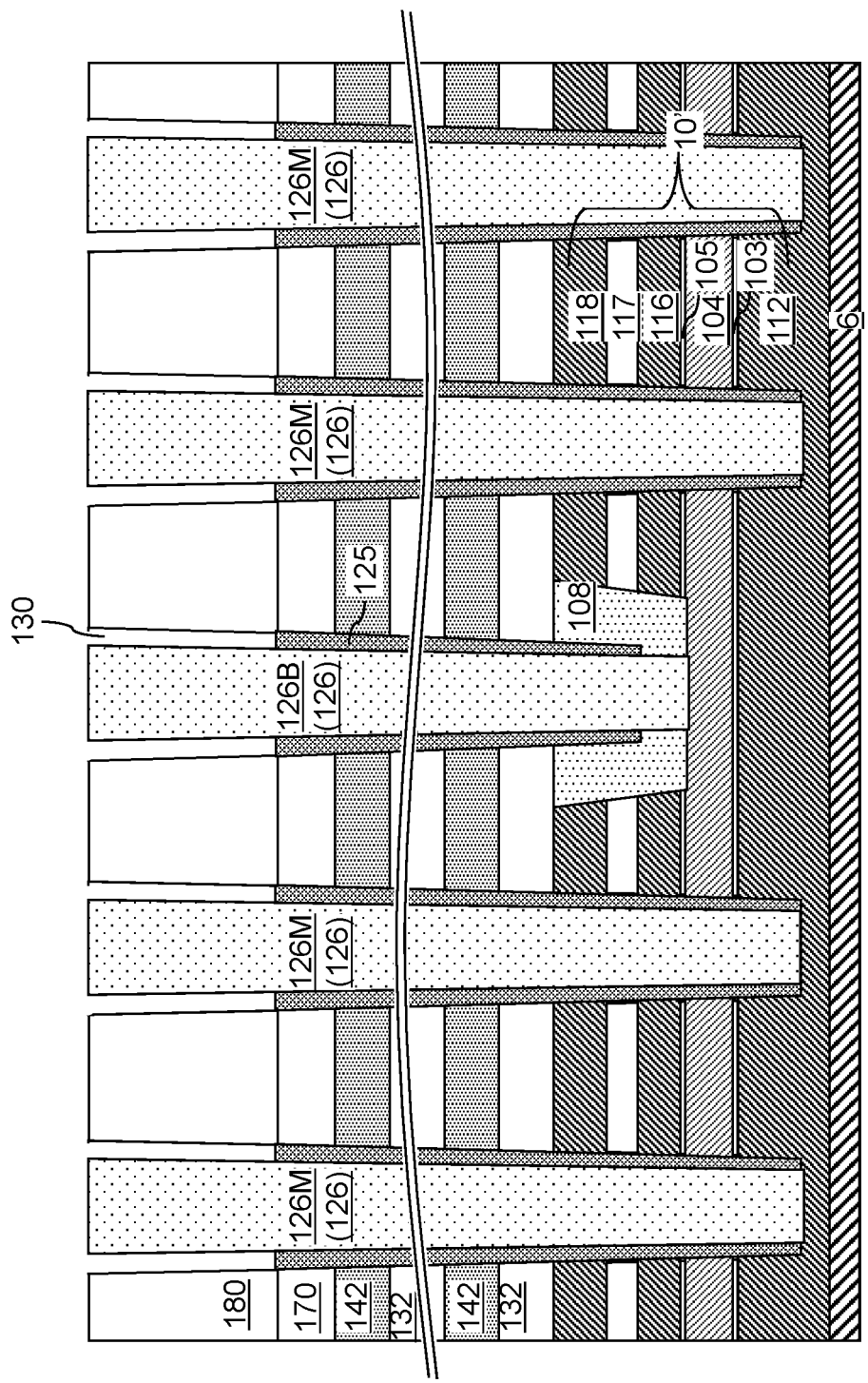
Figure 6E:
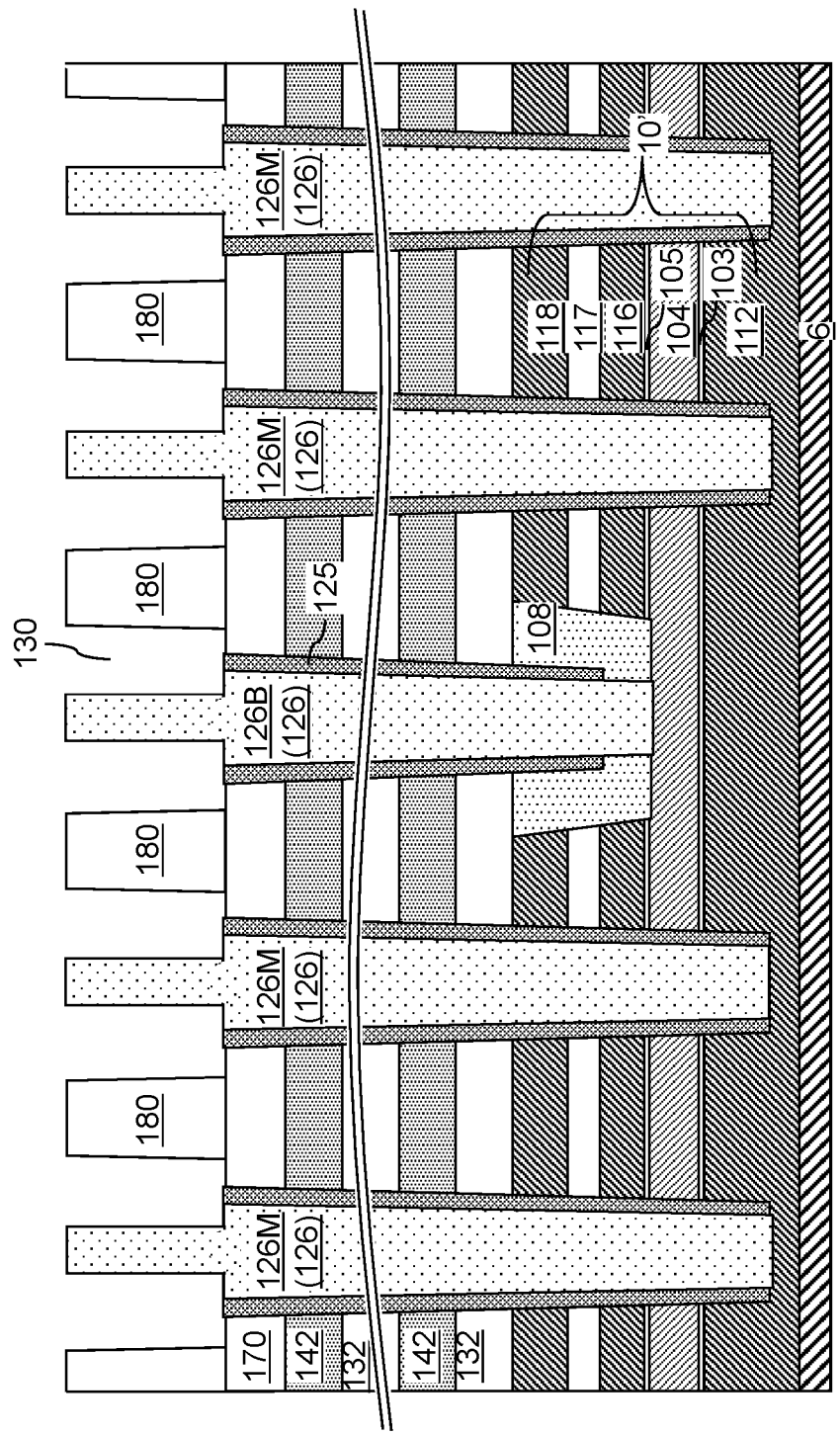
Figure 6F:
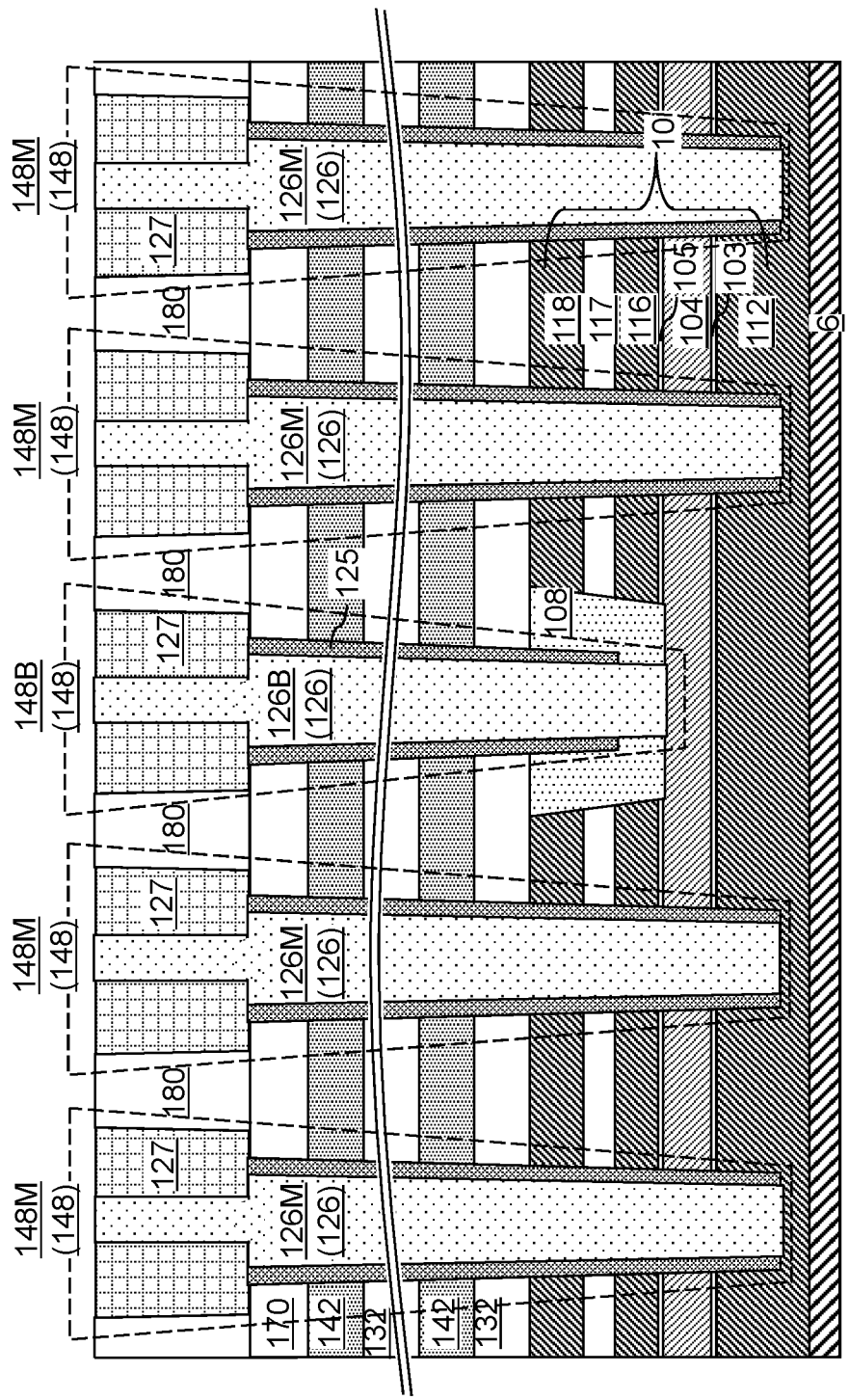
Figure 7:
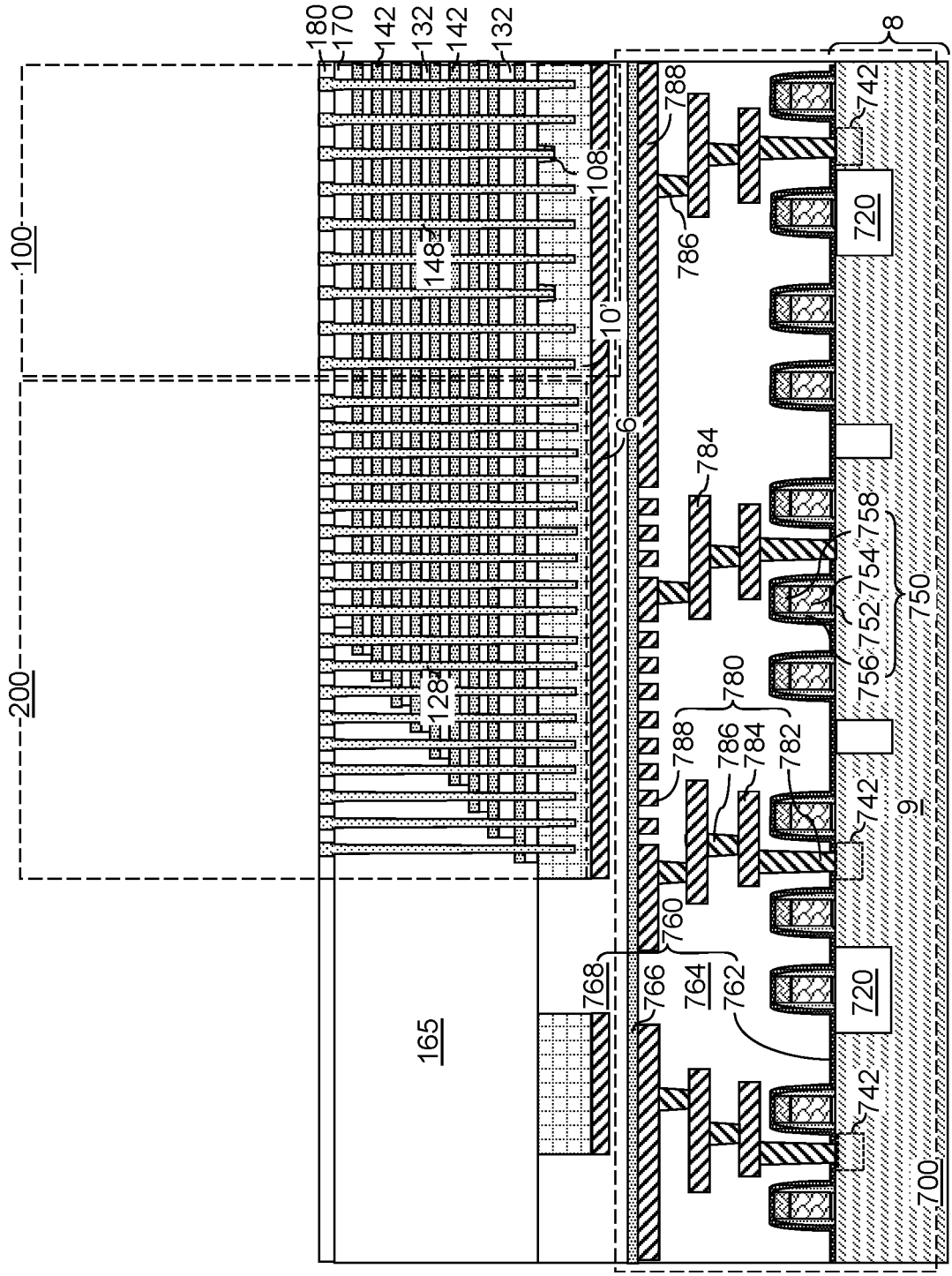
FIG. 7 is a vertical cross-sectional view of the exemplary structure after formation of various sacrificial fill structures according to an embodiment of the present disclosure.

FIGS. 6A-6F illustrate sequential vertical cross-sectional views of first-tier memory openings 149M and a first-tier backside opening 149B during formation of sacrificial fill structures (148, 128) which are shown in FIG. 7.

Referring to FIG. 6A, a first sacrificial liner layer 125L may be formed by a conformal deposition process such as a chemical vapor deposition (CVD) process or an atomic layer deposition (ALD) process. The first sacrificial liner layer 125L includes a first sacrificial material that may be removed selective to the first insulating layers 132, the first insulating cap layer 170, and the inter-tier dielectric layer 180. For example, the first sacrificial liner layer 125L may comprise a silicon nitride layer. The thickness of the first sacrificial liner layer 125L may be in a range from 3 nm to 10 nm, although lesser and greater thicknesses may also be used.

Referring to FIG. 6B, an anisotropic etch process may be performed to remove horizontal portions of the first sacrificial liner layer 125L from above the inter-tier dielectric layer 180, at the bottom of each first-tier device opening 149, and at the bottom of each first-tier support opening 129. Each remaining portion of the first sacrificial liner layer 125L may constitute a first sacrificial liner 125 having a generally cylindrical shape. The anisotropic etch process may be continued with a change in the etch chemistry to remove physically exposed portions of the dielectric etch stop material portions 108. For example, the silicon nitride fill 108B may be etched together with the first sacrificial liner layer 125L, and then the etch chemistry is changed to etch the metal oxide liner 108A. Center regions of the dielectric etch stop material portions 108 may be etched through, and a top surface of the source-level sacrificial layer 104 may be physically exposed at the bottom of each opening through the dielectric etch stop material portions 108. Each dielectric etch stop material portion 108 may be topologically homeomorphic to a torus after the anisotropic etch process. The dielectric etch stop material portions 108 are also referred to as annular dielectric material portions. As used herein, an "annular" element refers to an element having an inner periphery and an outer periphery that is located outside of, and not in contact with, the inner periphery.

Referring to FIG. 6C, a first-tier sacrificial fill material may be deposited in remaining volumes of the first-tier memory openings 149M, the first-tier backside openings 149B, and the first-tier support openings 129. The first-tier sacrificial fill material may include, for example, a silicon oxide-based material such as undoped silicon oxide, borosilicate glass, phosphosilicate glass, or organosilicate glass. Excess portion of the first-tier sacrificial fill material may be removed from above the horizontal plane including the top surface of the inter-tier dielectric layer 180. Each remaining portion of the first-tier sacrificial fill material filling a first-tier memory opening 149, the first-tier backside openings 149B or a first-tier support opening 129 constitutes a first-tier sacrificial fill material portion 126. The first-tier sacrificial fill material portions 126 may include first-tier memory opening fill portions 126M filling first-tier memory openings 149M, first-tier backside opening fill portions 126B filling first-tier backside openings 149B, and first-tier support opening fill portions filling first-tier support openings 129.

Referring to FIG. 6D, an isotropic etch process that etches the material of the first sacrificial liners 125 selective to the materials of the inter-tier dielectric layer 180 and the first-tier sacrificial fill material portion 126. For example, if the first sacrificial liners 125 include silicon nitride, a wet etch process using hot phosphoric acid may be used to vertically recess the first sacrificial liners 125 to form annular cavities 130. The duration of the isotropic etch process may be selected such that a recessed annular top surface of each first sacrificial liner 125 is located above, and near, the horizontal plane including the bottom surface of the inter-tier dielectric layer 180.

Referring to FIG. 6E, an isotropic etch process that removes the dielectric materials of the inter-tier dielectric layer 180 and the first-tier sacrificial fill material portions 126 selective to the material of the first sacrificial liners 125 may be performed. Each annular cavity 130 laterally surrounding a respective one of the first-tier sacrificial fill material portions 126 may be laterally expanded as the materials of the inter-tier dielectric layer 180 and the first-tier sacrificial fill material portions 126 are isotropically etched. For example, a wet etch process using dilute hydrofluoric acid may be used to laterally expand the annular cavities. Each first-tier sacrificial fill material portion 126 may include a vertically protruding portion that extends above the horizontal plane including the top surface of the first insulating cap layer 170 after the isotropic etch process.

Referring to FIG. 6F, an inter-tier sacrificial fill material may be deposited in the annular cavities 130 by a conformal deposition process or a self-planarizing deposition process. The inter-tier sacrificial fill material may be the same as, or may be different from, the first-tier sacrificial fill material of the first-tier sacrificial fill material portions 126. For example, a sacrificial semiconductor material such as amorphous silicon, polysilicon, or a silicon-germanium alloy may be deposited in the annular cavities. Excess portions of the inter-tier sacrificial fill material may be removed from above the horizontal plane including the top surface of the inter-tier dielectric layer 180 by a planarization process, which may include a chemical mechanical planarization (CMP) process and/or an etch back process. Each remaining annular portion of the inter-tier sacrificial fill material filling the annular cavities may constitute an annular sacrificial material portion 127.

The combination of all elements filling a first-tier memory opening 149M is herein referred to as a first-tier sacrificial memory opening fill structure 148M. The combination of all elements filling a first-tier backside opening 149B is herein referred to as a first-tier sacrificial backside opening fill structure 148B. The combination of all elements filling a first-tier support opening 129 is herein referred to as a first-tier sacrificial support opening fill structure. The first-tier sacrificial memory opening fill structures 148M and the first-tier sacrificial backside opening fill structures 148B are collectively referred to as first-tier sacrificial device opening fill structures 148.

Referring to FIG. 7, the exemplary structure is illustrated at the processing steps of FIG. 6F. Each first-tier device opening 149 may be filled with a respective sacrificial device opening fill structure 148, and each first-tier support opening 129 is filled with a respective sacrificial support opening fill structure 128.

Figure 8:
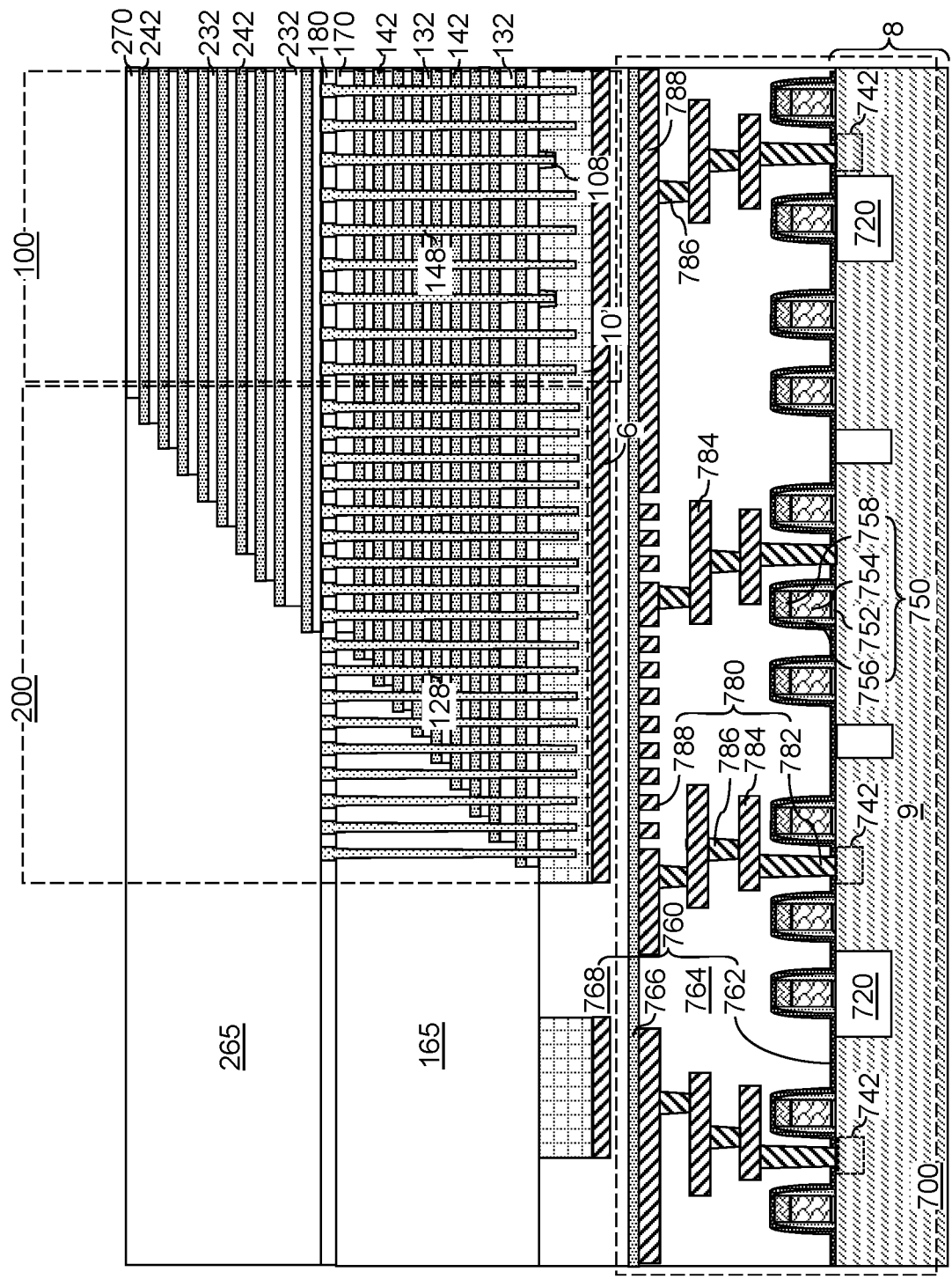
FIG. 8 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.
Figure 9A:
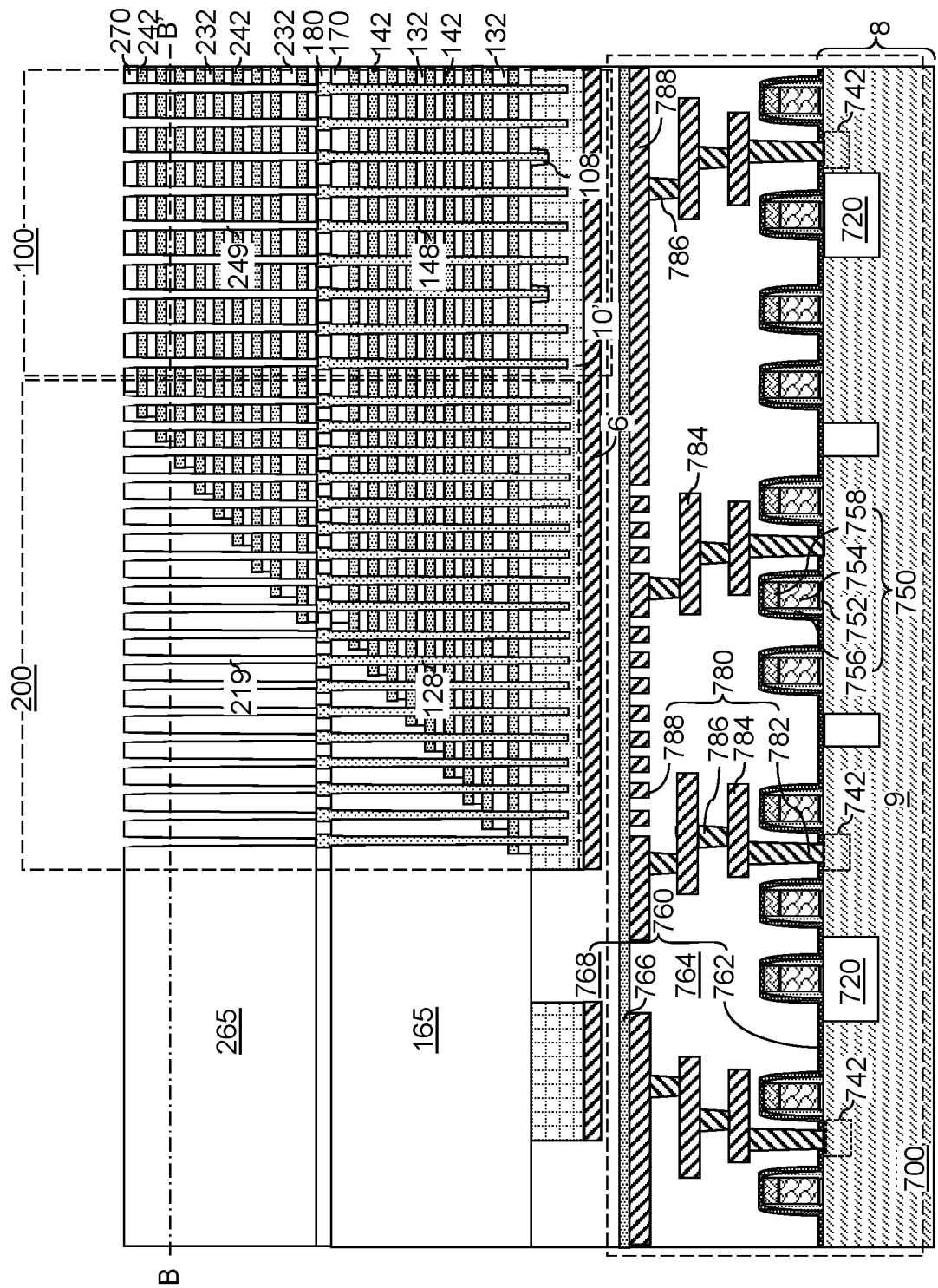
FIG. 9A is a vertical cross-sectional view of the exemplary structure after formation of second-tier memory openings, second-tier backside openings, and second-tier support openings according to an embodiment of the present disclosure.
Figure 9B:
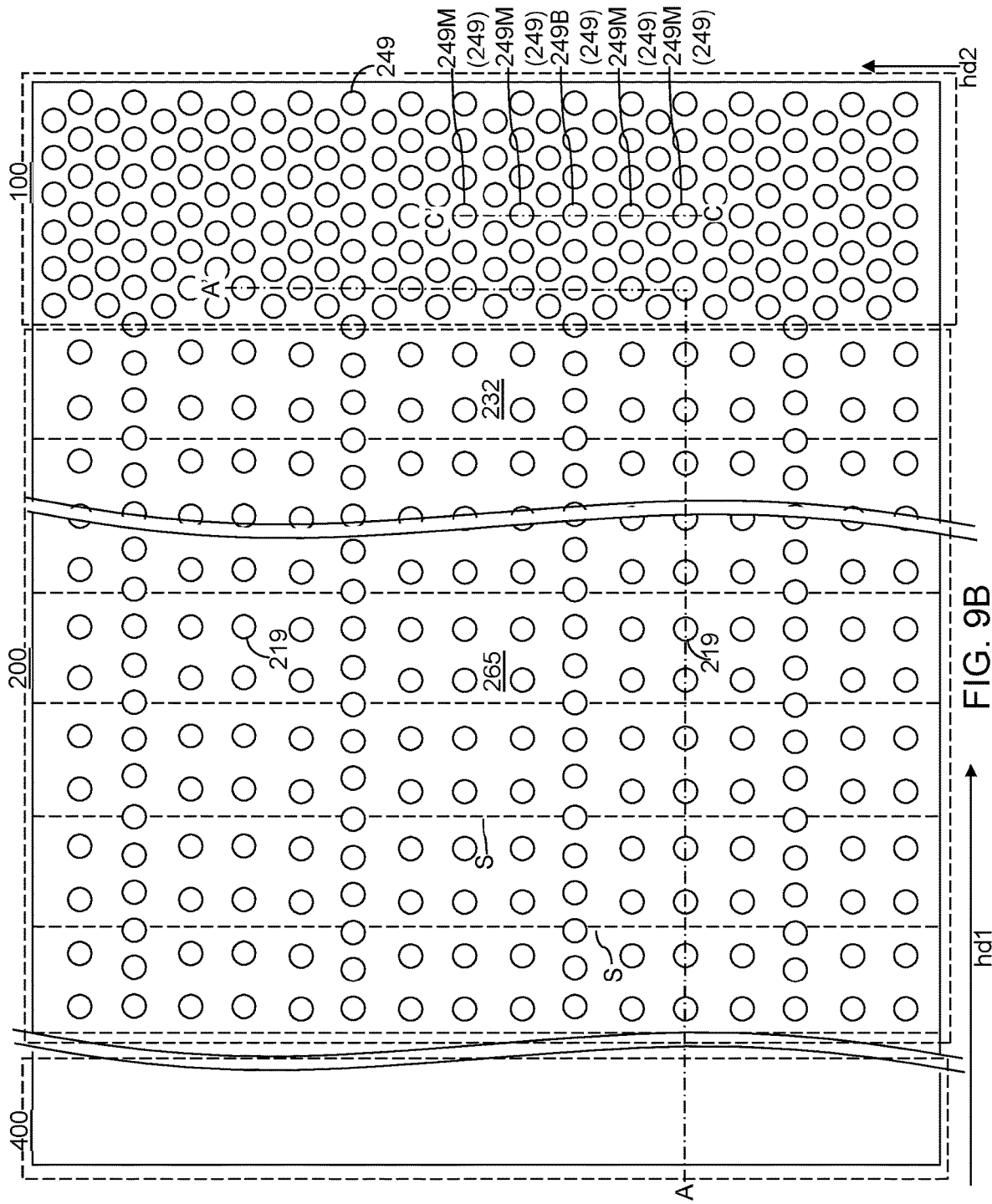
FIG. 9B is a horizontal cross-sectional of the exemplary structure along the horizontal plane B-B' of FIG. 9A. The hinged vertical plane A-A' corresponds to the plane of the vertical cross-sectional view of FIG. 9A.
Figure 9C:
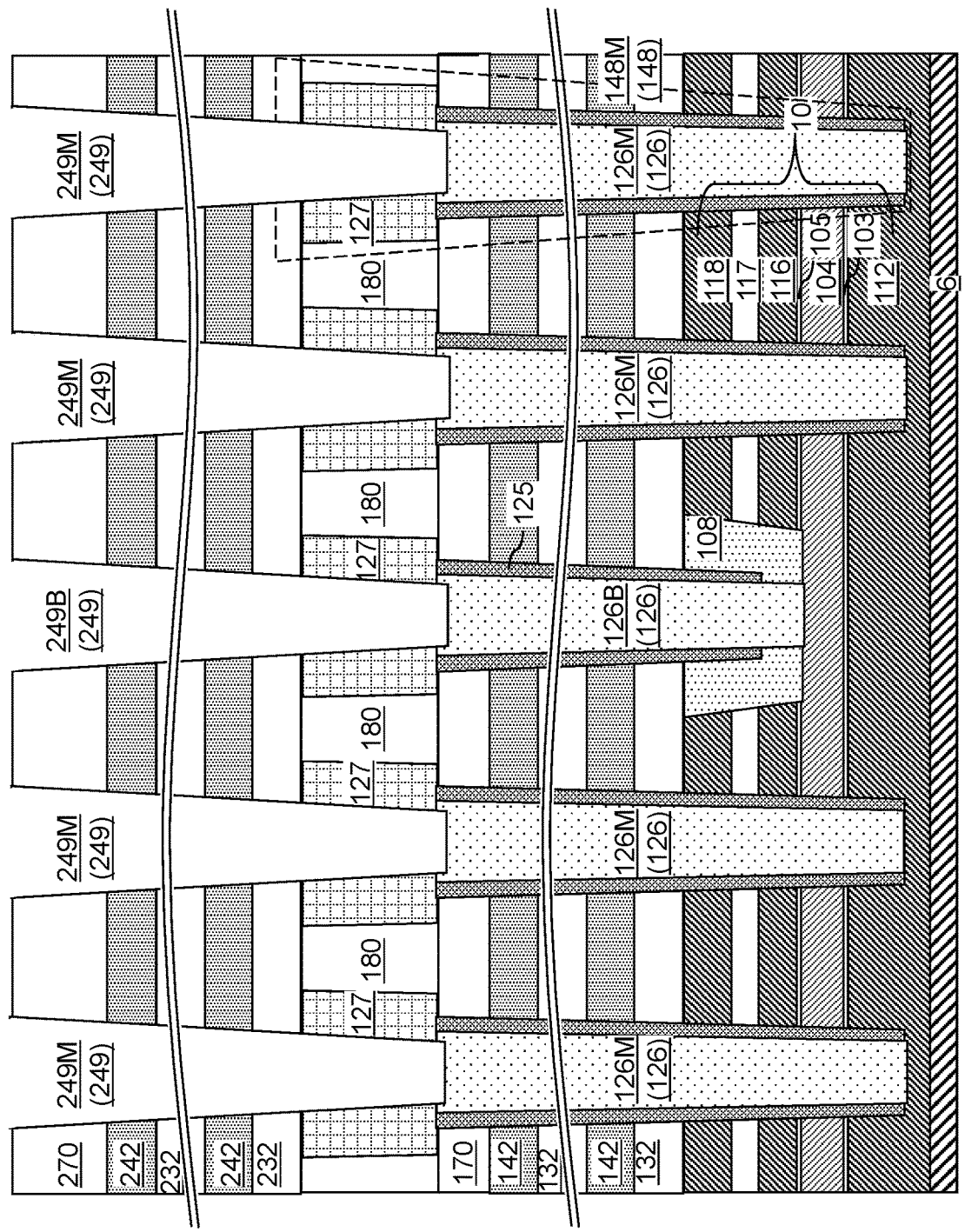
FIG. 9C is a vertical cross-sectional view of the exemplary structure along the vertical plane C-C' of FIG. 9B.

Referring to FIG. 8, a second-tier structure may be formed over the first-tier structure (132, 142, 170, 165, 148, 128) and the inter-tier dielectric layer 180. The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second stack (232, 242) may have a uniform thickness that is substantially invariant within each respective second sacrificial material layer 242.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Second stepped surfaces in the second stepped area may be formed in the staircase region 200 using a same set of processing steps as the processing steps used to form the first stepped surfaces in the first stepped area with suitable adjustment to the pattern of at least one masking layer. The second stepped surfaces may be laterally offset from the first stepped surfaces to avoid an overlap in a see-through top-down view. The cavity overlying the second stepped surfaces is herein referred to as a second stepped cavity.

A dielectric fill material (such as undoped silicate glass or doped silicate glass) may be deposited to fill the second stepped cavity. Excess portions of the dielectric fill material may be removed from above the horizontal plane including the top surface of the second insulating cap layer 270. A remaining portion of the dielectric fill material that fills the region overlying the second stepped surfaces constitutes a second retro-stepped dielectric material portion 265. The second-tier alternating stack (232, 242) and the second retro-stepped dielectric material portion 265 collectively constitute a second-tier structure, which is an in-process structure that is subsequently modified. Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed in the staircase regions on the at least one alternating stack (132, 142, 232, 242).

Referring to FIGS. 9A-9D, second-tier device openings 249 and second tier support openings 219 may be formed through the second-tier structure (232, 242, 270, 265). The second-tier device openings 249 may be formed in areas overlying the sacrificial device opening fill structures 148, and second-tier support openings 219 may be formed in areas overlying the sacrificial support opening fill structures 128. A photoresist layer may be applied over the second-tier structure (232, 242, 270, 265), and may be lithographically patterned to form a same pattern as the pattern of the sacrificial device opening fill structures 148 and the sacrificial support opening fill portions 128, i.e., the pattern of the first-tier device openings 149 and the first-tier support openings 129. Thus, the lithographic mask used to pattern the first-tier device openings 149 and the first-tier support openings 129 may be used to pattern the second-tier device openings 249 and the second-tier support openings 219. An anisotropic etch may be performed to transfer the pattern of the lithographically patterned photoresist layer through the second-tier structure (232, 242, 270, 265). In one embodiment, the chemistry of the anisotropic etch process used to etch through the materials of the second-tier alternating stack (232, 242) may alternate to optimize etching of the alternating material layers in the second-tier alternating stack (232, 242). The anisotropic etch may be, for example, a series of reactive ion etches. The patterned lithographic material stack may be removed, for example, by ashing after the anisotropic etch process.

A top surface of an underlying sacrificial device opening fill structure 148 may be physically exposed at the bottom of each second-tier device opening 249. A top surface of an underlying sacrificial support opening fill portion 128 may be physically exposed at the bottom of each second-tier support opening 219. The top surfaces of the sacrificial device opening fill structures 148 and the sacrificial support opening fill portions 128 are physically exposed. In one embodiment, the anisotropic etch process may remove protruding regions of each first-tier sacrificial fill material portion 126 at the level of the inter-tier dielectric layer 180. Inner sidewalls of the annular sacrificial material portions 127 may be physically exposed. The second-tier device openings 249 may include second-tier memory openings 249M formed over a respective one of the first-tier memory opening fill portions 126M and second-tier backside openings 249B formed over a respective one of the first-tier backside opening fill portions 126B.

FIG. 9D illustrates an alternative embodiment of the present disclosure. Horizontal cross-sectional shapes of the second-tier backside openings 249B may be modified to match the shapes of the underlying first-tier backside opening fill portions 126B such that the bottom periphery of each second-tier backside opening 249B may be laterally offset inward from the periphery of the top surface of an underlying first-tier backside opening fill portion 126B by an offset distance. Thus, the second-tier backside openings 249B may be arranged in rows that laterally extend along the first horizontal direction hd1, and the second-tier backside openings 249B may have a variable lateral extent that changes along the first horizontal direction hd1. Specifically, the variable lateral extent may be the maximum lateral dimension of respective second-tier backside openings 249B along the first horizontal direction hd1.

In one embodiment, the second-tier backside openings 249B may be modified in the staircase region 200 such that the lateral dimensions of the second-tier backside openings along the first horizontal direction hd1 gradually increases with a lateral distance from the memory array region 100. The second-tier backside openings 249B may be elongated more along the first horizontal direction hd1 with an increase in the lateral distance from the memory array region 100. In one embodiment, the second-tier backside openings 249B in the memory array region 100 may have substantially circular horizontal cross-sectional shapes, and the second-tier backside openings 249B in the staircase regions may have elongated horizontal cross-sectional shapes having a greater maximum lateral dimension along the first horizontal direction hd1 than a maximum lateral dimension along the second horizontal direction hd2. The ratio of the maximum lateral dimension along the first horizontal direction hd1 to the maximum lateral dimension along the second horizontal direction hd2 may monotonically increase with the lateral distance of the second-tier backside opening 249B from the memory array region 100.

In one embodiment, the second-tier backside openings 249B may be arranged in rows that extend along the first horizontal direction hd1 and are laterally spaced apart along the second horizontal direction hd2. Second-tier backside openings 249B located within a same row may be laterally spaced apart by a same spacing. The length-to-width ratio, i.e., the ratio of the maximum dimension along the first horizontal direction hd1 to the maximum dimension along the second horizontal dimension hd2, for the second-tier backside openings 249B may be 1.0 in the memory array region 100, and may monotonically, and/or strictly, increase with a lateral distance from the memory array region 100 along the first horizontal direction hd1 within the area of the staircase region 200. The maximum value for the length-to-width ratio of the second-tier backside openings 249B may be in a range from 2.0 to 20, such as from 4.0 to 20, although lesser and greater maximum values may also be used. In one embodiment, each of the second-tier backside openings 249B may have the same maximum lateral dimension along the second horizontal direction hd2. In this case, the length-to-width ratios of the second-tier backside openings 249B may be greater than 2.0 in the staircase region 200 by having a respective maximum lateral dimension along the first horizontal direction hd1 that is greater than the maximum lateral dimension along the second horizontal direction hd2. Generally, the backside openings 249B may be formed directly on a respective one of the first-tier backside opening fill portions 126B.

Figure 10A:
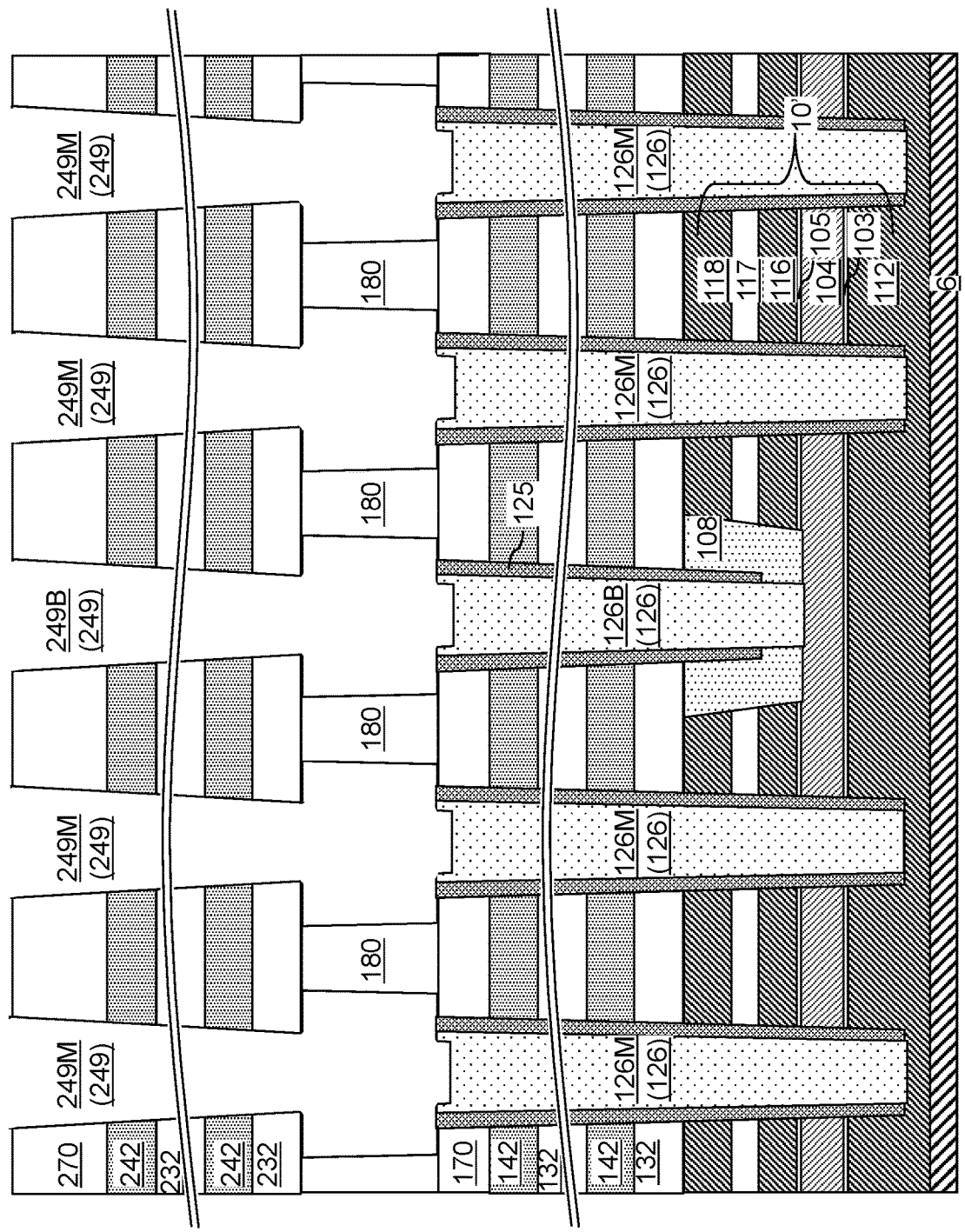
FIGS. 10A-10C illustrate sequential vertical cross-sectional views of memory openings and a backside opening during formation of sacrificial fill structures according to an embodiment of the present disclosure.

Referring to FIG. 10A, the annular sacrificial material portions 127 may be removed selective to the materials of the first-tier sacrificial fill material portions 126, the first sacrificial liners 125, the inter-tier dielectric layer 180, the second alternating stack (232, 242), and the second insulating cap layer 270. For example, if the annular sacrificial material portions 127 include a semiconductor material such as amorphous silicon, a wet etch using hot trimethyl-2 hydroxyethyl ammonium hydroxide ("hot TMY") or tetramethyl ammonium hydroxide (TMAH) may be used to remove the annular sacrificial material portions 127. Each of the second-tier device openings 249 and the second-tier support openings 219 may include a bulging cavity portion at the level of the inter-tier dielectric layer 180.

Figure 10B:
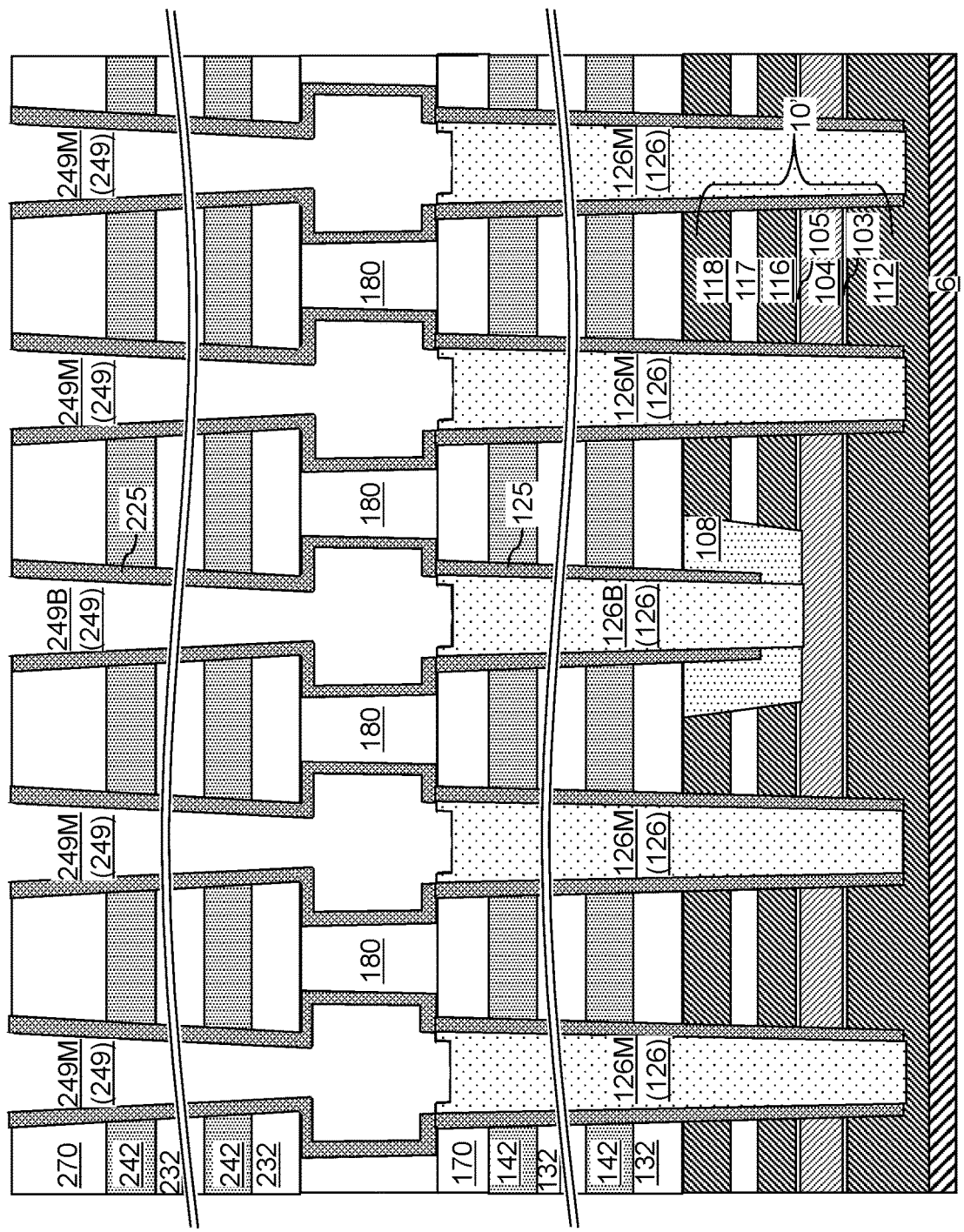

Referring to FIG. 10B, second sacrificial liners 225 may be formed by conformally depositing a sacrificial material that may be removed selective to the materials of the second insulating layers 232, the second insulating cap layer 270, and the inter-tier dielectric layer 180, and by anisotropically etching unmasked portions of the conformally deposited sacrificial material using an anisotropic etch process. The conformally deposited sacrificial material may be removed from above the top surface of the second insulating cap layer 270 and from the top surfaces of the first-tier sacrificial fill material portions 126. Each remaining patterned portion of the conformally deposited sacrificial material, such as silicon nitride, constitutes a second sacrificial liner 225. The thickness of the second sacrificial liners 225 may be in a range from 3 nm to 10 nm, although lesser and greater thicknesses may also be used.

Figure 10C:
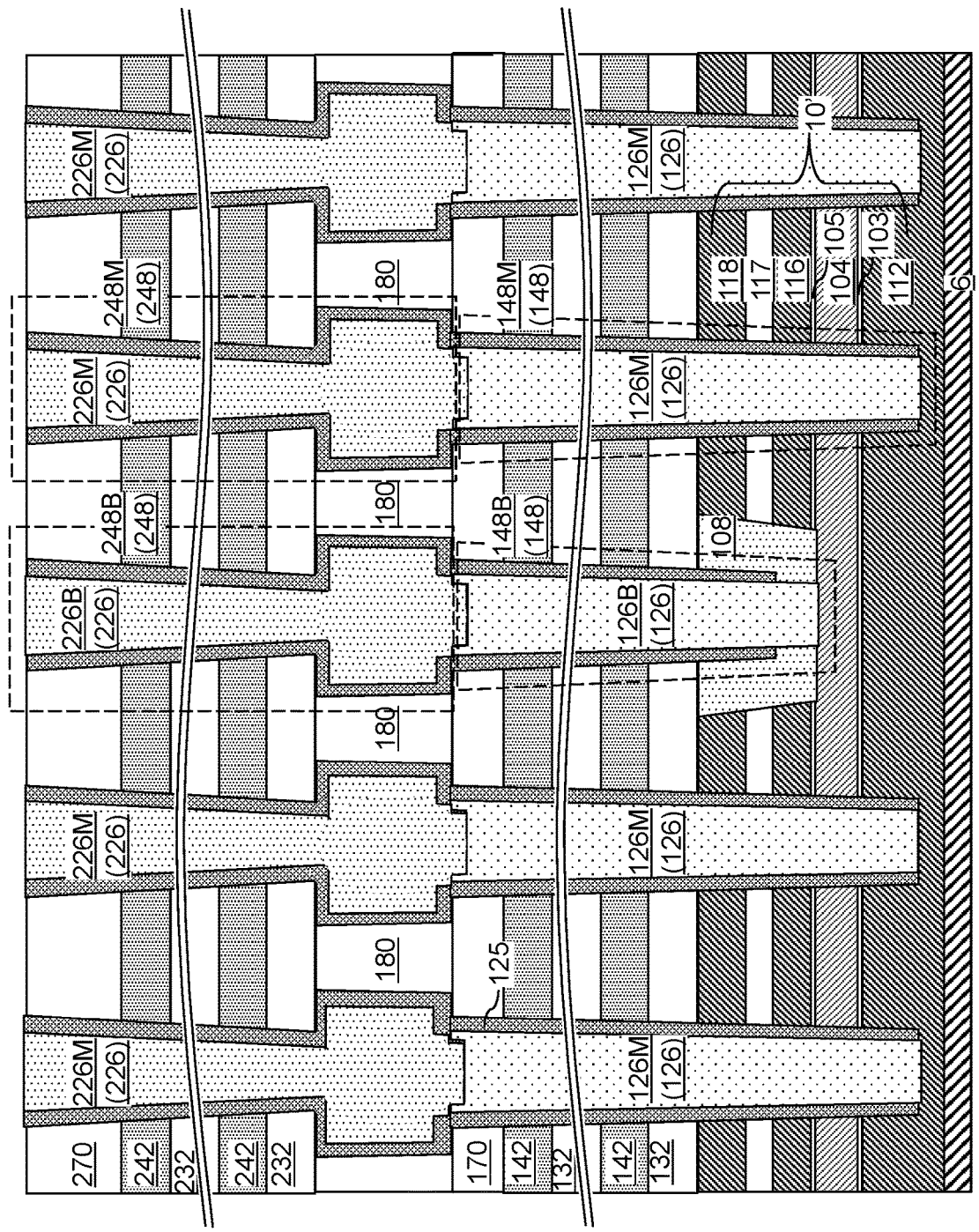

Referring to FIG. 10C, a second-tier sacrificial fill material may be deposited in the volumes of the second-tier device openings 249 and the second-tier support openings 219 by a conformal or a non-conformal deposition process. The second-tier sacrificial fill material may be the same as, or may be different from, the first-tier sacrificial fill material of the first-tier sacrificial fill material portions 126. Excess portions of the second-tier sacrificial fill material may be removed from above a horizontal plane including the top surface of the second insulating cap layer 270. Each remaining portion of the second-tier sacrificial fill material constitutes a second-tier sacrificial fill material portion 226. The second-tier sacrificial fill material portions 226 may include second-tier memory opening fill portions 226M filling second-tier memory openings 249M, second-tier backside opening fill portions 226B filling second-tier backside openings 249B, and second-tier support opening fill portions filling second-tier support openings 219.

The combination of all elements filling a second-tier memory opening 249M as provided at the processing steps of FIG. 10A is herein referred to as a second-tier sacrificial memory opening fill structure 248M. The combination of all elements filling a second-tier backside opening 249B as provided at the processing steps of FIG. 10A is herein referred to as a second-tier sacrificial backside opening fill structure 248B. The combination of all elements filling a second-tier support opening 219 is herein referred to as a second-tier sacrificial support opening fill structure. The second-tier sacrificial memory opening fill structures 248M and the second-tier sacrificial backside opening fill structures 248B are collective referred to as second-tier sacrificial device opening fill structures 248. Each vertical stack of a first-tier sacrificial memory opening fill structure 148M and a second-tier sacrificial memory opening fill structure 248M constitutes a sacrificial memory opening fill structure (148M, 248M). Each vertical stack of a first-tier sacrificial backside opening fill structure 148B and a second-tier sacrificial backside opening fill structure 248B constitutes a sacrificial backside opening fill structure (148B, 248B). Each combination of a first-tier memory opening 149M and a second-tier memory opening 249M is collectively referred to as a memory opening (149M, 249M). Each combination of a first-tier backside opening 149B and a second-tier backside opening 249B is collectively referred to as a backside opening (149B, 249B). Each combination of a first-tier support opening 129 and a second-tier support opening 219 is collectively referred to as a support opening (129, 219). The sacrificial memory opening fill structures (148M, 248M) in the memory openings (149M, 249M) and the sacrificial backside opening fill structures (148B, 248B) in the backside openings (149B, 249B) may be formed using a same set of processing steps.

Formation of the second-tier structure is optional, and may be omitted. Generally, memory openings (149M, 249M) and backside openings (149B, 249B) may be formed through at least one alternating stack {132, 142, and optionally (232, 242)}. The backside openings (149B, 249B) may be formed in rows that laterally extend along the first horizontal direction hd1. The memory openings (149M, 249M) may be formed as groups of memory openings located between neighboring pairs of rows of backside openings (149B, 249B). Each group of memory openings (149M, 249M) may be formed as rows of memory openings arranged along the first horizontal direction hd1, and may form a respective two-dimensional periodic array. In some embodiment, the backside openings (149B, 249B) may be formed at locations that are commensurate with the two-dimensional periodicity of a neighboring two-dimensional periodic array of memory openings (149M, 249M). In this case, the backside openings (149B, 249B) and the memory openings (149M, 249M) may be formed as a respective subset of openings within a two-dimensional periodic array of openings (149M, 249M, 149B, 249B) that extend through the at least one alternating stack {132, 142, and optionally (232, 242)}. A subset of the backside openings (149B, 249B) may be formed through the retro-stepped dielectric material portions (165, 265).

Referring to FIGS. 11A-11D, a first hard mask layer 330 may be formed over the second insulating cap layer 270. The first hard mask layer 330 includes a material that may be used as an etch mask during subsequent removal of the second-tier memory opening fill portions 226M, first-tier memory opening fill portions 126M, the second-tier support opening fill portions, and the first-tier support opening fill portions. For example, the first hard mask layer 330 may include silicon nitride. The thickness of the first hard mask layer 330 may be in a range from 10 nm to 150 nm, such as from 20 nm to 75 nm, although lesser and greater thicknesses may also be used.

Figure 11A:
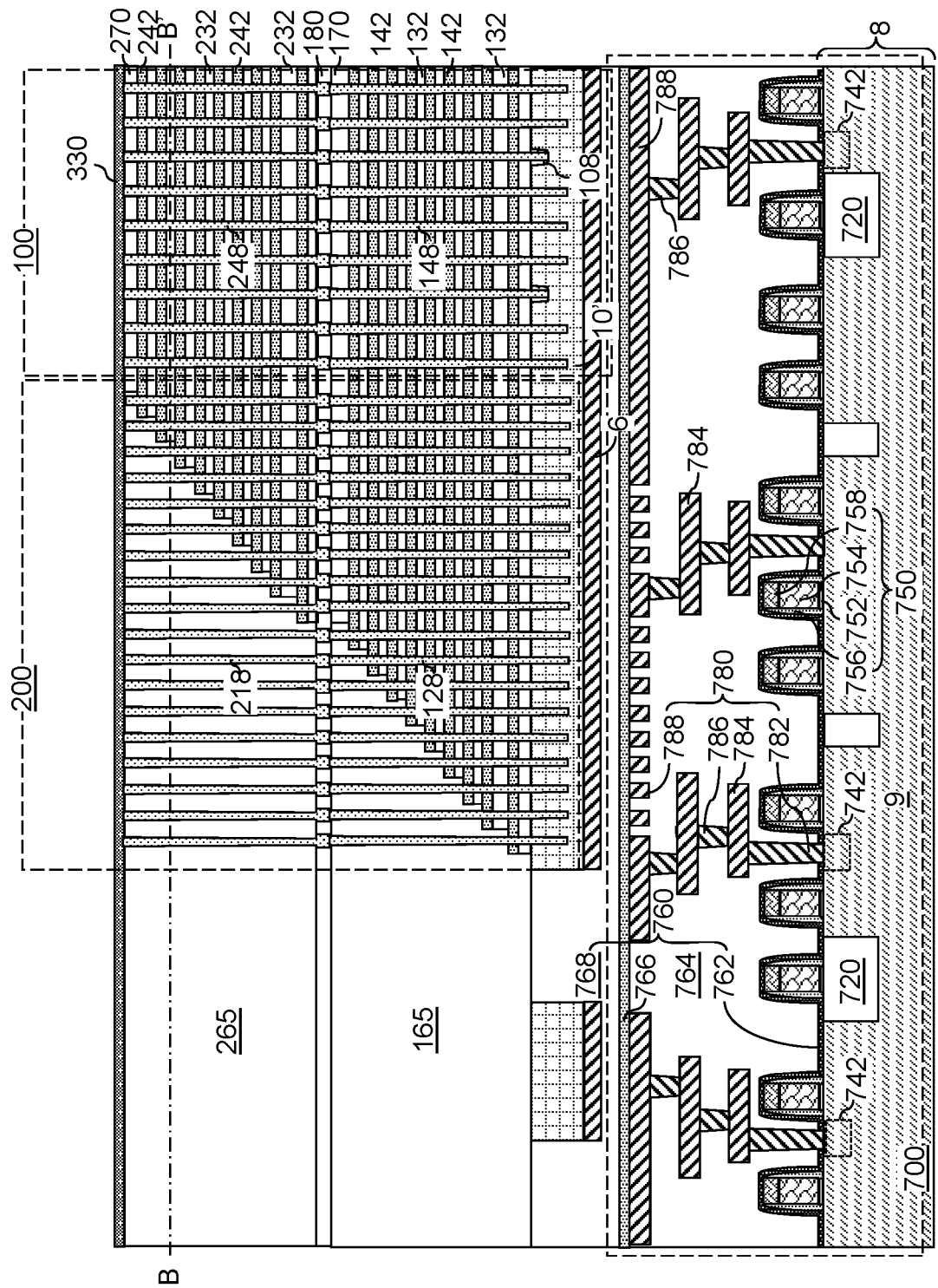
FIG. 11A is a vertical cross-sectional view of the exemplary structure after formation of a first hard mask layer according to an embodiment of the present disclosure.
Figure 11B:
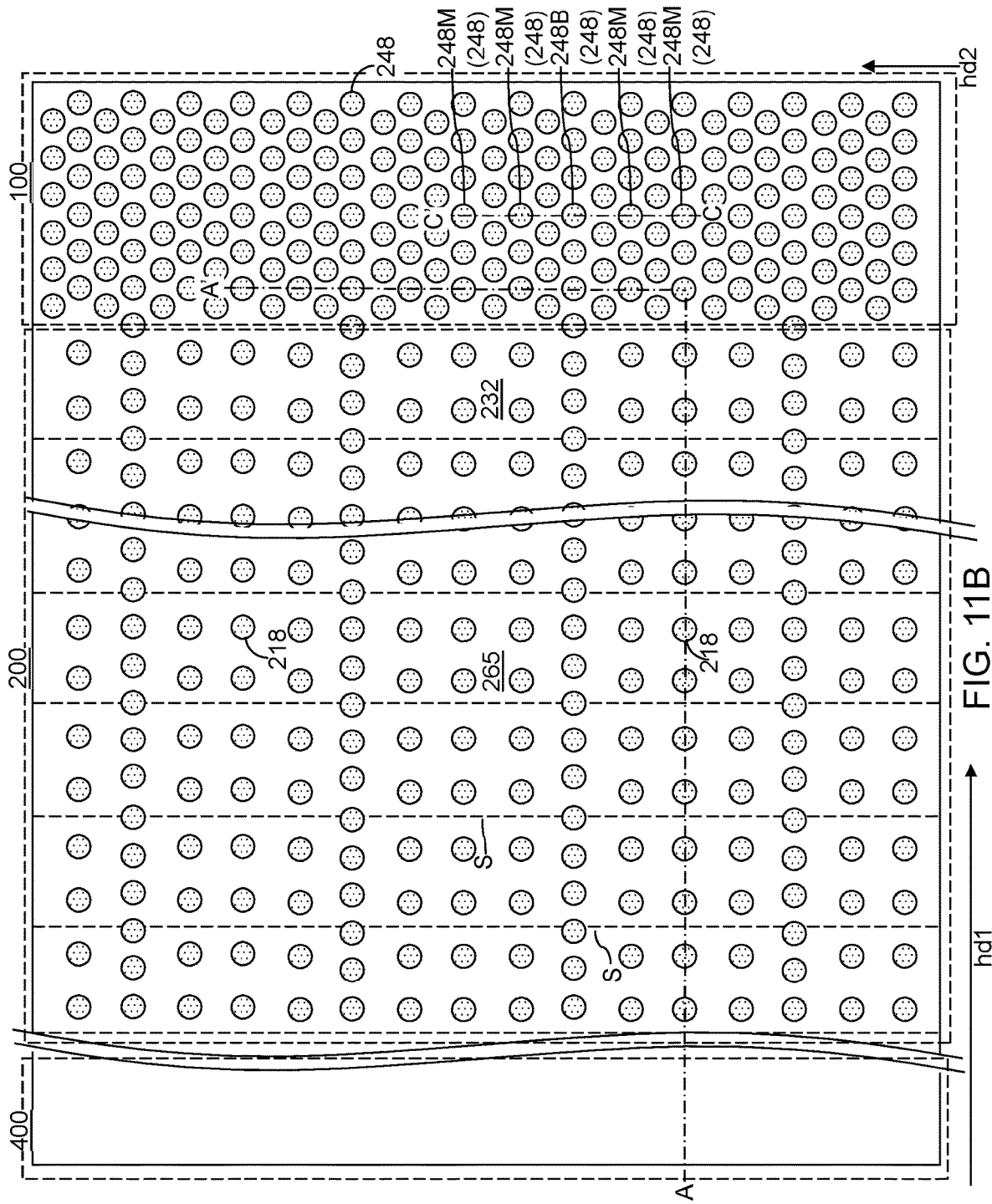
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.
Figure 11C:
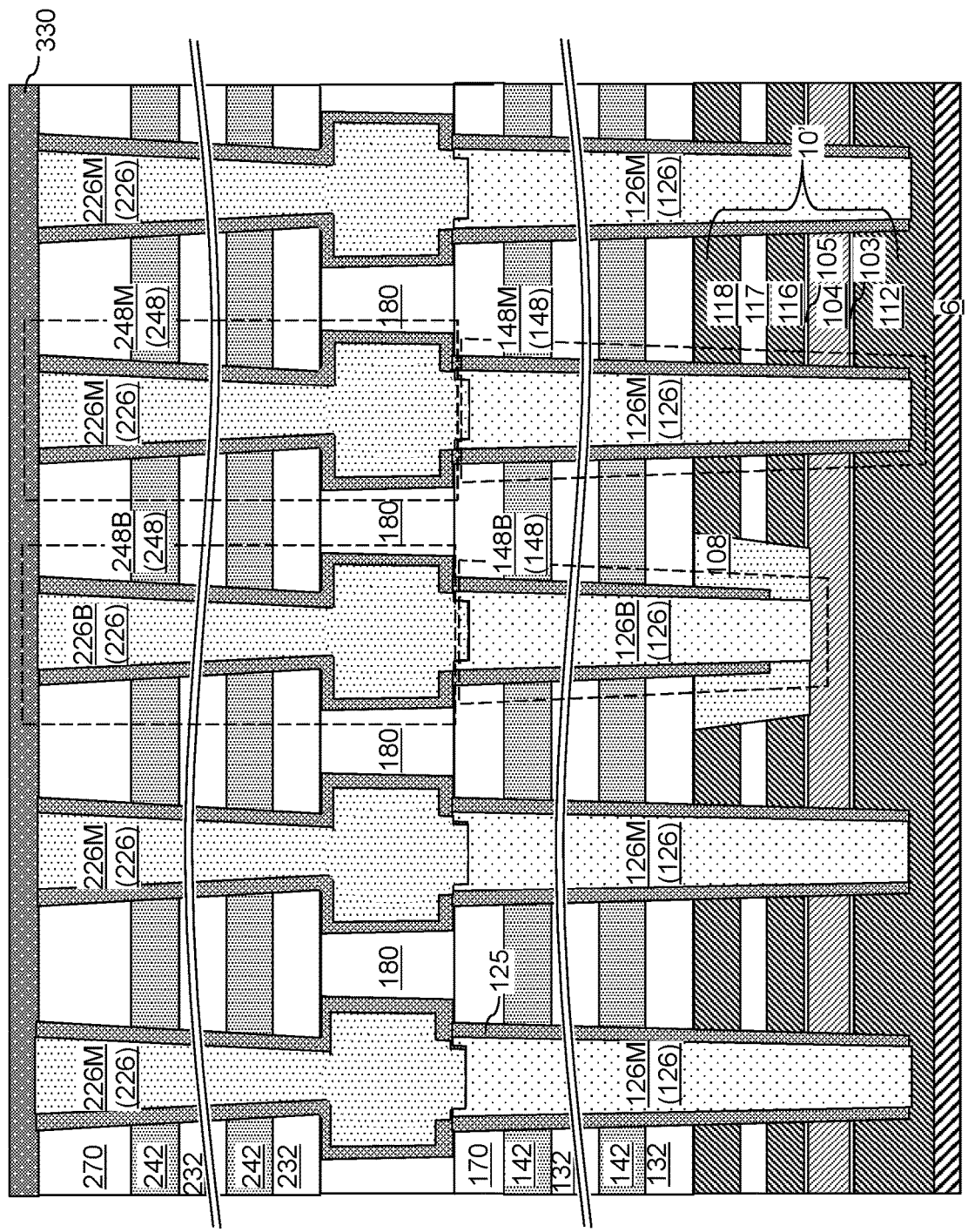
FIG. 11C is a magnified vertical cross-sectional view of the exemplary structure along the vertical plane C-C' of FIG. 11B.
Figure 11D:
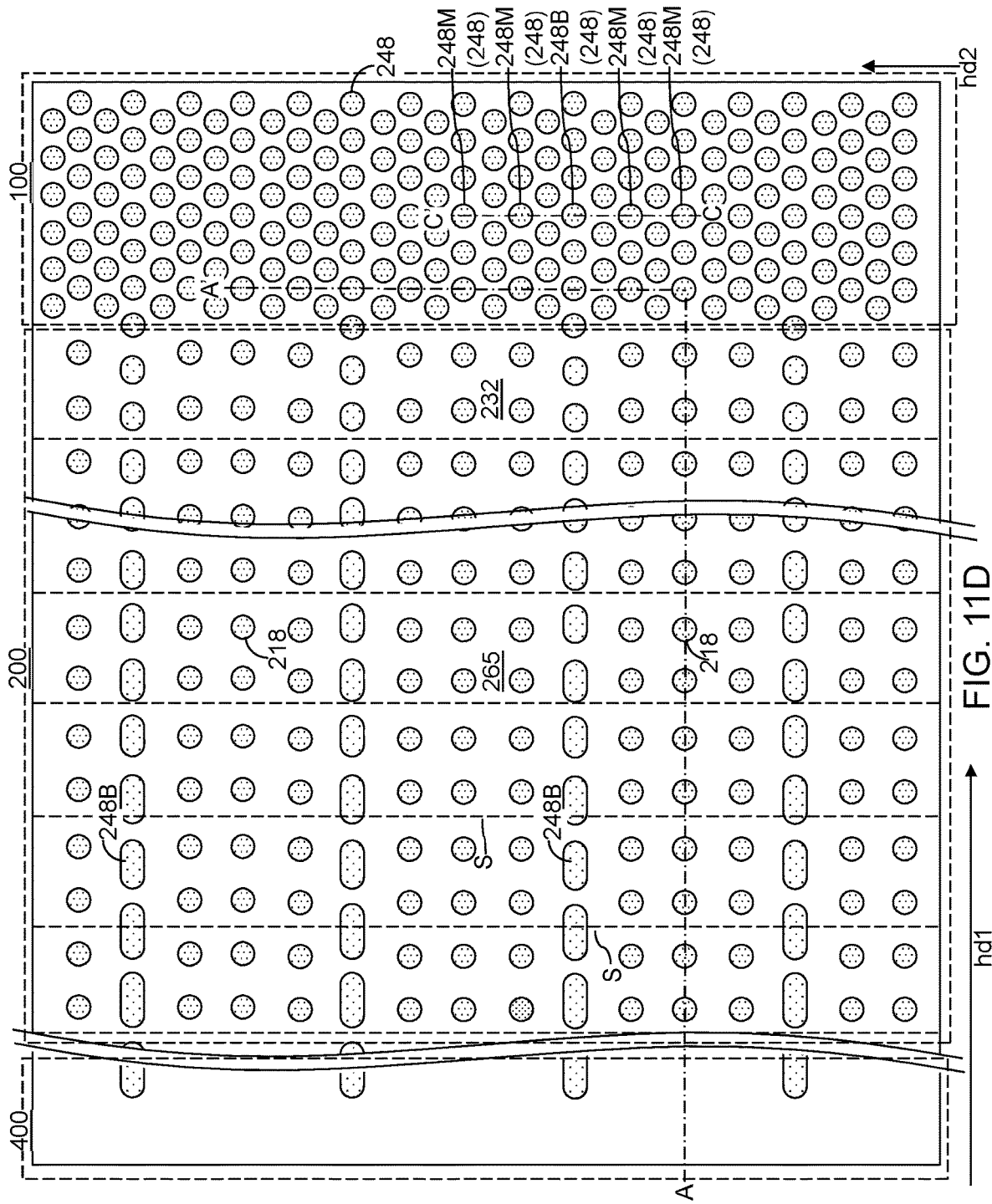
FIG. 11D is a horizontal cross-sectional view of the first alternative embodiment of the exemplary structure along the horizontal plane B-B' of FIG. 11A. The hinged vertical plane A-A' corresponds to the plane of the vertical cross-sectional view of FIG. 11A. The vertical plane C-C' corresponds the plane of the vertical cross-sectional view of FIG. 11C.

FIG. 11D illustrates an alternative embodiment of the present disclosure. The lateral dimensions of the second-tier sacrificial backside opening fill structure 248B along the first horizontal direction hd1 may gradually increase with a lateral distance from the memory array region 100. Likewise, the lateral dimensions of the first-tier sacrificial backside opening fill structure 148B along the first horizontal direction hd1 may gradually increase with a lateral distance from the memory array region 100. The second-tier sacrificial backside opening fill structure 248B and the first-tier sacrificial backside opening fill structure 148B may be elongated more along the first horizontal direction hd1 with an increase in the lateral distance from the memory array region 100. In one embodiment, the second-tier sacrificial backside opening fill structure 248B and the first-tier sacrificial backside opening fill structure 148B in the memory array region 100 may have substantially circular horizontal cross-sectional shapes, and the second-tier sacrificial backside opening fill structure 248B and the first-tier sacrificial backside opening fill structure 148B in the staircase regions 200 may have elongated horizontal cross-sectional shapes having a greater maximum lateral dimension along the first horizontal direction hd1 than a maximum lateral dimension along the second horizontal direction hd2. The ratio of the maximum lateral dimension along the first horizontal direction hd1 to the maximum lateral dimension along the second horizontal direction hd2 may monotonically increase with the lateral distance of the second-tier backside opening 249B from the memory array region 100.

Figure 12A:
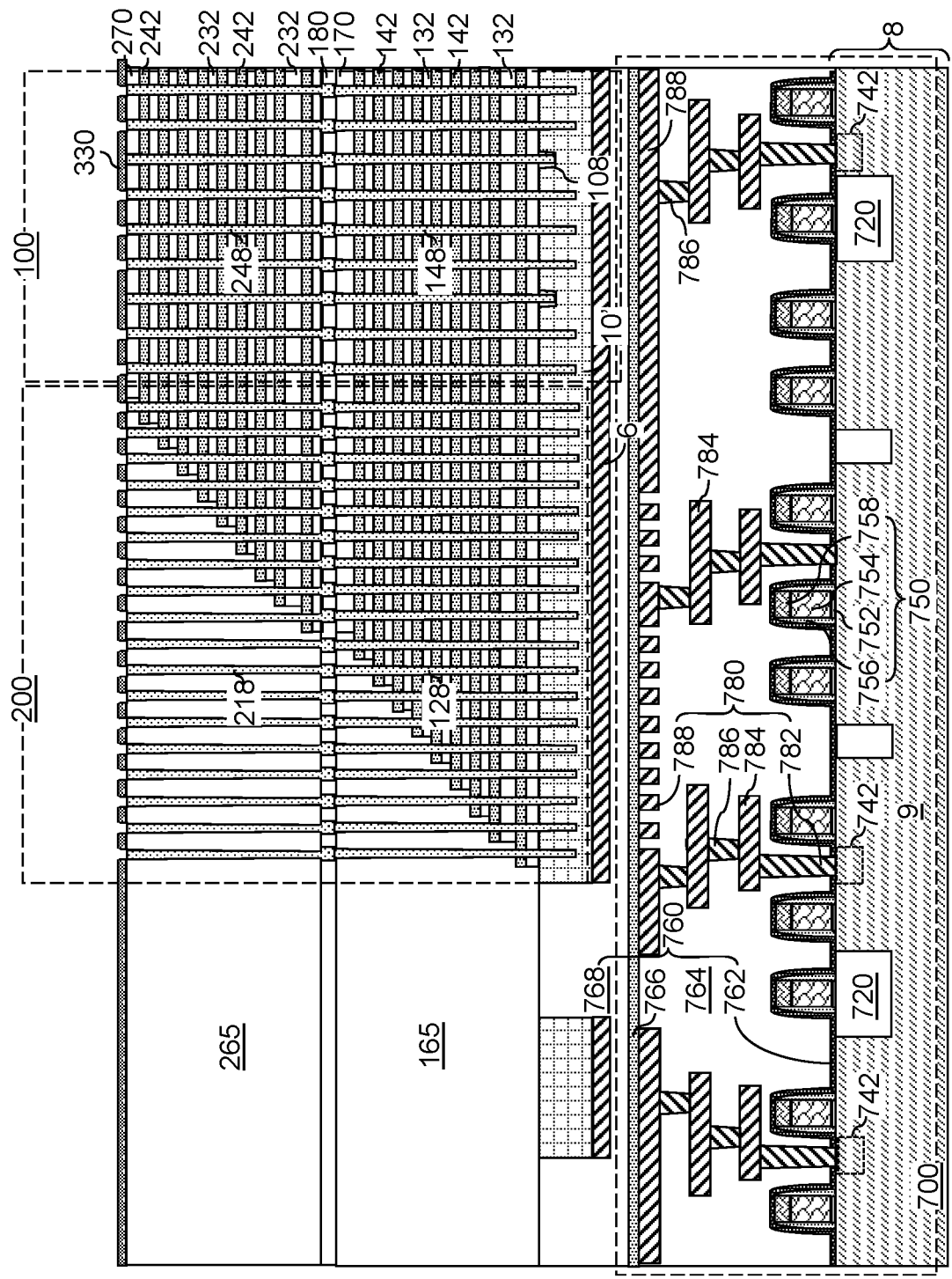
FIG. 12A is a vertical cross-sectional view of the exemplary structure after patterning the first hard mask layer according to an embodiment of the present disclosure.
Figure 12B:
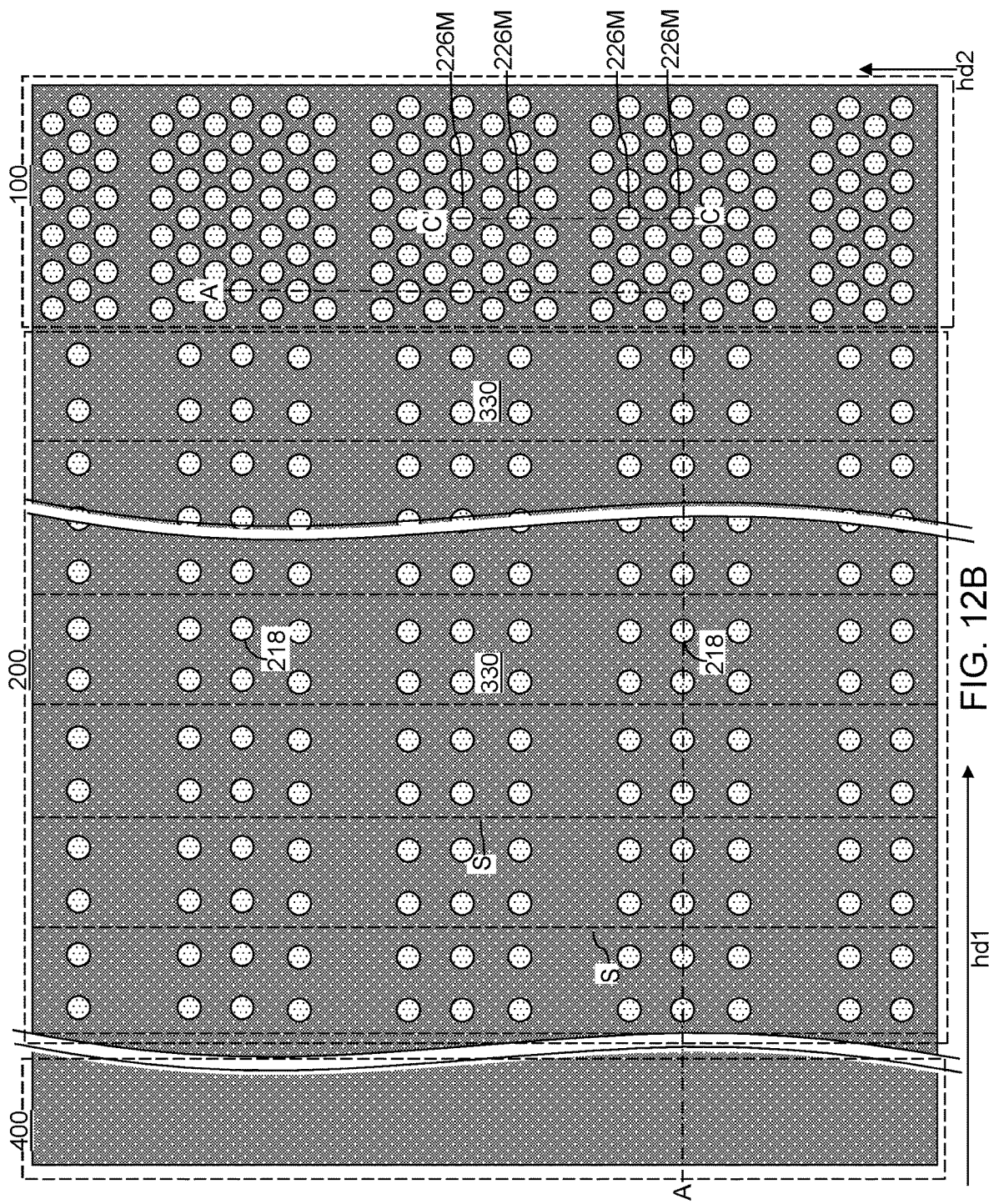
FIG. 12B is a top-down of the exemplary structure of FIG. 12A. The hinged vertical plane A-A' corresponds to the plane of the vertical cross-sectional view of FIG. 12A.
Figure 12C:
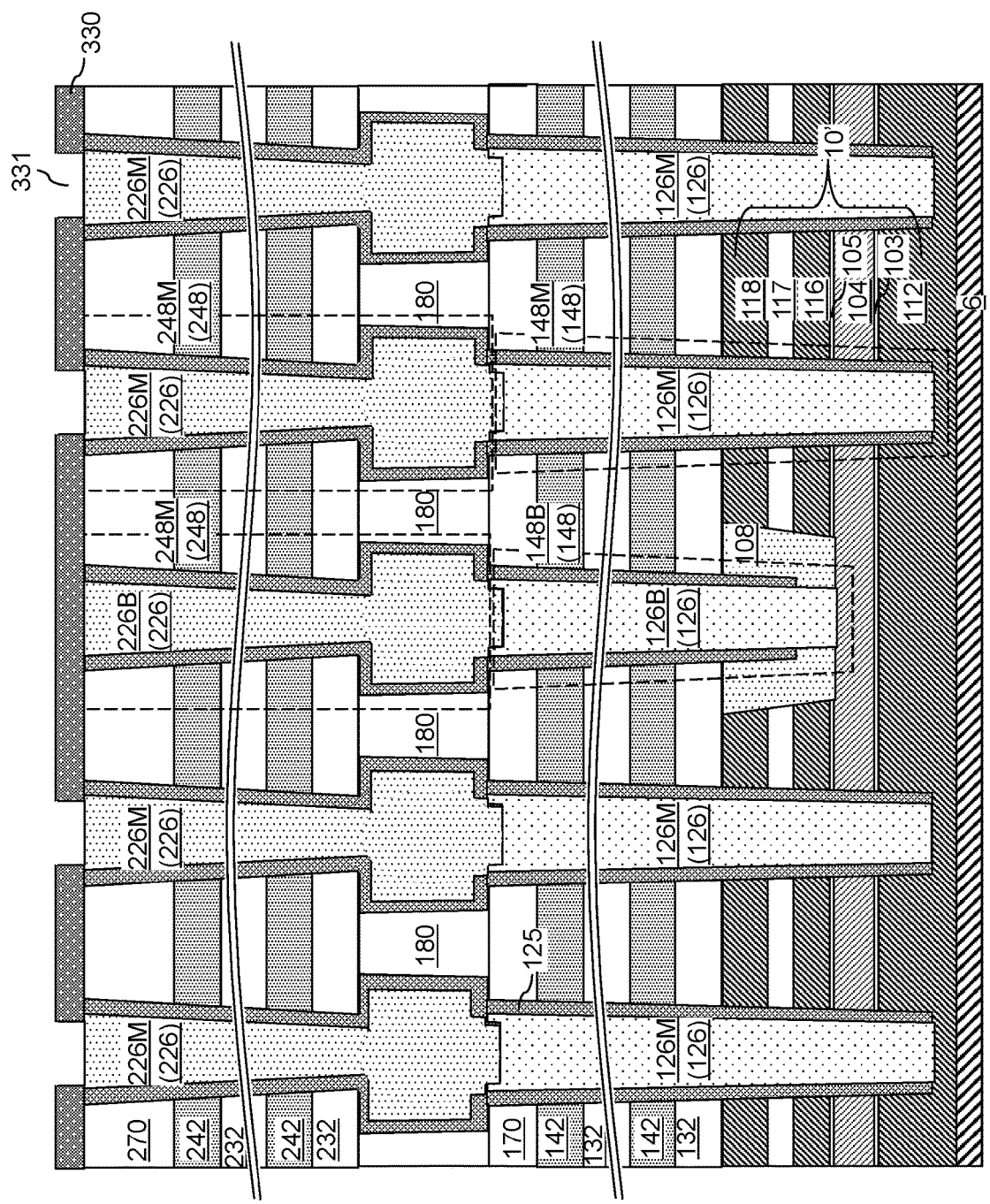
FIG. 12C is a vertical cross-sectional view of the exemplary structure along the vertical plane C-C' of FIG. 12B.

Referring to FIGS. 12A-12C, the first hard mask layer 330 may be lithographically patterned, for example, by application and patterning of a photoresist layer and transfer of the pattern in the photoresist layer into the first hard mask layer 330 by an anisotropic etch. The photoresist layer may be removed, for example, by ashing. The pattern of the openings 331 in the first hard mask layer 330 may be selected such that an opening 331 is provided through the first hard mask layer 330 above each top surface of the second-tier memory opening fill portions 226M and the second-tier support opening fill portions. Preferably, the width (e.g., diameter) of each opening 331 is smaller than the width (e.g., diameter) of the respective underlying second-tier memory opening 249M. The first hard mask layer 330 does not include any openings over the second-tier backside opening fill portions 226B. Thus, each top surface of the second-tier backside opening fill portions 226B is covered by the first hard mask layer 330.

Figure 13A:
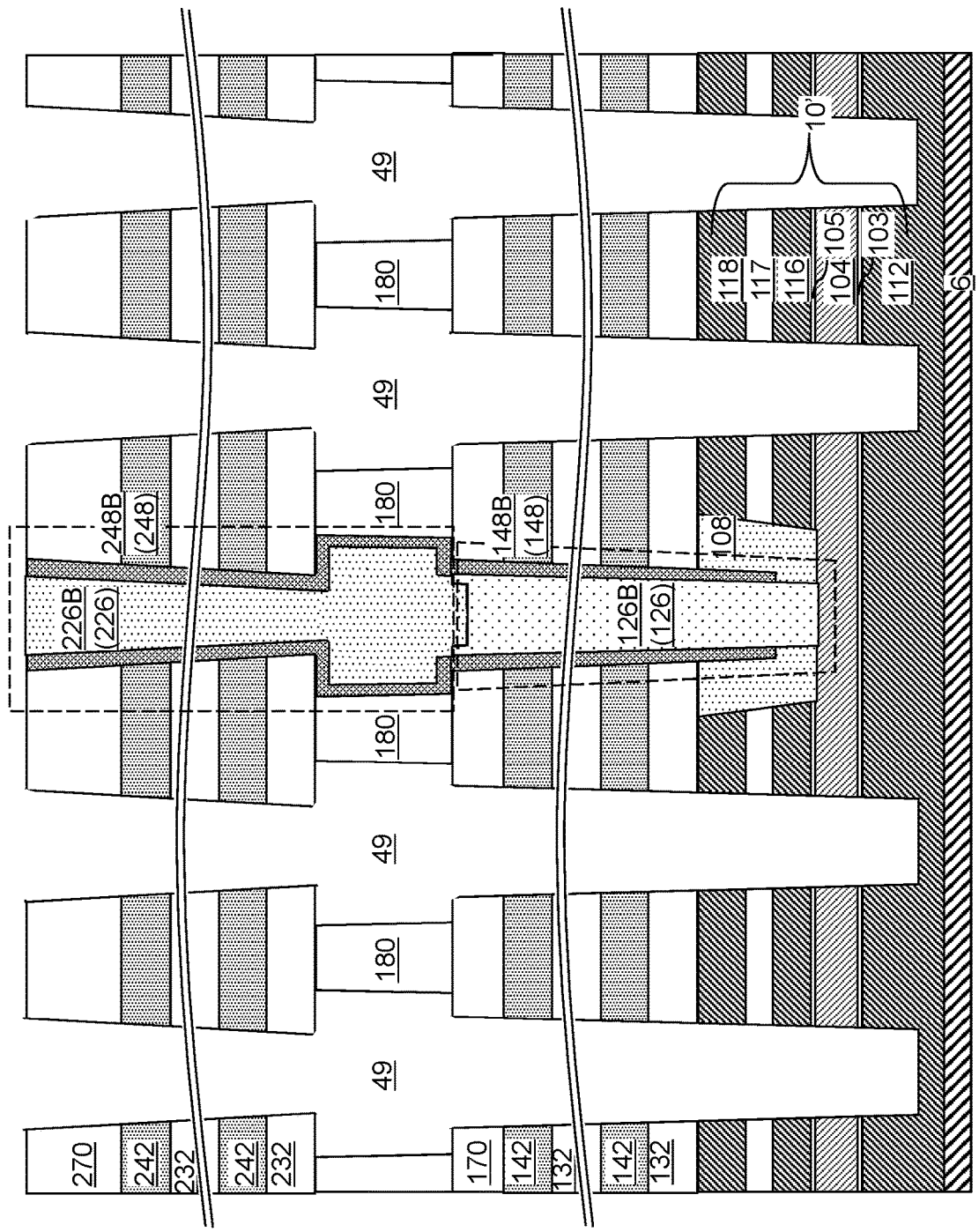
FIGS. 13A-13E illustrate sequential magnified vertical cross-sectional views of memory openings and a backside opening during formation of memory opening fill structures and a second hard mask layer according to an embodiment of the present disclosure.

Referring to FIG. 13A, the second-tier memory opening fill portions 226M and the first-tier memory opening fill portions 126M may be subsequently removed by an etch process. The second-tier support opening fill portions and the first-tier support opening fill portions may also be removed during the same etch process. The etch process may be selective to the material of the lower source-level material layer 112 (and/or the planar conductive material layer 6). For example, if the second-tier sacrificial fill material and the first-tier sacrificial fill material include a silicon oxide material such as undoped silicon oxide, borosilicate glass, phosphosilicate glass, or organosilicate glass, and if the first sacrificial liners 125, the second sacrificial liners 225, and the first hard mask layer 330 include silicon nitride, then the second-tier sacrificial fill material and the first-tier sacrificial fill material may be removed selective to the first sacrificial liners 125, the second sacrificial liners 225, and the first hard mask layer 330 by a wet etch process using dilute hydrofluoric acid.

Subsequently, the first sacrificial liners 125 and the second sacrificial liners 225 may be removed selective to the materials of the first and second insulating layers (132, 232), the first and second insulating cap layers (170, 270), the inter-tier dielectric layer 180, and the various layers within the in-process source-level material layers 10' by an isotropic etch process. For example, a wet etch process using hot phosphoric acid may be used to remove the first sacrificial liners 125 and the second sacrificial liners 225. The first hard mask layer 330 may be collaterally removed during removal of the first sacrificial liners 125 and the second sacrificial liners 225.

Memory openings 49 may be formed in volumes from which a respective set of a second-tier memory opening fill portion 226M, a first-tier memory opening fill portion 126M, a first sacrificial liner 125, and a second sacrificial liner 225 is removed. Support openings may be formed in volumes from which a respective set of a second-tier support opening fill portion, a first-tier support opening fill portion, a first sacrificial liner 125, and a second sacrificial liner 225 is removed. The memory openings 49 may be formed in the memory array region 100, and the support openings are formed in the staircase region 200. Each memory opening 49 and each support opening may extend through the first-tier structure and the second-tier structure. A top surface of the lower source layer 112 may be physically exposed at the bottom of each memory opening 49 and at the bottom of each support opening. Sidewalls of the lower sacrificial liner 103, the source-level sacrificial layer 104, the upper sacrificial liner 105, the upper source layer 116, the source-level insulating layer 117, and the optional source select level conductive layer 118 may be physically exposed around each memory opening 49 and around each support opening.

Generally, the memory openings 49 may be formed as groups of memory openings located between a neighboring pair of rows of backside openings that are filled with a respective stack of a second-tier sacrificial backside opening fill structure 248B and first-tier sacrificial backside opening fill structure 148B. Each group of memory openings 49 may be formed as rows of memory openings 49 arranged along the first horizontal direction hd1.

Figure 13B:
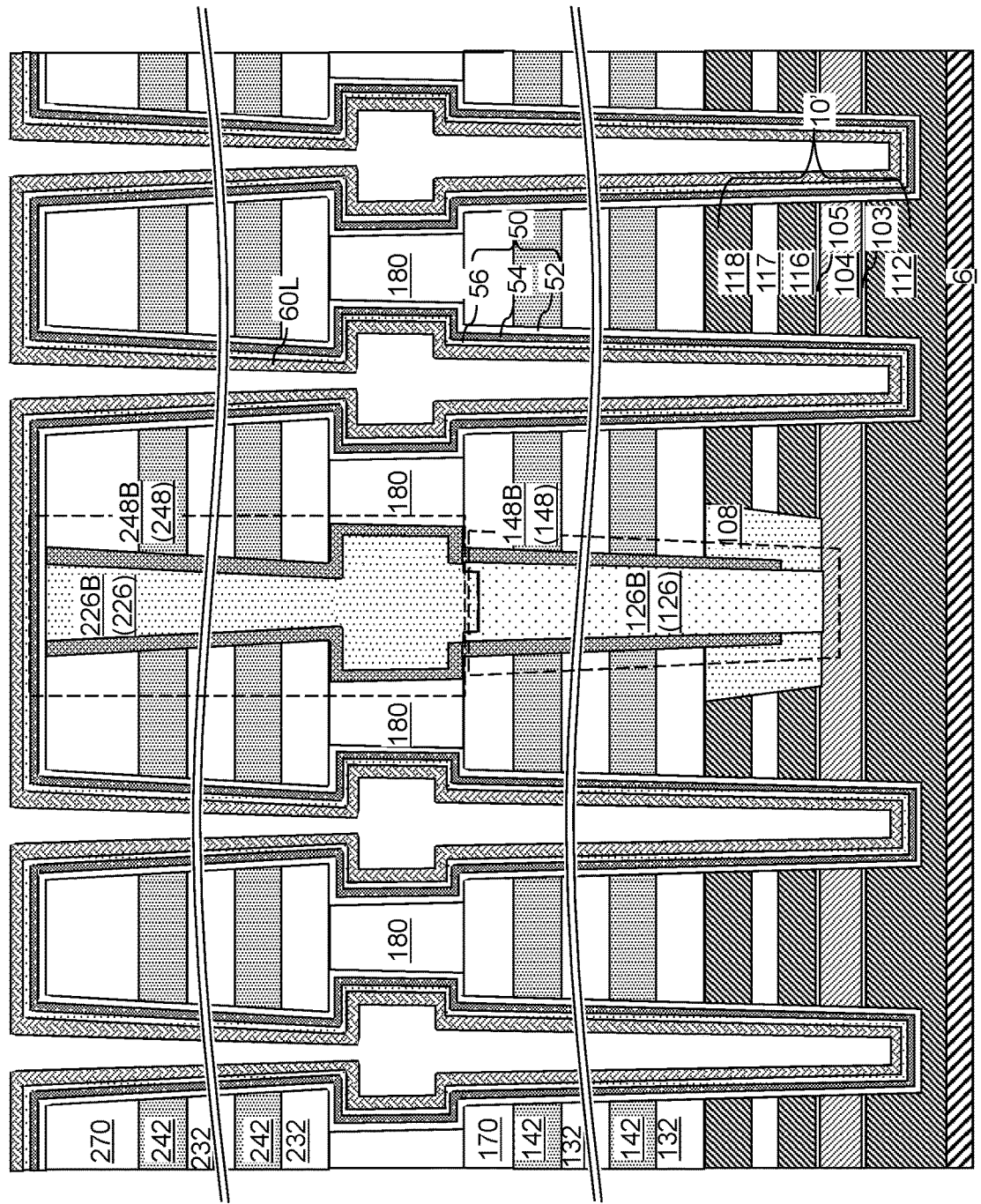

Referring to FIG. 13B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer 52 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer.

In another embodiment, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity may be provided in the volume of each memory opening 49 that is not filled with the deposited material layers (52, 54, 56, 60L).

Figure 13C:
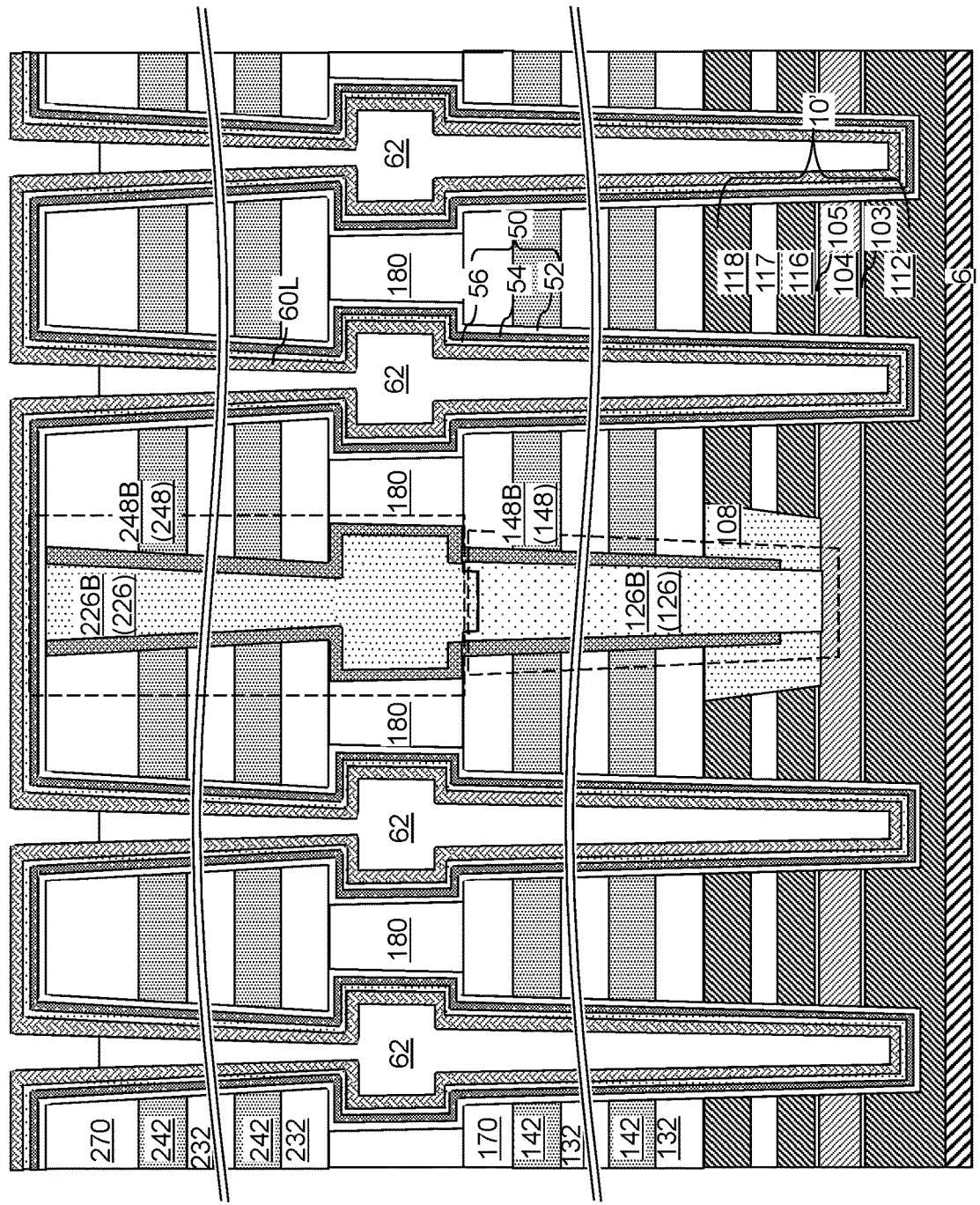

Referring to FIG. 13C, in case a cavity is present in each memory opening 49, a dielectric core layer may be deposited in each cavity to form a dielectric core layer. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 13D:
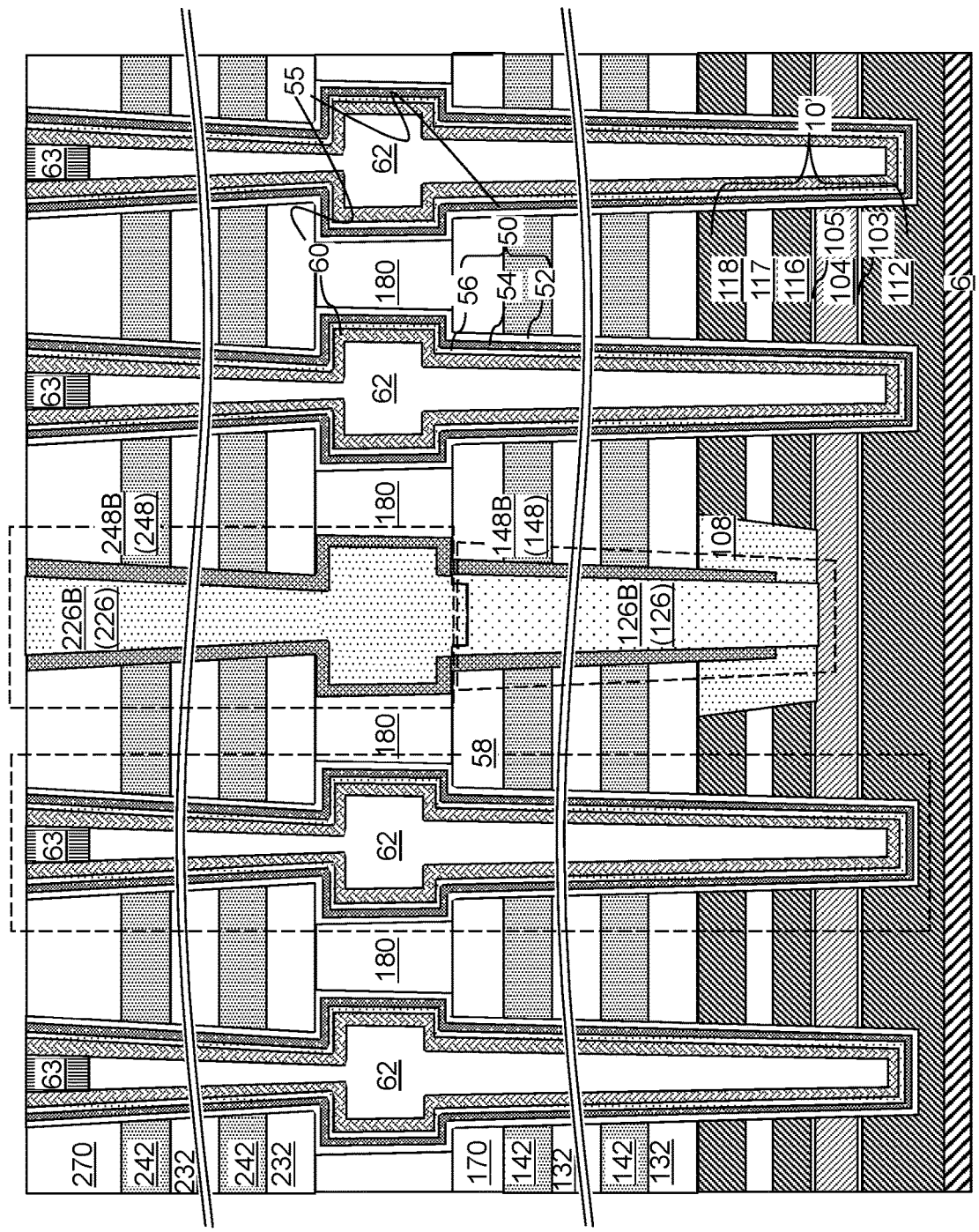

Referring to FIG. 13D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material having a doping of the second conductivity type constitutes a drain region 63. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 may be a combination of a vertical semiconductor channel 60, a tunneling dielectric layer 56, a plurality of memory elements which comprise portions of the charge storage layer 54, and an optional blocking dielectric layer 52. Each combination of a memory stack structure 55, a dielectric core 62, and a drain region 63 within a memory opening 49 constitutes a memory opening fill structure 58. Each memory opening may be filled with a respective memory opening fill structure 58. Each of the memory stack structures 55 comprises a memory film 50 and a vertical semiconductor channel 60 laterally surrounded by the memory film 50. Each memory stack structure 55 may vertically extend through each layer within the first alternating stack (132, 142) and within the second alternating stack (232, 242), and may be formed within a two-dimensional array of memory stack structures 55 in the memory array region 100.

During formation of the memory opening fill structures 58 (i.e., during the processing steps of FIGS. 13A-13D), the same structural changes occur in each of the support openings to form support pillar structures. Each support pillar structure may have a same set of structural elements as a memory opening fill structure 58 with optional modifications that occur due to differences in the lateral dimensions of the support openings relative to the lateral dimensions of the memory openings. The support pillar structures may be electrically inactive components (also referred to as dummy components), i.e., components that are not used to form an electrically active component. The in-process source-level material layers 10', the first-tier structure (132, 142, 170, 165), the second-tier structure (232, 242, 265), the inter-tier dielectric layer 180, the memory opening fill structures 58, the support opening fill structures, and the sacrificial backside opening fill structures (148B, 248B) collectively constitute a memory-level assembly.

The processing steps of FIGS. 13A-13D replace the sacrificial memory opening fill structures (148M, 248M) with the memory opening fill structures 58 without removing the sacrificial backside opening fill structures (148B, 248B). Memory opening fill structures 58 are formed in the memory openings 49, and sacrificial backside opening fill structures (148B, 248B) are provided in the backside openings (149B, 249B).

Figure 13E:
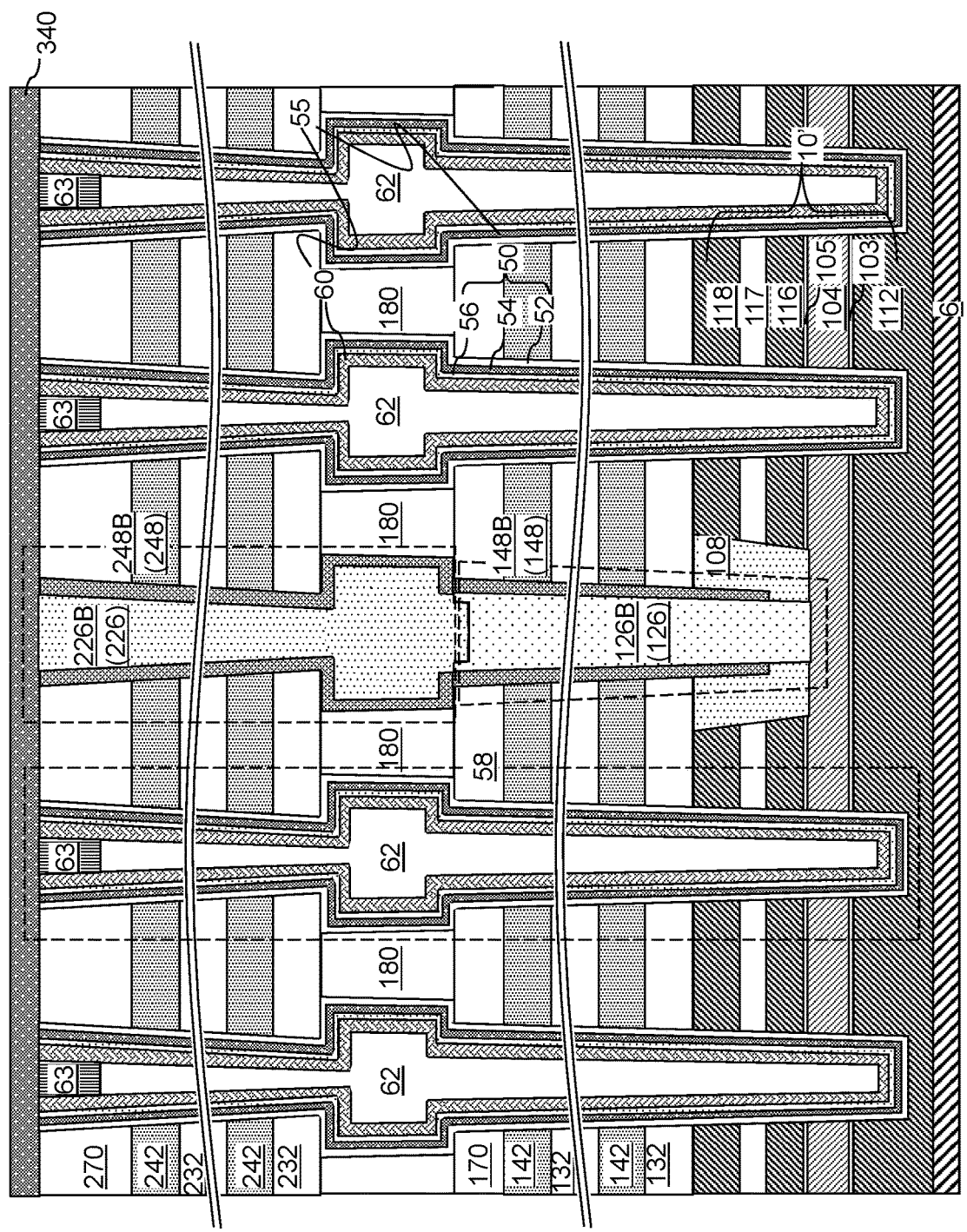
Figure 14A:
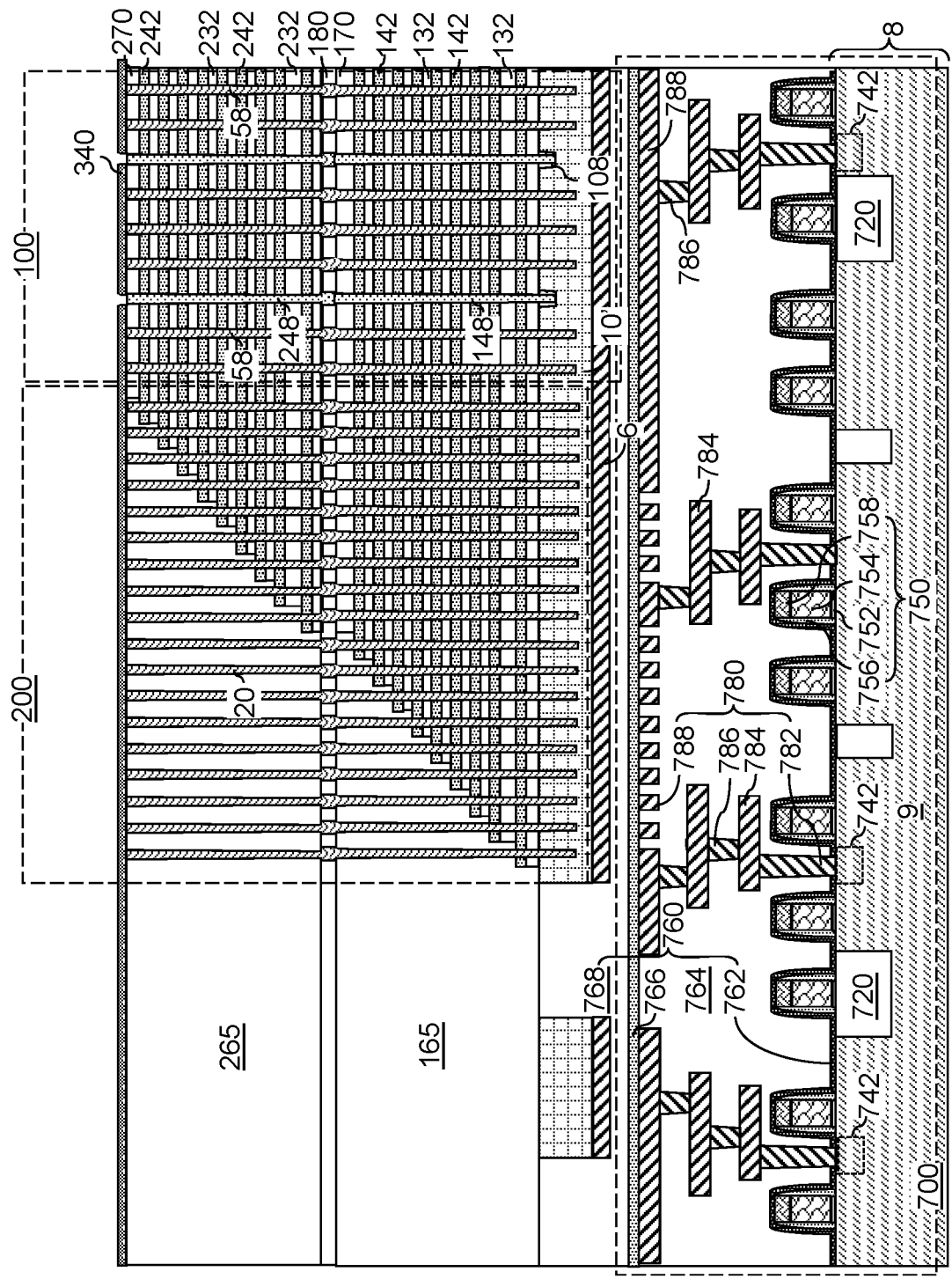
FIG. 14A is a vertical cross-sectional view of the exemplary structure after patterning the second hard mask layer according to an embodiment of the present disclosure.
Figure 14B:
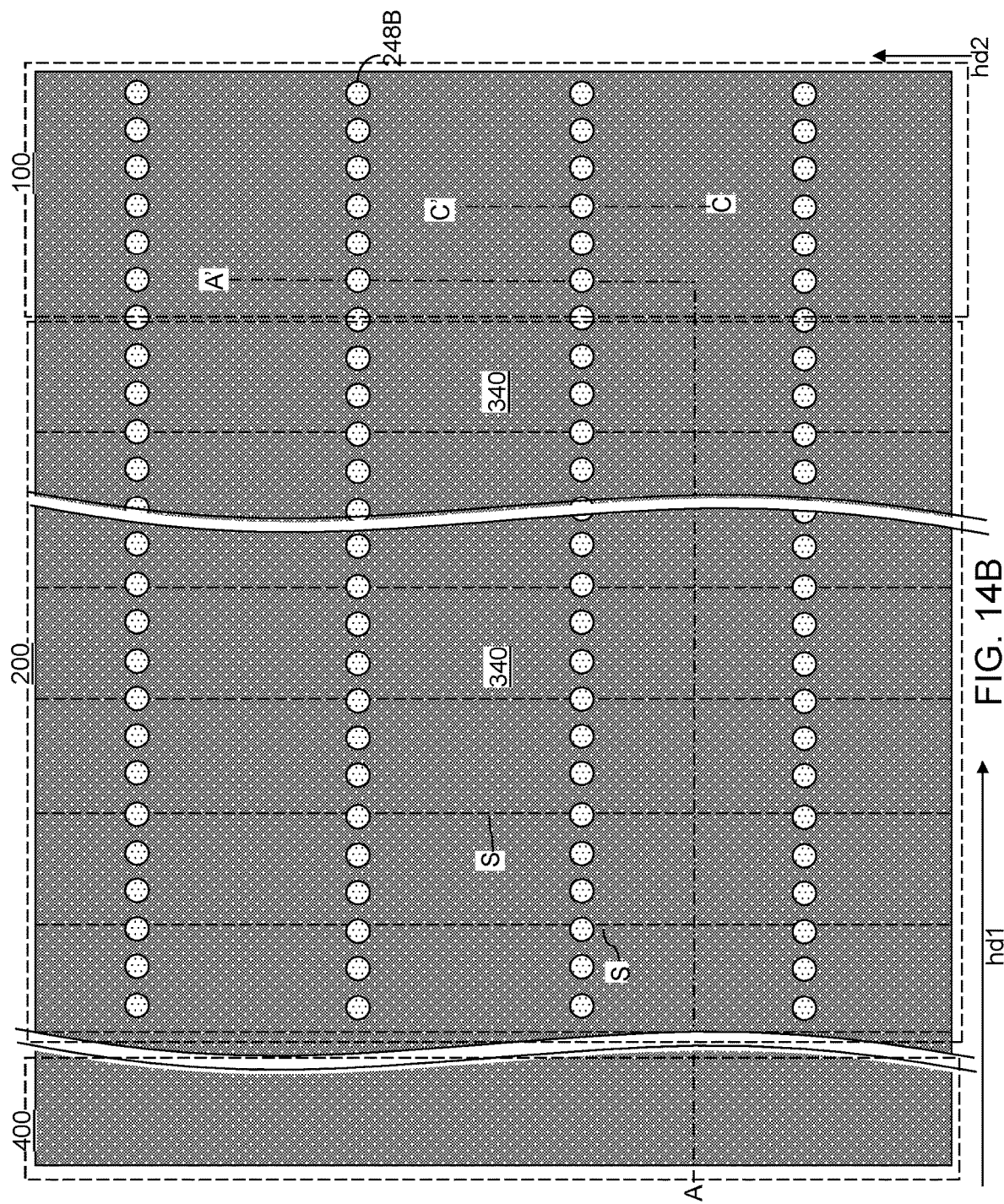
FIG. 14B is a top-down of the exemplary structure of FIG. 14A. The hinged vertical plane A-A' corresponds to the plane of the vertical cross-sectional view of FIG. 14A.
Figure 14C:
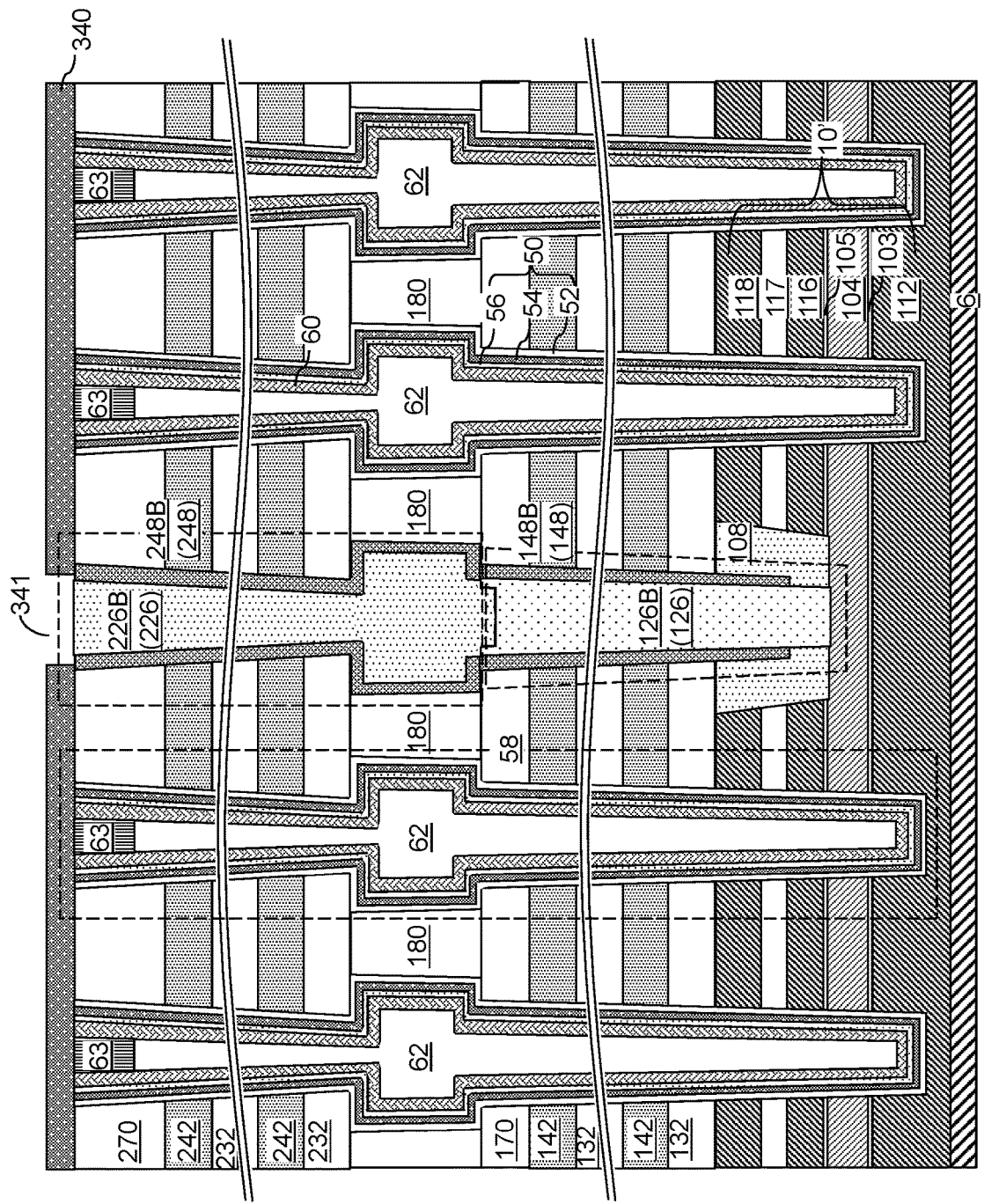
FIG. 14C is a vertical cross-sectional view of the exemplary structure along the vertical plane C-C' of FIG. 14B.

Referring to FIG. 13E, a second hard mask layer 340 may be formed over the second insulating cap layer 270. The second hard mask layer 340 includes a material that may be used as an etch mask during subsequent removal of the second-tier backside opening fill portions 226B and the first-tier backside opening fill portions 126B. For example, the second hard mask layer 340 may include silicon nitride. The thickness of the second hard mask layer 340 may be in a range from 10 nm to 150 nm, such as from 20 nm to 75 nm, although lesser and greater thicknesses may also be used.

Referring to FIGS. 14A-14D, the second hard mask layer 340 may be lithographically patterned, for example, by application and patterning of a photoresist layer and transfer of the pattern in the photoresist layer into the second hard mask layer 340 by an anisotropic etch. The photoresist layer may be removed, for example, by ashing. The pattern of the openings 341 in the second hard mask layer 340 may be selected such that an opening 341 is provided through the second hard mask layer 340 above each top surface of the second-tier backside opening fill portions 226B. The second hard mask layer 340 does not include any openings over the memory opening fill structures 58 or support pillar structures 20 (that are formed in the support openings). Thus, each top surface of the memory opening fill structures 58 and support pillar structures 20 is covered by the second hard mask layer 340.

Figure 15A:
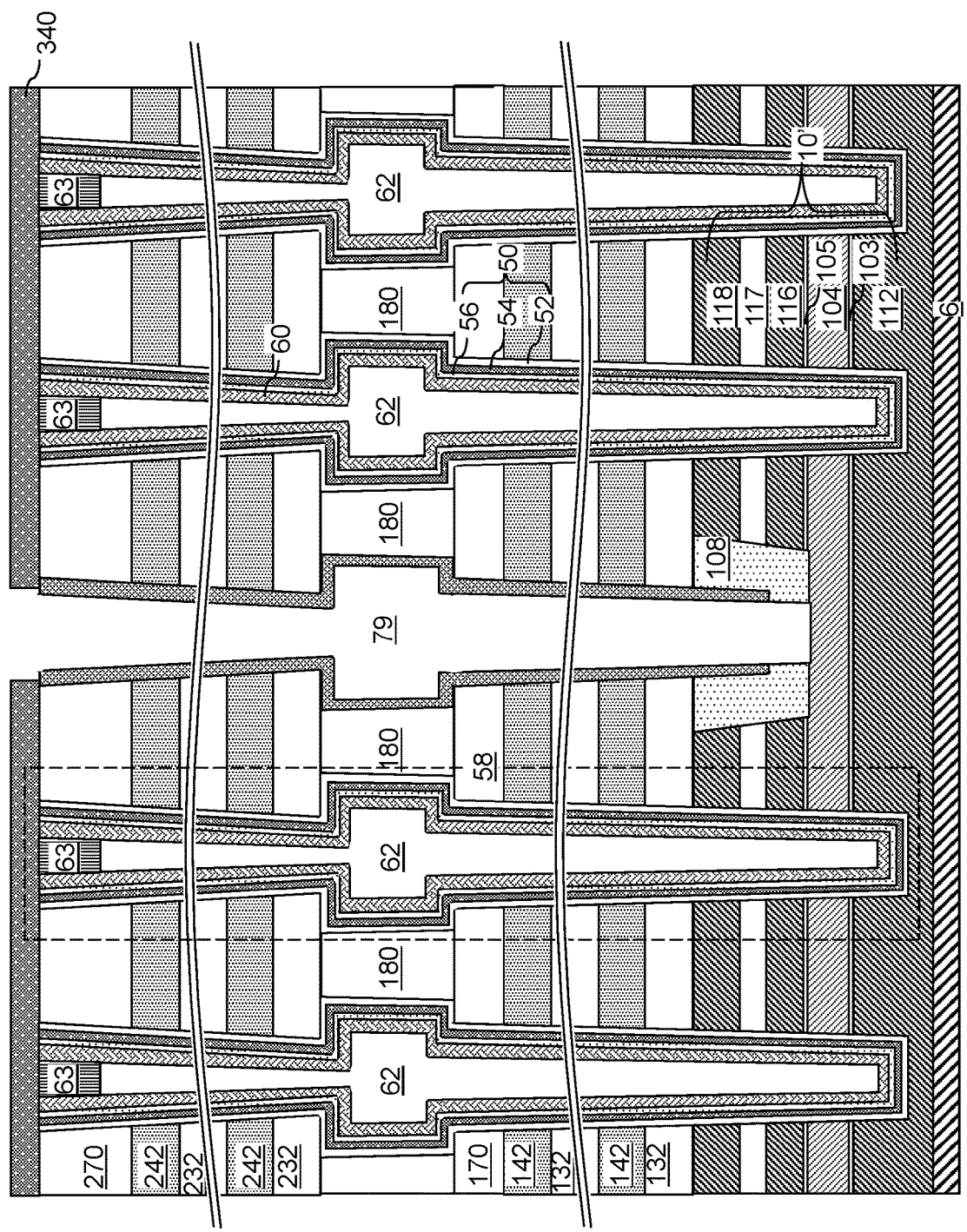
FIGS. 15A-15C illustrate sequential vertical cross-sectional views of memory openings and a backside opening during formation of a source cavity according to an embodiment of the present disclosure.

Referring to FIG. 15A, the second-tier backside opening fill portions 226B and the first-tier backside opening fill portions 126B may be subsequently removed by an etch process. The etch process may, or may not, be selective to the material of the source-level sacrificial layer 104. For example, if the second-tier sacrificial fill material and the first-tier sacrificial fill material include a silicon oxide material such as undoped silicon oxide, borosilicate glass, phosphosilicate glass, or organosilicate glass, and if the first sacrificial liners 125, the second sacrificial liners 225, and the second hard mask layer 340 include silicon nitride, then the second-tier sacrificial fill material and the first-tier sacrificial fill material may be removed selective to the first sacrificial liners 125, the second sacrificial liners 225, and the first hard mask layer 330 by a wet etch process using dilute hydrofluoric acid.

Discrete backside openings 79 may be formed in volumes from which a respective set of a second-tier backside opening fill portion 226B and a first-tier backside opening fill portion 126B is removed. The backside openings 79 may be formed in the memory array region 100 and in the staircase region 200. Each backside opening 79 may extend through the first-tier structure and the second-tier structure. A top surface of the source-level sacrificial layer 104 may be physically exposed at the bottom of each backside opening 79. The upper sacrificial liner 105, the upper source layer 116, the source-level insulating layer 117, and the optional source select level conductive layer 118 may be laterally spaced from each backside opening 79 by a respective dielectric etch stop material portion 108.

Figure 15B:
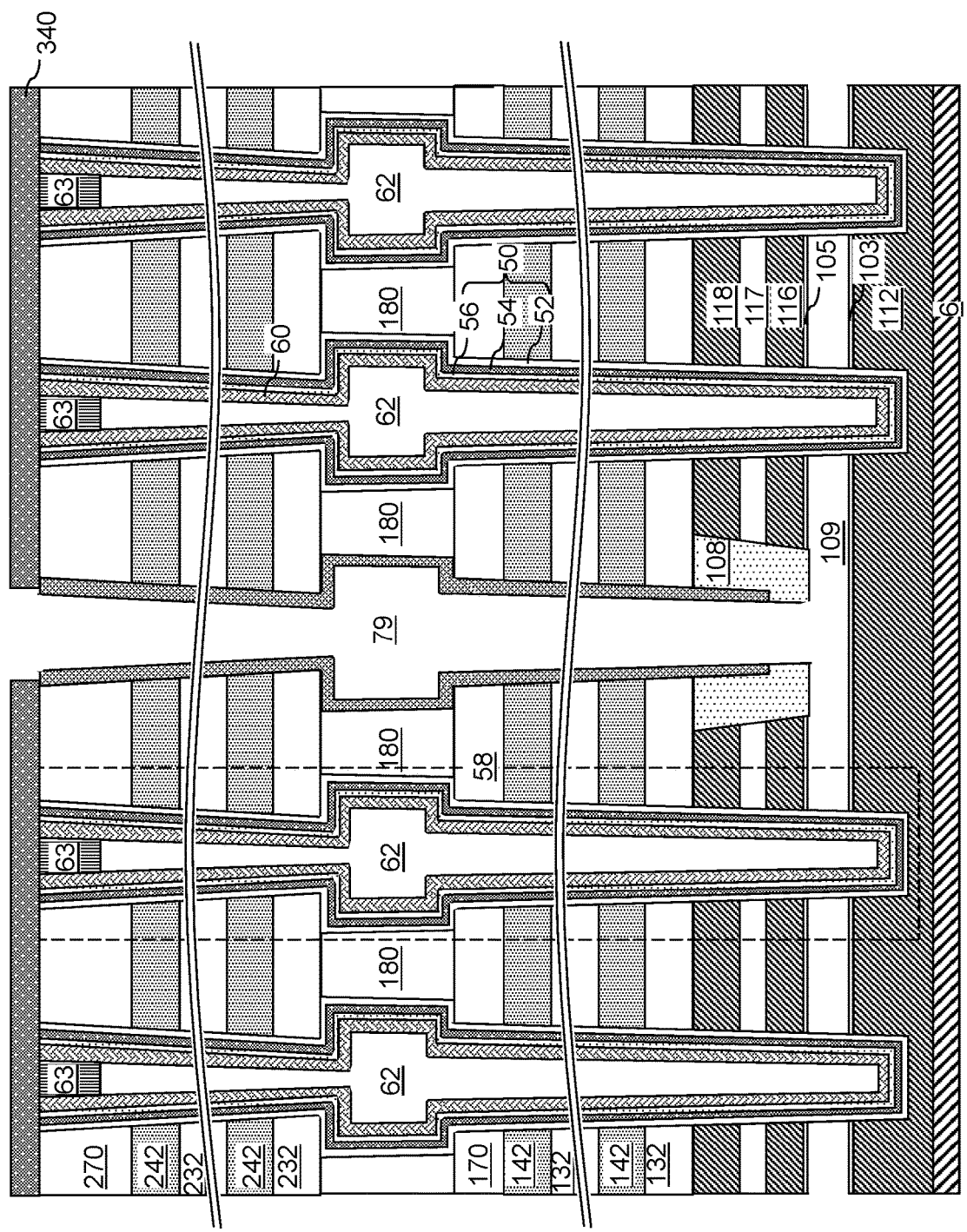

Referring to FIG. 15B, an etchant that etches the material of the source-level sacrificial layer 104 selective to the materials of the first alternating stack (132, 142), the second alternating stack (232, 242), the first and second insulating cap layers (170, 270), the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 15C:
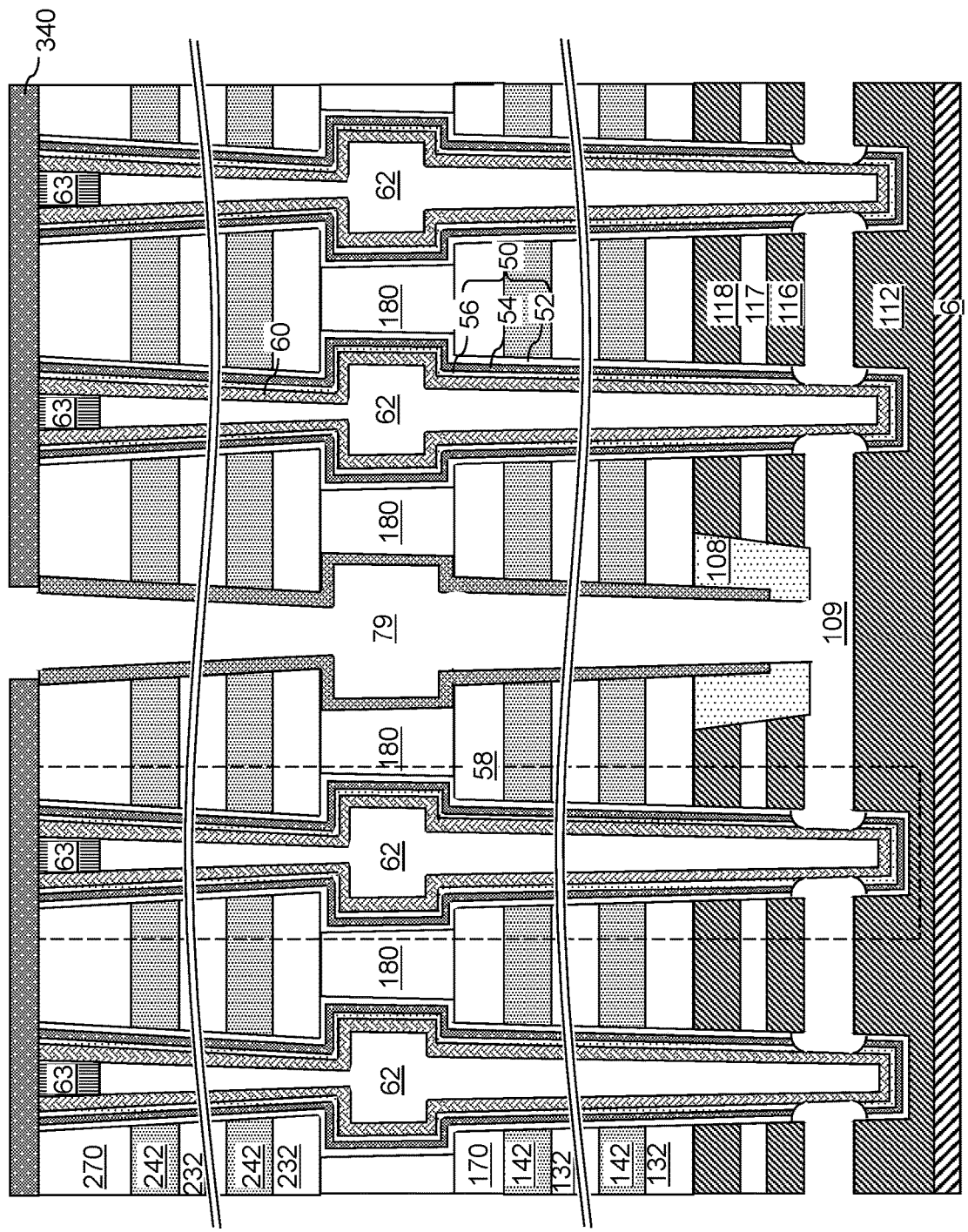

Referring to FIG. 15C, a sequence of isotropic etchants, such as wet etchants, may be applied to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source layer 112 and a bottom surface of the upper source layer 116 may be physically exposed to the source cavity 109.

Referring to FIGS. 16A-16D, a doped semiconductor material having a doping of the second conductivity type may be deposited by a selective semiconductor deposition process. A semiconductor precursor gas, an etchant, and a dopant precursor gas may be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine may be provided. The deposited doped semiconductor material forms a source contact layer 114, which may contact sidewalls of the vertical semiconductor channels 60. The duration of the selective semiconductor deposition process may be selected such that the source cavity is filled with the source contact layer 114, and the source contact layer 114 contacts the exposed portions of the semiconductor channel 60 and bottom end portions of inner sidewalls of the backside trench spacers 74. Thus, the source contact layer 114 may be formed by selectively depositing a doped semiconductor material from semiconductor surfaces around the source cavity 109. In one embodiment, the doped semiconductor material may include doped polysilicon.

The layer stack including the lower source layer 112, the source contact layer 114, and the upper source layer 116 constitutes a buried source layer (112, 114, 116), which function as a common source region that is connected each of the vertical semiconductor channels 60 and has a doping of the second conductivity type. The average dopant concentration in the buried source layer (112, 114, 116) may be in a range from $5.0\times10^{19}/cm^3$ to $2.0\times10^{21}/cm^3$, although lesser and greater dopant concentrations may also be used. The set of layers including the buried source layer (112, 114, 116), the source-level insulating layer 117, and the optional source select level conductive layer 118 constitutes source-level material layers 10, which replace the in-process source-level material layers 10'. Optionally, an oxidation process may be performed to convert a surface portion of the source contact layer 114 into a semiconductor oxide portion (not illustrated) underneath each backside opening 79.

Figure 16A:
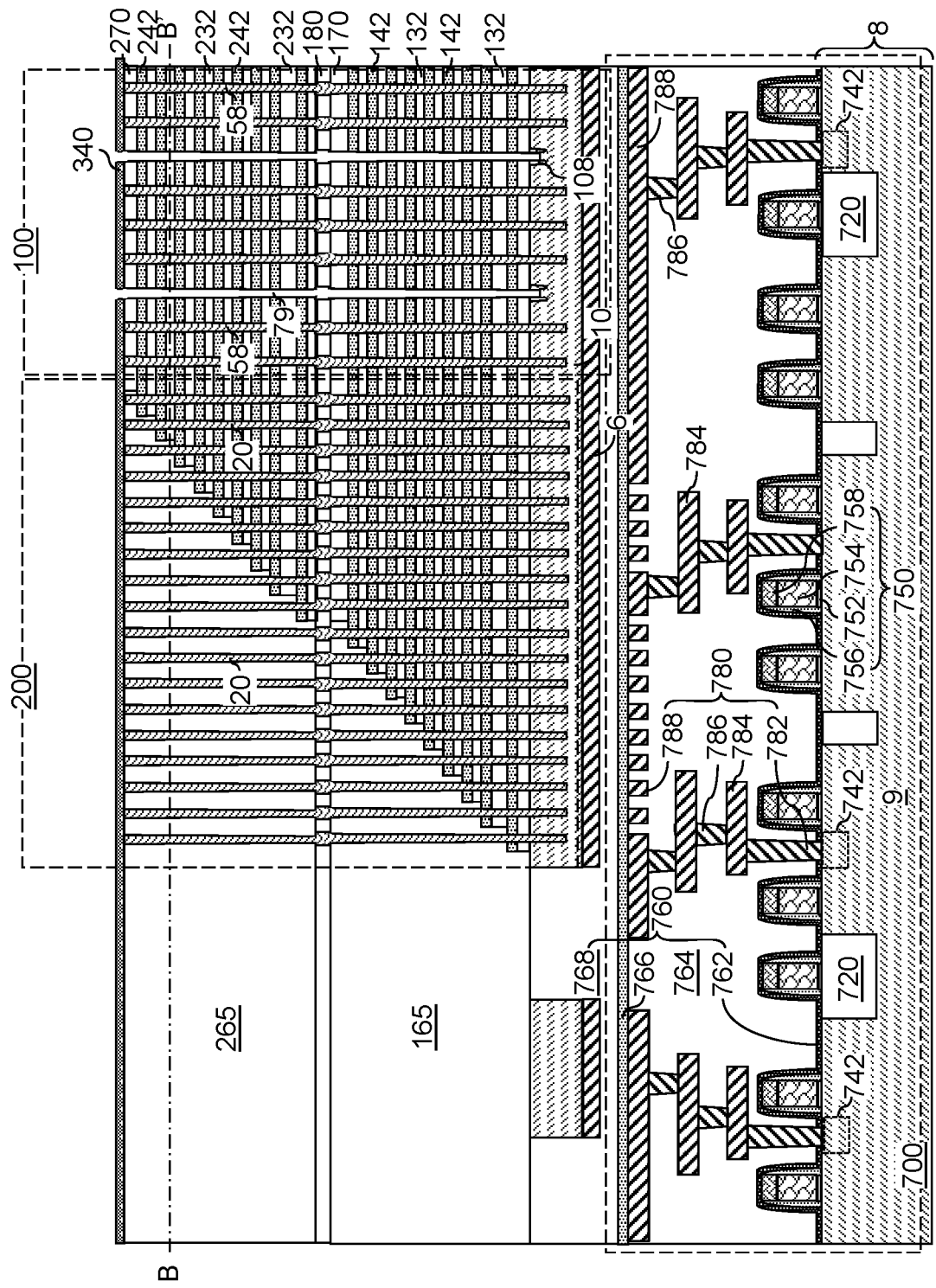
FIG. 16A is a vertical cross-sectional view of the exemplary structure after formation of a source contact layer according to an embodiment of the present disclosure.
Figure 16B:
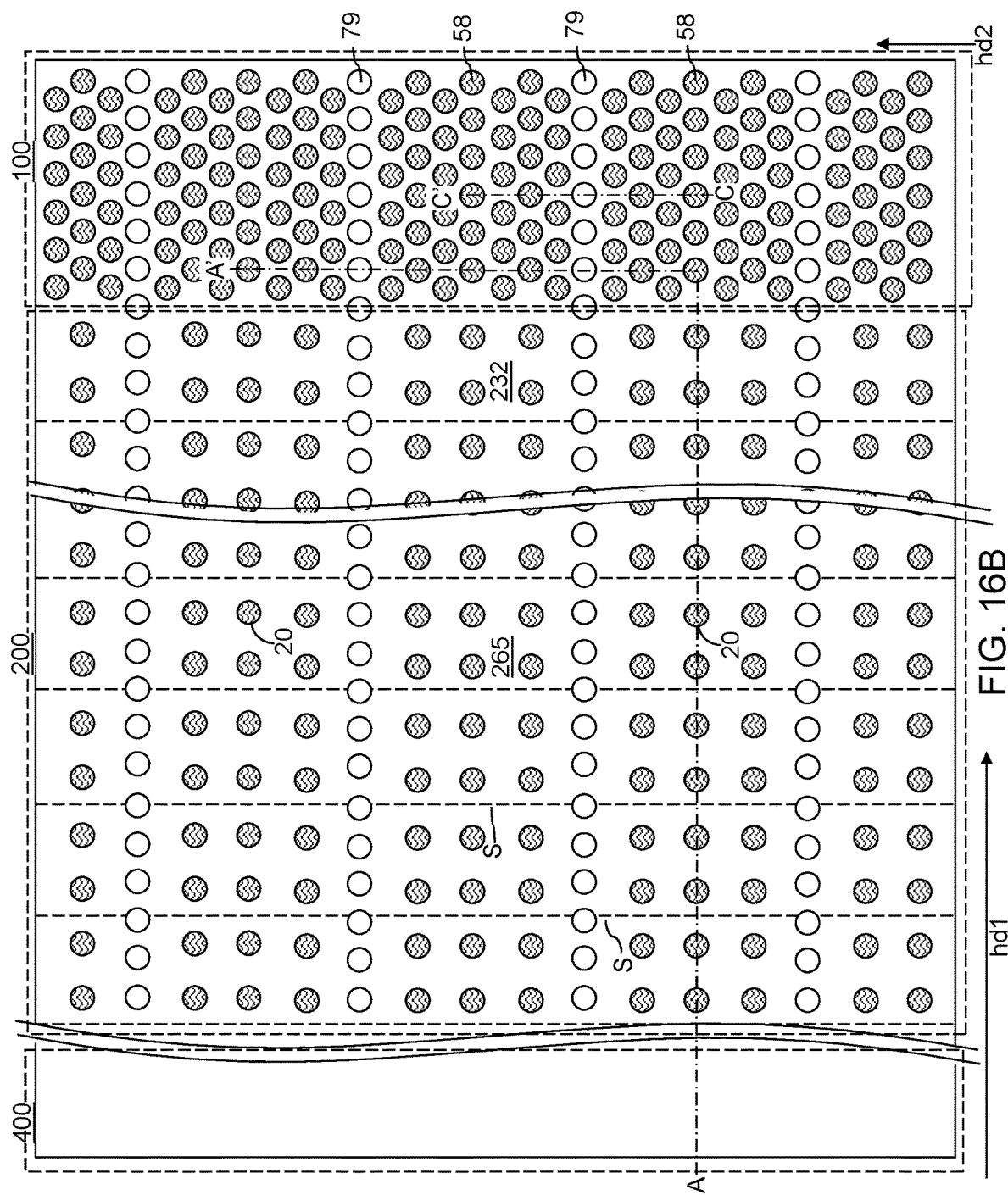
FIG. 16B is a horizontal cross-sectional of the exemplary structure along the horizontal plane B-B' of FIG. 16A. The hinged vertical plane A-A' corresponds to the plane of the vertical cross-sectional view of FIG. 16A.
Figure 16C:
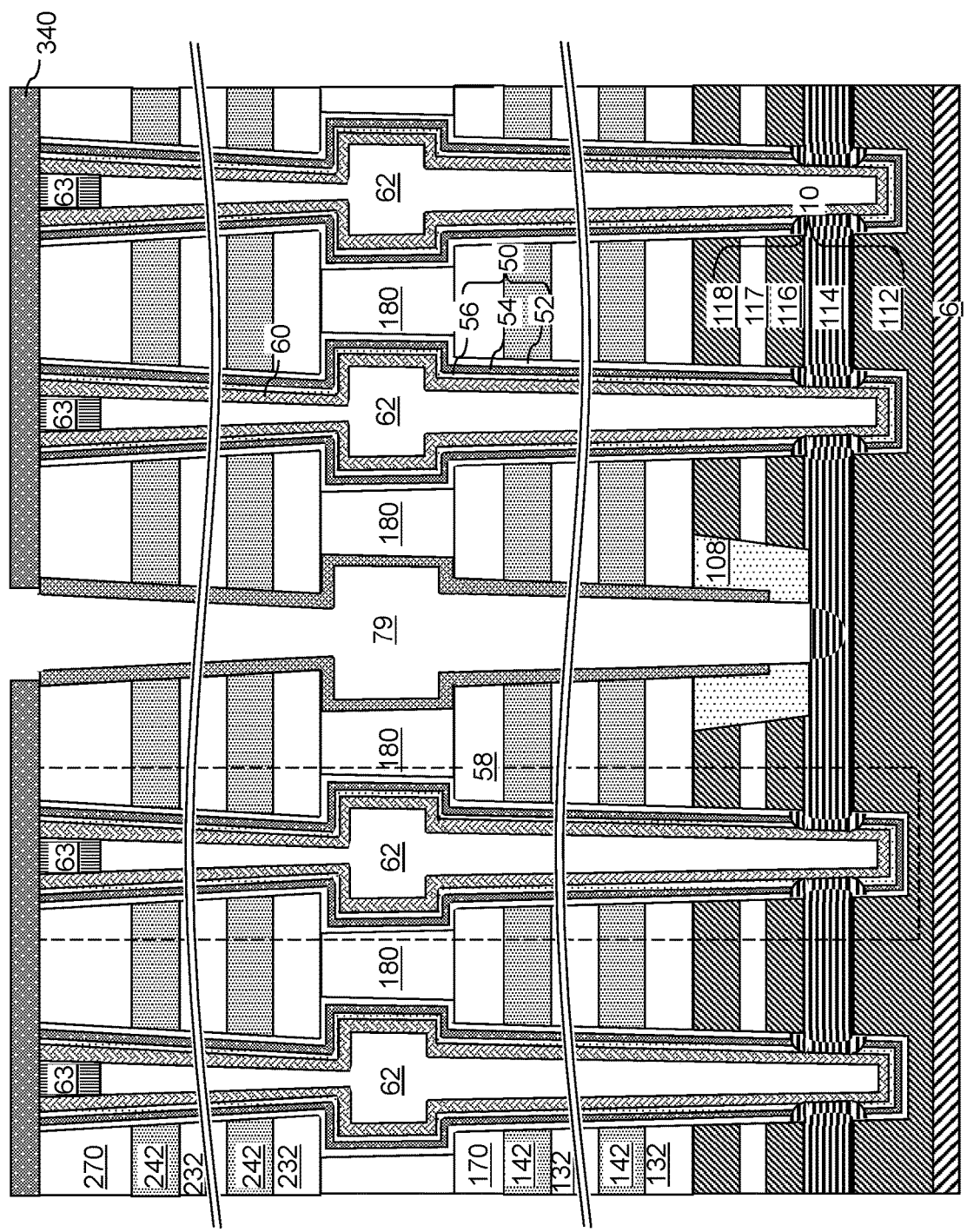
FIG. 16C is a vertical cross-sectional view of the exemplary structure along the vertical plane C-C' of FIG. 16B.
Figure 16D:
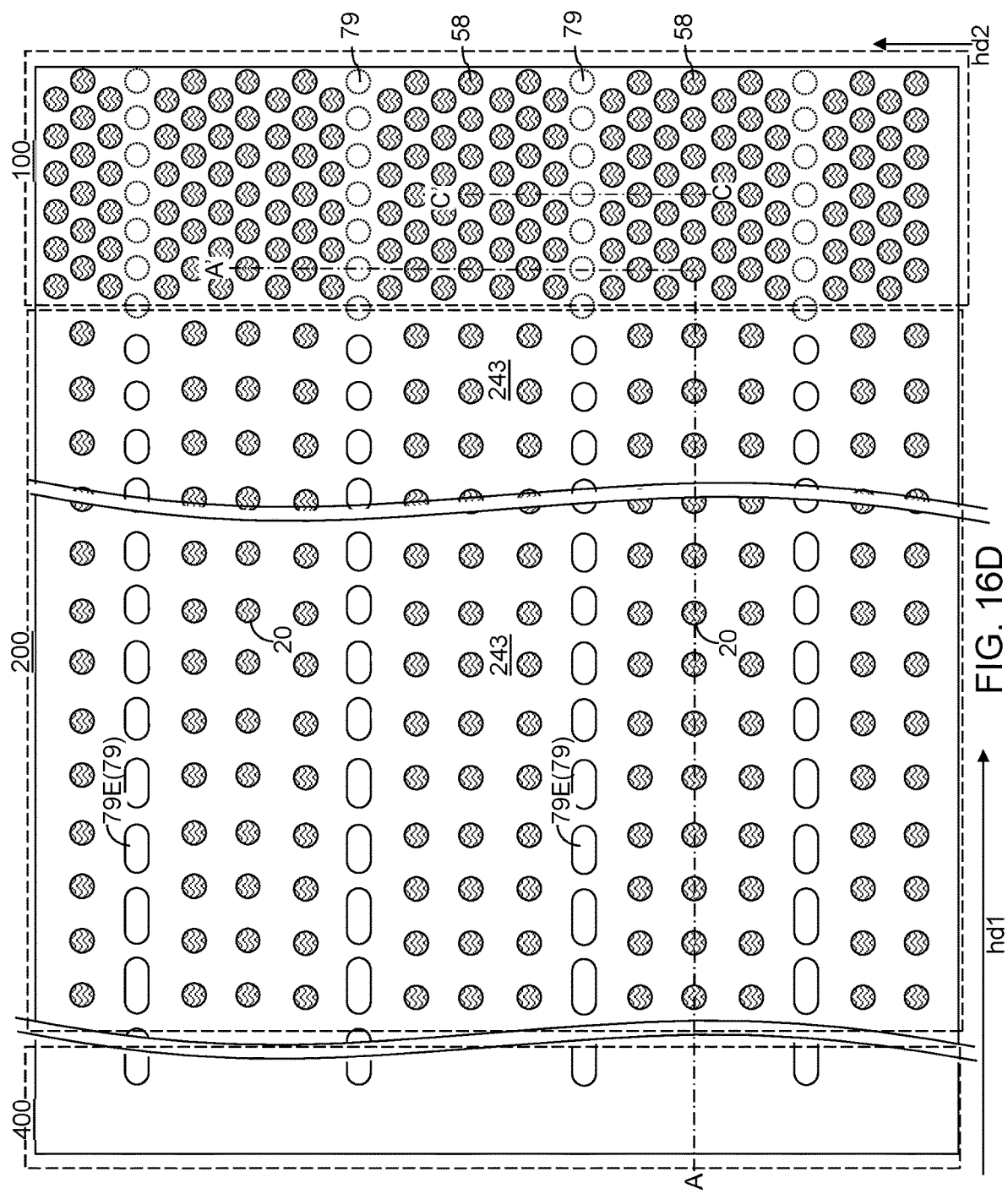
FIG. 16D is a horizontal cross-sectional view of the first alternative embodiment of the exemplary structure along the horizontal plane B-B' of FIG. 16A. The hinged vertical plane A-A' corresponds to the plane of the vertical cross-sectional view of FIG. 16A. The vertical plane C-C' corresponds the plane of the vertical cross-sectional view of FIG. 16C.
Figure 17A:
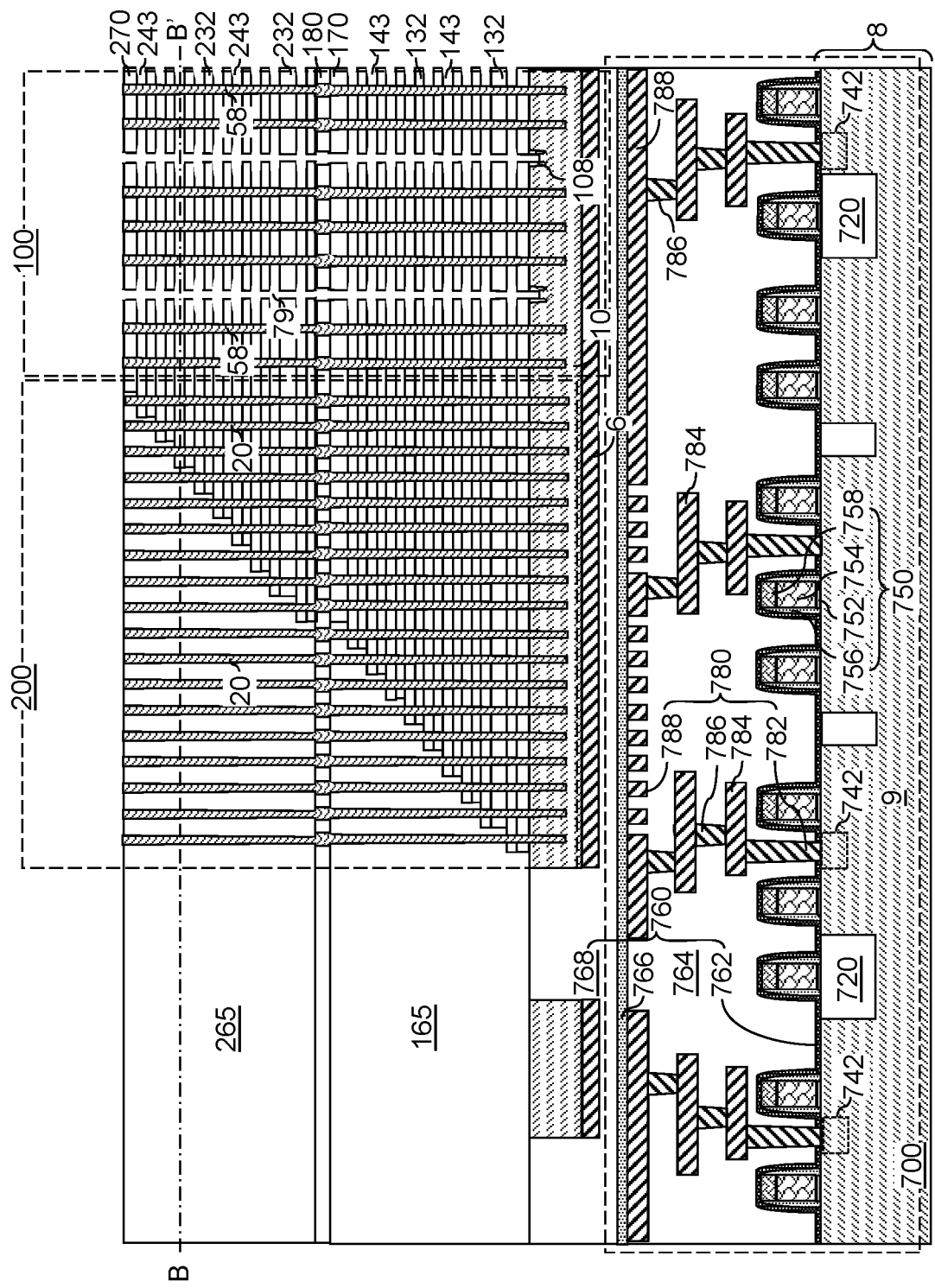
FIG. 17A is a vertical cross-sectional view of the exemplary structure after formation of backside recesses according to an embodiment of the present disclosure.
Figure 17B:
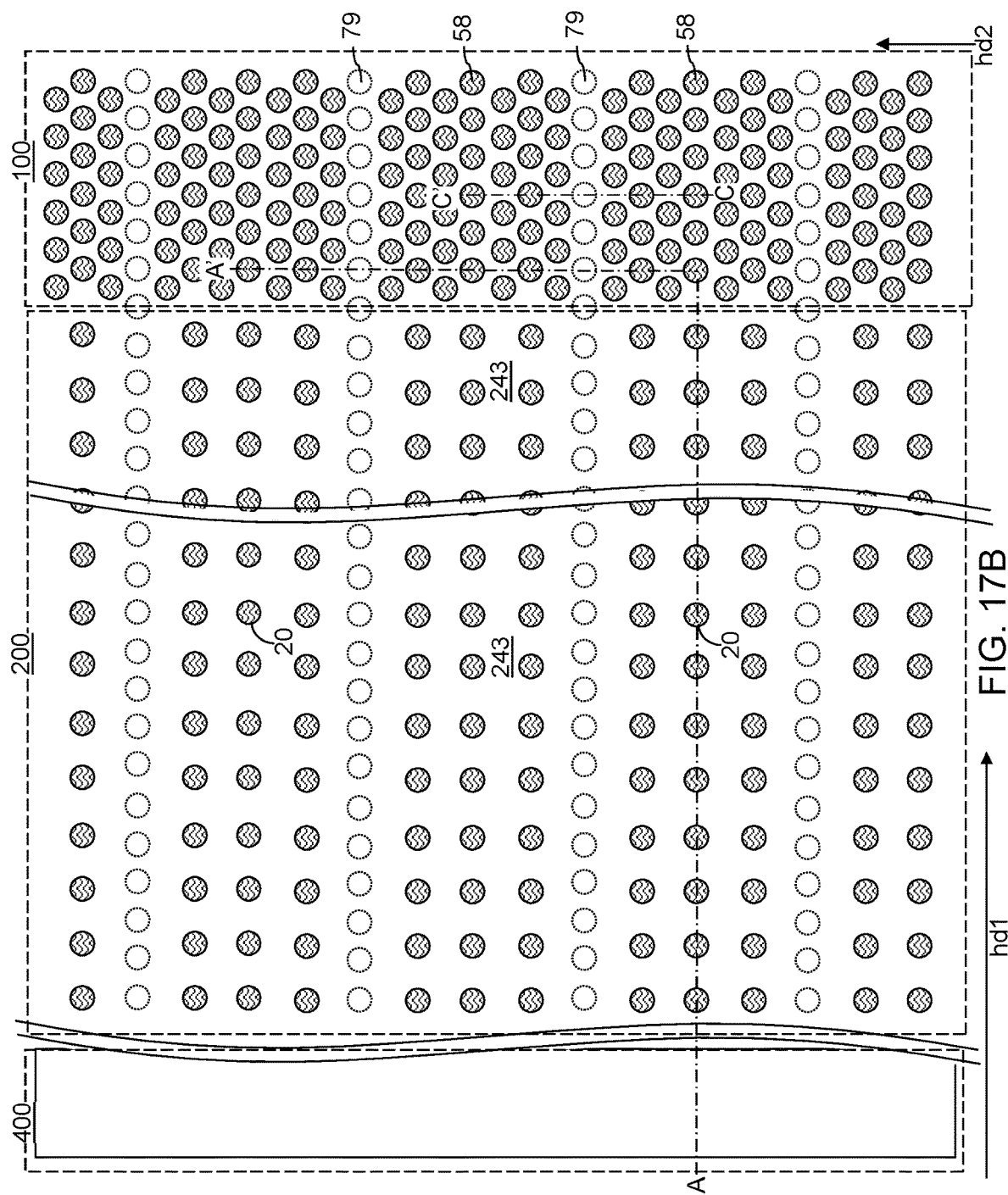
FIG. 17B is a horizontal cross-sectional of the exemplary structure along the horizontal plane B-B' of FIG. 17A. The hinged vertical plane A-A' corresponds to the plane of the vertical cross-sectional view of FIG. 17A.
Figure 17C:
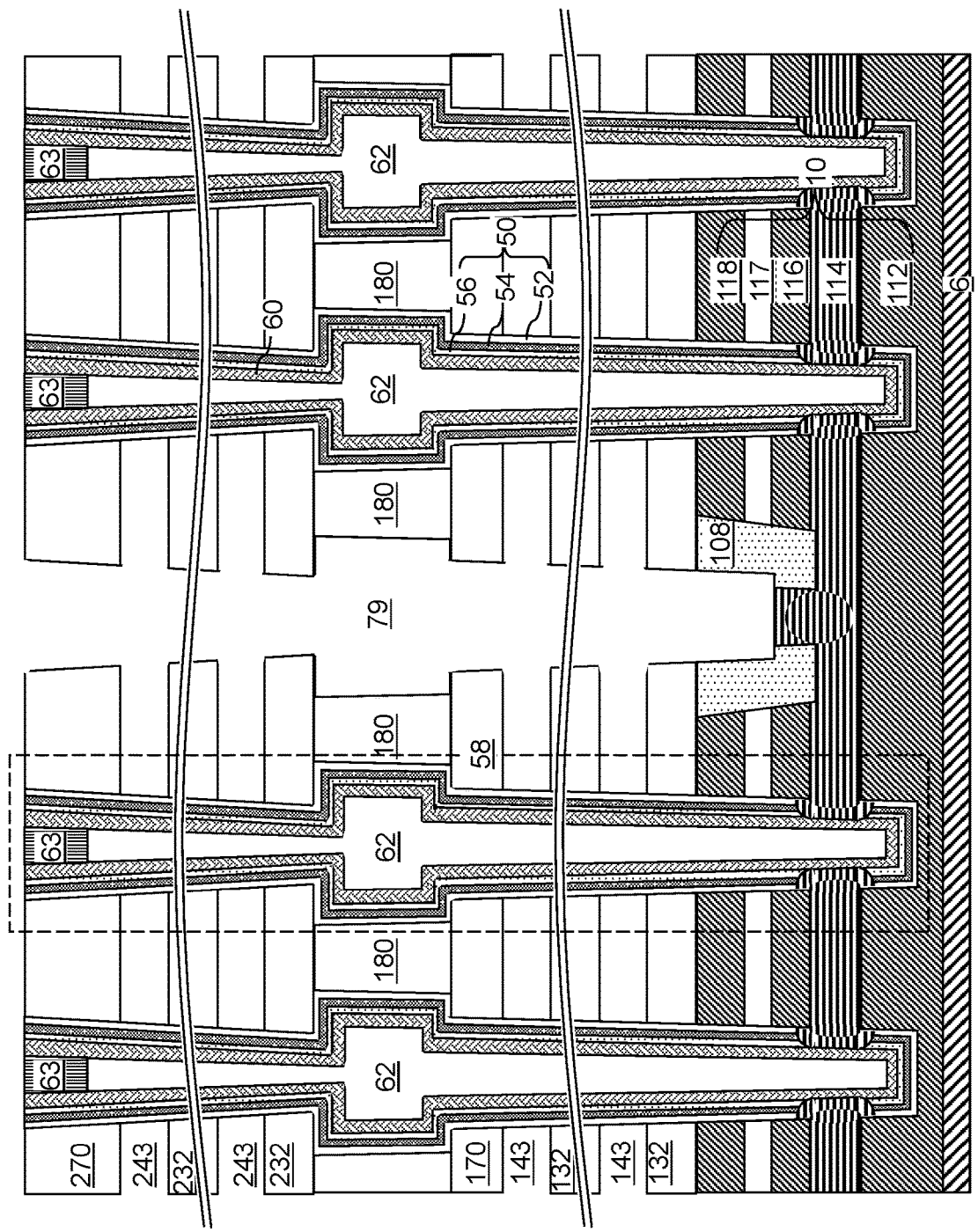
FIG. 17C is a vertical cross-sectional view of the exemplary structure along the vertical plane C-C' of FIG. 17B.
Figure 17D:
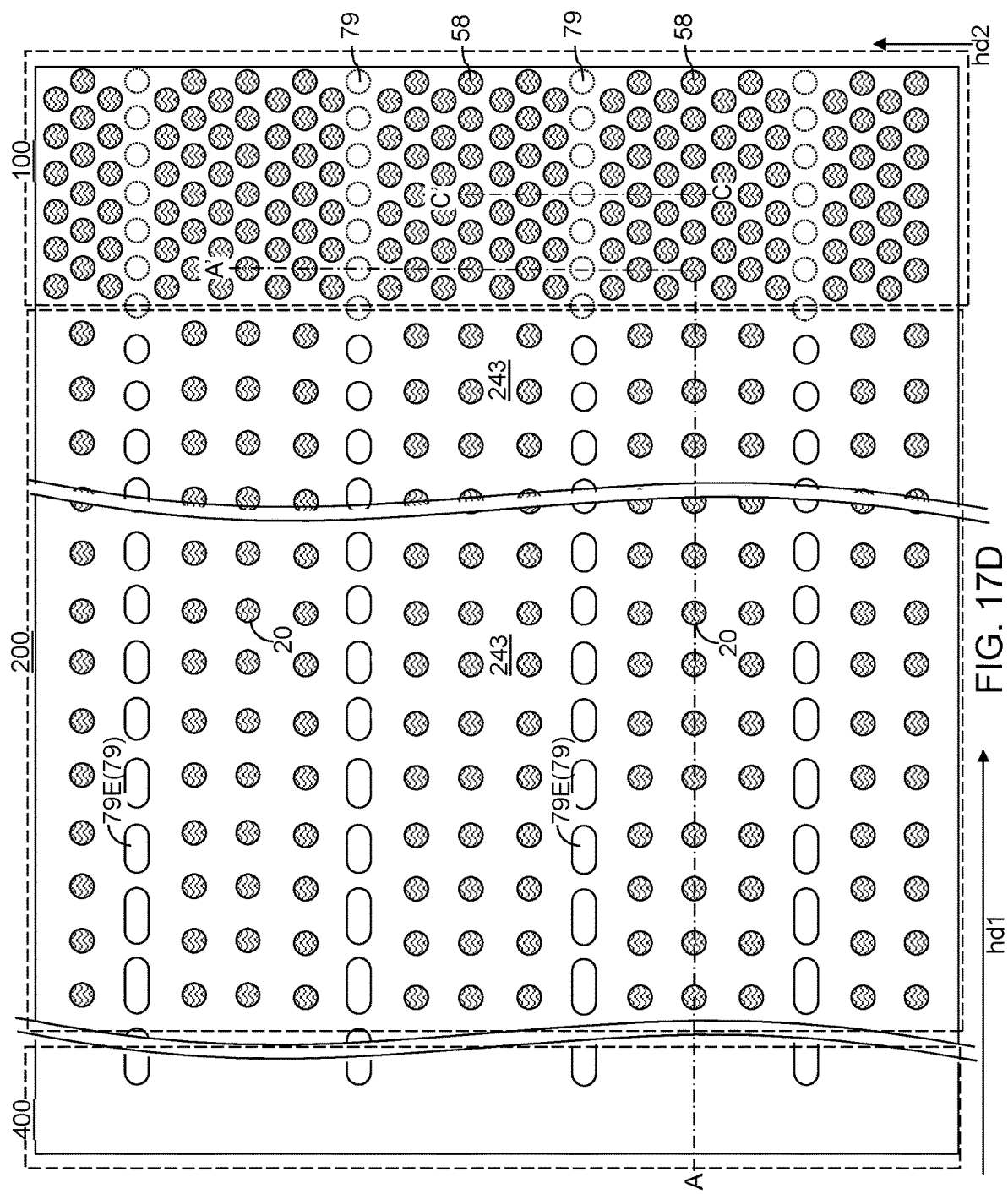
FIG. 17D is a horizontal cross-sectional view of the first alternative embodiment of the exemplary structure along the horizontal plane B-B' of FIG. 17A. The hinged vertical plane A-A' corresponds to the plane of the vertical cross-sectional view of FIG. 17A. The vertical plane C-C' corresponds the plane of the vertical cross-sectional view of FIG. 17C.
Figure 18A:
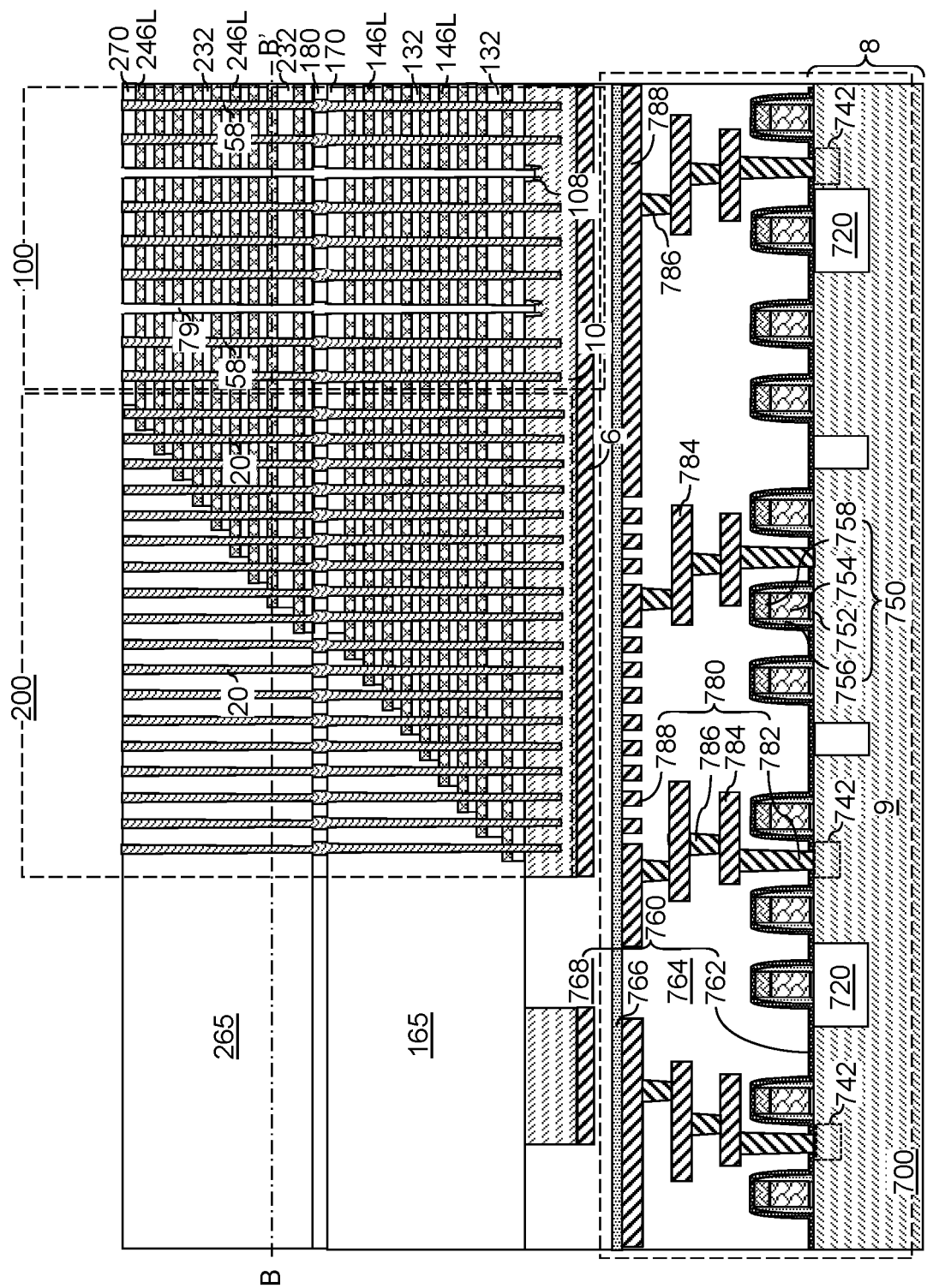
FIG. 18A is a vertical cross-sectional view of the exemplary structure after formation of electrically conductive layers according to an embodiment of the present disclosure.
Figure 18B:
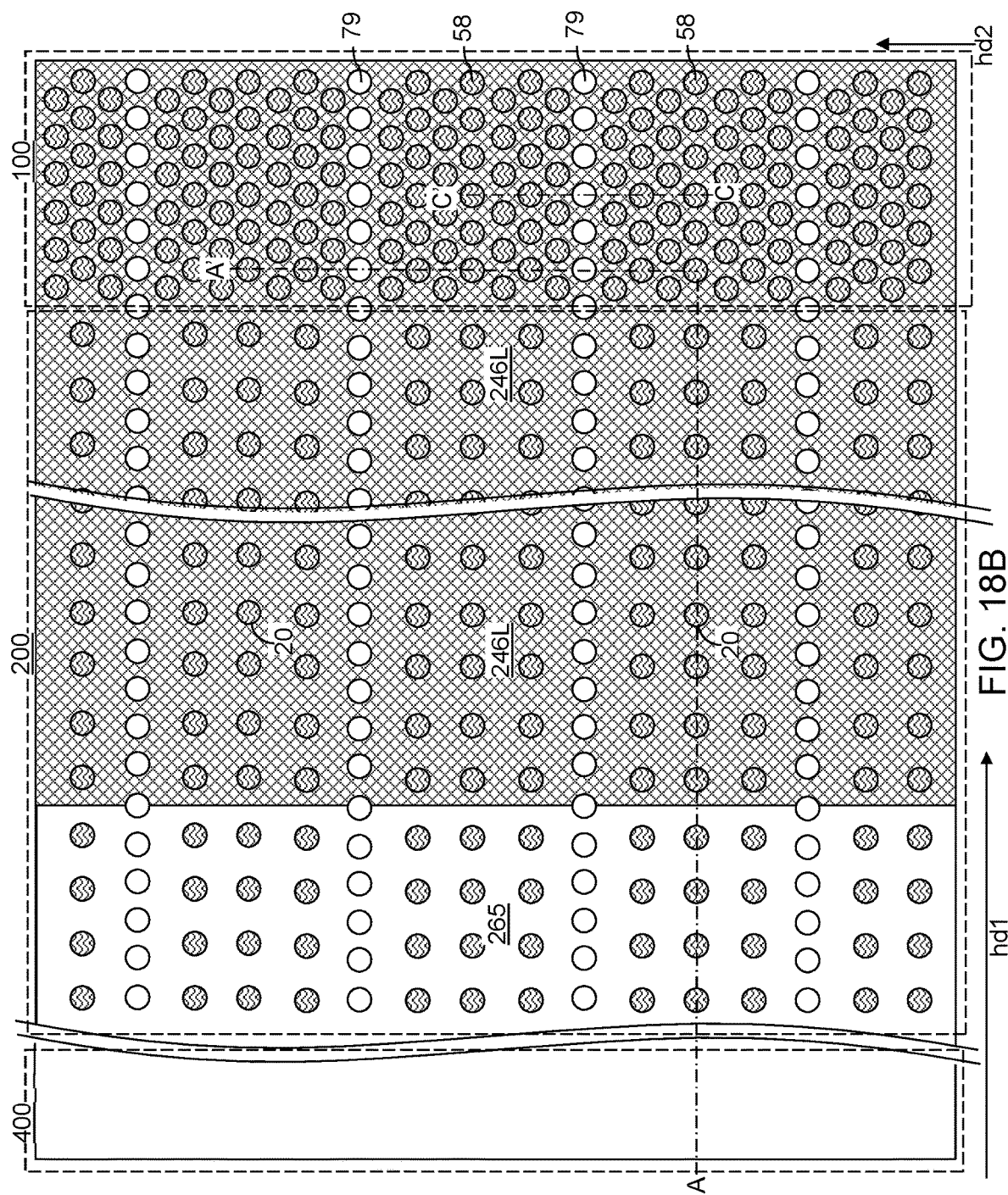
FIG. 18B is a horizontal cross-sectional of the exemplary structure along the horizontal plane B-B' of FIG. 18A. The hinged vertical plane A-A' corresponds to the plane of the vertical cross-sectional view of FIG. 18A.
Figure 18C:
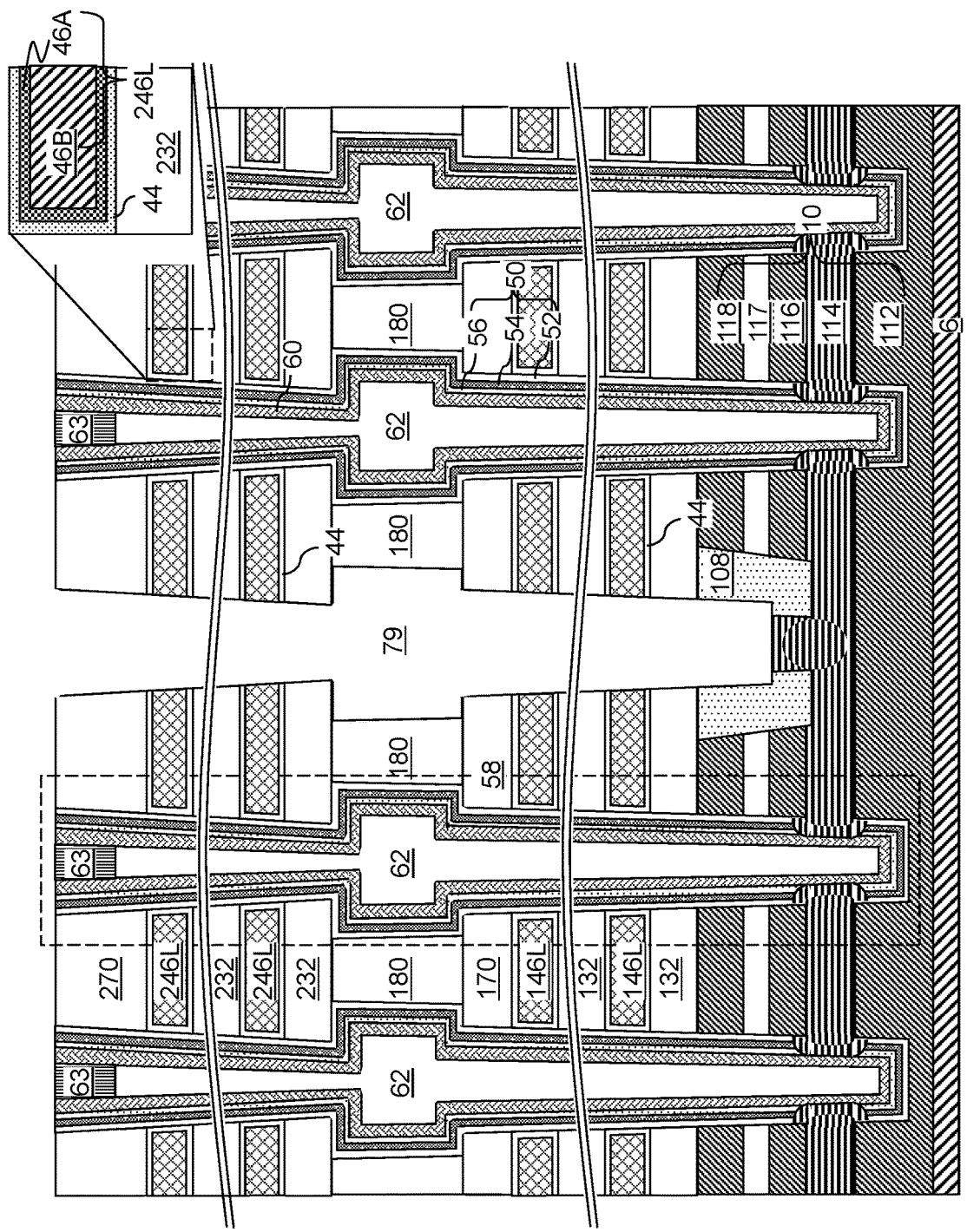
FIG. 18C is a vertical cross-sectional view of the exemplary structure along the vertical plane C-C' of FIG. 18B.

FIG. 16D illustrates an alternative embodiment of the present disclosure. The backside openings 79 may include elongated backside openings 79E that are formed in the staircase region 200. Horizontal cross-sectional shapes of the elongated backside openings 49E may match the shapes of the underlying first-tier backside opening fill portions 126B such that the bottom periphery of each elongated backside opening 49E may be laterally offset inward from the periphery of the top surface of an underlying first-tier backside opening fill portion 126B by an offset distance. Thus, the elongated backside openings 49E may be arranged in rows that laterally extend along the first horizontal direction hd1, and the elongated backside openings 49E may have a variable lateral extent that changes along the first horizontal direction hd1. Specifically, the variable lateral extent may be the maximum lateral dimension of respective elongated backside openings 49E along the first horizontal direction hd1.

In one embodiment, the elongated backside openings 49E may be modified in the staircase region 200 such that the lateral dimensions of the elongated backside openings 49E along the first horizontal direction hd1 may gradually increase with a lateral distance from the memory array region 100. The elongated backside openings 49E may be elongated more along the first horizontal direction hd1 with an increase in the lateral distance from the memory array region 100. In one embodiment, the elongated backside openings 49E in the memory array region 100 may have substantially circular horizontal cross-sectional shapes, and the elongated backside openings 49E in the staircase regions may have elongated horizontal cross-sectional shapes having a greater maximum lateral dimension along the first horizontal direction hd1 than a maximum lateral dimension along the second horizontal direction hd2. The ratio of the maximum lateral dimension along the first horizontal direction hd1 to the maximum lateral dimension along the second horizontal direction hd2 may monotonically increase with the lateral distance of the second-tier backside opening 249B from the memory array region 100.

In one embodiment, the elongated backside openings 49E may be arranged in rows that extend along the first horizontal direction hd1 and are laterally spaced apart along the second horizontal direction hd2. Elongated backside openings 49E located within a same row may be laterally spaced apart by a same spacing along the first horizontal direction hd1. The length-to-width ratio, i.e., the ratio of the maximum dimension along the first horizontal direction hd1 to the maximum dimension along the second horizontal dimension hd2, for the elongated backside openings 49E may be 1.0 in the memory array region 100, and may monotonically, and/or strictly, increase with a lateral distance from the memory array region 100 along the first horizontal direction hd1 within the area of the staircase region 200. The maximum value for the length-to-width ratio of the elongated backside openings 49E may be in a range from 2.0 to 20, such as from 4.0 to 20, although lesser and greater maximum values may also be used. In one embodiment, each of the elongated backside openings 49E may have the same maximum lateral dimension along the second horizontal direction hd2. In this case, the length-to-width ratios of the elongated backside openings 49E may be greater than 2.0 in the staircase region 200 by having a respective maximum lateral dimension along the first horizontal direction hd1 that is greater than the maximum lateral dimension along the second horizontal direction hd2.

Referring to FIGS. 17A-17D, the first sacrificial liners 125 and the second sacrificial liners 225 may be removed selective to the materials of the first and second insulating layers (132, 232), the first and second insulating cap layers (170, 270), the inter-tier dielectric layer 180, and the dielectric etch stop material portions 108 by an isotropic etch process. For example, a wet etch process using hot phosphoric acid may be used to remove the first sacrificial liners 125 and the second sacrificial liners 225. The second hard mask layer 340 may be collaterally removed during removal of the first sacrificial liners 125 and the second sacrificial liners 225. The backside openings 79 are cavities that are formed in volumes of the backside openings (149B, 249B) by removing the sacrificial backside opening fill structures (126B, 226B), the first sacrificial liners 125, and the second sacrificial liners 225.

Subsequently, remaining portions of the sacrificial material layers (142, 242) are replaced with material portions including electrically conductive layers. For example, an etchant that selectively etches the materials of the first and second sacrificial material layers (142, 242) with respect to the materials of the first and second insulating layers (132, 232), the first and second insulating cap layers (170, 270), the inter-tier insulating layer 180, the first and second retro-stepped dielectric material portions (165, 265), and the material of the outermost layer of the memory films 50 may be introduced into the backside openings 79, for example, using an isotropic etch process. For example, the first and second sacrificial material layers (142, 242) may include silicon nitride, the materials of the first and second insulating layers (132, 232), the first and second insulating cap layers (170, 270), the material of the inter-tier insulating layer 180, the material of the first and second retro-stepped dielectric material portions (165, 265), and the material of the outermost layer of the memory films 50 may include silicon oxide materials.

The isotropic etch process may be a wet etch process using a wet etch solution, or may be a gas phase (dry) etch process in which the etchant is introduced in a vapor phase into the backside opening 79. For example, if the first and second sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. In case the sacrificial material layers (142, 242) comprise a semiconductor material, a wet etch process (which may use a wet etchant such as a KOH solution) or a dry etch process (which may include gas phase HCl) may be used.

Each of the first and second backside recesses (143, 243) may be a laterally extending cavity having a lateral dimension that is greater than the vertical extent of the cavity. In other words, the lateral dimension of each of the first and second backside recesses (143, 243) may be greater than the height of the respective backside recess (143, 243). A plurality of first backside recesses 143 may be formed in the volumes from which the material of the first sacrificial material layers 142 is removed. A plurality of second backside recesses 243 may be formed in the volumes from which the material of the second sacrificial material layers 242 is removed. Each of the first and second backside recesses (143, 243) may extend substantially parallel to the top surface of the substrate 8. A backside recess (143, 243) may be vertically bounded by a top surface of an underlying insulating layer (132 or 232) and a bottom surface of an overlying insulating layer (132 or 232). In one embodiment, each of the first and second backside recesses (243, 243) may have a uniform height throughout.

Referring to FIGS. 18A-18D, a backside blocking dielectric layer 44 may be optionally deposited in the backside recesses (143, 243) and the backside openings 79 and over the contact level dielectric layer 280. The backside blocking dielectric layer 44 may be deposited on the physically exposed portions of the outer surfaces of the memory stack structures 55, which are portions of the memory opening fill structures 58. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material (46A, 46B) may be deposited in the plurality of backside recesses (243, 243), on the sidewalls of the backside opening 79, and over the contact level dielectric layer 280. The at least one conductive material (46A, 46B) may be deposited by a conformal deposition method, which may be, for example, chemical vapor deposition (CVD), atomic layer deposition (ALD), electroless plating, electroplating, or a combination thereof. The at least one conductive material (46A, 46B) may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material (46A, 46B) may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material (46A, 46B) may include a conductive metallic nitride liner 46A that includes a conductive metallic nitride material such as TiN, TaN, WN, or a combination thereof, and a conductive fill material 46B such as W, Co, Ru, Mo, Cu, or combinations thereof. In one embodiment, the at least one conductive material (46A, 46B) for filling the backside recesses (143, 243) may be a combination of titanium nitride layer and a tungsten fill material.

Electrically conductive layers (146L, 246L) may be formed in the backside recesses (143, 243) by deposition of the at least one conductive material (46A, 46B). A plurality of first electrically conductive layers 146L may be formed in the plurality of first backside recesses 143, a plurality of second electrically conductive layers 246L may be formed in the plurality of second backside recesses 243, and a continuous metallic material layer (not shown) may be formed on the sidewalls of each backside opening 79 and over the contact level dielectric layer 280. Each of the first electrically conductive layers 146L and the second electrically conductive layers 246L may include a respective conductive metallic nitride liner 46A and a respective conductive fill material 46B. Thus, the first and second sacrificial material layers (142, 242) may be replaced with the first and second electrically conductive layers (146L, 246L), respectively. Specifically, each first sacrificial material layer 142 may be replaced with an optional portion of the backside blocking dielectric layer and a first electrically conductive layer 146L, and each second sacrificial material layer 242 may be replaced with an optional portion of the backside blocking dielectric layer and a second electrically conductive layer 246L. A backside cavity is present in the portion of each backside opening 79 that is not filled with the continuous metallic material layer.

Residual conductive material may be removed from inside the backside openings 79. Specifically, the deposited metallic material of the continuous metallic material layer may be etched back from the sidewalls of each backside opening 79 and from above the contact level dielectric layer 280, for example, by an anisotropic or isotropic etch. Each remaining portion of the deposited metallic material in the first backside recesses constitutes a first electrically conductive layer 146L. Each remaining portion of the deposited metallic material in the second backside recesses constitutes a second electrically conductive layer 246L.

Each electrically conductive layer (146L, 246L) may be a conductive sheet including openings therein. A first subset of the openings through each electrically conductive layer (146L, 246L) may be filled with memory opening fill structures 58. A second subset of the openings through each electrically conductive layer (146L, 246L) may be filled with the support pillar structures 20. A third subset of the openings through each electrically conductive layer (146L, 246L) may include backside openings 79. Each electrically conductive layer (146L, 246L) may have a lesser area than any underlying electrically conductive layer (146L, 246L) because of the first and second stepped surfaces. Each electrically conductive layer (146L, 246L) may have a greater area than any overlying electrically conductive layer (146L, 246L) because of the first and second stepped surfaces.

In some embodiment, drain-select-level isolation structures (not illustrated) may be provided at topmost levels of the second electrically conductive layers 246L. A subset of the second electrically conductive layers 246L located at the levels of the drain-select-level isolation structures constitutes drain select gate electrodes. A subset of the electrically conductive layer (146L, 246L) located underneath the drain select gate electrodes may function as combinations of a control gate and a word line located at the same level. The control gate electrodes within each electrically conductive layer (146L, 246L) are the control gate electrodes for a vertical memory device including the memory stack structure 55.

Each of the memory stack structures 55 comprises a vertical stack of memory elements located at each level of the electrically conductive layers (146L, 246L). A subset of the electrically conductive layers (146L, 246L) may comprise word lines for the memory elements. The semiconductor devices in the underlying peripheral region 700 may comprise word line switch devices configured to control a bias voltage to respective word lines. The memory-level assembly is located over the substrate semiconductor layer 9. The memory-level assembly includes at least one alternating stack (132, 146L, 232, 246L) and memory stack structures 55 vertically extending through the at least one alternating stack (132, 146L, 232, 246L). Each of the at least one an alternating stack (132, 146L, 232, 246L) includes alternating layers of respective insulating layers (132 or 232) and respective electrically conductive layers (146 or 246L). The at least one alternating stack (132, 146L, 232, 246L) comprises staircase regions that include terraces in which each underlying electrically conductive layer (146L, 246L) extends farther along the first horizontal direction hd1 than any overlying electrically conductive layer (146L, 246L) in the memory-level assembly. The first sacrificial material layers 142 are replaced with material portions including the first electrically conductive layers 146L and a subset of the backside blocking dielectric layers 44. The second sacrificial material layers 142 are replaced with material portions including the second electrically conductive layers 246L and another subset of the backside blocking dielectric layers 44. Thus, each electrically conductive layer (146L, 246L) may be formed as a continuous material layer including multiple rows of holes, which are the multiple rows of backside openings 79.

Generally, remaining portions of the sacrificial material layers (142, 242) may be replaced with electrically conductive layers (146, 246) by introducing an isotropic etchant that etches the remaining portions of the sacrificial material layers through the backside openings and subsequently introducing a precursor material for deposition of the electrically conductive layers (146, 246) thorough the backside openings 79. Each electrically conductive layer (146, 246) may be formed as a continuous material layer including holes around the backside openings 79.

Referring to FIGS. 19A-19F, each electrically conductive layer (146L, 246L) may be singulated (i.e., divided) into a plurality of electrically conductive strips (146, 246) by isotropically recessing the electrically conductive layers (146L, 246L) around each backside opening 79. As used herein, an "electrically conductive strip" refers to an electrically conductive layer that laterally extends along a lengthwise direction such as the first horizontal direction hd1. Specifically, the at least one conductive material (46A, 46B) may be isotropically etched around each backside opening 79. An isotropic etch process (such as a wet etch process) that etches the at least one conductive material (46A, 46B) selective to the materials of the first and second insulating layers (132, 142) may be used. The duration of the isotropic etch process may be selected such that the lateral recess distance of the isotropic etch process is greater than one half of the spacing between neighboring pairs of backside openings 79 in the rows of the backside openings 79. Thus, each electrically conductive layer (146L, 246L) may be divided into multiple electrically conductive strips (146, 246) that are laterally spaced apart along the second horizontal direction hd2. Specifically, each of the first electrically conductive layers 146L may be divided into multiple discrete first electrically conductive strips 146 having a respective pair of serrated sidewalls. Each of the second electrically conductive layers 246L may be divided into multiple discrete second electrically conductive strips 246 having a respective pair of serrated sidewalls.

Each serrated sidewall of the first and second electrically conductive strips (146, 246) may include a laterally adjoined plurality of vertical concave sidewall segments that are adjoined to one or two neighboring concave sidewall segments at vertically extending edges. In case the backside openings 79 have circular shapes at the processing steps of FIGS. 18A-18C, the vertical concave sidewall segments may have a same radius of curvature, which is greater than one half of the pitch of the backside openings 79 along the first horizontal direction hd1 at the processing steps of FIGS. 18A-18C within each row of backside openings 79. Each first electrically conductive strip 146 is electrically and physically isolated from neighboring first electrically conductive strips 146 located at the same level. Likewise, each second electrically conductive strip 246 is electrically and physically isolated from neighboring second electrically conductive strip 246 located at the same level. Width-modulated cavities 79' extending along the first horizontal direction with a periodic width modulation is formed. The width-modulated cavities 79' include expanded volumes of the backside openings 79 within a row of backside openings 79 as provided at the processing steps of FIGS. 18A-18C. The width-modulated cavities 79' are formed by isotropically etching the at least one conductive material of the electrically conductive layers (146L, 246L) selective to materials of the insulating layers (132, 232) and the retro-stepped dielectric material portions (165, 265).

Figure 19A:
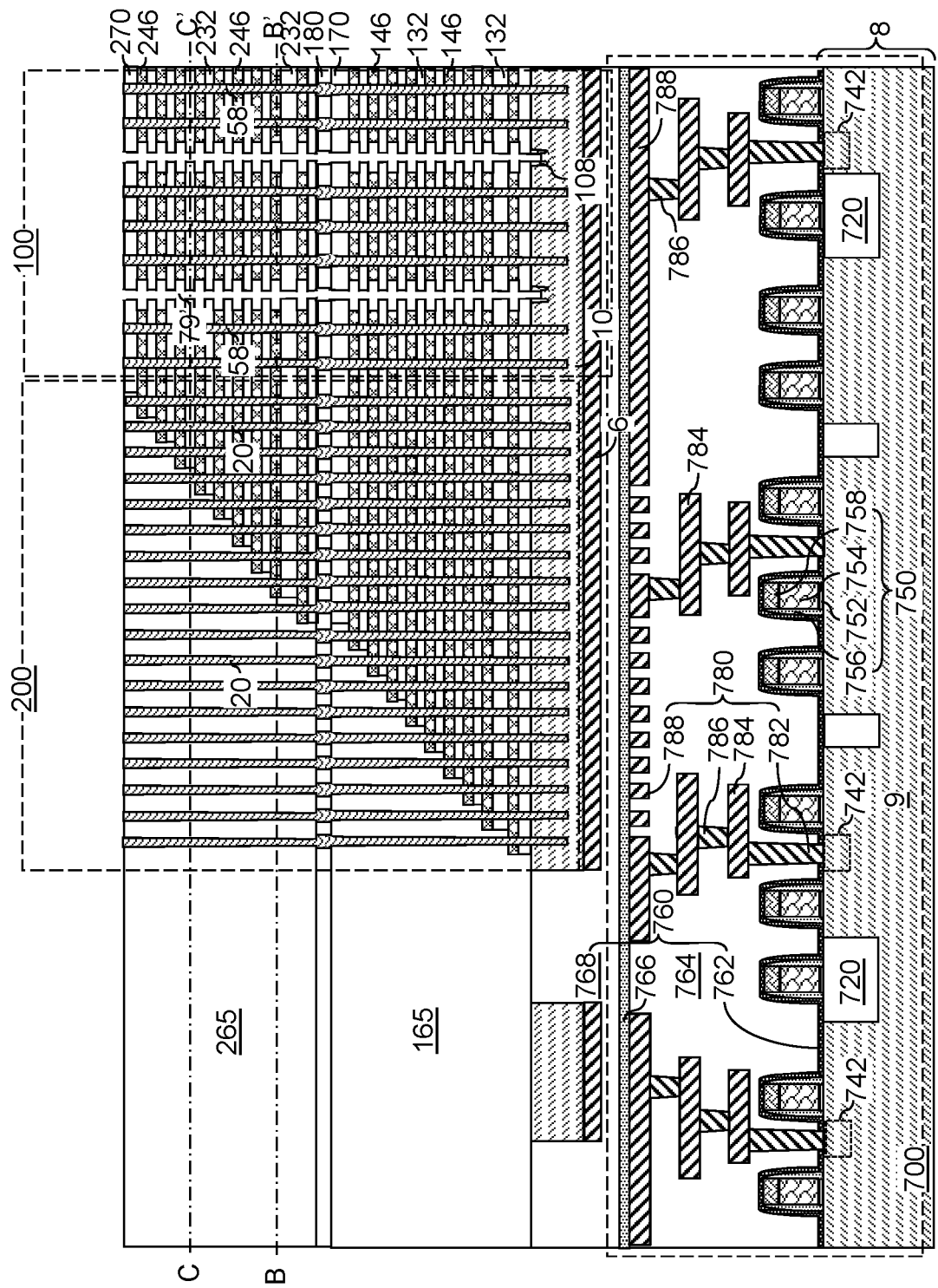
FIG. 19A is a vertical cross-sectional view of the exemplary structure after formation of electrically conductive strips by laterally recessing the electrically conductive layers according to an embodiment of the present disclosure.
Figure 19B:
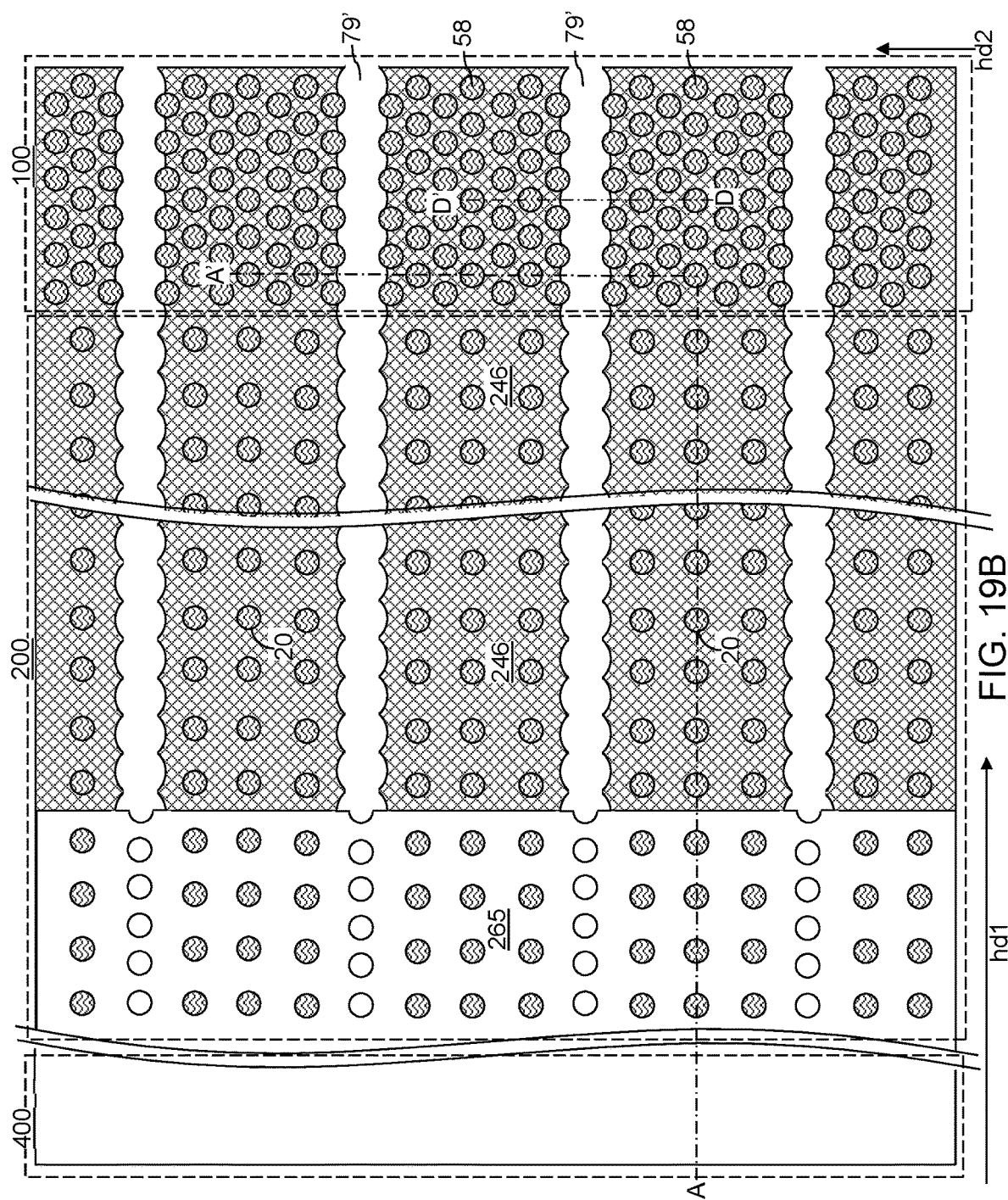
FIGS. 19B and 19C are horizontal cross-sectional of the exemplary structure along the horizontal planes B-B' and C-C' of FIG. 19A. The hinged vertical plane A-A' corresponds to the plane of the vertical cross-sectional view of FIG. 19A.
Figure 19C:
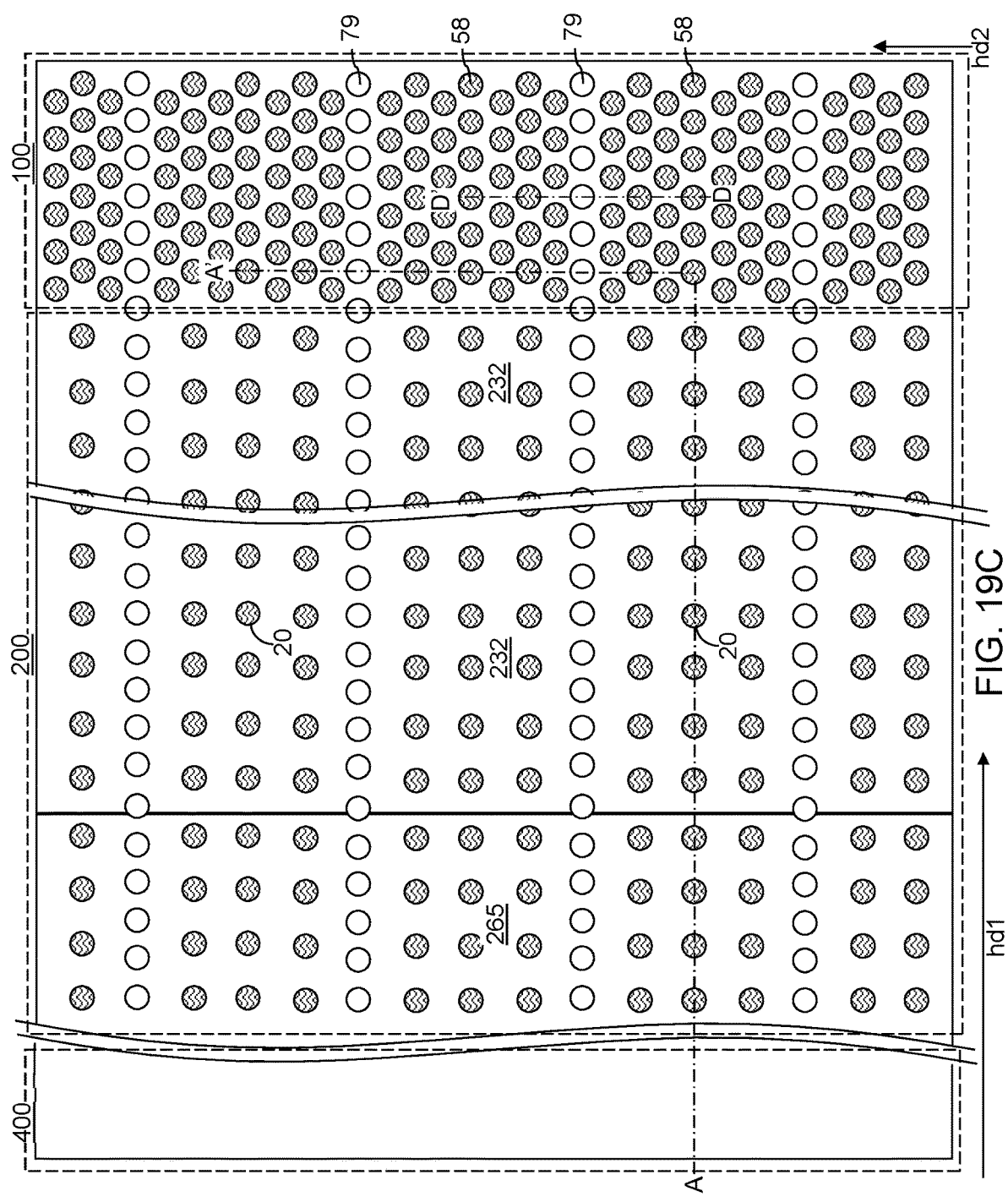
Figure 19D:
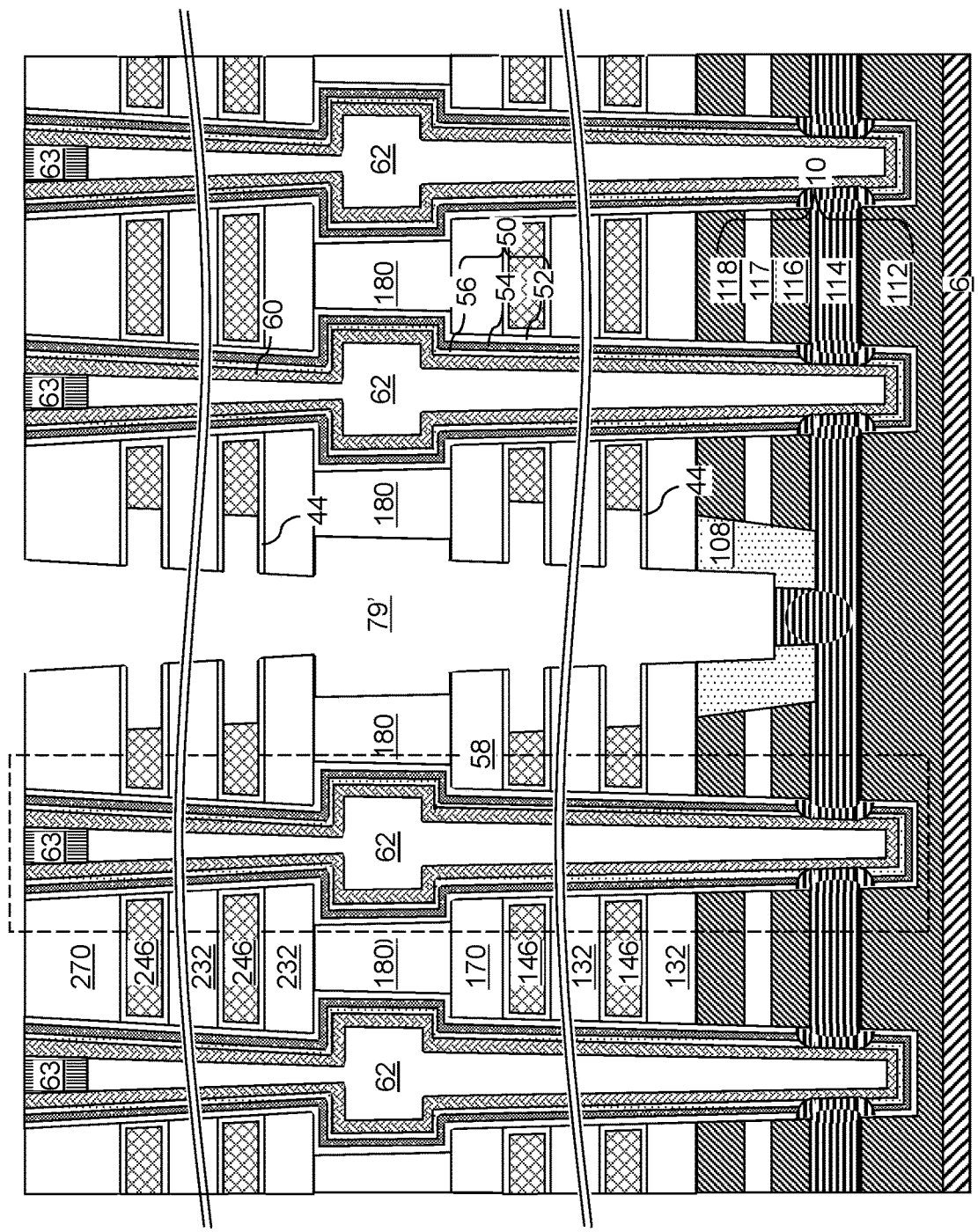
FIG. 19D is a vertical cross-sectional view of the exemplary structure along the vertical plane D-D' of FIGS. 19B and 19C.
Figure 19E:
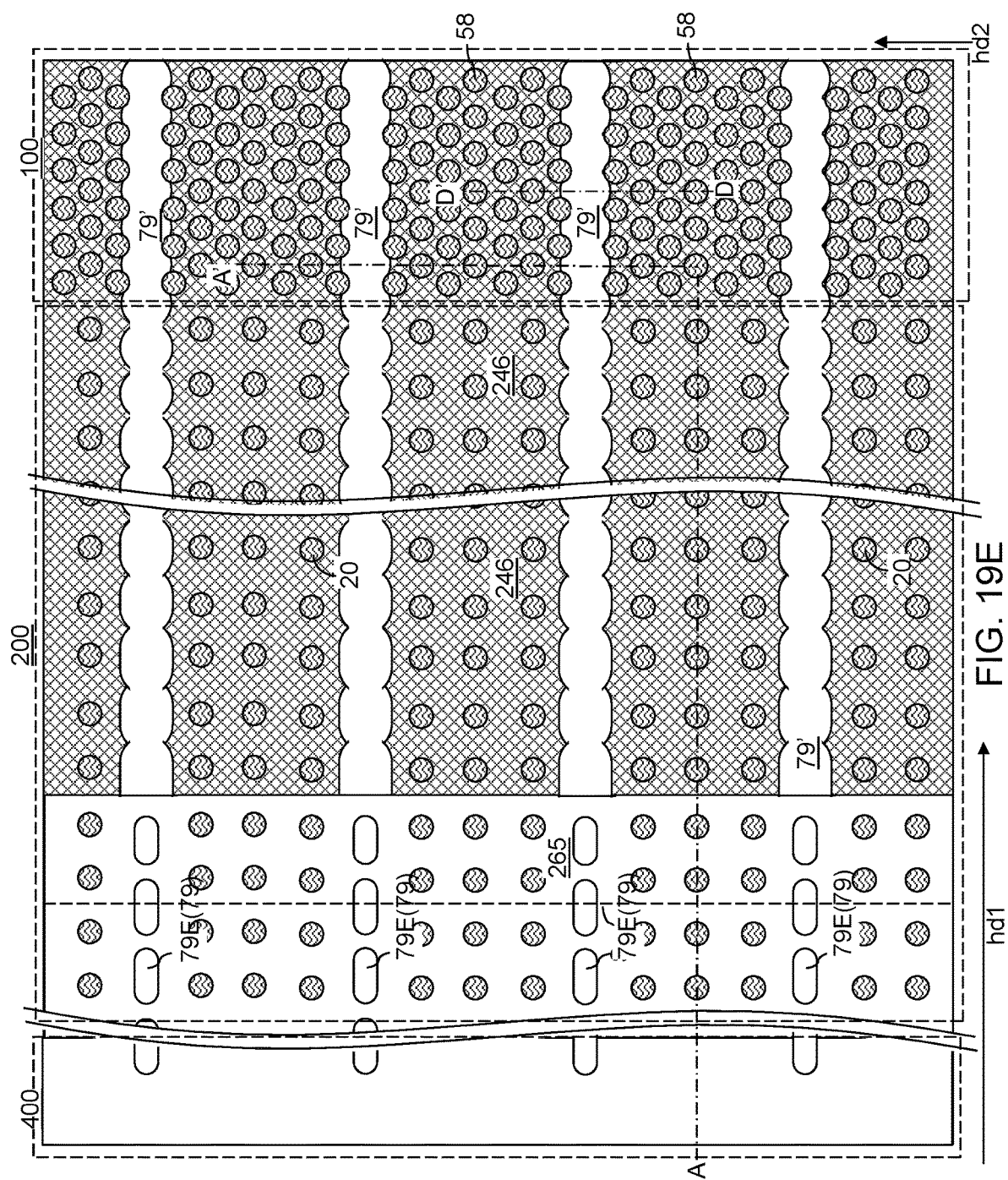
FIGS. 19E and 19F are horizontal cross-sectional views of the first alternative embodiment of the exemplary structure along the horizontal planes B-B' and C-C' of FIG. 19A, respectively. The hinged vertical plane A-A' corresponds to the plane of the vertical cross-sectional view of FIG. 19A. The vertical plane C-C' corresponds the plane of the vertical cross-sectional view of FIG. 19C.
Figure 19F:
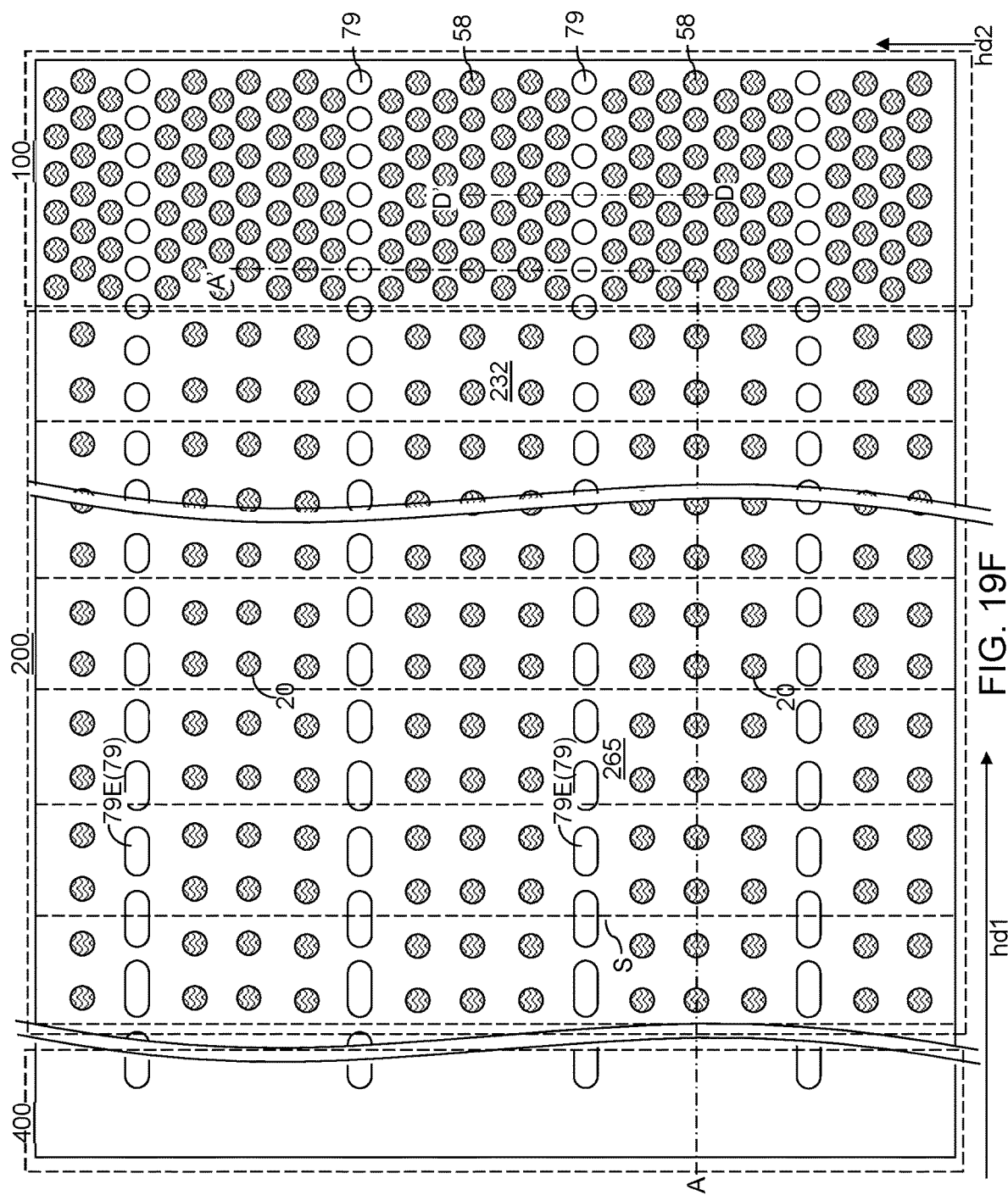

In other words, as shown in FIG. 19B, the backside openings 79 are expanded and merged together into width-modulated cavities 79' at the levels of the electrically conductive layers (146L, 246L). Thus, the width-modulated cavities 79' comprise trenches which extend into the first horizontal direction hd1 and separate the electrically conductive layers (146L, 246L) into the discrete electrically conductive strips (146, 246). In contrast, as shown in FIG. 19C, the backside openings 79 are not significantly expanded and are not merged into continuous trenches at the levels of the insulating layers (132, 232). Thus, the insulating layers (132, 233) are not separated into discrete strips and remain as continuous insulating layers containing perforations at the locations of the backside openings 79 and the memory openings 49. Thus, each alternating stack includes discrete electrically conductive strips which are separated from each other in the vertical direction by continuous insulating layers. Each continuous perforated insulating layer (132, 232) overlies and/or underlies plural discrete electrically conductive strips (146, 246) located in the same vertical level (i.e., located equidistant from the top of the substrate 8).

Each of the electrically conductive strips (146, 246) include a pair of laterally undulating lengthwise sidewalls that generally extend along the first horizontal direction hd1 and a straight widthwise sidewall that extends along the second horizontal direction hd2 that is perpendicular to the first horizontal direction hd1. The straight sidewall may be spaced from the first retro-stepped dielectric material portion 165 or the second retro-stepped dielectric material portion 265 by a backside blocking dielectric layer 44. Alternatively, if the backside blocking dielectric layer 44 is omitted, the straight sidewall may contact the first retro-stepped dielectric material portion 165 or the second retro-stepped dielectric material portion 265. Each of the laterally undulating lengthwise sidewalls of the electrically conductive strips (146, 246) may include a plurality of concave vertical sidewalls that are adjoined to one another along vertical edges.

Generally, the width-modulated cavities 79' may be formed by isotropically etching a conductive material of the electrically conductive layers (146, 246) selective to materials of the insulating layers (132, 232) and the retro-stepped dielectric material portions (165, 265). The backside openings 79 may be expanded and merged together into width-modulated cavities 79' at levels of the electrically conductive layers (146, 246). Each electrically conductive layer (146, 246) may be singulated into a plurality of electrically conductive strips by isotropically recessing the electrically conductive layers (146, 246) around each backside opening 79 to form width-modulated cavities 79' including expanded volumes of the backside openings 79. The width-modulated cavities 79' at the levels of the electrically conductive layers (146, 246) comprise continuous trenches that extend along the first horizontal direction hd1 and separate the electrically conductive layers (146 246) into the electrically conductive strips. The backside openings 79 are not merged into continuous trenches at levels of the insulating layers (132, 232). Each of the electrically conductive strips include a pair of laterally undulating lengthwise sidewalls that generally extend along the first horizontal direction hd1 and a straight widthwise sidewall that extends along the second horizontal direction hd2 that is perpendicular to the first horizontal direction hd1. In one embodiment, each of the laterally undulating lengthwise sidewalls includes a plurality of concave vertical sidewalls that are adjoined to one another along vertical edges.

Referring to FIGS. 20A-20G, an insulating material may be deposited in the width-modulated cavities 79' by a conformal deposition process. Excess portions of the insulating material deposited over the top surface of the contact level dielectric layer 280 may be removed by a planarization process such as a recess etch or a chemical mechanical planarization (CMP) process. Each remaining portion of the insulating material in the width-modulated cavities 79' constitutes a width-modulated insulating wall structure 76. The width-modulated insulating wall structures 76 include an insulating material such as silicon oxide, silicon nitride, and/or a dielectric metal oxide. Each width-modulated insulating wall structure 76 may vertically extend through first alternating stacks (132, 146) of first insulating layers 132 and first electrically conductive strips 146 and second alternating stacks (232, 246) of second insulating layers 232 and second electrically conductive strips 246, and laterally extends along the first horizontal direction hd1 and are laterally spaced apart from one another along the second horizontal direction hd2.

Figure 20A:
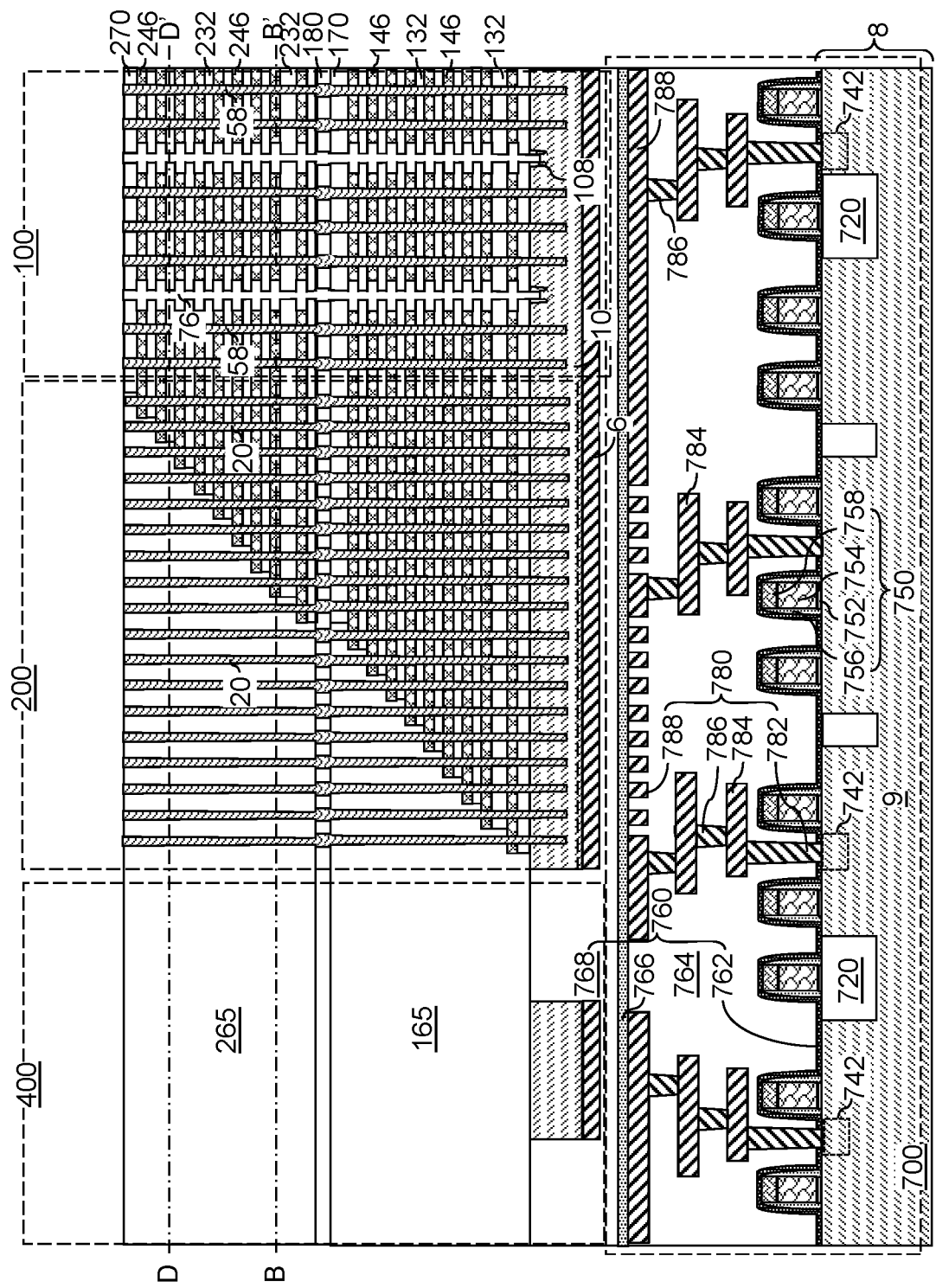
FIG. 20A is a vertical cross-sectional view of the exemplary structure after formation of width-modulated insulating wall structures according to an embodiment of the present disclosure.
Figure 20B:
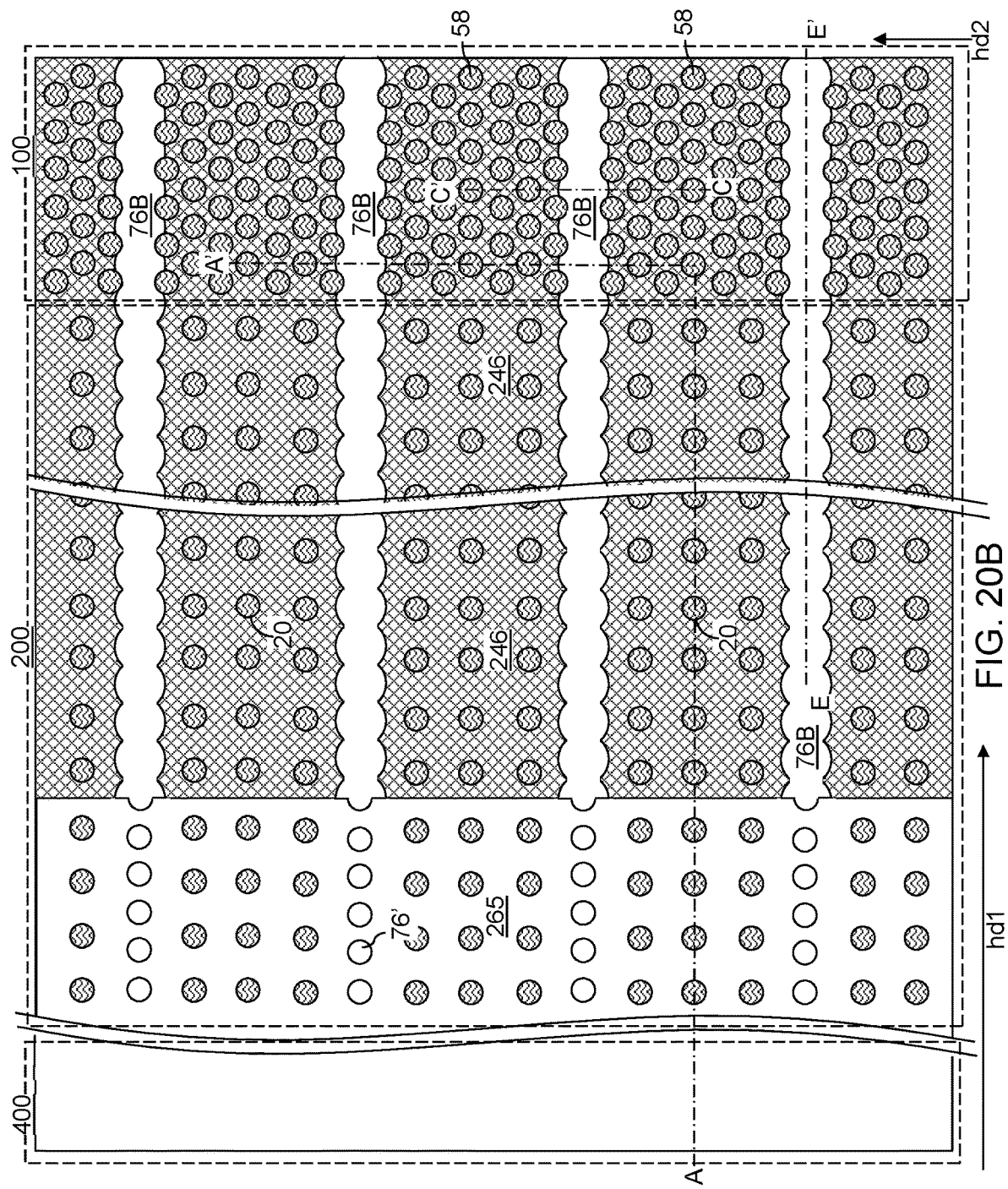
FIG. 20B is a horizontal cross-sectional of the exemplary structure along the horizontal plane B-B' of FIG. 20A. The hinged vertical plane A-A' corresponds to the plane of the vertical cross-sectional view of FIG. 20A.
Figure 20C:
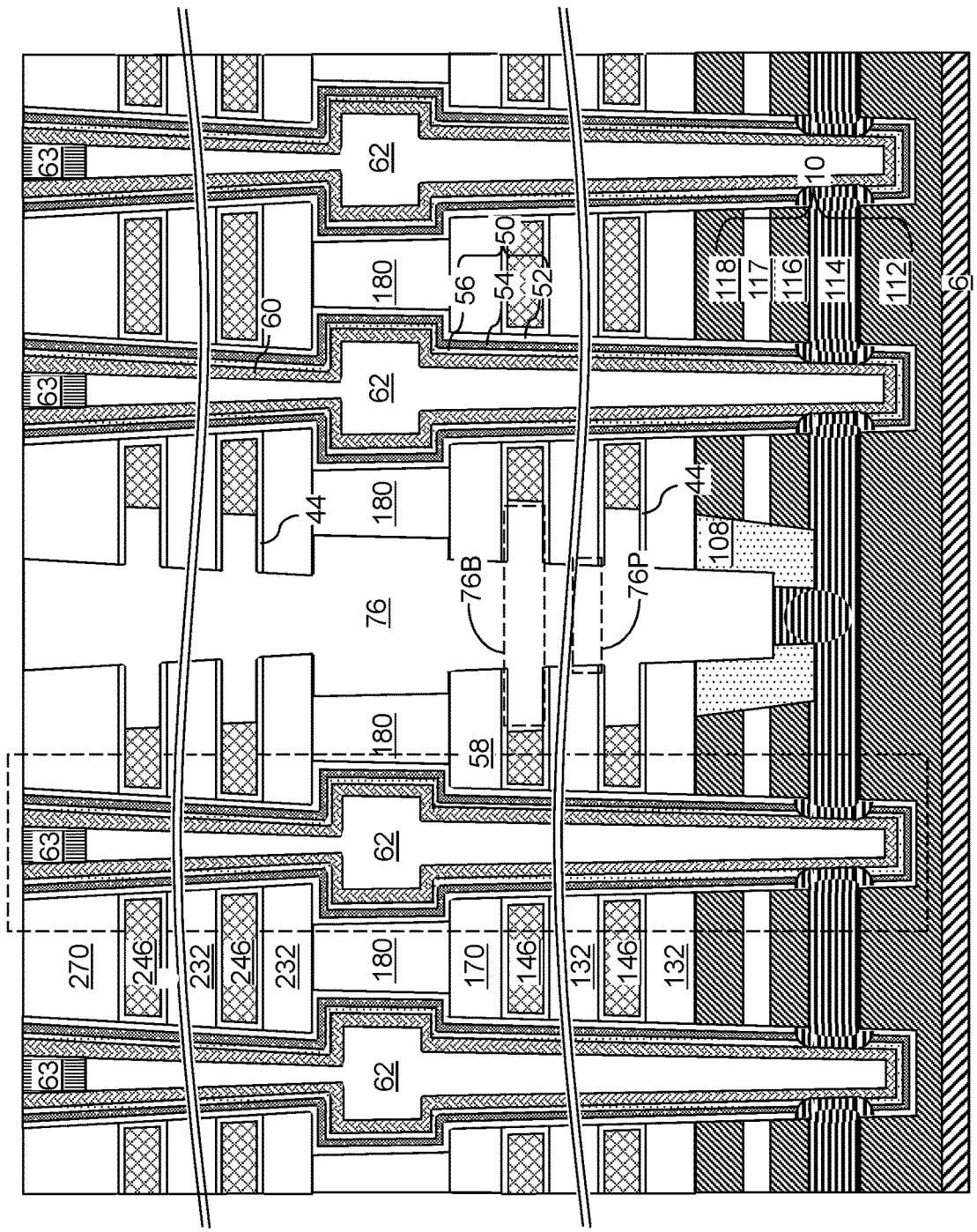
FIG. 20C is a vertical cross-sectional view of the exemplary structure along the vertical plane C-C' of FIG. 20B.
Figure 20D:
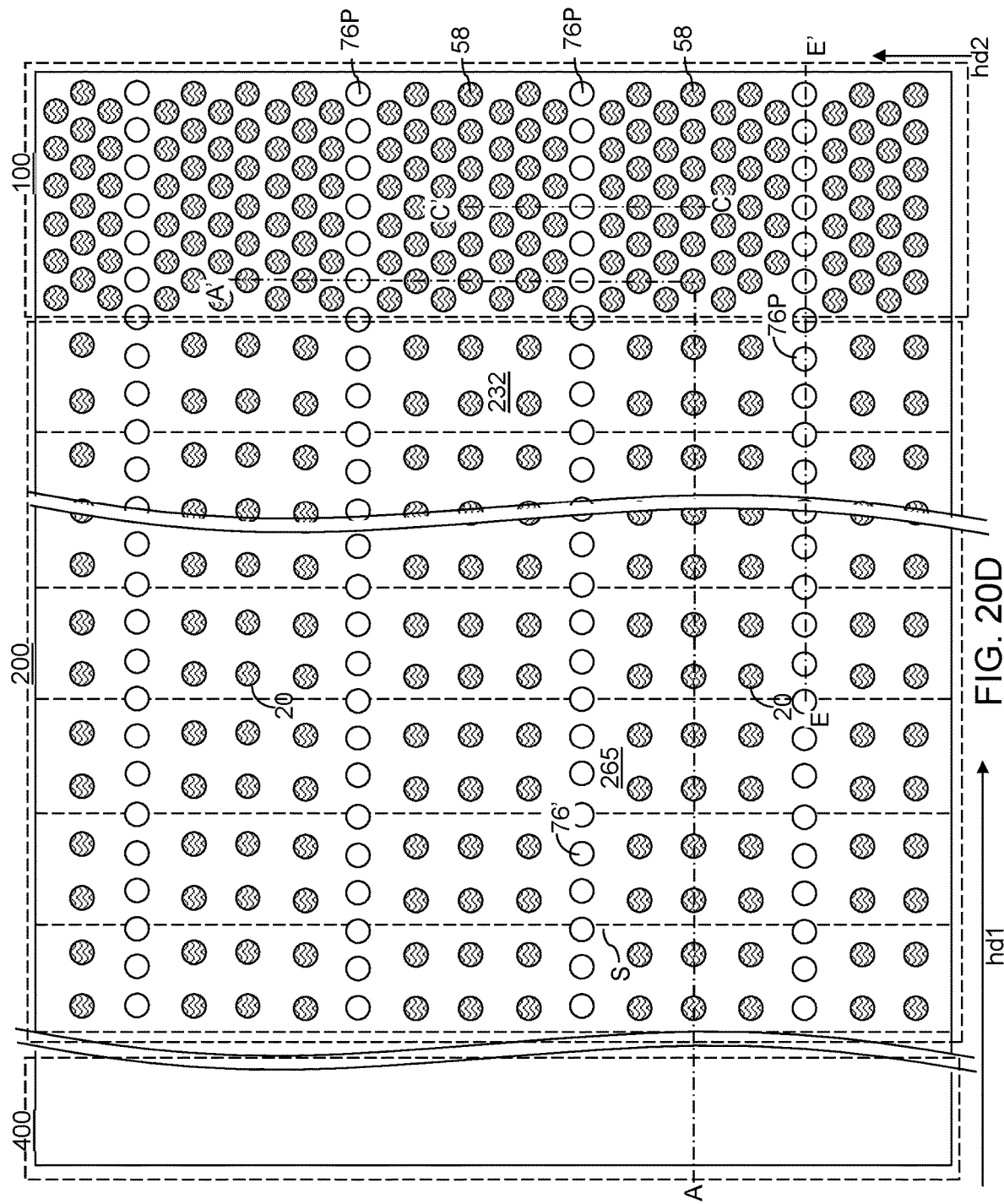
FIG. 20D is a horizontal cross-sectional view of the exemplary structure along the vertical plane D-D' of FIG. 20A.
Figure 20E:
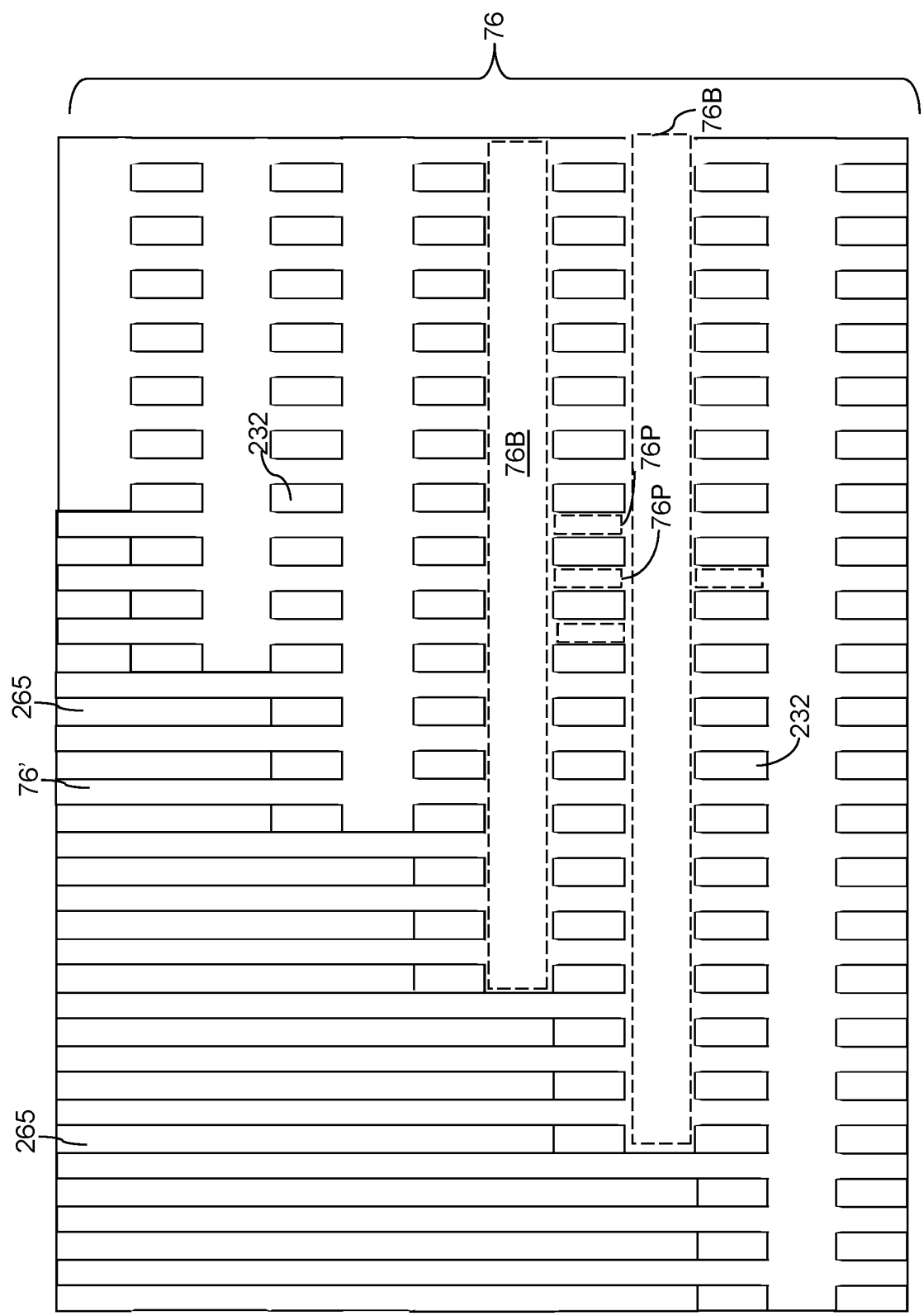
FIG. 20E is a vertical cross-sectional view of the exemplary structure along the vertical plane E-E' of FIGS. 20B and 20D.

Discrete insulating pillars 76' may be formed in the subset of the backside openings 79 that vertically extend through the retro-stepped dielectric material portions (165, 265), as shown in FIG. 20E. Each insulating pillar 76' may have a sidewall that contacts a respective sidewall of the second retro-stepped dielectric material portion 265. A subset of the insulating pillars 76' may have a sidewall that contacts a respective sidewall of the first retro-stepped dielectric material portion 165. At the same time, width-modulated insulating wall structures 76 may be formed in the width-modulated cavities 79'. As shown in FIG. 20E, each of the width-modulated insulating wall structures 76 is a perforated structure (where insulating layers 132 or 232 fill the perforations) that extends in the vertical direction and in the first horizontal direction (e.g., the word line direction) hd1.

In one embodiment shown in FIG. 20E, each of the width-modulated insulating wall structures 76 comprises ribbed beams 76B laterally contacting a respective pair of electrically conductive strips (146 or 246) and located at each level of the electrically conductive strips (146 or 246). Each ribbed beam 76B continuously extends along the first horizontal direction hd1, does not protrude above a first horizontal plane including a bottom surface of an immediately overlying insulating material layer (132, 170, 232, or 270) and does not protrude below a second horizontal plane including a top surface of an immediately underlying insulating material layer (132 or 232).

Further, each of the width-modulated insulating wall structures 76 comprises cylindrical pillar structures 76P located at each level of the insulating layers (132, 232). Each pillar structure 76P contacts a respective pair of an overlying ribbed beam 76B and an underlying ribbed beam 76B. The ribbed beams 76B may be arranged along the first horizontal direction hd1 and laterally spaced apart from one another by the perforations filled with the insulating layers (132, 232). The lateral extent of each ribbed beam 76B along the first horizontal direction hd1 decreases with the vertical distance from the source-level material layers 10. The lateral extent of each ribbed beam 76B along the first horizontal direction hd1 may be less than the sum of the lateral extent of an underlying insulating layer (132 or 232) and the maximum lateral dimension (such as the diameter) of the backside openings 79 as provided at the processing steps of FIGS. 18A-18C. Each of the laterally undulating lengthwise sidewalls of the electrically conductive strips (146, 246) may contact a respective set of convex vertical sidewalls of a respective one of the width-modulated insulating wall structures 76, which is a set of convex vertical sidewalls of a ribbed beam 76B.

In one embodiment, each group of memory stack structures 55 includes a two-dimensional periodic array of memory stack structures 55. At least one row of memory stack structures 55 of at least one group of memory stack structures 55 contacts one of the width-modulated insulating wall structures 76. In one embodiment, the memory stack structures 55 contacting the width-modulated insulating wall structures 76 may be dummy structures that are not used to store electrical charge.

Generally, each width-modulated insulating wall structure 76 includes a laterally alternating sequence of bulging regions and neck regions. As used herein, a "bulging region" refers to a region in which a structure laterally bulges, i.e., laterally protrudes relative to neighboring regions. As used herein, a "neck region" refers to a region in which a structure has a local minimum in width, i.e., is narrower than neighboring regions. The neck-to-neck distance may be uniform as illustrated in FIG. 20B, or may vary as illustrated in FIG. 20F.

Figure 20F:
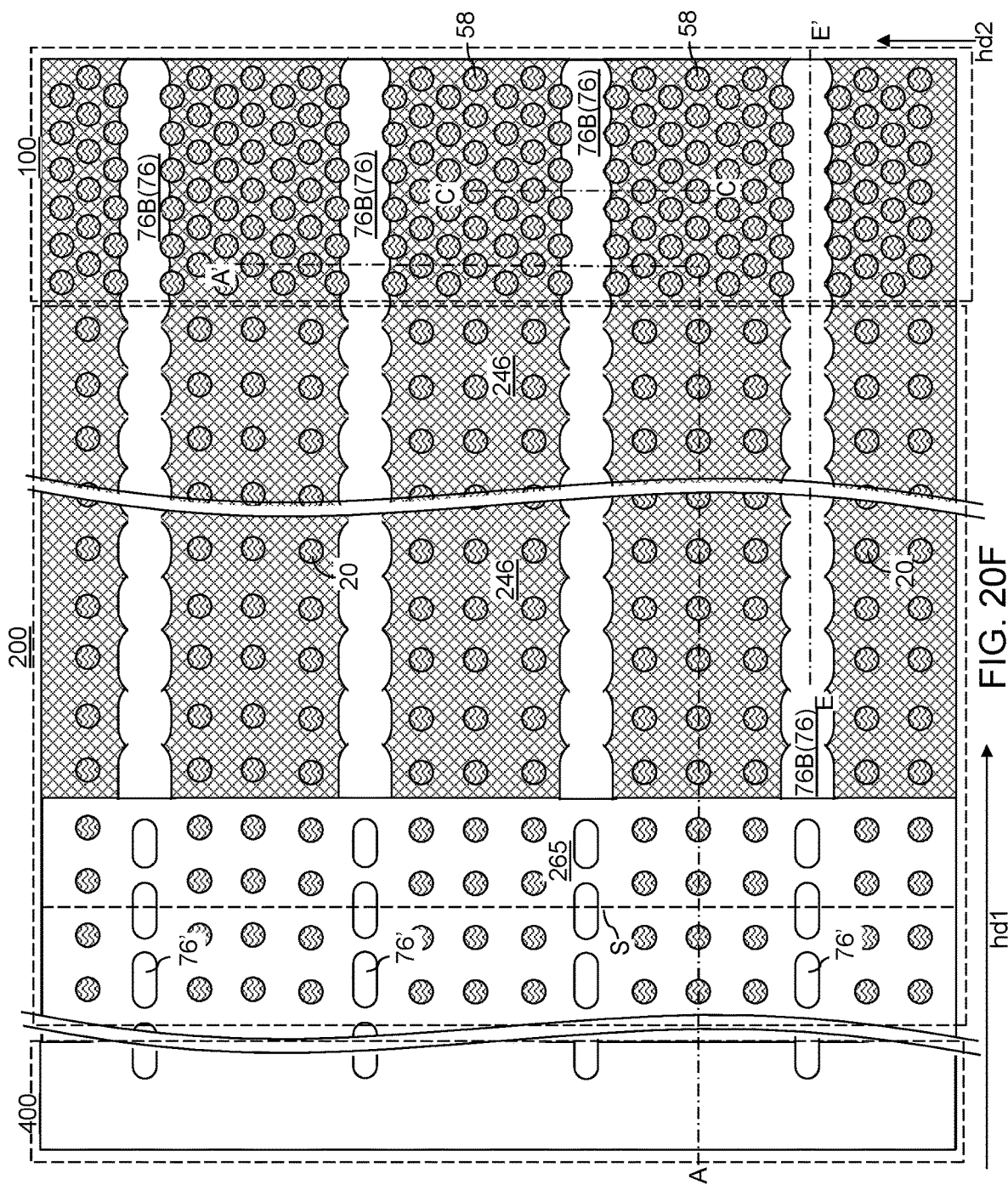
FIG. 20F is a horizontal cross-sectional of the first alternative embodiment of the exemplary structure along the horizontal planes B-B' of FIG. 20A. The hinged vertical plane A-A' corresponds to the plane of the vertical cross-sectional view of FIG. 20A. The vertical plane C-C' corresponds the plane of the vertical cross-sectional view of FIG. 20C.
Figure 20G:
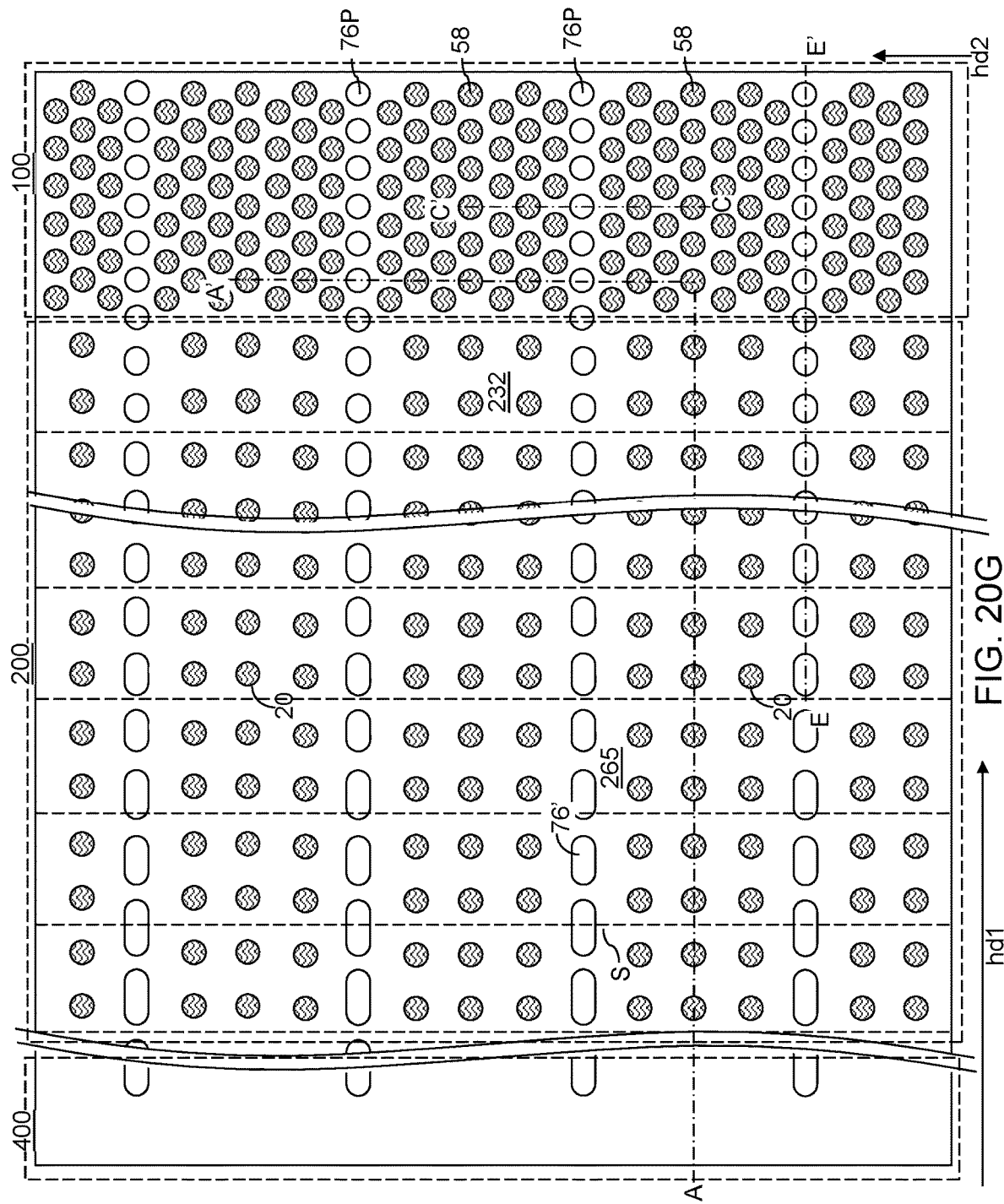
FIG. 20G is a horizontal cross-sectional view of the first alternative embodiment of the exemplary structure along the horizontal planes C-C' of FIG. 20A. The hinged vertical plane A-A' corresponds to the plane of the vertical cross-sectional view of FIG. 20A. The vertical plane C-C' corresponds the plane of the vertical cross-sectional view of FIG. 20C.
Figure 21B:
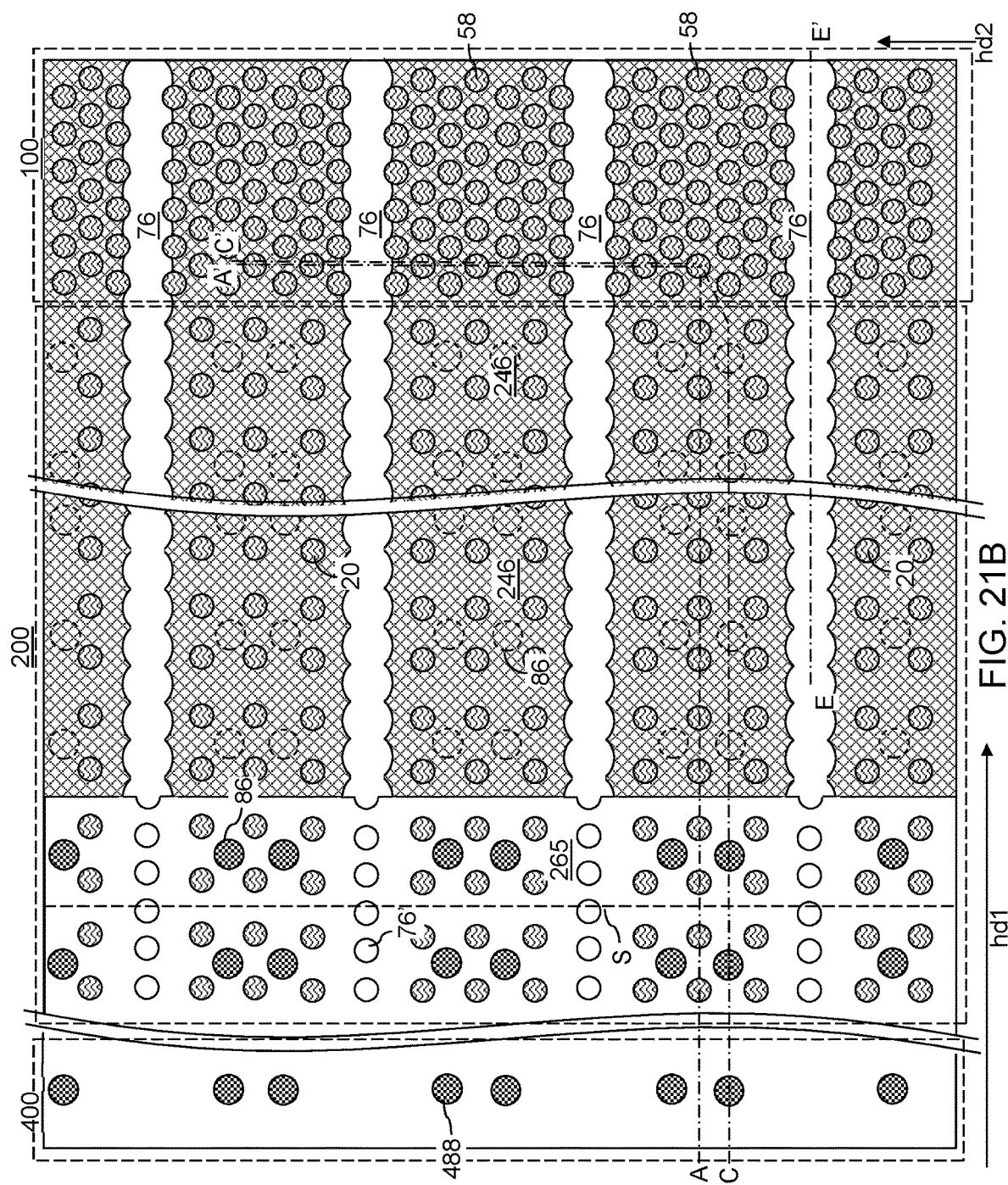
FIG. 21B is a horizontal cross-sectional view of the exemplary structure along the vertical plane B-B' of FIG. 21A. The hinged vertical plane A-A' corresponds to the plane of the vertical cross-sectional view of FIG. 21A.
Figure 21C:
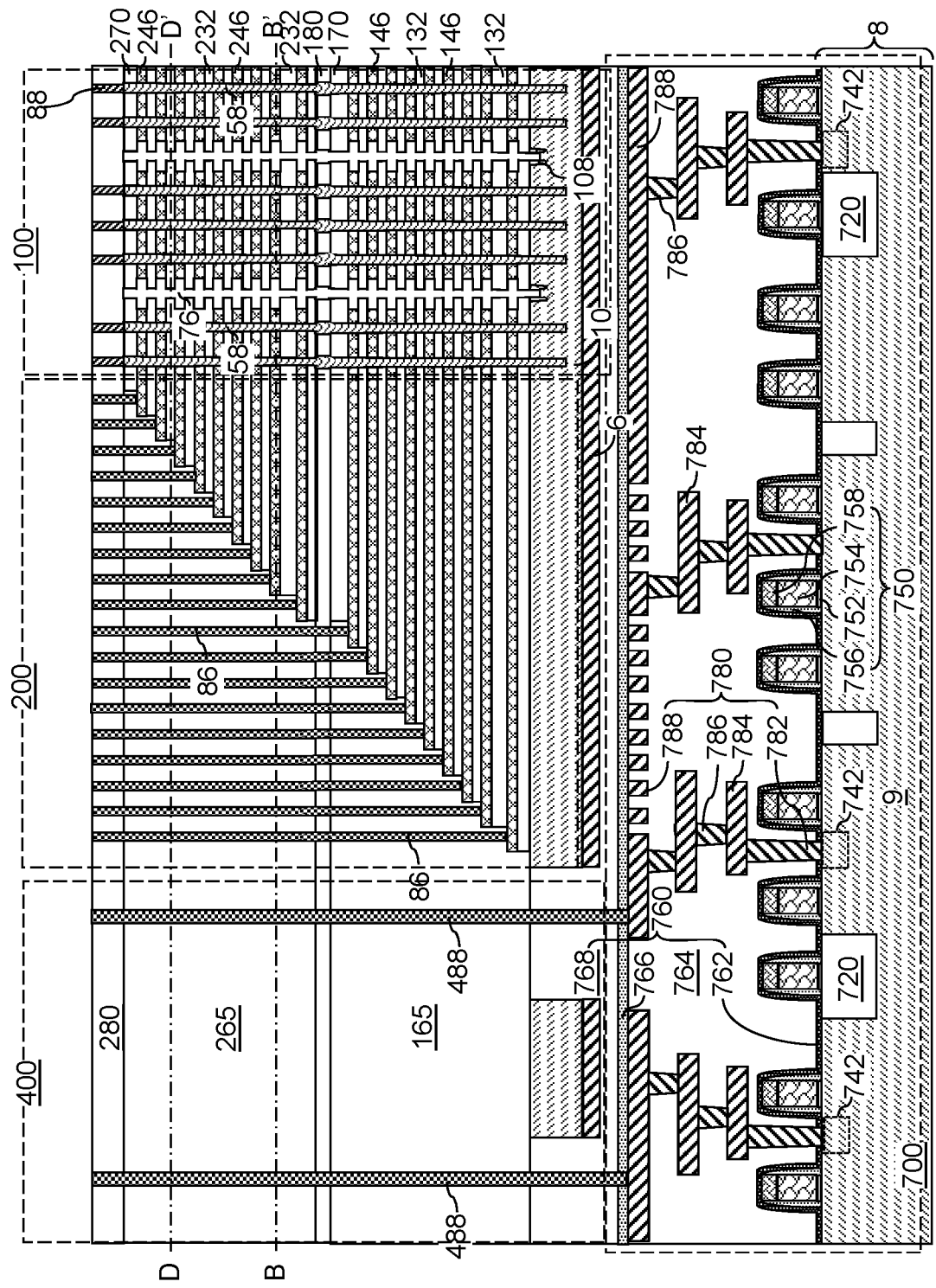
FIG. 21C is a vertical cross-sectional view of the exemplary structure along the vertical plane C-C' of FIG. 21B.
Figure 21D:
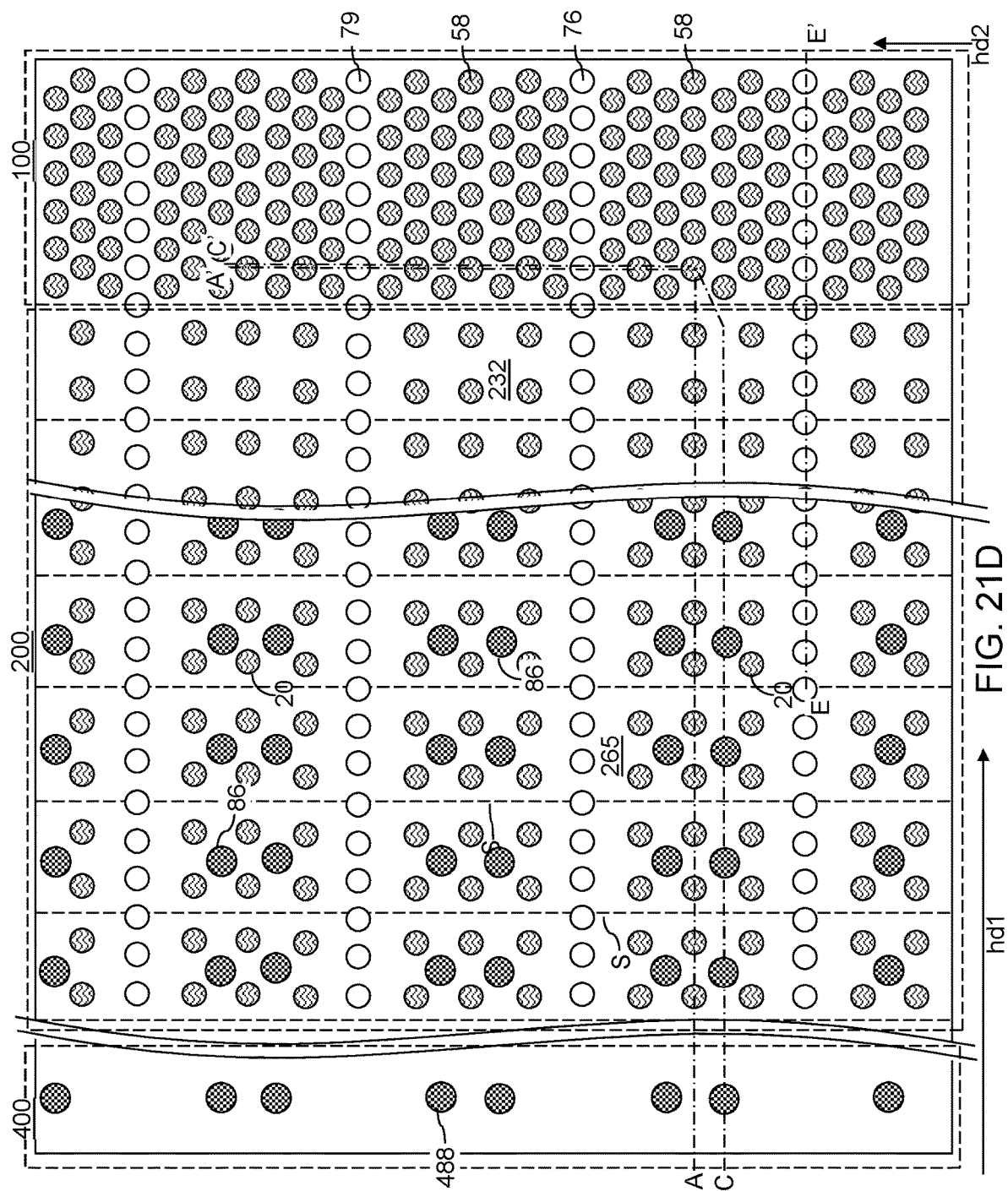
FIG. 21D is a horizontal cross-sectional view of the exemplary structure along the vertical plane D-D' of FIG. 21A.
Figure 21E:
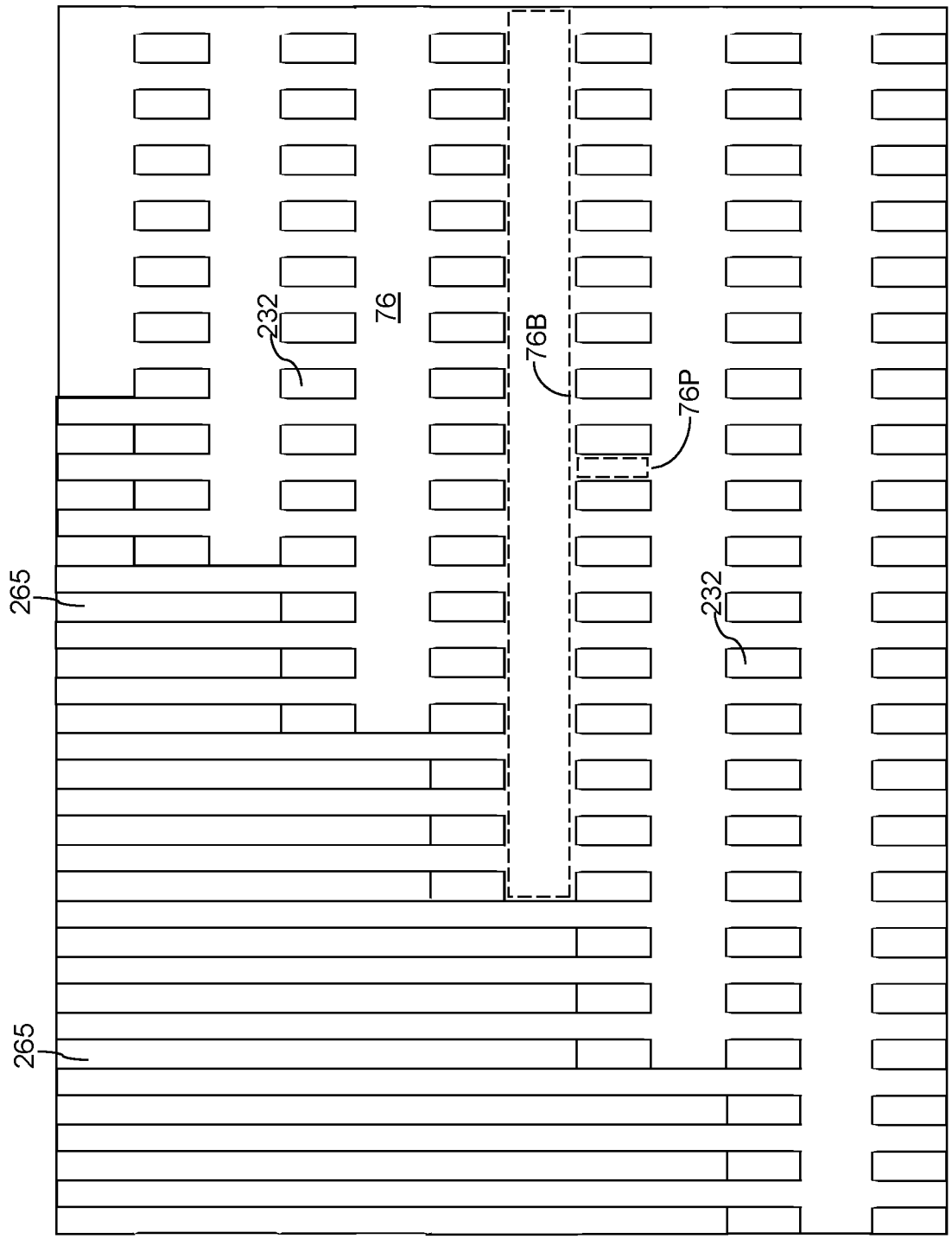
FIG. 21E is a vertical cross-sectional view of the exemplary structure along the vertical plane E-E' of FIGS. 21B and 21D.
Figure 21F:
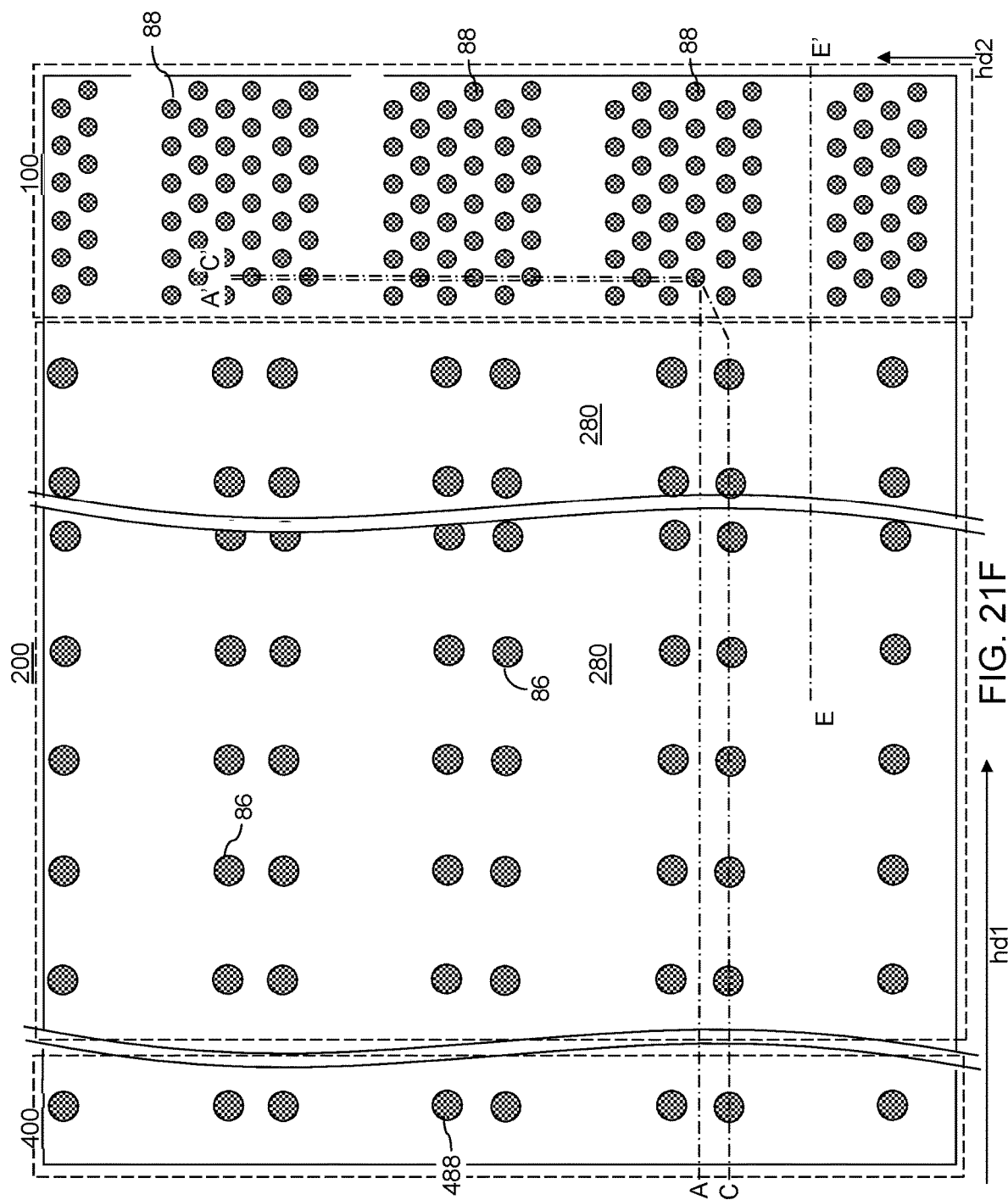
FIG. 21F is a top-down view of the exemplary structure of FIGS. 21A-21E.
Figure 21G:
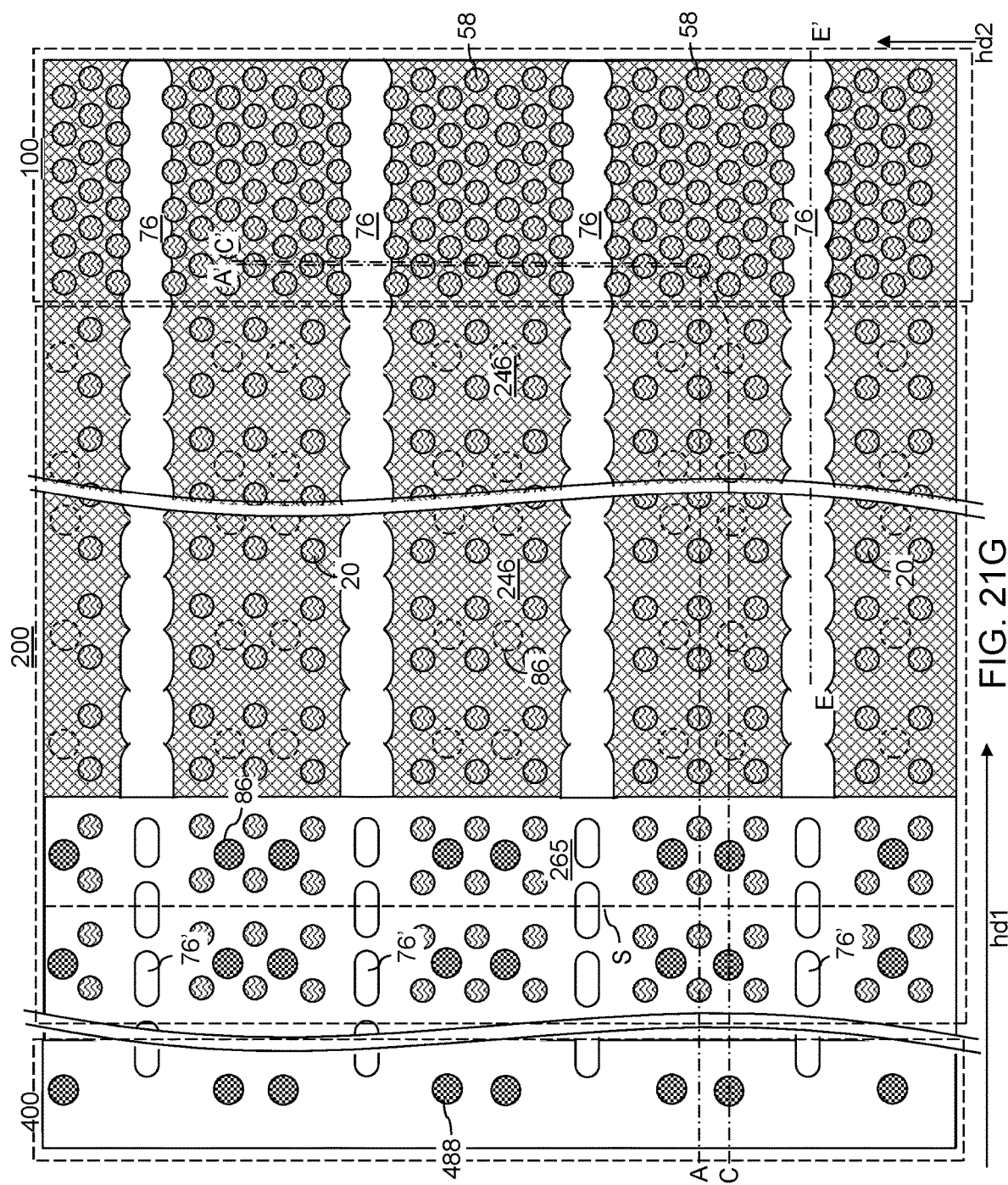
FIG. 21G is a horizontal cross-sectional of the first alternative embodiment of the exemplary structure along the horizontal planes B-B' of FIG. 21A. The hinged vertical plane A-A' corresponds to the plane of the vertical cross-sectional view of FIG. 21A. The hinged vertical plane C-C' corresponds the plane of the vertical cross-sectional view of FIG. 21C.
Figure 21H:
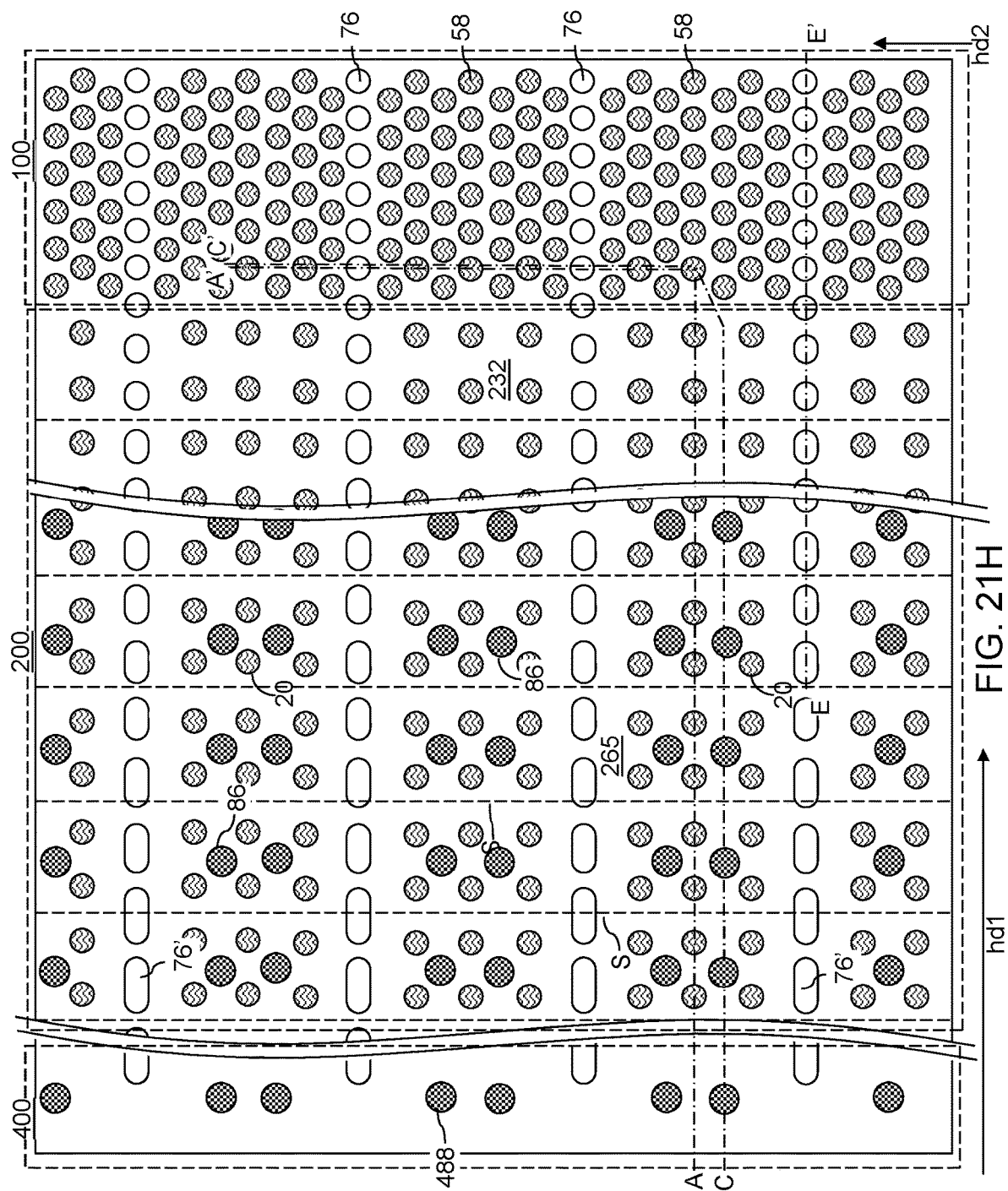
FIG. 21H is a horizontal cross-sectional view of the first alternative embodiment of the exemplary structure along the horizontal planes C-C' of FIG. 21A. The hinged vertical plane A-A' corresponds to the plane of the vertical cross-sectional view of FIG. 16A. The hinged vertical plane C-C' corresponds the plane of the vertical cross-sectional view of FIG. 21C.

FIGS. 20F and 20G illustrated an embodiment in which the neck-to-neck distance between neighboring pairs of neck regions monotonically changes along a lengthwise direction (such as the first horizontal direction hd1) of the width-modulated insulating wall structure 76 within a nonuniform spacing segment of the laterally alternating sequence. The nonuniform spacing segment is the segment of the laterally alternating sequence that has a nonuniform spacing between neck regions, i.e., the segment of the laterally alternating sequence in which the neck-to-neck distance is nonuniform. In one embodiment, the neck-to-neck distance between neighboring pairs of neck regions monotonically changes along the lengthwise direction of a width-modulated insulating wall structure (such as the first horizontal direction hd1) within the nonuniform spacing segment of the laterally alternating sequence. In one embodiment, the laterally alternating sequence may include a nonuniform spacing segment in the staircase region 200, and may include a uniform-spacing segment in the memory array region 100.

Referring to FIGS. 21A-21H, a contact level dielectric layer 280 may be formed on the top surface of the second insulating cap layer 270. The contact level dielectric layer 280 includes a dielectric material such as undoped silicate glass or doped silicate glass. The thickness of the contact level dielectric layer 280 may be in a range from 150 nm to 1,000 nm, such as from 300 nm to 500 nm, although lesser and greater thicknesses may also be used. The contact level dielectric layer 280 may be formed after formation of the width-modulated insulating wall structures 76 by a planarization process (such as chemical mechanical planarization). Alternatively, the contact level dielectric layer 280 may be formed by not planarizing the dielectric material that is deposited to form the width-modulated insulating wall structures 76. In other words, the contact level dielectric layer 280 may be collaterally formed by deposition of the dielectric material that forms the width-modulated insulating wall structures 76.

Various contact via cavities may be formed through the contact level dielectric layer 280 and underlying dielectric material portions to various underlying electrically active elements. For example, drain contact via cavities may be formed through the contact level dielectric layer 280 to top surfaces of the drain regions 63. Staircase-region contact via cavities may be formed in the staircase region 200 in the memory array region 100. The staircase-region contact via cavities may be formed through the contact level dielectric layer 280 and the second and first retro-stepped dielectric material portions (265, 165) to top surfaces of the electrically conductive strips (146, 246) in the staircase region 200. Peripheral-region via cavities may be formed through the contact level dielectric layer 280, the second and first retro-stepped dielectric material portions (265, 165), and the at least one second dielectric layer 768 to top surfaces of the lower metal interconnect structure 780 in the peripheral region 400. Additional via cavities may be formed as needed. The various via cavities may be formed using a single masking step and a single etch stop, or may be formed using multiple combinations of a masking step in which a patterned mask (such as a patterned photoresist layer) is provided and an etch step in which an anisotropic etch process is used to transfer the pattern in the patterned mask through underlying dielectric material portions.

At least one conductive material may be deposited in the various contact via cavities. The at least one conductive material may include a metallic nitride liner and a metallic fill material. The metallic nitride liner may include a metallic nitride material such as TiN, TaN, WN, or combinations thereof. The metallic fill material may include a metal or a metallic alloy such as W, Ru, Co, Mo, Cu, or combinations thereof. Excess portions of the at least one conductive material may be removed from above the horizontal plane including the top surface of the contact level dielectric layer 280 by a planarization process such as chemical mechanical planarization and/or a recess etch.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive strips (146, 246). The staircase-region contact via structures 86 may include drain select level contact via structures that contact a subset of the second electrically conductive strips 246 that function as drain select level gate electrodes. Further, the staircase-region contact via structures 86 may include word line contact via structures that contact electrically conductive strips (146, 246) that underlie the drain select level gate electrodes and function as word lines for the memory stack structures 55. Peripheral-region contact via structures 488 may be formed in the peripheral-region contact via cavities and on a respective one of the lower metal interconnect structure 780 in the peripheral region 400.

Figure 22:
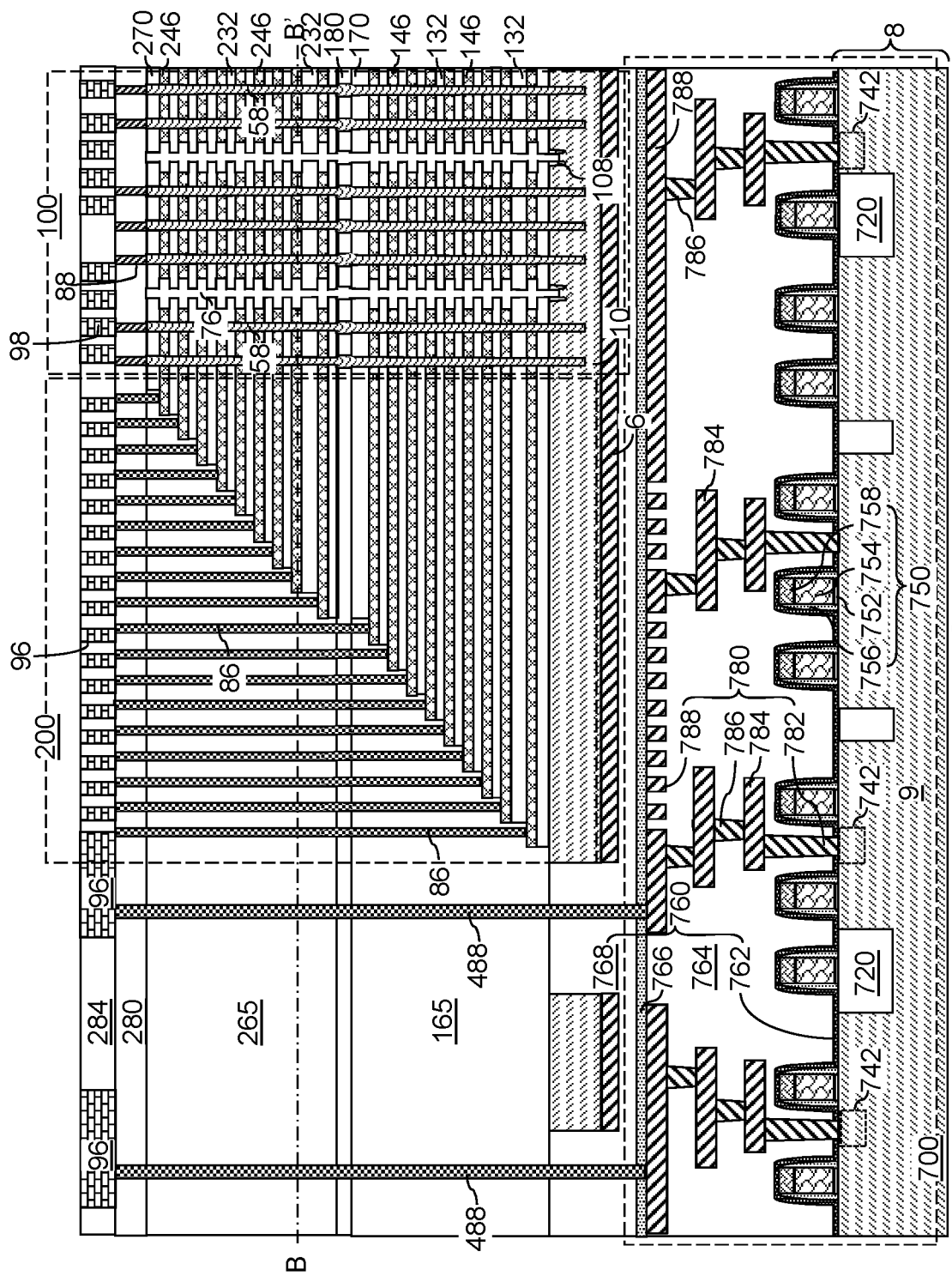
FIG. 22 is a vertical cross-sectional view of the exemplary structure after formation of upper metal line structures according to an embodiment of the present disclosure.

Referring to FIG. 22, at least one additional dielectric layer may be formed over the contact level dielectric layer 280, and additional metal interconnect structures (herein referred to as upper-level metal interconnect structures) may be formed in the at least one additional dielectric layer. For example, the at least one additional dielectric layer may include a line-level dielectric layer 284 that is formed over the contact level dielectric layer 280. The upper-level metal interconnect structures may include bit lines 98 contacting, or electrically connecting to, a respective one of the drain contact via structures 88, and interconnection line structures 96 contacting, and/or electrically connected to, at least one of the staircase-region contact via structures 86 and/or the peripheral region contact via structures 488. In this embodiment, no dummy memory stack structures 55 are formed.

Referring to FIGS. 23A-23D, a second alternative embodiment of the exemplary structure is illustrated. The second alternative embodiment of the exemplary structure may be derived from the exemplary structure by modifying the layout for the various backside openings (149B, 249B) and the various memory openings (149M, 249M). In the second alternative embodiment, the rows of first-tier backside openings 149B are not located at the lattice sites of neighboring two-dimensional periodic arrays of first-tier memory openings 149M. In some embodiments, the center-to-center distance between a row of first-tier backside openings 149B and a most proximal row of first-tier memory openings 149M may be greater than the center-to-center distance between neighboring rows of first-tier memory openings 149M within a two-dimensional array of first-tier memory openings 149M. In some embodiment, the first-tier backside openings 149B may have a greater maximum lateral dimension (e.g., a diameter) than the first-tier memory openings 149M.

Figure 23A:
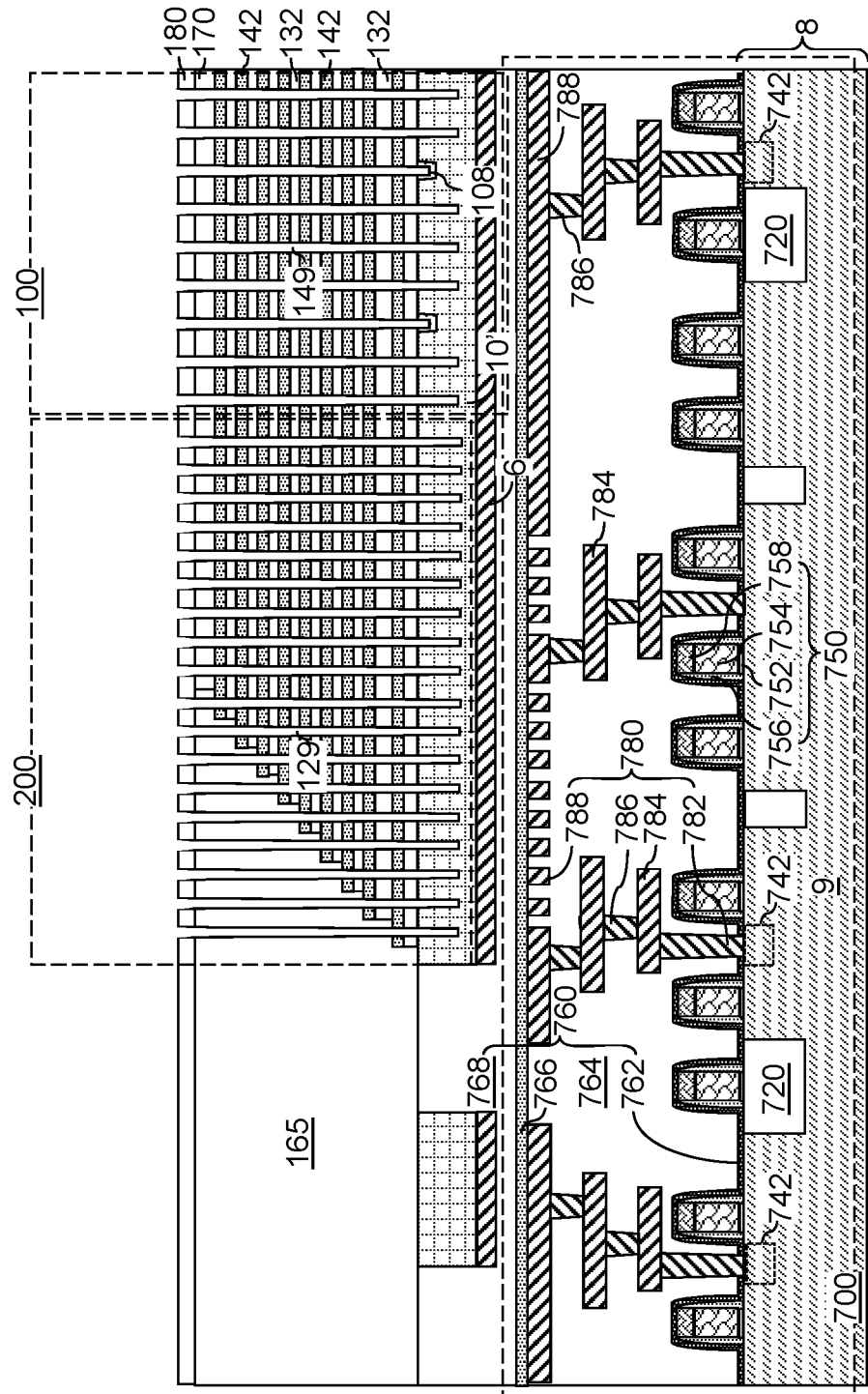
FIG. 23A is a vertical cross-sectional view of a second alternative embodiment of the exemplary structure at the processing steps of FIGS. 5A, 5B, and 5C.
Figure 23B:
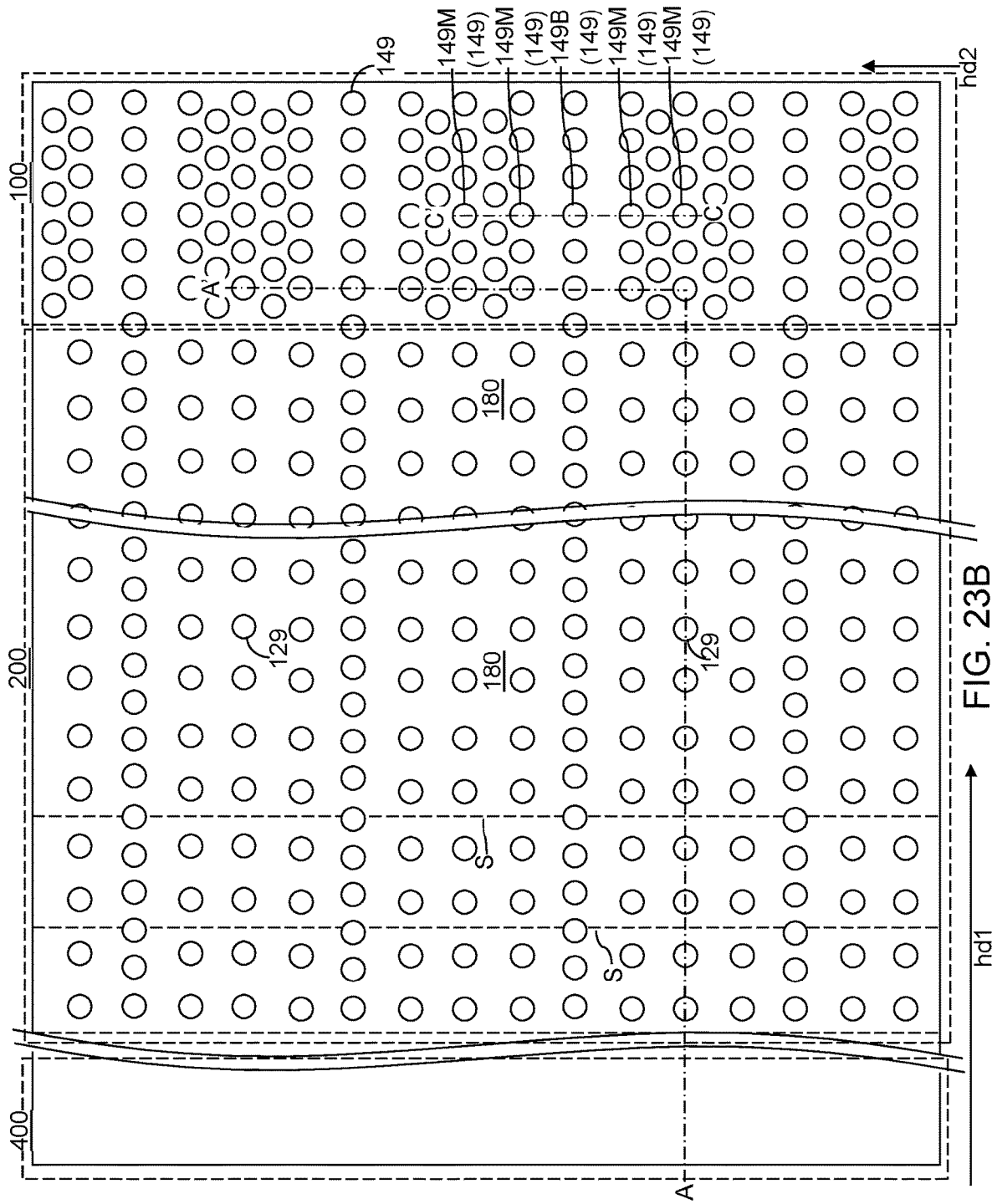
FIG. 23B is a top-down view of the second alternative configuration of the exemplary structure of FIG. 23A. The hinged vertical plane A-A' corresponds to the plane of the vertical cross-sectional view of FIG. 23A.
Figure 23C:
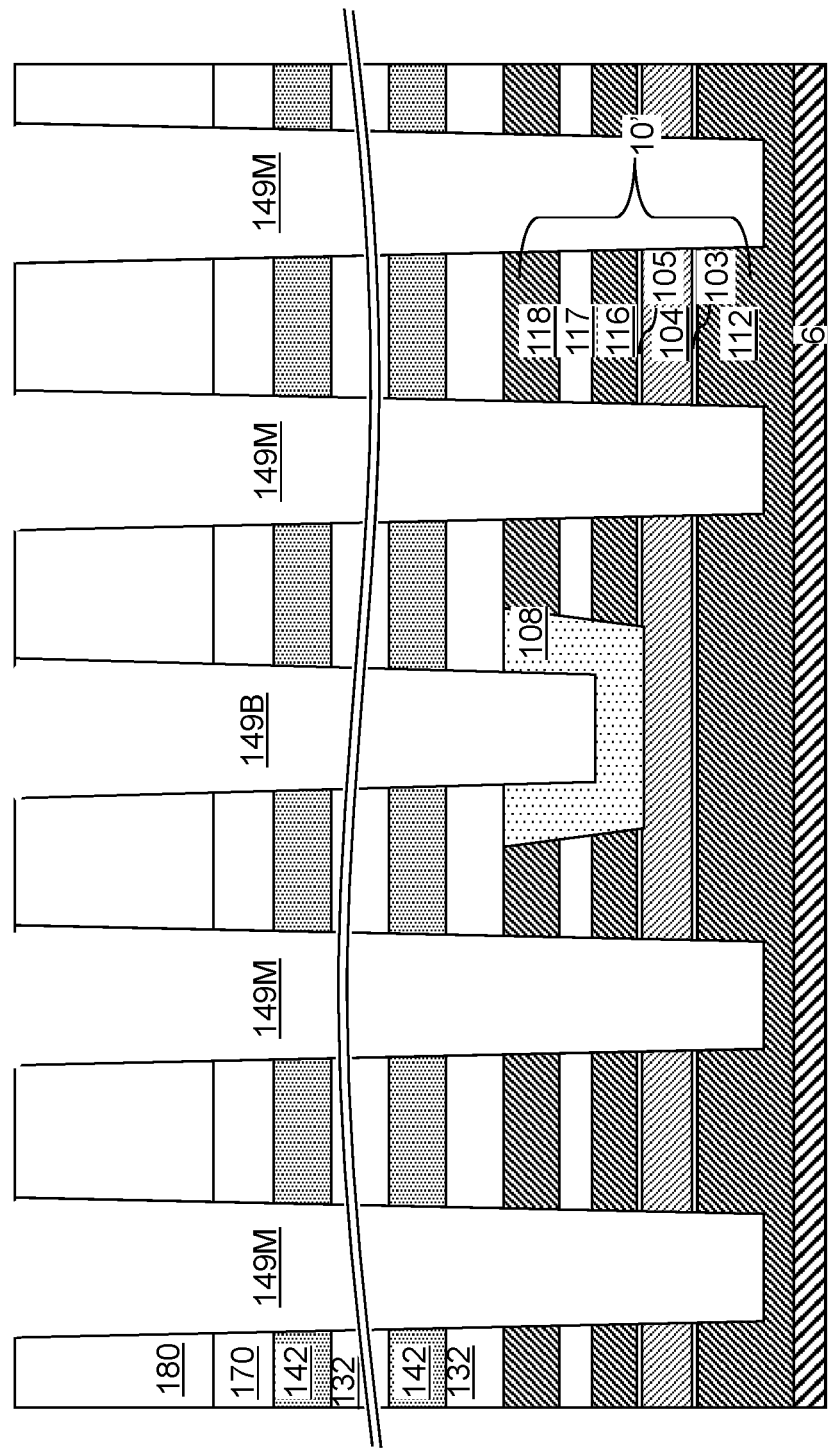
FIG. 23C is a vertical cross-sectional view of the second alternative embodiment of the exemplary structure along the vertical plane C-C' of FIG. 23B.
Figure 23D:
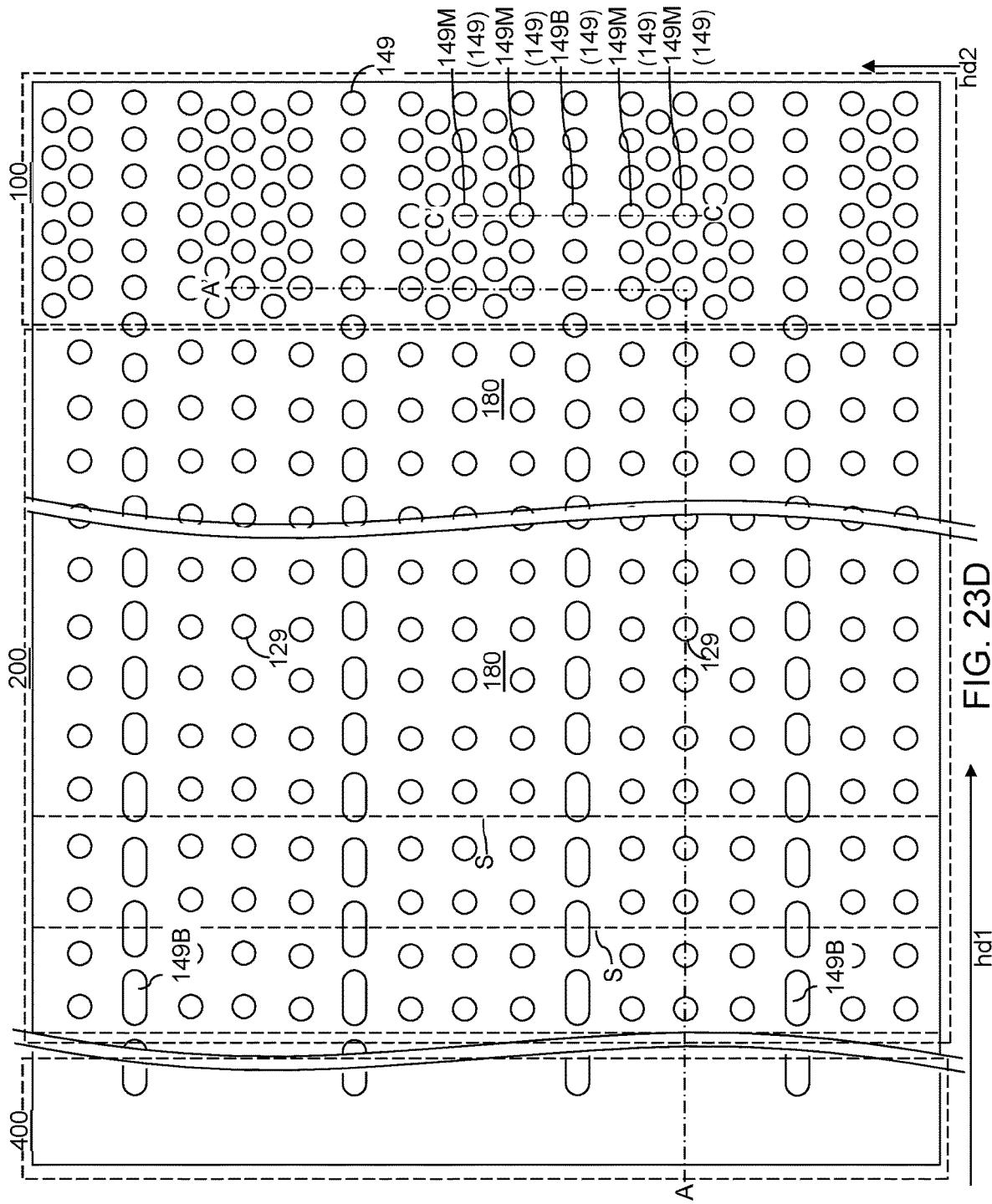
FIG. 23D is a horizontal cross-sectional view of a third alternative embodiment of the exemplary structure at the processing steps of FIGS. 5A, 5B, and 5C. The hinged vertical plane A-A' corresponds to the plane of the vertical cross-sectional view of FIG. 23A. The vertical plane C-C' corresponds the plane of the vertical cross-sectional view of FIG. 23C.

FIG. 23D is a horizontal cross-sectional view of a third alternative embodiment of the exemplary structure at the processing steps of FIGS. 5A, 5B, and 5C. The hinged vertical plane A-A' corresponds to the plane of the vertical cross-sectional view of FIG. 23A. The vertical plane C-C' corresponds the plane of the vertical cross-sectional view of FIG. 23C.

Referring to FIGS. 24A-24D, the second alternative embodiment of the exemplary structure is illustrated. The second-tier backside openings 249B may be formed over the first-tier backside openings 149B, and the second-tier memory openings 249M are formed over the first-tier memory openings 149M. Sacrificial memory opening fill structure (148M, 248M), sacrificial backside opening fill structures (148B, 248B), and sacrificial support opening fill structures may be formed as described above.

Figure 24A:
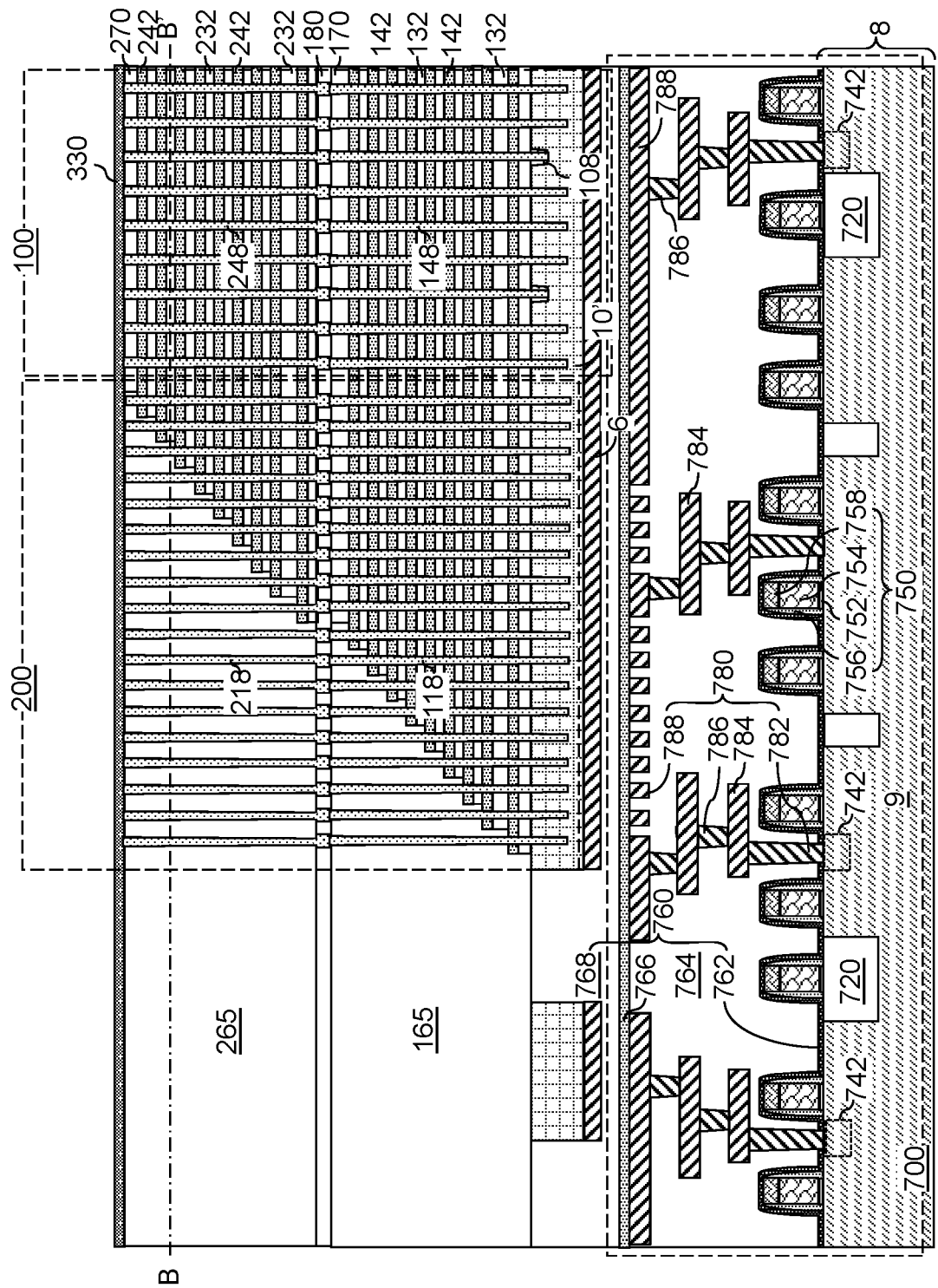
FIG. 24A is a vertical cross-sectional view of the second alternative embodiment of the exemplary structure at the processing steps of FIGS. 11A, 11B, and 11C according to an embodiment of the present disclosure.
Figure 24B:
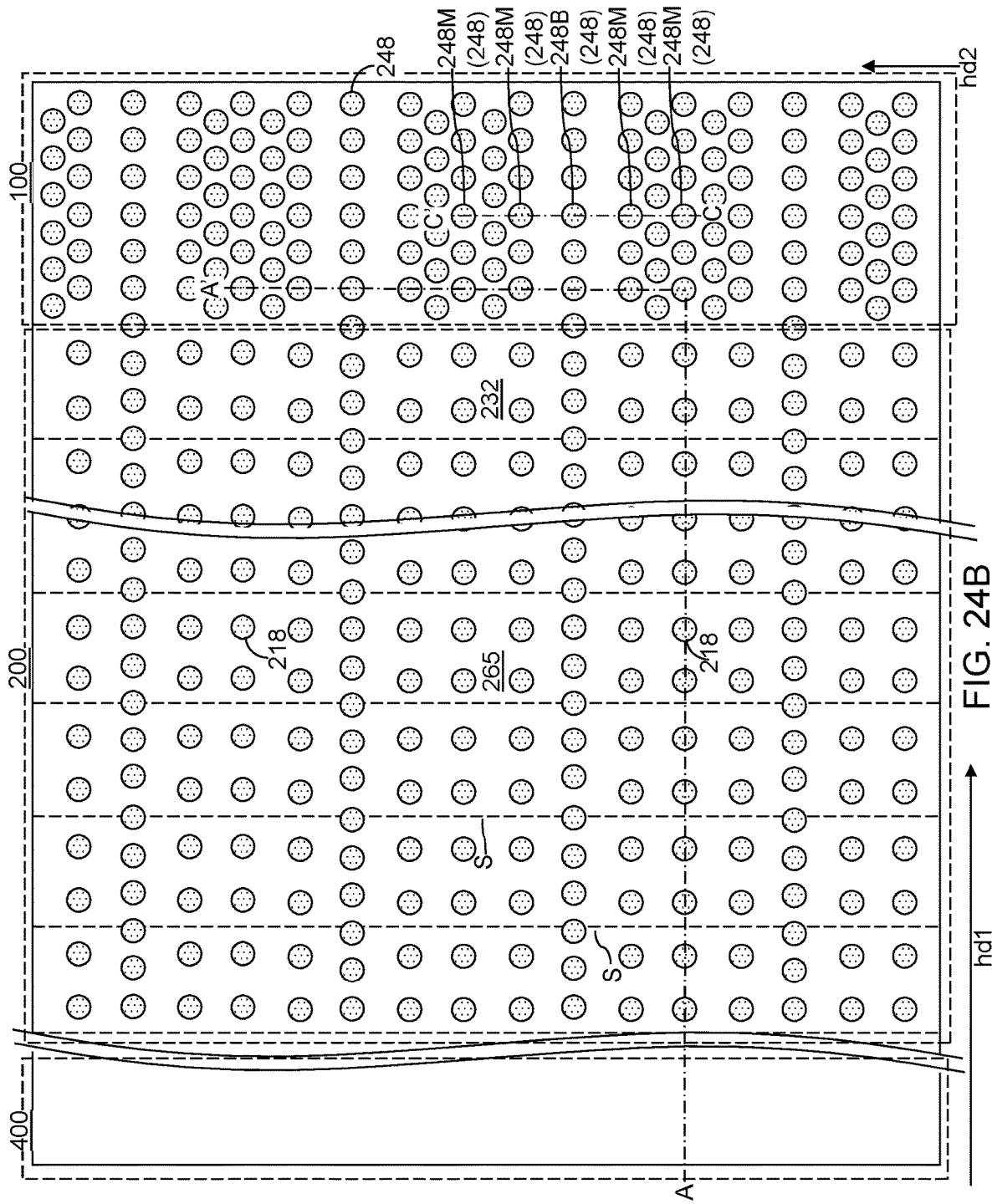
FIG. 24B is a horizontal cross-sectional view of the second alternative embodiment of the exemplary structure along the vertical plane B-B' of FIG. 24A. The hinged vertical plane A-A' corresponds to the plane of the vertical cross-sectional view of FIG. 24A.
Figure 24C:
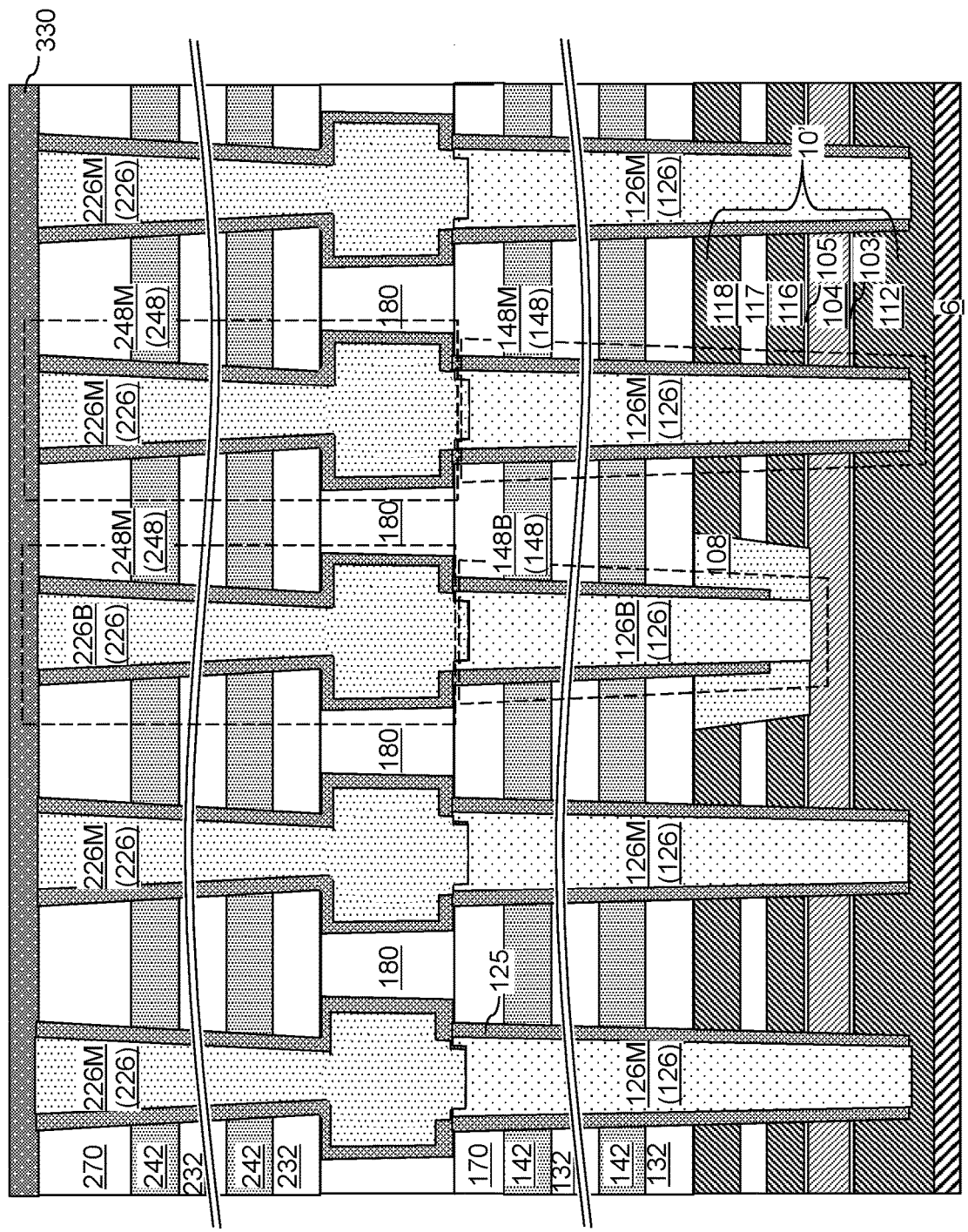
FIG. 24C is a vertical cross-sectional view of the second alternative embodiment of the exemplary structure along the vertical plane C-C' of FIG. 24B.
Figure 24D:
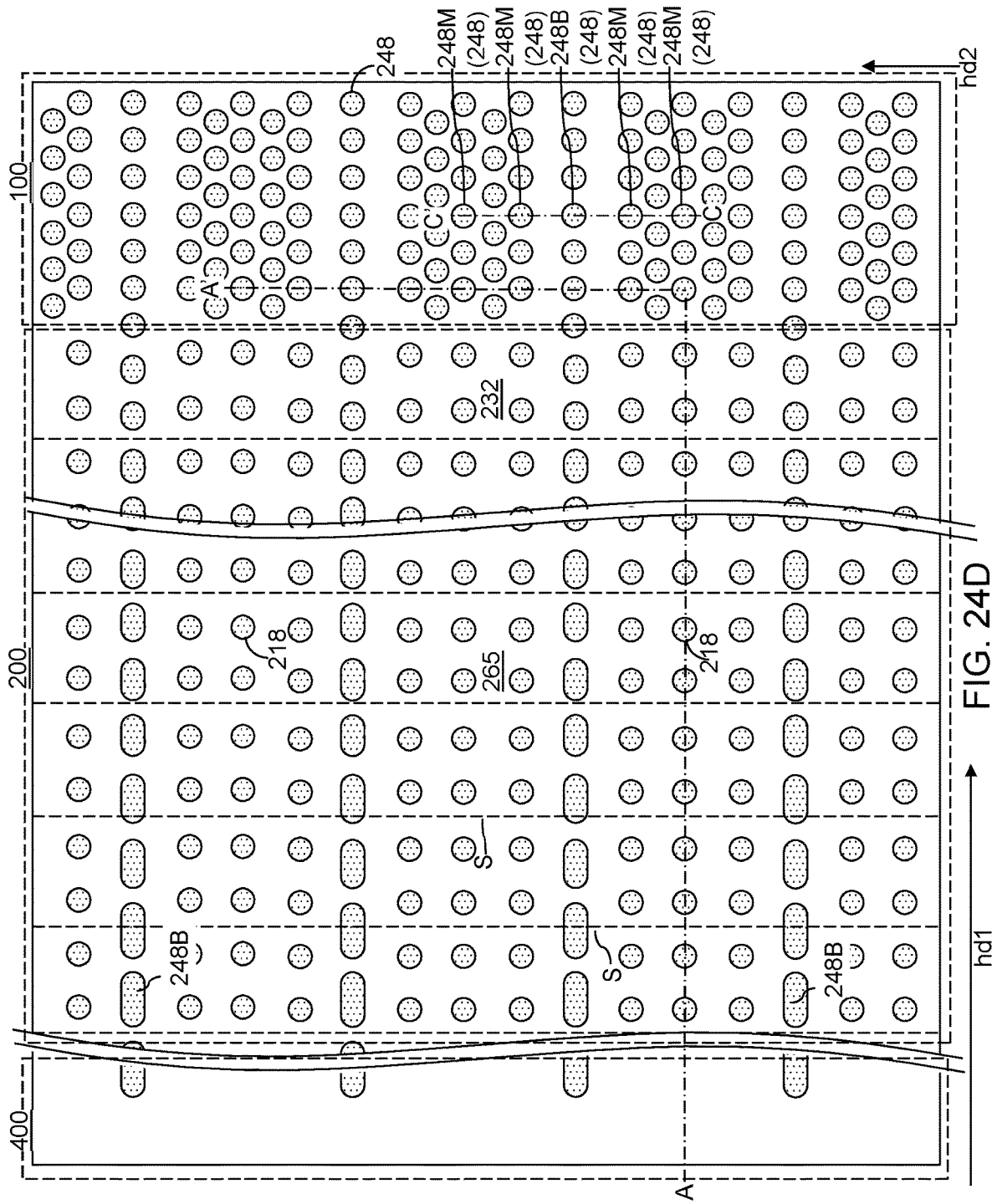
FIG. 24D is a horizontal cross-sectional view of the third alternative embodiment of the exemplary structure at the processing steps of FIGS. 11A, 11B, and 11C. The hinged vertical plane A-A' corresponds to the plane of the vertical cross-sectional view of FIG. 24A. The vertical plane C-C' corresponds the plane of the vertical cross-sectional view of FIG. 24C.
Figure 25A:
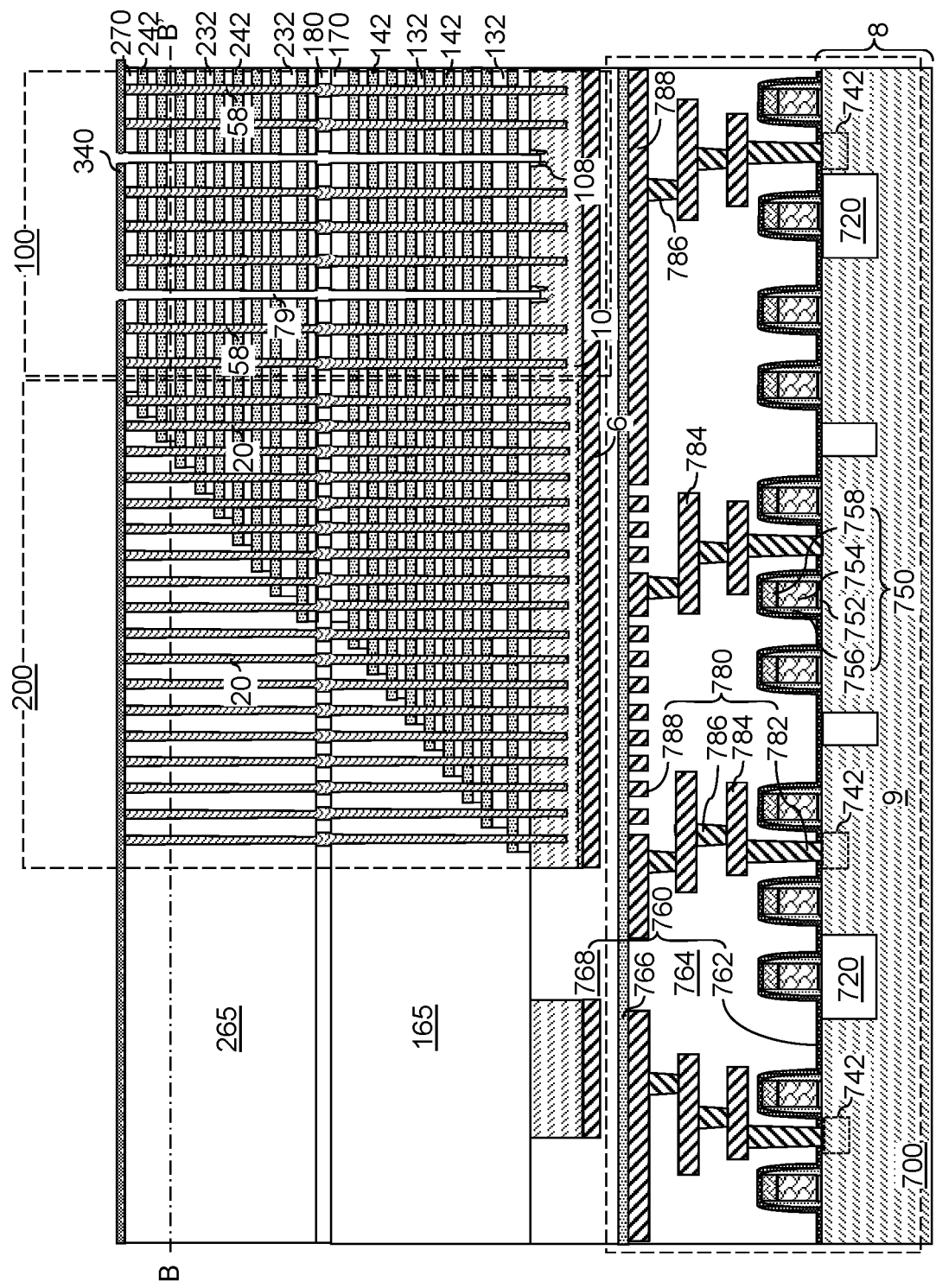
FIG. 25A is a vertical cross-sectional view of the second alternative embodiment of the exemplary structure at the processing steps of FIGS. 16A, 16B, and 16C.
Figure 25B:
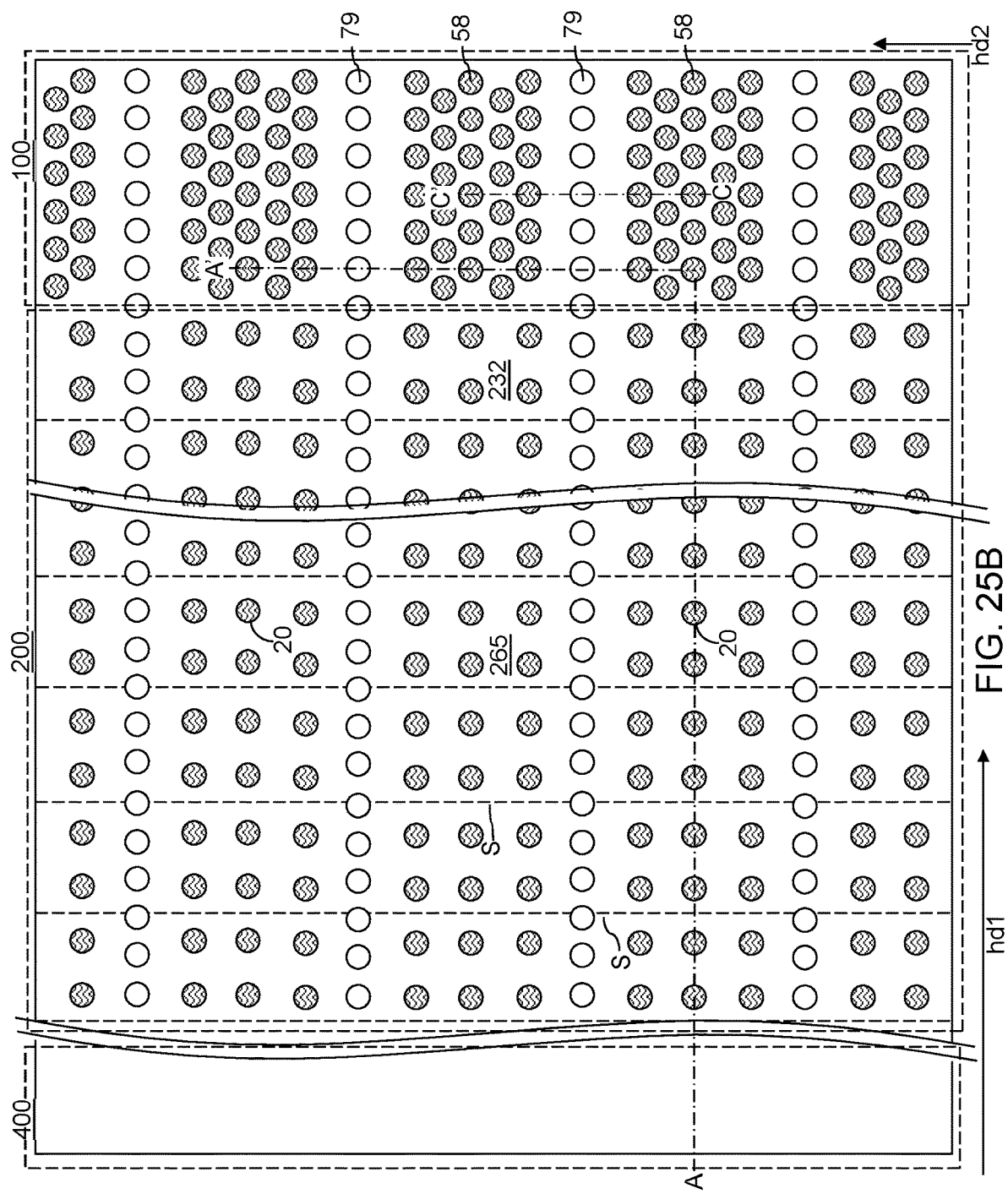
FIG. 25B is a horizontal cross-sectional view of the second alternative embodiment of the exemplary structure along the vertical plane B-B' of FIG. 25A. The hinged vertical plane A-A' corresponds to the plane of the vertical cross-sectional view of FIG. 25A.
Figure 25C:
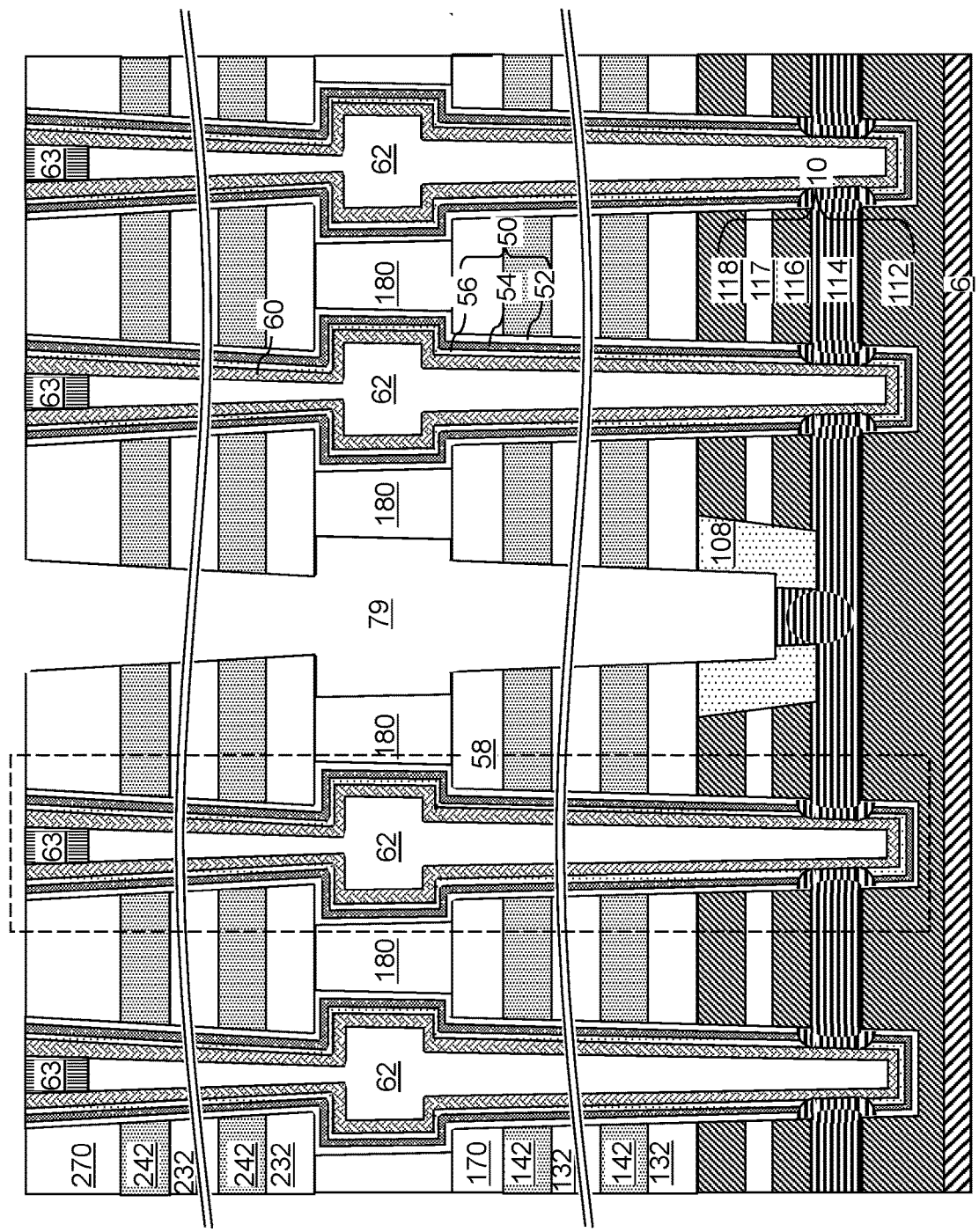
FIG. 25C is a vertical cross-sectional view of the second alternative embodiment of the exemplary structure along the vertical plane C-C' of FIG. 25B.

FIG. 24D is a horizontal cross-sectional view of the third alternative embodiment of the exemplary structure at the processing steps of FIGS. 11A, 11B, and 11C. The hinged vertical plane A-A' corresponds to the plane of the vertical cross-sectional view of FIG. 24A. The vertical plane C-C' corresponds the plane of the vertical cross-sectional view of FIG. 24C.

Referring to FIGS. 25A-25D, the second alternative embodiment of the exemplary structure is illustrated. Memory opening fill structures 58, support pillar structures 20, and the backside openings 79 may be formed as described above.

Referring to FIGS. 26A-26G, the second alternative embodiment of the exemplary structure is illustrated. Various contact via structures (88, 86, 488) may be formed as described above. In this case, each group of memory stack structures 55 includes a two-dimensional periodic array of memory stack structures 55, and each memory stack structure 55 may be laterally spaced from the width-modulated insulating wall structures 76. All of the memory stack structures 55 may be electrically active components that may store electrical charge therein because all memory stack structures 55 are surrounded by the electrically conductive strips (146, 246) (i.e., word lines/control gate electrodes).

Generally, remaining portions of the sacrificial material layers (142, 242) are replaced with electrically conductive layers (146, 246). Each electrically conductive layer (146, 246) is formed as a continuous material layer including holes around the backside openings 79. Electrically conductive layers (146, 246) may be singulated into a plurality of electrically conductive strips by isotropically recessing the electrically conductive layers (146, 246) around each backside opening 79 to form width-modulated cavities 79' including expanded volumes of the backside openings 79. Width-modulated insulating wall structures 76 are formed in the width-modulated cavities 79'.

Referring to all drawings of the present disclosure and according to various embodiments of the present disclosure, a three-dimensional semiconductor device is provided. The device comprises: an alternating stacks of insulating layers (132, 232) and electrically conductive strips (146, 246) located over a substrate 8, a width-modulated insulating wall structure 76 laterally extends along a first horizontal direction hd1 and vertically extends through each layer in the alternating stack {(132, 146) and/or (232, 246)}, and groups of memory stack structures 55 extending through the alternating stack {(132, 146) and/or (232, 246)}, and each memory stack structure 55 includes a memory film 50 and a vertical semiconductor channel 60. Each insulating layer (132, 232) is a continuous perforated insulating layer that laterally extends through the width-modulated insulating wall structure 76. The electrically conductive strips (146, 246) in each vertical level are discrete strips which are laterally separated from each other by the width-modulated insulating wall structure 76.

In one embodiment, the alternating stack {(132, 146) and/or (232, 246)} includes respective stepped surfaces that extend from a bottommost layer to a topmost layer within a respective alternating stack {(132, 146) and/or (232, 246)}. In one embodiment, two electrically conductive strips (146 or 246) in each laterally neighboring pairs of electrically conductive strips that are located in the same vertical level are vertically spaced from the substrate 8 by a same distance and are laterally spaced apart from each other by a laterally undulating portion of the width-modulated insulating wall structure 76.

In one embodiment, each of the electrically conductive strips (146, 246) includes a pair of laterally undulating lengthwise sidewalls that generally extend along the first horizontal direction hd1 and a straight widthwise sidewall that is located at the stepped surfaces and that extends along a second horizontal direction hd2 that is perpendicular to the first horizontal direction hd1.

In one embodiment, the three-dimensional semiconductor device further comprises a retro-stepped dielectric material portion (165 or 265) that contacts each straight widthwise sidewall of the electrically conductive strips (146 or 246) or is laterally spaced from each straight widthwise sidewall of the electrically conductive strips (146 or 246) by a respective backside blocking dielectric layer 44. The retro-stepped dielectric material portion (165 or 265) overlies the stepped surfaces of each of the alternating stacks {(132, 146) and/or (232, 246)}.

In one embodiment, each of the laterally undulating lengthwise sidewalls of the electrically conductive strips (146, 246) includes a plurality of concave vertical sidewalls that are adjoined to one another along vertical edges, and each of the plurality of concave vertical sidewalls contacts a respective convex vertical sidewall of the width-modulated insulating wall structure 76.

In one embodiment, discrete insulating pillars 76' vertically extend through the retro-stepped dielectric material portion (165 and/or 265).

In one embodiment, the width-modulated insulating wall structure 76 comprises: ribbed beams 76B laterally contacting a respective pair of electrically conductive strips (146, 246) and located at each level of the electrically conductive strips (146, 246) and continuously extending along the first horizontal direction hd1; and cylindrical pillar structures 76P contacting a respective pair of an overlying ribbed beam 76B and an underlying ribbed beam 76B and arranged along the first horizontal direction hd1 and laterally spaced apart from one another.

In one embodiment, each insulating layer (132, 232) is perforated by backside openings 79 that extend through the insulating layer. The pillar structures 76P extend through the respective backside openings 79. Each insulating layer (132, 232) continuously extends in spaces between the backside openings 79 containing the pillar structures 76P. The width-modulated insulating wall structure 76 is a perforated structure containing horizontal (i.e., lateral) perforations filled by the insulating layers (132, 232).

In one embodiment, each ribbed beam 76B laterally contacting the respective pair of electrically conductive strips (146 or 246) has a sidewall located within a flat vertical plane (that may be laterally offset from a vertical step S by a thickness of a backside blocking dielectric layer 44) that includes sidewalls of the respective pair of electrically conductive strips (146 or 246) that laterally extend along the second horizontal direction hd2, and for each pair of an overlying ribbed beam 76B and an underlying ribbed beam 76B, the underlying ribbed beam 76B has a greater lateral extent along the first horizontal direction hd1 than the overlying ribbed beam 76B.

In one embodiment, each group of memory stack structures 55 includes rows of memory stack structures 55 that are arranged along the first horizontal direction hd1 with a first pitch, and the ribbed beams 76B have a variable width along the second horizontal direction hd2 that changes periodically with translation along the first horizontal direction hd1, wherein a periodicity of modulation of the variable width is the same as the first pitch.

Figure 26A:
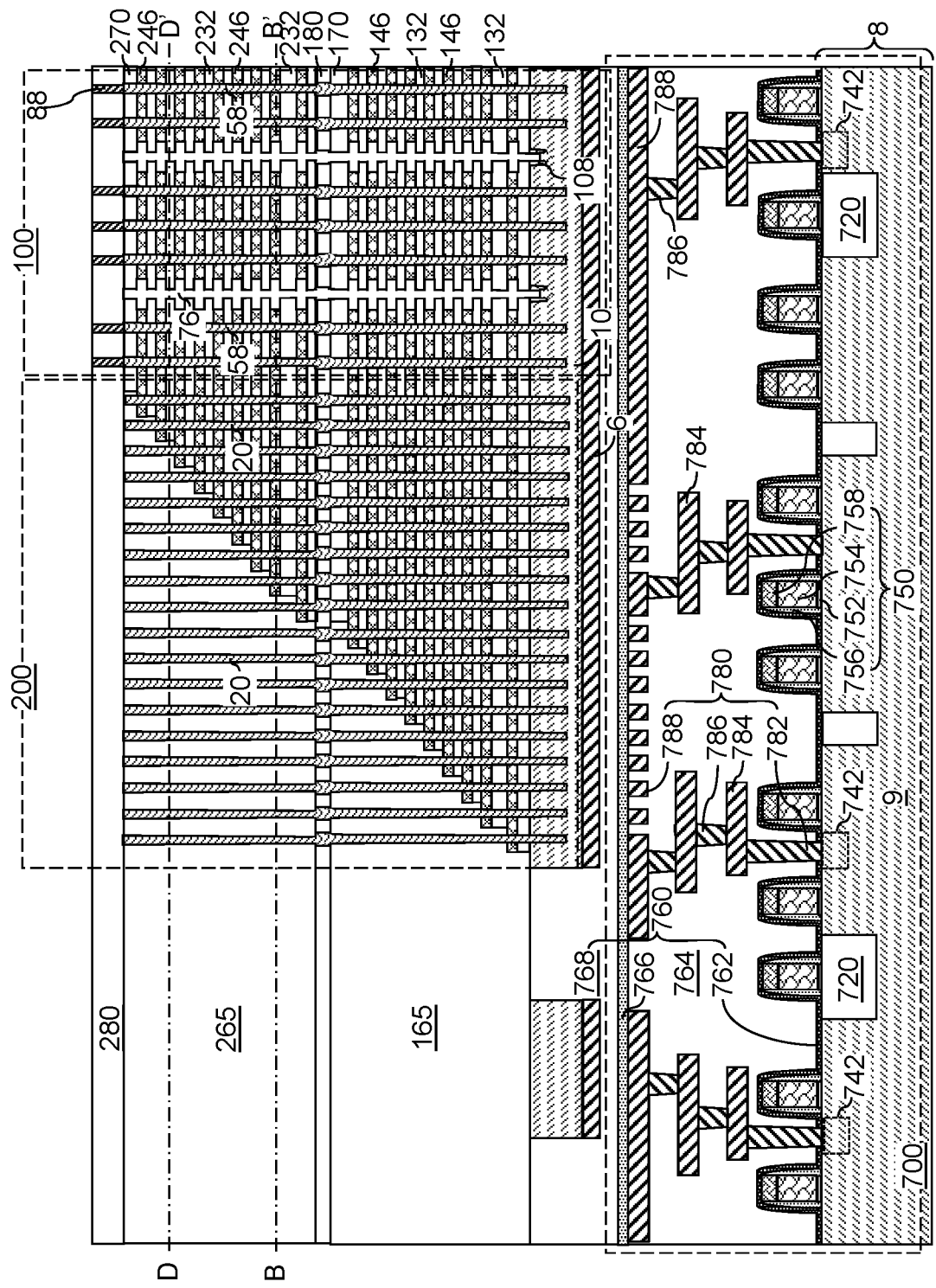
FIG. 26A is a vertical cross-sectional view of the second alternative embodiment of the exemplary structure at the processing steps of FIGS. 21A, 21B, and 21C.
Figure 26B:
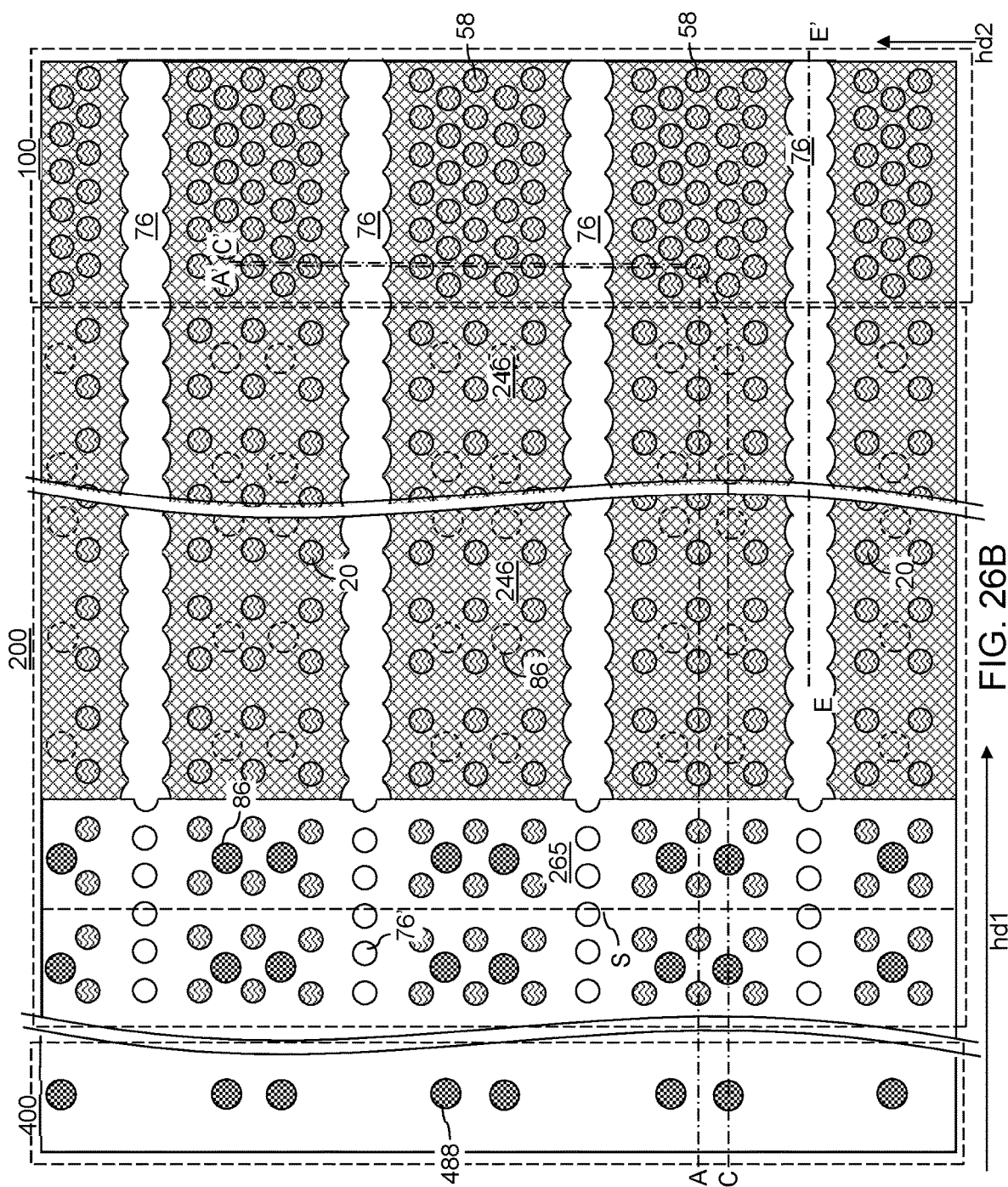
FIG. 26B is a horizontal cross-sectional view of the second alternative embodiment of the exemplary structure along the vertical plane B-B' of FIG. 26A. The hinged vertical plane A-A' corresponds to the plane of the vertical cross-sectional view of FIG. 26A.
Figure 26C:
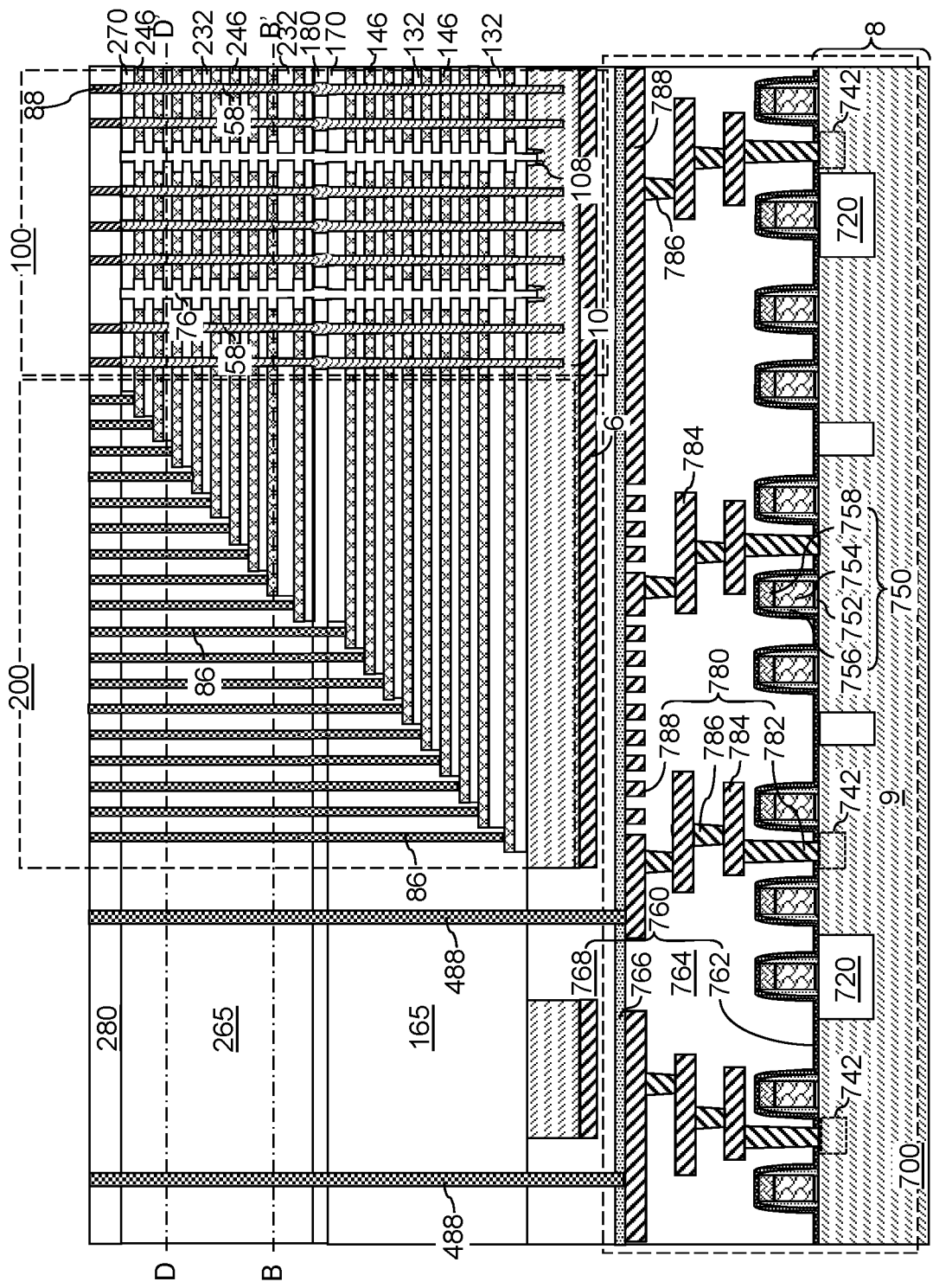
FIG. 26C is a vertical cross-sectional view of the second alternative embodiment of the exemplary structure along the vertical plane C-C' of FIG. 26B.
Figure 26D:
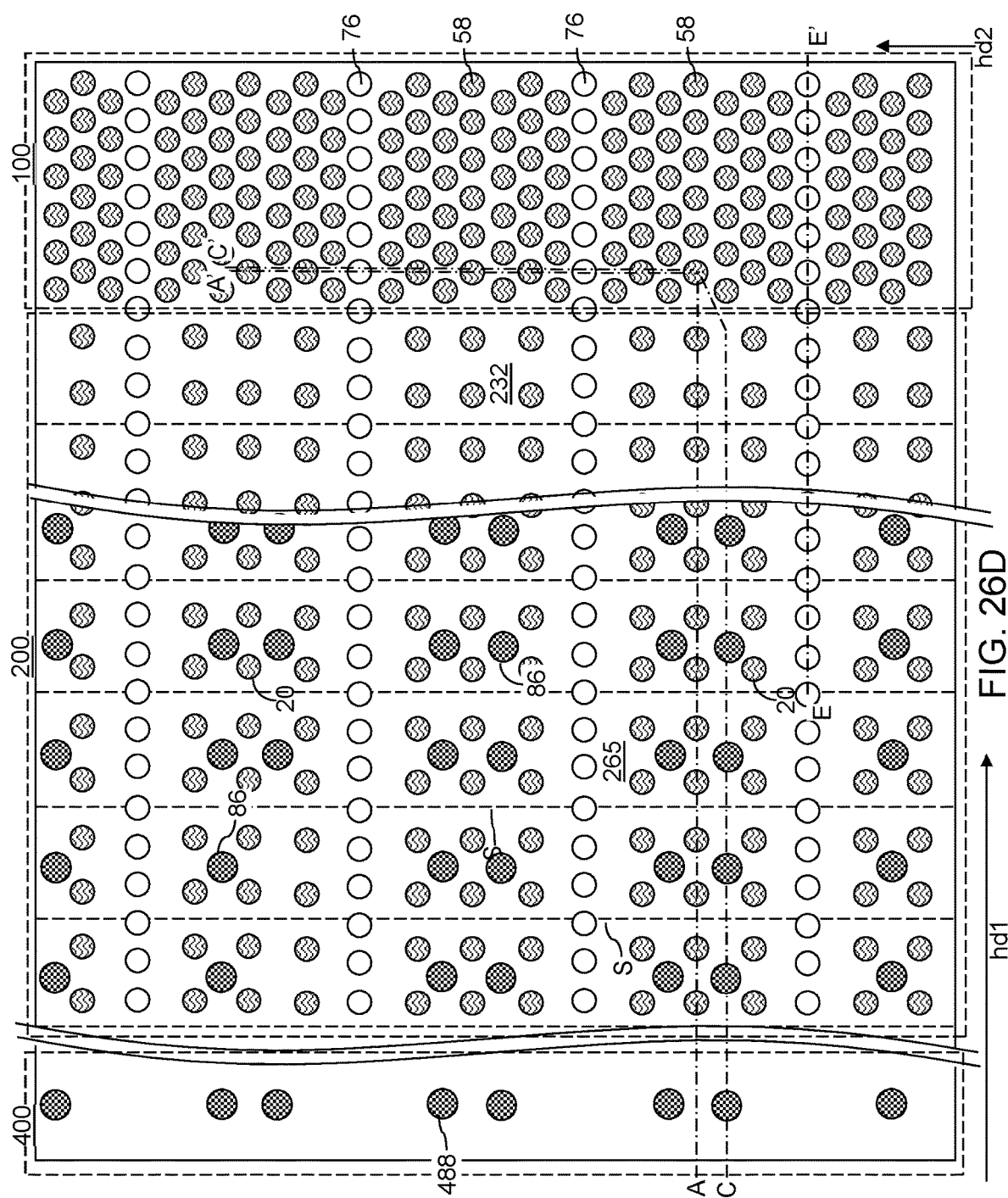
FIG. 26D is a horizontal cross-sectional view of the second alternative embodiment of the exemplary structure along the vertical plane D-D' of FIGS. 26A and 26C.
Figure 26E:
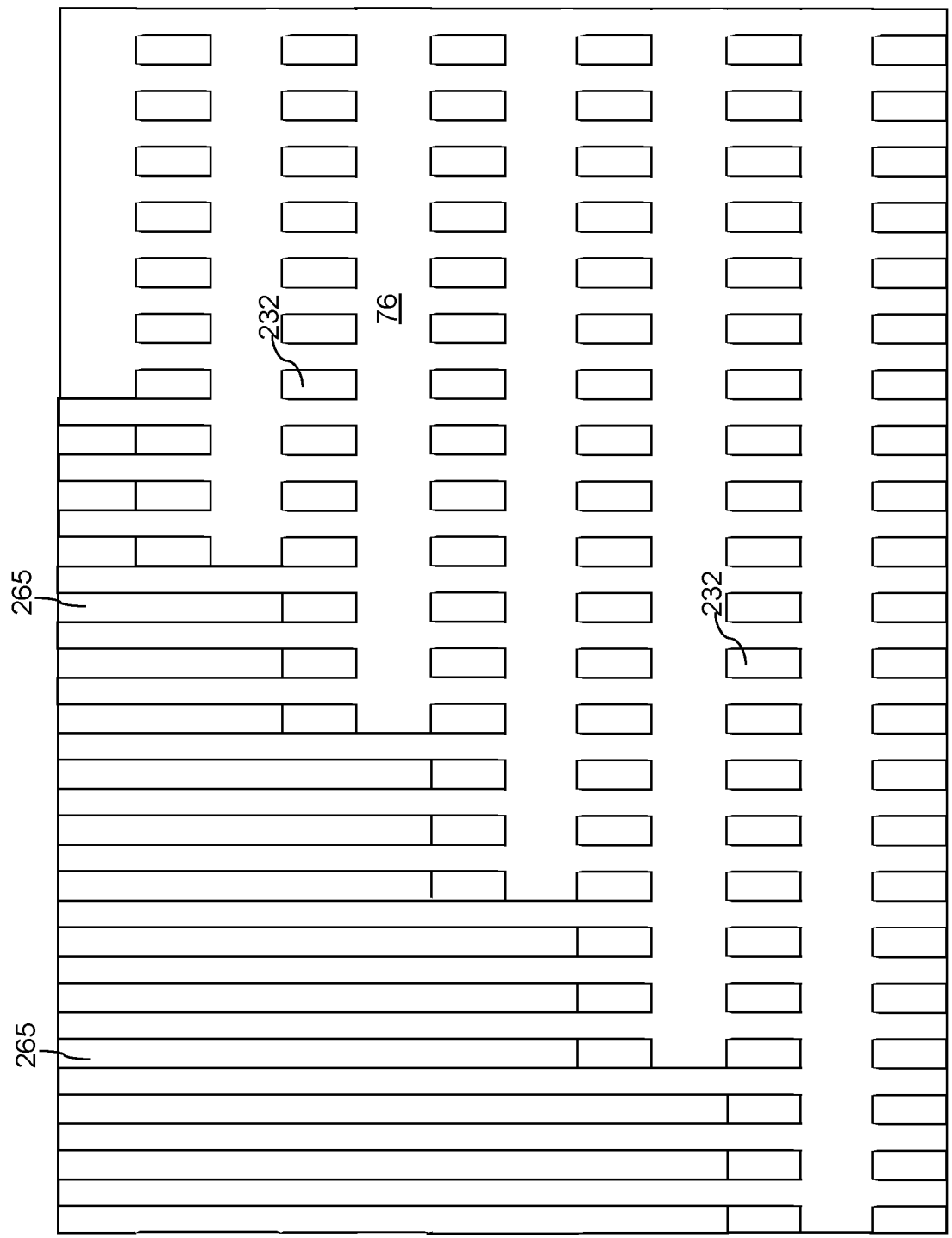
FIG. 26E is a vertical cross-sectional view of the second alternative embodiment of the exemplary structure along the vertical plane E-E' of FIGS. 26B and 26D.
Figure 26F:
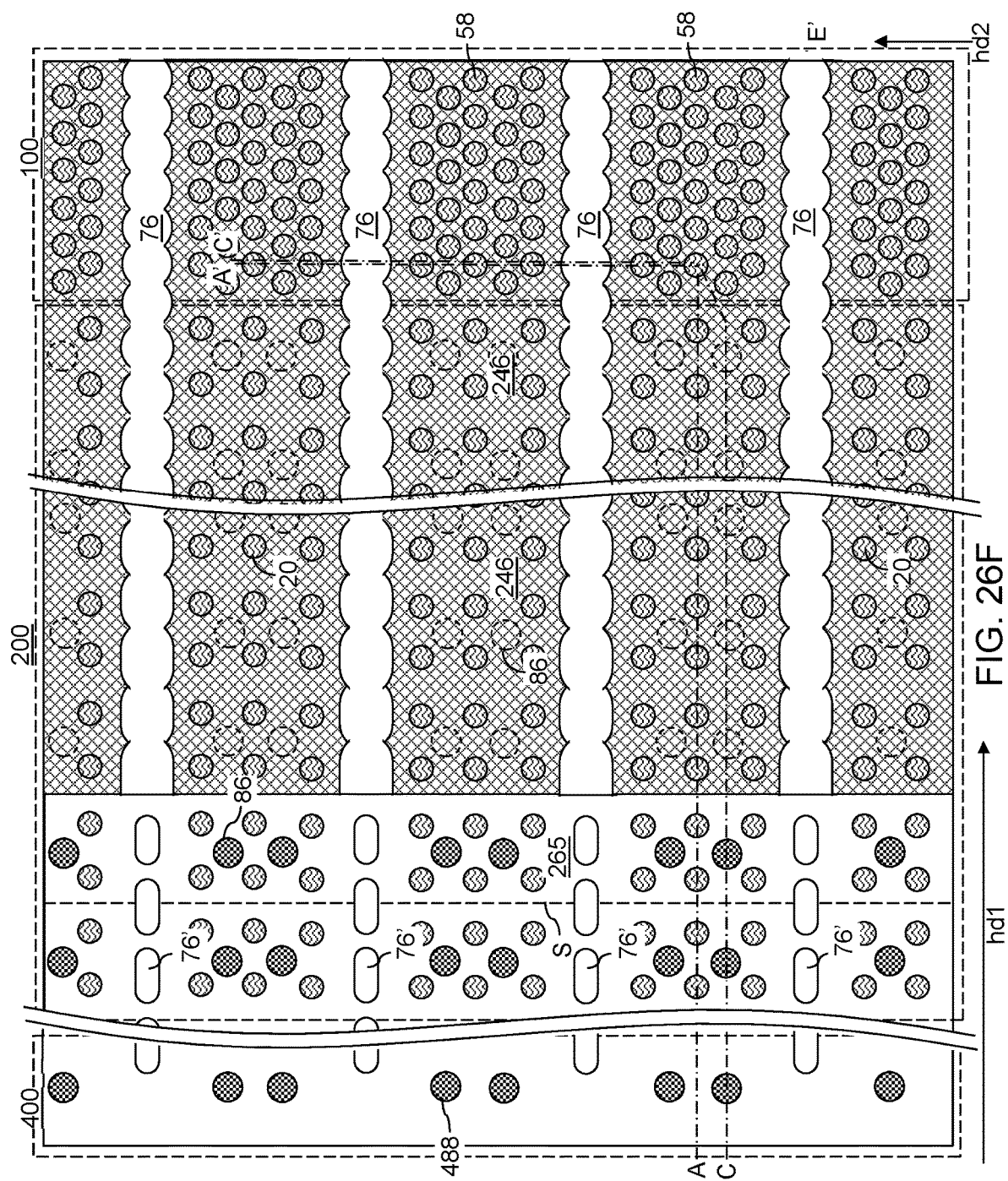
FIG. 26F is a horizontal cross-sectional view of the third alternative embodiment of the exemplary structure at the processing steps of FIGS. 21A, 21B, and 21C. The hinged vertical plane A-A' corresponds to the plane of the vertical cross-sectional view of FIG. 26A. The hinged vertical plane C-C' corresponds the plane of the vertical cross-sectional view of FIG. 26C.
Figure 26G:
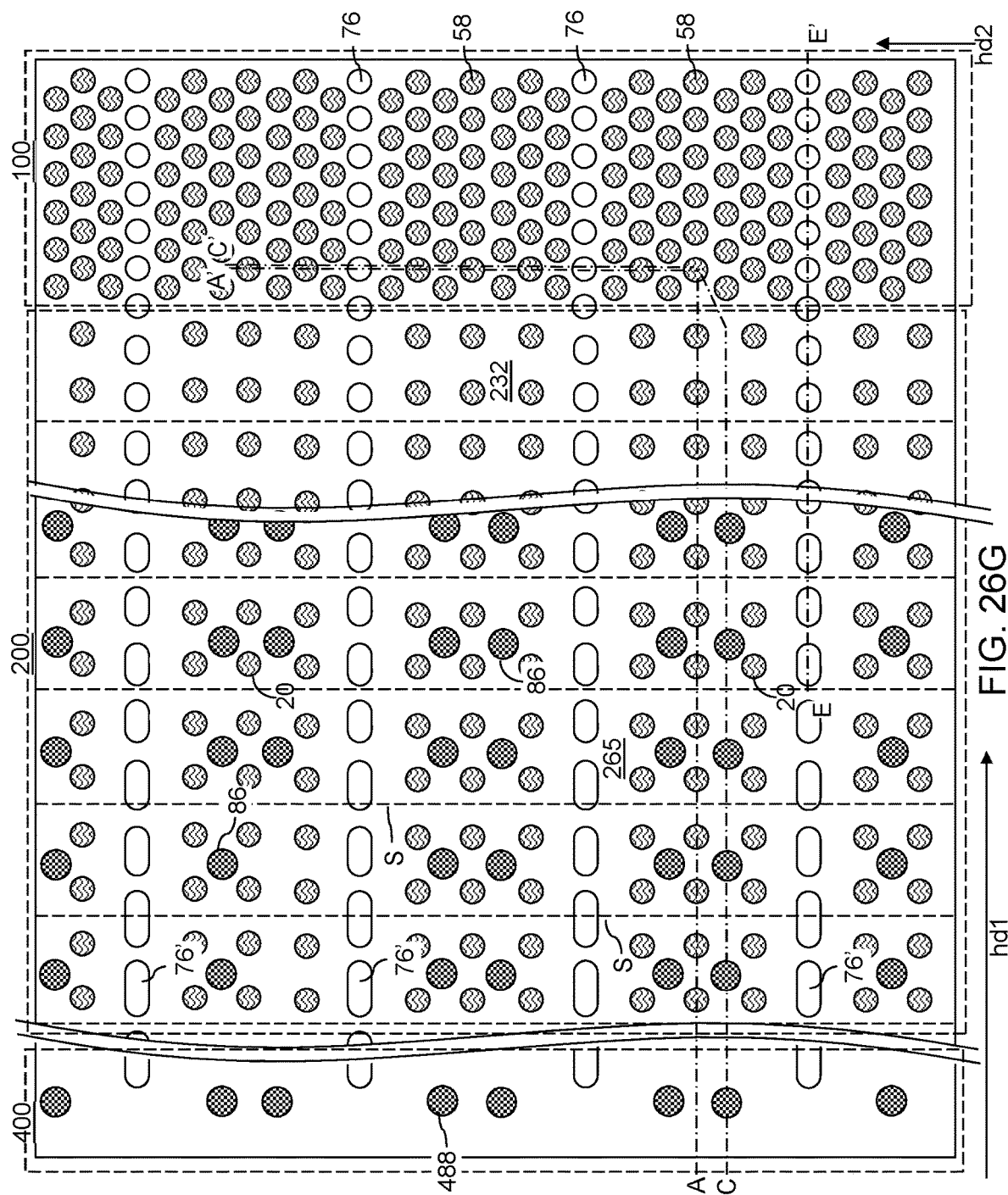
FIG. 26G is a horizontal cross-sectional view of the third alternative embodiment of the exemplary structure at the processing steps of FIGS. 21A, 21B, and 21C. The hinged vertical plane A-A' corresponds to the plane of the vertical cross-sectional view of FIG. 26A. The vertical plane C-C' corresponds the plane of the vertical cross-sectional view of FIG. 26C.

In one embodiment, each group of memory stack structures 55 includes a two-dimensional periodic array of memory stack structures 55; and each memory stack structure 55 is laterally spaced from the width-modulated insulating wall structure 76, as illustrated in FIG. 26B.

In one embodiment, each group of memory stack structures 55 includes a two-dimensional periodic array of memory stack structures 55, and at least one row of memory stack structures 55 of at least one group of memory stack structures 55 contacts the width-modulated insulating wall structure 76, as illustrated in FIG. 20B.

In one embodiment, each insulating layer (132, 232) is perforated by backside openings 79 that extend through the insulating layer. The pillar structures 76P extend through the respective backside openings 79. Each insulating layer (132, 232) continuously extends in spaces between the backside openings 79 containing the pillar structures 76P. The width-modulated insulating wall structure 76 is a perforated structure containing horizontal (i.e., lateral) perforations filled by the insulating layers (132, 232).

In some embodiments, a plurality of width-modulated insulating wall structures 76 extend through the alternating stack, and the three-dimensional semiconductor device may comprise a source contact layer 114 located between the substrate 8 and the alternating stacks {(132, 146) and/or (232, 246)} and contacting a sidewall of each of the vertical semiconductor channels 60, wherein the plurality of the width-modulated insulating wall structures 76 contact a top surface of the source contact layer 114.

In one embodiment, the three-dimensional semiconductor device further comprises dielectric etch stop material portions 108 contacting the source contact layer 114 and a sidewall the width-modulated insulating wall structure 76 and underlying a horizontal plane including a bottommost surface of the alternating stacks {(132, 146) and/or (232, 246)}.

Referring to all drawings and according to various embodiments of the present disclosure, a three-dimensional memory device is provided, which comprises: an alternating stack of insulating layers (132, 232) and electrically conductive strips (146, 246) located over a substrate 8; a width-modulated insulating wall structure 76 that laterally extends along a first horizontal direction hd1 and vertically extends through each layer in the alternating stack {(132, 246), (232, 246)}; and groups of memory stack structures 55 extending through the alternating stack {(132, 246), (232, 246)}, wherein each insulating layer (132, 232) is a continuous perforated insulating layer that laterally extends around pillar structures 76P of the width-modulated insulating wall structure 76 along a second horizontal direction hd2 that is perpendicular to the first horizontal direction hd1, and includes a laterally alternating sequence of bulging regions and neck regions, and wherein a neck-to-neck distance between neighboring pairs of neck regions monotonically changes along a lengthwise direction of the width-modulated insulating wall structure 76 within a nonuniform spacing segment of the laterally alternating sequence.

In one embodiment, the three-dimensional memory device comprises a staircase region 200 in which a first electrically conductive strip (146 or 246) within the alternating stack {(132, 246), (232, 246)} has a greater lateral extent than a second electrically conductive strip (146 or 246) within the alternating stack {(132, 246), (232, 246)} that underlies the first electrically conductive strip (146 or 246), wherein the segment of the laterally alternating sequence is located in the staircase region 200.

In one embodiment, the groups of memory stack structures 55 are located in a memory array region 100 in which each layer of the alternating stack {(132, 246), (232, 246)} is present, and wherein the nonuniform spacing segment of the laterally alternating sequence is located in the staircase region 200. In one embodiment, the neck-to-neck distance between neighboring pairs of neck regions monotonically increases in the staircase region 200 as a function of a lateral distance from the memory array region 100. In one embodiment, a ratio of a maximum neck-to-neck distance between neighboring pairs of neck regions and a minimum neck-to-neck distance between neighboring pairs of neck regions increases in the staircase region is at least two.

In one embodiment, the neck-to-neck distance between neighboring pairs of neck regions has a uniform pitch within the memory array region 100. In one embodiment, memory stack structures within each group within the groups of memory stack structures 55 are arranged in a two-dimensional array with a first periodicity along the first horizontal direction hd1, and the uniform pitch of the neck-to-neck distance between neighboring pairs of neck regions within the memory array region 100 is the same as the first periodicity.

In one embodiment, the electrically conductive strips (146, 246) in each vertical level of the alternating stack {(132, 146), (232, 246)} comprise discrete strips that are laterally spaced apart by the width-modulated insulating wall structure 76. Two electrically conductive strips (146 or 246) in each laterally neighboring pair of electrically conductive strips (146 or 246) that are located in a same vertical level are vertically spaced from the substrate 8 by a same vertical distance, and are laterally spaced apart from each other by a laterally undulating portion of the width-modulated insulating wall structure 76.

In one embodiment, the alternating stack {(132, 146), (232, 246)} includes respective stepped surfaces that extend from a bottommost layer to a topmost layer within a respective alternating stack {(132, 146), (232, 246)}; and each of the electrically conductive strips (146 or 246) includes a pair of laterally undulating lengthwise sidewalls that generally extend along the first horizontal direction hd1 and a straight widthwise sidewall that is located at the stepped surfaces and that extends along a second horizontal direction hd2 that is perpendicular to the first horizontal direction hd1.

In one embodiment, the three-dimensional memory device comprises: a retro-stepped dielectric material portion (165, 265) that contacts each straight widthwise sidewall of the electrically conductive strips (146, 246), or is laterally spaced from each straight widthwise sidewall of the electrically conductive strips by a respective backside blocking dielectric layer 44; and discrete insulating pillars 76' that vertically extend through the retro-stepped dielectric material portion (165, 265). In one embodiment, the retro-stepped dielectric material portion (165, 265) overlies the stepped surfaces of the alternating stack {(132, 246), (232, 246)}; each of the laterally undulating lengthwise sidewalls of the electrically conductive strips (146, 246) includes a plurality of concave vertical sidewalls that are adjoined to one another along vertical edges; and each of the plurality of concave vertical sidewalls contacts a respective convex vertical sidewall of the width-modulated insulating wall structure 76.

In one embodiment, the width-modulated insulating wall structure 76 comprises: ribbed beams 76B laterally contacting a respective pair of electrically conductive strips (146, 246) and located at each level of the electrically conductive strips (14, 246) and continuously extending along the first horizontal direction hd1; and pillar structures 76P contacting a respective pair of an overlying ribbed beam 76B and an underlying ribbed beam 76B and arranged along the first horizontal direction hd1 and laterally spaced apart from each other. In one embodiment, each ribbed beam 76B laterally contacting the respective pair of electrically conductive strips (146, 246) has a sidewall located within a flat vertical plane that includes sidewalls of the respective pair of electrically conductive strips (146, 246) that laterally extend along the second horizontal direction hd2; and for each pair of an overlying ribbed beam 76B and an underlying ribbed beam 76B, the underlying ribbed beam 76B has a greater lateral extent along the first horizontal direction hd1 than the overlying ribbed beam 76B.

In one embodiment, each group of memory stack structures 55 includes rows of memory stack structures 44 that are arranged along the first horizontal direction hd1 with a first pitch; and the ribbed beams 76B have a variable width along the second horizontal direction hd2 that changes periodically with translation along the first horizontal direction hd1, wherein a periodicity of modulation of the variable width is the same as the first pitch.

In one embodiment, each width-modulated insulating wall structure may have a same maximum width at each node region with a uniform neck-to-neck pitch in the memory array region 100 and a variable neck-to-neck pitch in the staircase region 200. In one embodiment, a subset of the bulging regions of each width-modulated insulating wall structure 76 may have a respective pair of straight sidewalls that extend along the first horizontal direction hd1. The distance between each pair of straight sidewalls may be the same for all bulging regions of a width-modulated insulating wall structure 76 that have a respective pair of flat vertical sidewalls that are perpendicular to the second horizontal direction hd2 and parallel to the first horizontal direction hd1.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

The embodiments of the present disclosure provide discrete backside openings 79 that sort and separate arrays of memory openings 49. Because the electrically conductive layers (146L, 246L) are formed as continuous sheets that are not divided in any horizontal direction, unidirectional stress may be avoided during formation of the electrically conductive layers (146L, 246L). Thus, transient mechanical stress during formation of the electrically conductive layers (146L, 246L) may be reduced during formation of a three-dimensional memory device.

Circular backside openings 79 in the peripheral region 400 and in the staircase region 200 tend to form random distortions due to accumulation of etch residues in random directions during an anisotropic etch process that forms the backside openings 79. However, the present inventors realized that elongated openings reduce trench distortion in regions where the number of layers of an alternating stack decreases. Without wishing to be bound by any particular theory, it is believed that elongated openings may provide a more stable etch profile than circular openings due to reduction in deposition of etch residues in random directions. Formation of overall straight width-modulated insulating wall structure 76 may be facilitated by an increase in the neck-to-neck distance in regions with a lesser number of layers in the alternating stack {(132, 142), (232, 242)} and in regions without layers of the alternating stack {(132, 142), (232, 242)}. Thus, embodiments of the present disclosure may suppress collateral damage to the support pillar structures 20 and reduce the leakage current through the support pillar structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive strips located over a substrate;
    a width-modulated insulating wall structure that laterally extends along a first horizontal direction and vertically extends through each layer in the alternating stack; and
    groups of memory stack structures extending through the alternating stack,
    wherein each insulating layer is a continuous perforated insulating layer that laterally extends around pillar structures of the width-modulated insulating wall structure along a second horizontal direction that is perpendicular to the first horizontal direction, and the width-modulated insulating wall structure includes a laterally alternating sequence of bulging regions and neck regions.

2. The three-dimensional memory device of claim 1, further comprising a staircase region in which a first electrically conductive strip within the alternating stack has a greater lateral extent than a second electrically conductive strip within the alternating stack that underlies the first electrically conductive strip, wherein the segment of the laterally alternating sequence is located in the staircase region.

3. The three-dimensional memory device of claim 2, wherein the groups of memory stack structures are located in a memory array region in which each layer of the alternating stack is present, and wherein a neck-to-neck distance between neighboring pairs of neck regions monotonically changes along a lengthwise direction of the width-modulated insulating wall structure within a nonuniform spacing segment of the laterally alternating sequence, and wherein the nonuniform spacing segment of the laterally alternating sequence is located in the staircase region.

4. The three-dimensional memory device of claim 3, wherein the neck-to-neck distance between neighboring pairs of neck regions monotonically increases in the staircase region as a function of a lateral distance from the memory array region.

5. The three-dimensional memory device of claim 3, wherein a ratio of a maximum neck-to-neck distance between neighboring pairs of neck regions and a minimum neck-to-neck distance between neighboring pairs of neck regions increases in the staircase region is at least two.

6. The three-dimensional memory device of claim 3, wherein the neck-to-neck distance between neighboring pairs of neck regions has a uniform pitch within the memory array region.

7. The three-dimensional memory device of claim 6, wherein:
    memory stack structures within each group within the groups of memory stack structures are arranged in a two-dimensional array with a first periodicity along the first horizontal direction; and
    the uniform pitch of the neck-to-neck distance between neighboring pairs of neck regions within the memory array region is the same as the first periodicity.

8. The three-dimensional memory device of claim 1, wherein the electrically conductive strips in each vertical level of the alternating stack comprise discrete strips that are laterally spaced apart by the width-modulated insulating wall structure.

9. The three-dimensional memory device of claim 1, wherein two electrically conductive strips in each laterally neighboring pair of electrically conductive strips that are located in a same vertical level are vertically spaced from the substrate by a same vertical distance, and are laterally spaced apart from each other by a laterally undulating portion of the width-modulated insulating wall structure.

10. The three-dimensional memory device of claim 9, wherein:
the alternating stack includes respective stepped surfaces that extend from a bottommost layer to a topmost layer within a respective alternating stack; and
each of the electrically conductive strips includes a pair of laterally undulating lengthwise sidewalls that generally extend along the first horizontal direction and a straight widthwise sidewall that is located at the stepped surfaces and that extends along a second horizontal direction that is perpendicular to the first horizontal direction.

11. The three-dimensional memory device of claim 10, further comprising:
a retro-stepped dielectric material portion that contacts each straight widthwise sidewall of the electrically conductive strips, or is laterally spaced from each straight widthwise sidewall of the electrically conductive strips by a respective backside blocking dielectric layer; and
discrete insulating pillars that vertically extend through the retro-stepped dielectric material portion.

12. The three-dimensional memory device of claim 11, wherein:
the retro-stepped dielectric material portion overlies the stepped surfaces of the alternating stack;
each of the laterally undulating lengthwise sidewalls of the electrically conductive strips includes a plurality of concave vertical sidewalls that are adjoined to one another along vertical edges; and
each of the plurality of concave vertical sidewalls contacts a respective convex vertical sidewall of the width-modulated insulating wall structure.

13. The three-dimensional memory device of claim 1, wherein the width-modulated insulating wall structure comprises:
ribbed beams laterally contacting a respective pair of electrically conductive strips and located at each level of the electrically conductive strips and continuously extending along the first horizontal direction; and
pillar structures contacting a respective pair of an overlying ribbed beam and an underlying ribbed beam and arranged along the first horizontal direction and laterally spaced apart from each other.

14. The three-dimensional memory device of claim 13, wherein:
each ribbed beam laterally contacting the respective pair of electrically conductive strips has a sidewall located with a same flat vertical plane that includes sidewalls of the respective pair of electrically conductive strips that laterally extend along the second horizontal direction; and
for each pair of an overlying ribbed beam and an underlying ribbed beam, the underlying ribbed beam has a greater lateral extent along the first horizontal direction than the overlying ribbed beam.

15. The three-dimensional memory device of claim 14, wherein:
each group of memory stack structures includes rows of memory stack structures that are arranged along the first horizontal direction with a first pitch; and
the ribbed beams have a variable width along the second horizontal direction that changes periodically with translation along the first horizontal direction, wherein a periodicity of modulation of the variable width is the same as the first pitch.

* * * * *